United States Patent
Osaka et al.

(10) Patent No.: US 9,985,218 B2
(45) Date of Patent: May 29, 2018

(54) LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Harue Osaka, Kanagawa (JP); Hiroshi Kadoma, Kanagawa (JP); Yasushi Kitano, Kanagawa (JP); Satoko Shitagaki, Kanagawa (JP); Nobuharu Ohsawa, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 544 days.

(21) Appl. No.: 13/954,121

(22) Filed: Jul. 30, 2013

(65) Prior Publication Data

US 2014/0034925 A1    Feb. 6, 2014

(30) Foreign Application Priority Data

Jul. 31, 2012 (JP) ................. 2012-169081

(51) Int. Cl.
*H01L 51/00* (2006.01)
*H01L 51/50* (2006.01)
*H01L 51/52* (2006.01)

(52) U.S. Cl.
CPC ...... *H01L 51/0067* (2013.01); *H01L 51/0072* (2013.01); *H01L 51/0073* (2013.01);
(Continued)

(58) Field of Classification Search
None
See application file for complete search history.

(56) References Cited

U.S. PATENT DOCUMENTS 6,723,445 B2    4/2004 Li et al.
7,355,340 B2    4/2008 Shitagaki et al.
(Continued)

FOREIGN PATENT DOCUMENTS

CN    101203968 A    6/2008
CN    101853923 A    10/2010
(Continued)

OTHER PUBLICATIONS

Goldsmith, C.R. et al, "C—H Bond Activation by a Ferric Methoxide Complex: Modeling the Rate-Determining Step in the Mechanism of Lipoxygenase,"J. Am. Chem. Soc., vol. 124, No. 1, 2002, pp. 83-96.

(Continued)

*Primary Examiner* — J. L. Yang
(74) *Attorney, Agent, or Firm* — Husch Blackwell LLP

(57) ABSTRACT

A light-emitting element with low drive voltage, a light-emitting element with high current efficiency, and/or a light-emitting element with a long lifetime are/is provided. Specifically, a light-emitting element with low drive voltage, a light-emitting element with high current efficiency, and/or a light-emitting element with a long lifetime are/is provided by the use of an organic compound with a dibenzo[f,h]quinoxaline skeleton in a light-emitting layer. In a light-emitting element which includes a light-emitting layer containing an organic compound between a pair of electrodes, the organic compound has a 2,3-unsubstituted dibenzo[f,h]quinoxaline skeleton, a hole-transport skeleton selected from a substituted or unsubstituted dibenzothiophene skeleton, a substituted or unsubstituted dibenzofuran skeleton, and a substituted or unsubstituted carbazole skeleton, and an arylene skeleton, and the 2,3-unsubstituted dibenzo[f,h]quinoxaline skeleton and the hole-transport skeleton are bonded through the arylene skeleton.

9 Claims, 40 Drawing Sheets

(52) U.S. Cl.
CPC ...... *H01L 51/0074* (2013.01); *H01L 51/5016* (2013.01); *H01L 51/5278* (2013.01)

(56) References Cited

U.S. PATENT DOCUMENTS

| | | | |
|---|---|---|---|
| 7,601,435 B2 | 10/2009 | Shitagaki et al. | |
| 7,927,720 B2 | 4/2011 | Nomura et al. | |
| 7,931,974 B2 | 4/2011 | Egawa et al. | |
| 8,017,252 B2 | 9/2011 | Iwaki et al. | |
| 8,084,146 B2 | 12/2011 | Murase et al. | |
| 8,119,259 B2 | 2/2012 | Kadoma et al. | |
| 8,138,303 B2 | 3/2012 | Chebotareva et al. | |
| 8,178,216 B2 | 5/2012 | Nomura et al. | |
| 8,231,984 B2 | 7/2012 | Shitagaki et al. | |
| 8,252,433 B2 | 8/2012 | Egawa et al. | |
| 8,252,434 B2 | 8/2012 | Iwaki et al. | |
| 8,314,101 B2 | 11/2012 | Kadoma et al. | |
| 8,541,114 B2 | 9/2013 | Iwaki et al. | |
| 8,758,905 B2 | 6/2014 | Shitagaki et al. | |
| 8,815,419 B2 | 8/2014 | Iwaki et al. | |
| 9,056,856 B2 | 6/2015 | Kadoma et al. | |
| 9,067,916 B2 | 6/2015 | Osaka et al. | |
| 9,079,879 B2 * | 7/2015 | Kadoma | C07D 403/10 |
| 9,570,690 B2 | 2/2017 | Kadoma et al. | |
| 2005/0064237 A1 | 3/2005 | Kato et al. | |
| 2009/0026922 A1 | 1/2009 | Iwaki et al. | |
| 2009/0072718 A1 | 3/2009 | Nomura et al. | |
| 2009/0140641 A1 | 6/2009 | Nomura et al. | |
| 2009/0140642 A1 | 6/2009 | Kadoma et al. | |
| 2009/0153041 A1 | 6/2009 | Kawakami et al. | |
| 2009/0184633 A1 | 7/2009 | Kadoma et al. | |
| 2009/0203704 A1 | 8/2009 | Kadoma et al. | |
| 2010/0039024 A1 | 2/2010 | Wendeborn et al. | |
| 2010/0090588 A1 | 4/2010 | Yokoyama et al. | |
| 2010/0109514 A1 | 5/2010 | Schäfer et al. | |
| 2010/0249349 A1 | 9/2010 | Chebotareva et al. | |
| 2011/0089407 A1 * | 4/2011 | Schmidhalter | B01J 31/1825 257/40 |
| 2011/0210316 A1 | 9/2011 | Kadoma et al. | |
| 2012/0138907 A1 | 6/2012 | Murase et al. | |
| 2012/0193613 A1 | 8/2012 | Kadoma et al. | |
| 2012/0197020 A1 | 8/2012 | Osaka et al. | |
| 2012/0286257 A1 | 11/2012 | Shitagaki et al. | |
| 2012/0313506 A1 | 12/2012 | Egawa et al. | |
| 2013/0048971 A1 | 2/2013 | Kitano et al. | |
| 2013/0060033 A1 | 3/2013 | Seo et al. | |
| 2013/0075704 A1 | 3/2013 | Takasu et al. | |
| 2013/0082591 A1 | 4/2013 | Seo et al. | |
| 2013/0112954 A1 | 5/2013 | Osaka et al. | |
| 2015/0270499 A1 | 9/2015 | Kadoma et al. | |
| 2015/0318493 A1 | 11/2015 | Kadoma et al. | |

FOREIGN PATENT DOCUMENTS

| | | |
|---|---|---|
| CN | 101867019 A | 10/2010 |
| CN | 101970448 A | 2/2011 |
| EP | 1 616 864 A1 | 1/2006 |
| EP | 1 748 045 A1 | 1/2007 |
| EP | 1 905 768 A1 | 4/2008 |
| EP | 1 962 354 A1 | 8/2008 |
| EP | 2 055 704 A1 | 5/2009 |
| EP | 2 065 378 A1 | 6/2009 |
| EP | 2 236 506 A1 | 10/2010 |
| EP | 2 363 398 A1 | 9/2011 |
| EP | 2 450 356 A1 | 5/2012 |
| JP | 2006-324650 | 11/2006 |
| JP | 2006-324850 A | 11/2006 |
| JP | 2007-189001 | 7/2007 |
| JP | 2008-106051 | 5/2008 |
| JP | 2008-239613 | 10/2008 |
| JP | 2009-149629 | 7/2009 |
| JP | 2009-149631 | 7/2009 |
| JP | 2009-149632 | 7/2009 |
| JP | 2009-526111 | 7/2009 |
| JP | 2011-511821 | 4/2011 |
| JP | 2011-201869 | 10/2011 |
| JP | 2013-060413 A | 4/2013 |
| JP | 2013-060414 A | 4/2013 |
| KR | 10-2008-0005441 | 1/2008 |
| KR | 10-2010-0123716 | 11/2010 |
| KR | 10-2011-0042004 | 4/2011 |
| TW | 200940554 | 10/2009 |
| WO | WO 03/058667 A1 | 7/2003 |
| WO | WO 2004/094389 A1 | 4/2004 |
| WO | WO 2004/043937 A1 | 5/2004 |
| WO | WO 2005/113531 A1 | 12/2005 |
| WO | WO 2006/115232 A1 | 11/2006 |
| WO | WO 2007/069569 A1 | 6/2007 |
| WO | WO 2007/090773 A1 | 8/2007 |
| WO | WO 2008/023628 A1 | 2/2008 |
| WO | WO 2008/031743 A1 | 3/2008 |
| WO | WO 2008/119666 A1 | 10/2008 |
| WO | WO 2009/100991 A1 | 8/2009 |

OTHER PUBLICATIONS

Onishi, T. et al., "A Method of Measuring an Energy Level," *High Molecular EL Materials—Development of Light-Emitting High Molecular Compounds*, Kyoritsu Shuppan, Dec. 25, 2004, pp. 64-67 (with English translation, pp. 1-3).

Zhang, M. et al., "Highly-Efficient Solution-Processed OLEDs Based on New Bipolar Emitters," Chemical Communications, vol. 46, 2010, pp. 3923-3925.

Wermuth, C.G., "Molecular Variations Based on Isosteric Replacements," *The Practice of Medicinal Chemistry*, Academic Press Ltd., 1996, pp. 204-237.

* cited by examiner

LIGHT-EMITTING ELEMENT, LIGHT-EMITTING DEVICE, ELECTRONIC DEVICE, AND LIGHTING DEVICE

BACKGROUND OF THE INVENTION

1. Field of the Invention

The present invention relates to a light-emitting element. Specifically, the present invention relates to a light-emitting element using organic electroluminescence (EL). The present invention also relates to a light-emitting device, an electronic device, and a lighting device each including the light-emitting element.

2. Description of the Related Art

In recent years, research and development have been extensively conducted on light-emitting elements using electroluminescence. In a basic structure of such a light-emitting element, a light-emitting layer containing a light-emitting substance is interposed between a pair of electrodes. By applying voltage to this element, light emission from the light-emitting substance can be obtained.

Such a light-emitting element is of self-luminous type, and thus has advantages over a liquid crystal display in that visibility of pixels is high, a backlight is not needed, and so on. Therefore, such a light-emitting element is regarded as being suitable as a flat panel display element. Besides, such a light-emitting element has advantages in that it can be manufactured to be thin and lightweight, and has very fast response speed.

Since such light-emitting elements can be formed in a film form, they make it possible to provide planar light emission. Thus, a large-area element utilizing planar light emission can be easily formed. This is a feature that is difficult to obtain with point light sources typified by an incandescent lamp and an LED or linear light sources typified by a fluorescent lamp. Therefore, the light-emitting element is very effective for use as a surface light source applicable to lighting and the like.

Such light-emitting elements utilizing electroluminescence can be broadly classified according to whether a light-emitting substance is an organic compound or an inorganic compound. In the case of an organic EL element in which a layer containing an organic compound used as a light-emitting substance is provided between a pair of electrodes, application of voltage to the light-emitting element causes injection of electrons from a cathode and holes from an anode into the layer containing the organic compound having a light-emitting property and thus current flows. The injected electrons and holes then lead the organic compound having a light-emitting property to its excited state, whereby light emission is obtained from the excited organic compound having a light-emitting property.

Note that excited states of the organic compound include a singlet excited state and a triplet excited state. Light emission from the singlet excited state (S*) is called fluorescence, and light emission from the triplet excited state (T*) is called phosphorescence. The statistical generation ratio thereof in the light-emitting element is considered to be S*:T*=1:3.

At room temperature, a compound capable of converting a singlet excited state into luminescence (hereinafter, referred to as a fluorescent compound) exhibits only luminescence from the singlet excited state (fluorescence), and luminescence from the triplet excited state (phosphorescence) cannot be observed. Accordingly, the internal quantum efficiency (the ratio of the number of generated photons to the number of injected carriers) of a light-emitting element including the fluorescent compound is assumed to have a theoretical limit of 25%, on the basis of S*:T*=1:3.

In contrast, a compound capable of converting a triplet excited state into luminescence (hereinafter, referred to as a phosphorescent compound) exhibits luminescence from the triplet excited state (phosphorescence). Further, since intersystem crossing (i.e., transition from a singlet excited state to a triplet excited state) easily occurs in a phosphorescent compound, the internal quantum efficiency can be theoretically increased to 100%. That is, higher emission efficiency can be achieved than using a fluorescent compound. For this reason, light-emitting elements using a phosphorescent compound have been under active development recently so that high-efficiency light-emitting elements can be achieved.

When a light-emitting layer of a light-emitting element is formed using the phosphorescent compound described above, in order to suppress concentration quenching or quenching due to triplet-triplet annihilation of the phosphorescent compound, the light-emitting layer is usually formed such that the phosphorescent compound is dispersed in a matrix of another compound. Here, the compound serving as the matrix is called host material, and the compound dispersed in the matrix like the phosphorescent compound is called guest material.

When the phosphorescent compound is used as the guest material, the host material is required to have a higher triplet excitation energy level (difference in energy between the ground state and the triplet excited state, which is also referred to as $T_1$ level) than the phosphorescent compound.

Since the singlet excitation energy level (difference in energy between the ground state and the singlet excited state, which is also referred to as $S_1$ level) is higher than a $T_1$ level, a substance that has a high $T_1$ level also has a high $S_1$ level. Therefore, the above substance that has a high $T_1$ level is also effective in a light-emitting element using a fluorescent compound as a light-emitting substance.

Studies have been conducted on compounds having a dibenzo[f,h]quinoxaline skeleton, which are examples of the host material used when a phosphorescent compound is a guest material (e.g., see Patent Documents 1 and 2).

REFERENCE

Patent Document

[Patent Document 1] International Publication WO 03/058667 pamphlet
[Patent Document 2] Japanese Published Patent Application No. 2007-189001

SUMMARY OF THE INVENTION

However, the above compounds having a dibenzo[f,h]quinoxaline skeleton have planar structures, thus being easily crystallized. A light-emitting element using a compound that is easily crystallized has a short lifetime. Moreover, if another skeleton is directly bonded to the dibenzo[f,h]quinoxaline skeleton so that the compound has a sterically bulky structure, the conjugated system could possibly extend to cause a decrease in $T_1$ level.

Further, in order to obtain a light-emitting device, an electronic device, and a lighting device each having reduced power consumption and high reliability, a light-emitting element having low drive voltage, a light-emitting element having high current efficiency, or a light-emitting element having a long lifetime has been demanded.

In view of the above, an object of one embodiment of the present invention is to provide a light-emitting element with low drive voltage, a light-emitting element with high current efficiency, and/or a light-emitting element with a long lifetime. Specifically, an object of one embodiment of the present invention is to provide a light-emitting element with low drive voltage, a light-emitting element with high current efficiency, and/or a light-emitting element with a long lifetime by the use of an organic compound with a dibenzo[f,h]quinoxaline skeleton in a light-emitting layer. Another object of one embodiment of the present invention is to provide a light-emitting device, an electronic device, and a lighting device each having reduced power consumption by the use of the above light-emitting element.

Note that the invention to be disclosed below aims to achieve at least one of the above-described objects.

An organic compound with a quinoxaline skeleton has a high electron-transport property, and the use of such a compound for a light-emitting element enables the element to have low drive voltage. However, a quinoxaline skeleton has a planar structure. Since an organic compound having a planar structure is easily crystallized when formed into a film, the use of such an organic compound for light-emitting elements causes the elements to have a short lifetime. Furthermore, a quinoxaline skeleton is poor at accepting holes. When an organic compound that cannot easily accept holes is used as a host material of a light-emitting layer, the region of electron-hole recombination concentrates on an interface of the light-emitting layer, leading to a reduction in lifetime of the light-emitting element.

These problems will be solved by introduction of a hole-transport skeleton into the molecule. However, if a hole-transport skeleton is directly bonded to a quinoxaline skeleton, the conjugated system extends to cause a decrease in band gap and a decrease in triplet excitation energy.

One embodiment of the present invention is a light-emitting element which includes an organic compound with a dibenzo[f,h]quinoxaline skeleton, a hole-transport skeleton selected from a dibenzothiophene skeleton, a dibenzofuran skeleton, and a carbazole skeleton which are hole-transport skeletons, and an arylene skeleton. The above-described problems can be solved when a light-emitting element includes the organic compound. Details will be described below.

In a light-emitting element including a light-emitting layer between a pair of electrodes, the light-emitting layer contains an organic compound; the organic compound has a 2,3-unsubstituted dibenzo[f,h]quinoxaline skeleton, a hole-transport skeleton selected from a substituted or unsubstituted dibenzothiophene skeleton, a substituted or unsubstituted dibenzofuran skeleton, and a substituted or unsubstituted carbazole skeleton, and an arylene skeleton; and the 2,3-unsubstituted dibenzo[f,h]quinoxaline skeleton and the hole-transport skeleton are bonded through the arylene skeleton.

In the organic compound, since the 2-position and the 3-position of the dibenzo[f,h]quinoxaline skeleton that is a skeleton which transports electrons are unsubstituted, molecular packing density becomes high so that a high electron-transport property is exhibited.

Further, in the organic compound, the dibenzo[f,h]quinoxaline skeleton and the hole-transport skeleton selected from a dibenzothiophene skeleton, a dibenzofuran skeleton, and a carbazole skeleton are bonded through the arylene skeleton. The introduction of the hole-transport skeleton in the dibenzo[f,h]quinoxaline skeleton enables the organic compound to have a sterically bulky structure, so that the organic compound does not readily crystallize when formed into a film. By the use of the organic compound for a light-emitting element, the element can have a long lifetime.

In addition, since the dibenzo[f,h]quinoxaline skeleton and the hole-transport skeleton are bonded through the arylene skeleton in the above organic compound, a reduction in band gap and a reduction in triplet excitation energy can be small as compared to those in the case where the skeletons are directly bonded. Therefore, the use of the organic compound in a light-emitting element enables the light-emitting element to have high current efficiency, low drive voltage, and a long lifetime.

Further, the number of the hole-transport skeletons of the organic compound is preferably one or two. Note that "the number of the hole-transport skeletons of the organic compound is two" means that the organic compound has a first hole-transport skeleton bonded to the dibenzo[f,h]quinoxaline skeleton through a first arylene skeleton and a second hole-transport skeleton bonded to the dibenzo[f,h]quinoxaline skeleton through a second arylene skeleton.

In each of the above-described structures, it is preferable that the organic compound have a molecular weight of 2000 or less. It is further preferable that the organic compound have a molecular weight of 1000 or less. When the organic compound has a molecular weight of 2000 or less, evaporation efficiency at the time of evaporation of the organic compound can be improved. In terms of heat resistance, the molecular weight of the organic compound is preferably not less than 500, in which case the film quality of the organic compound after deposition can be stable.

Further, in each of the above structures, the arylene skeleton is preferably bonded to the 6-position or the 7-position of the 2,3-unsubstituted dibenzo[f,h]quinoxaline skeleton, in which case the synthesis is simplified. In the case where the number of the arylene skeletons is two, the sites of substitution are preferably the 6-position and the 11-position or the 7-position and the 10-position, in which case the synthesis of raw materials is simplified. As the site of substitution in bonding of the dibenzo[f,h]quinoxaline skeleton and the arylene skeleton, the 6-position, the 7-position, the 10-position, or the 11-position of the dibenzo[f,h]quinoxaline skeleton is preferred to the 5-position, the 8-position, the 9-position, or the 12-position of the dibenzo[f,h]quinoxaline skeleton. When the arylene skeleton is bonded to the 6-position, the 7-position, the 10-position, or the 11-position of the dibenzo[f,h]quinoxaline skeleton, steric hindrance between the dibenzo[f,h]quinoxaline skeleton and the arylene skeleton can be suppressed and the organic compound can be chemically stable.

In each of the above structures, it is preferable that at least a precursor ion and a product ion with a value obtained by subtracting m/z=55 from a value of the precursor ion be detected from the organic compound by liquid chromatography mass spectrometry (LC/MS) analysis in which an argon gas is collided at an energy higher than or equal to 30 eV and lower than or equal to 100 eV after LC separation.

Another embodiment of the present invention is a light-emitting element including, between a pair of electrodes, a light-emitting layer which contains an organic compound; the organic compound has at least a 2,3-unsubstituted dibenzo[f,h]quinoxaline skeleton; and at least a precursor ion and a product ion with a value obtained by subtracting m/z=55 from a value of the precursor ion are detected from the organic compound by LC/MS analysis in which an argon gas is collided at an energy higher than or equal to 30 eV and lower than or equal to 100 eV after LC separation. At this time, the argon gas is preferably collided at an energy of 50 eV or higher in the LC/MS analysis, in which case a product ion is easily detected.

In the case of an organic compound with a 2,3-unsubstituted dibenzo[f,h]quinoxaline skeleton, a product ion derived from the 2,3-unsubstituted dibenzo[f,h]quinoxaline skeleton with a value obtained by subtracting m/z=55 from a value of a precursor ion is detected. Accordingly, by analysis of an organic compound in a light-emitting element by LC/MS, a skeleton of the organic compound in a mixture can be identified.

Low power consumption can be achieved in a light-emitting device (such as an image display device) which includes the above light-emitting element. Thus, one embodiment of the present invention is a light-emitting device including the above light-emitting element. One embodiment of the present invention also includes an electronic device using the light-emitting device in its display portion and a lighting device using the light-emitting device in its light-emitting portion.

The light-emitting device in this specification includes, in its category, an image display device that uses a light-emitting element. Further, the category of the light-emitting device includes a module in which a light-emitting element is provided with a connector, an anisotropic conductive film, or a TCP (tape carrier package); a module in which the end of the TCP is provided with a printed wiring board; and a module in which an IC (integrated circuit) is directly mounted on a light-emitting element by a COG (chip on glass) method. Furthermore, the category includes light-emitting devices that are used in lighting devices or the like.

In one embodiment of the present invention, a light-emitting element with low drive voltage, a light-emitting element with high current efficiency, and/or a light-emitting element with a long lifetime can be provided. Specifically, a light-emitting element with low drive voltage, a light-emitting element with high current efficiency, and/or a light-emitting element with a long lifetime can be provided by the use of an organic compound with a dibenzo[f,h]quinoxaline skeleton in a light-emitting layer. In one embodiment of the present invention, a light-emitting device, an electronic device, and a lighting device each having reduced power consumption can be provided by the use of the above light-emitting element.

DETAILED DESCRIPTION OF THE INVENTION

Hereinafter, embodiments of the present invention will be described in detail with reference to the accompanying drawings. Note that the present invention is not limited to the following description, and it will be easily understood by those skilled in the art that the mode and detail can be modified in various ways without departing from the spirit and scope of the present invention. Therefore, the present invention should not be construed as being limited to the description in the following embodiments.

Embodiment 1

In this embodiment, light-emitting elements each of which includes a light-emitting layer between a pair of electrodes will be described with reference to FIGS. 1A to 1C.

First, the light-emitting element illustrated in FIG. 1A will be described.

Figure 1A:
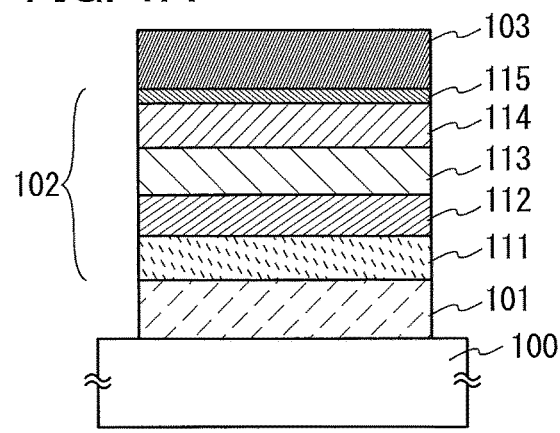
FIGS. 1A to 1C each illustrate a light-emitting element of one embodiment of the present invention.

As illustrated in FIG. 1A, the light-emitting element in this embodiment includes an EL layer 102 between a first electrode 101 and a second electrode 103. The EL layer 102 includes at least a light-emitting layer 113 and also includes a hole-injection layer 111, a hole-transport layer 112, an electron-transport layer 114, an electron-injection layer 115, and the like. Note that in this embodiment, the first electrode 101 is used as an anode and the second electrode 103 is used as a cathode.

The light-emitting layer 113 contains an organic compound which has a 2,3-unsubstituted dibenzo[f,h]quinoxaline skeleton, a hole-transport skeleton selected from a substituted or unsubstituted dibenzothiophene skeleton, a substituted or unsubstituted dibenzofuran skeleton, and a substituted or unsubstituted carbazole skeleton, and an arylene skeleton, and in which the 2,3-unsubstituted dibenzo[f,h]quinoxaline skeleton and the hole-transport skeleton are bonded through the arylene skeleton.

The dibenzo[f,h]quinoxaline skeleton and the hole-transport skeleton selected from a dibenzothiophene skeleton, a dibenzofuran skeleton, and a carbazole skeleton are bonded through the arylene skeleton, whereby the hole-transport skeleton is introduced in the dibenzo[f,h]quinoxaline skeleton. Thus, the organic compound has a sterically bulky structure and does not readily crystallize when formed into a film. By the use of the organic compound for a light-emitting element, the element can have a long lifetime. In addition, since the dibenzo[f,h]quinoxaline skeleton and the hole-transport skeleton are bonded through the arylene skeleton in the above organic compound, a reduction in band gap and a reduction in $T_1$ level can be small as compared to those in the case where the skeletons are directly bonded.

Therefore, the use of the organic compound in a light-emitting element enables the light-emitting element to have high current efficiency, low drive voltage, and a long lifetime.

Further details of the light-emitting elements in this embodiment will be described below.

A substrate 100 is used as a support of the light-emitting element. For example, glass, quartz, plastic, or the like can be used for the substrate 100. A flexible substrate may be used. The flexible substrate is a substrate that can be bent, such as a plastic substrate made of, for example, polycarbonate, polyarylate, or poly(ether sulfone). Alternatively, a film (made of polypropylene, a polyester, poly(vinyl fluoride), poly(vinyl chloride), or the like), a film on which an inorganic substance is deposited by evaporation, or the like can be used. Note that a different substrate can be used as long as it can function as a support in a process of manufacturing the light-emitting element.

For the first electrode 101 and the second electrode 103, a metal, an alloy, an electrically conductive compound, a mixture thereof, and the like can be used. Specifically, indium oxide-tin oxide (ITO: indium tin oxide), indium oxide-tin oxide containing silicon or silicon oxide, indium oxide-zinc oxide, indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. In addition, an element belonging to Group 1 or Group 2 of the periodic table, examples of which are an alkali metal such as lithium (Li) or cesium (Cs) and an alkaline earth metal such as magnesium (Mg), calcium (Ca), or strontium (Sr), an alloy containing such an element, a rare earth metal such as europium (Eu) or ytterbium (Yb), an alloy containing such an element, graphene, and the like can be used. The first electrode 101 and the second electrode 103 can be formed by, for example, a sputtering method, an evaporation method (including a vacuum evaporation method), or the like.

As a substance with a high hole-transport property that is used for the hole-injection layer 111 and the hole-transport layer 112, a π-electron rich heteroaromatic compound (e.g., a carbazole derivative or an indole derivative) or an aromatic amine compound can be used. For example, the following substances can be used: a compound having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(Spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBALBP), 4,4'-diphenyl-4"-(9-phenyl-9H-carbazol-3-yl)triphenylamine (abbreviation: PCBBLBP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4"-(benzene-1,3,5-triyptri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-W); and a compound having a furan skeleton such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II).

In the above-mentioned substances, a compound having a carbazole skeleton is preferable because the compound is highly reliable and has a high hole-transport property to contribute to a reduction in drive voltage.

Furthermore, as a material that can be used for the hole-injection layer 111 and the hole-transport layer 112, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl)methacryla mide] (abbreviation: PTPDMA), or poly[N,N'-bis(4-butylphenyl)-N,N'-bis(phenyl)benzidine] (abbreviation: Poly-TPD) can be used.

A layer in which any of the substances with a high hole-transport property given above and a substance with an acceptor property are mixed is preferably used as the hole-injection layer 111 and the hole-transport layer 112, in which case a favorable carrier-injection property is obtained. Examples of the acceptor substance to be used include a transition metal oxide and an oxide of a metal belonging to any of Groups 4 to 8 of the periodic table. Specifically, molybdenum oxide is particularly preferable.

The light-emitting layer 113 preferably contains, for example, an electron-transport material as a host material (a first organic compound), a light-emitting material which converts triplet excitation energy into light as a guest material (a second organic compound), and a hole-transport material as an assist material (a third organic compound). Note that a relation between the host material and the assist material is not limited to the above; an electron-transport material may be used as the assist material and a hole-transport material may be used as the host material.

Here, as the above host material (the first organic compound), an organic compound which has a 2,3-unsubstituted dibenzo[f,h]quinoxaline skeleton, a hole-transport skeleton selected from a substituted or unsubstituted dibenzothiophene skeleton, a substituted or unsubstituted dibenzofuran skeleton, and a substituted or unsubstituted carbazole skeleton, and an arylene skeleton, and in which the 2,3-unsubstituted dibenzo[f,h]quinoxaline skeleton and the hole-transport skeleton are bonded through the arylene skeleton is used.

Specifically, the above organic compound can be represented by General Formulae (G1-1) to (G1-3) below.

[Chemical formula 1]

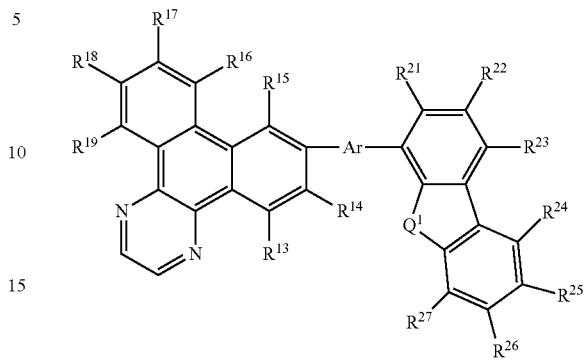

(G1-1)

In General Formula (G1-1), $Q^1$ represents any of a sulfur atom, an oxygen atom, and a nitrogen atom, and the nitrogen atom has an alkyl group having 1 to 4 carbon atoms or a substituted or unsubstituted aryl group having 6 to 13 carbon atoms as a substituent. In addition, $R^{13}$ to $R^{19}$ and $R^{21}$ to $R^{27}$ separately represent any of hydrogen, an alkyl group having 1 to 4 carbon atoms, and a substituted or unsubstituted aryl group having 6 to 13 carbon atoms, and Ar represents a substituted or unsubstituted arylene group having 6 to 13 carbon atoms.

[Chemical formula 2]

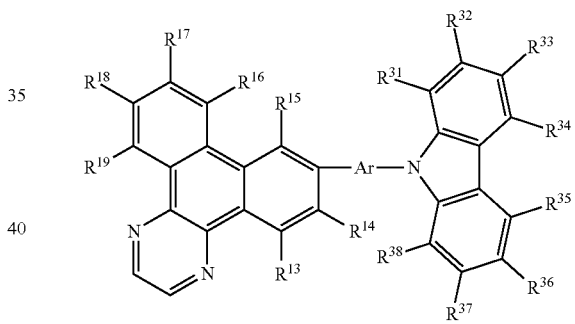

(G1-2)

In General Formula (G1-2), $R^{13}$ to $R^{19}$ and $R^{31}$ to $R^{38}$ separately represent any of hydrogen, an alkyl group having 1 to 4 carbon atoms, and a substituted or unsubstituted aryl group having 6 to 13 carbon atoms, and Ar represents a substituted or unsubstituted arylene group having 6 to 13 carbon atoms.

[Chemical formula 3]

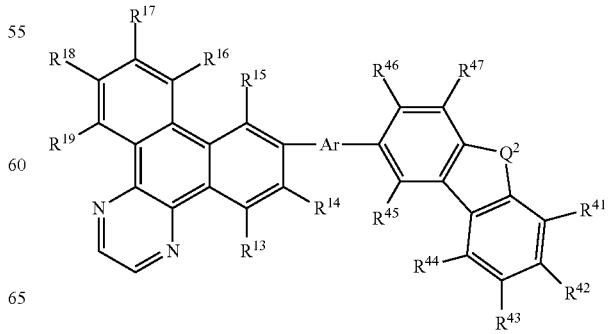

(G1-3)

In General Formula (G1-3), $R^{13}$ to $R^{19}$ and $R^{41}$ to $R^{47}$ separately represent any of hydrogen, an alkyl group having 1 to 4 carbon atoms, and a substituted or unsubstituted aryl group having 6 to 13 carbon atoms, Ar represents a substituted or unsubstituted arylene group having 6 to 13 carbon atoms, $Q^2$ represents any of a sulfur atom, an oxygen atom, and a nitrogen atom, and the nitrogen atom has an alkyl group having 1 to 4 carbon atoms or a substituted or unsubstituted aryl group having 6 to 13 carbon atoms as a substituent.

In General Formulae (G1-1) to (G1-3), it is preferable that Ar represent a substituted or unsubstituted phenylene group or a substituted or unsubstituted biphenyldiyl group, particularly a substituted or unsubstituted phenylene group. It is further preferable that Ar represent a substituted or unsubstituted m-phenylene group to obtain a high $T_1$ level. That is, the organic compounds can be represented by General Formulae (G2-1) to (G2-3) below.

[Chemical formula 4]

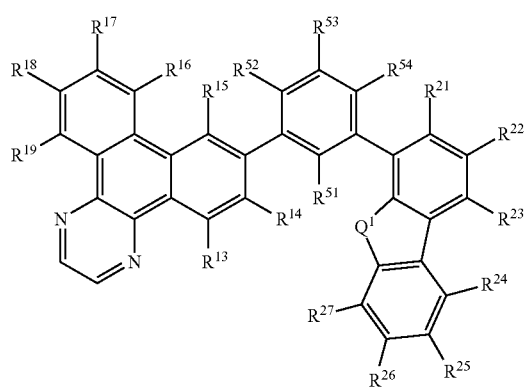

(G2-1)

In General Formula (G2-1), $Q^1$ represents any of a sulfur atom, an oxygen atom, and a nitrogen atom, and the nitrogen atom has an alkyl group having 1 to 4 carbon atoms or a substituted or unsubstituted aryl group having 6 to 13 carbon atoms as a substituent. In addition, $R^{13}$ to $R^{19}$, $R^{21}$ to $R^{27}$, and $R^{51}$ to $R^{54}$ separately represent any of hydrogen, an alkyl group having 1 to 4 carbon atoms, and a substituted or unsubstituted aryl group having 6 to 13 carbon atoms.

[Chemical formula 5]

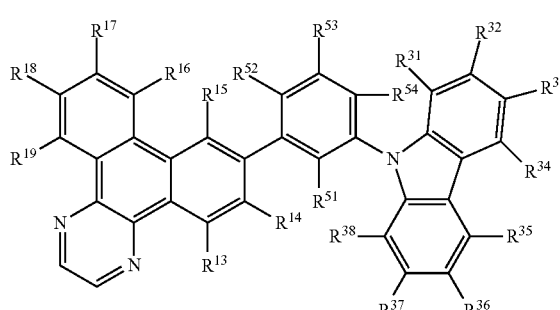

(G2-2)

In General Formula (G2-2), $R^{13}$ to $R^{19}$, $R^{31}$ to $R^{38}$, and $R^{51}$ to $R^{54}$ separately represent any of hydrogen, an alkyl group having 1 to 4 carbon atoms, and a substituted or unsubstituted aryl group having 6 to 13 carbon atoms.

[Chemical formula 6]

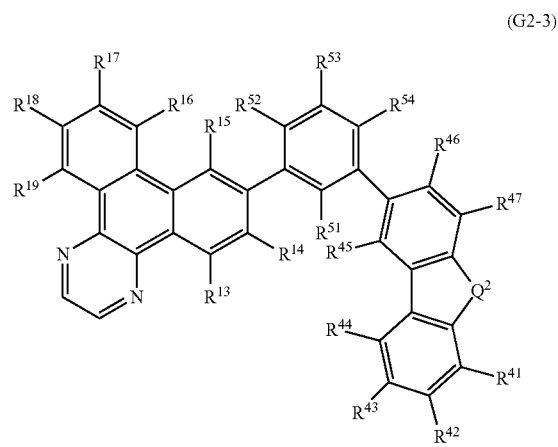

(G2-3)

In General Formula (G2-3), $R^{13}$ to $R^{19}$, $R^{41}$ to $R^{47}$, and $R^{51}$ to $R^{54}$ separately represent any of hydrogen, an alkyl group having 1 to 4 carbon atoms, and a substituted or unsubstituted aryl group having 6 to 13 carbon atoms, $Q^2$ represents any of a sulfur atom, an oxygen atom, and a nitrogen atom, and the nitrogen atom has an alkyl group having 1 to 4 carbon atoms or a substituted or unsubstituted aryl group having 6 to 13 carbon atoms as a substituent.

Specifically, the above organic compounds can be represented by General Formulae (G3-1) to (G3-3) below.

[Chemical formula 7]

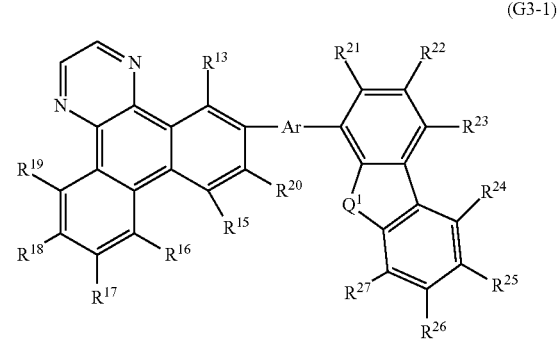

(G3-1)

In General Formula (G3-1), $Q^1$ represents any of a sulfur atom, an oxygen atom, and a nitrogen atom, and the nitrogen atom has an alkyl group having 1 to 4 carbon atoms or a substituted or unsubstituted aryl group having 6 to 13 carbon atoms as a substituent. In addition, $R^{13}$ and $R^{15}$ to $R^{27}$ separately represent any of hydrogen, an alkyl group having 1 to 4 carbon atoms, and a substituted or unsubstituted aryl group having 6 to 14 carbon atoms, and Ar represents a substituted or unsubstituted arylene group having 6 to 13 carbon atoms.

[Chemical formula 8]

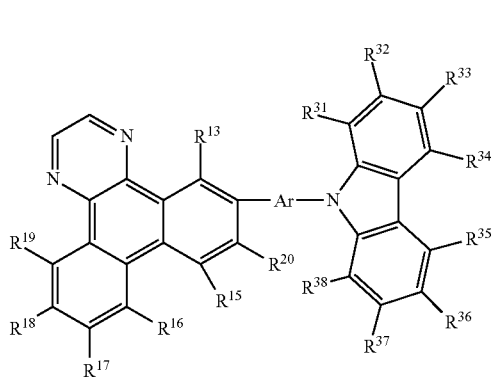

(G3-2)

In General Formula (G3-2), $R^{13}$, $R^{15}$ to $R^{20}$, and $R^{31}$ to $R^{38}$ separately represent any of hydrogen, an alkyl group having 1 to 4 carbon atoms, and a substituted or unsubstituted aryl group having 6 to 14 carbon atoms, and Ar represents a substituted or unsubstituted arylene group having 6 to 13 carbon atoms.

[Chemical formula 9]

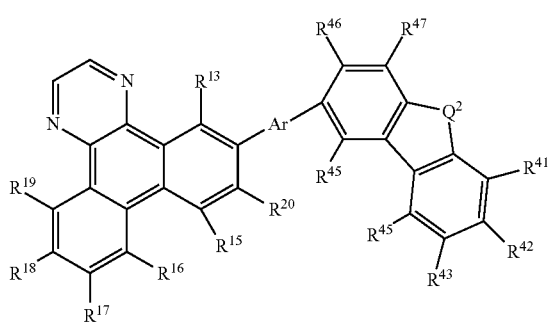

(G3-3)

In General Formula (G3-3), $R^{13}$, $R^{15}$ to $R^{20}$, and $R^{41}$ to $R^{47}$ separately represent any of hydrogen, an alkyl group having 1 to 4 carbon atoms, and a substituted or unsubstituted aryl group having 6 to 14 carbon atoms, Ar represents a substituted or unsubstituted arylene group having 6 to 13 carbon atoms, $Q^2$ represents any of a sulfur atom, an oxygen atom, and a nitrogen atom, and the nitrogen atom has an alkyl group having 1 to 4 carbon atoms or a substituted or unsubstituted aryl group having 6 to 14 carbon atoms as a substituent.

In General Formulae (G3-1) to (G3-3), it is preferable that Ar represent a substituted or unsubstituted phenylene group or a substituted or unsubstituted biphenyldiyl group, particularly a substituted or unsubstituted phenylene group. It is further preferable that Ar represent a substituted or unsubstituted m-phenylene group to obtain a high $T_1$ level. That is, the organic compounds can be represented by General Formulae (G4-1) to (G4-3) below.

[Chemical formula 10]

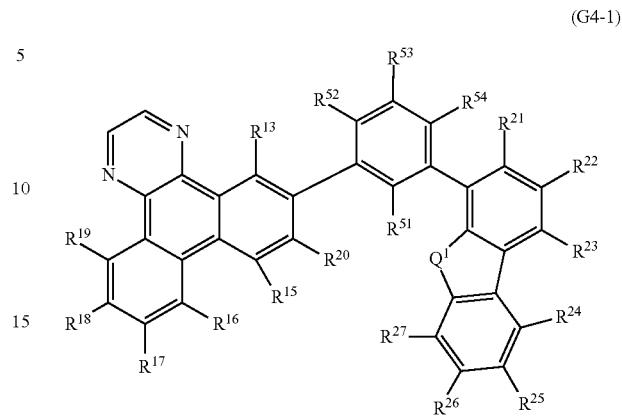

(G4-1)

In General Formula (G4-1), $Q^1$ represents any of a sulfur atom, an oxygen atom, and a nitrogen atom, and the nitrogen atom has an alkyl group having 1 to 4 carbon atoms or a substituted or unsubstituted aryl group having 6 to 13 carbon atoms as a substituent. In addition, $R^{13}$, $R^{15}$ to $R^{27}$, and $R^{51}$ to $R^{54}$ separately represent any of hydrogen, an alkyl group having 1 to 4 carbon atoms, and a substituted or unsubstituted aryl group having 6 to 14 carbon atoms.

[Chemical formula 11]

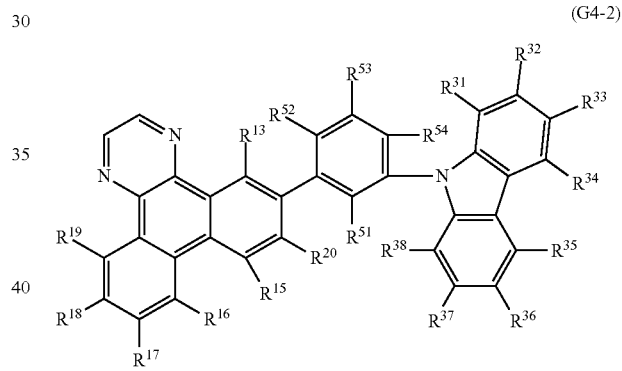

(G4-2)

In General Formula (G4-2), $R^{13}$, $R^{15}$ to $R^{20}$, $R^{31}$ to $R^{38}$, and $R^{51}$ to $R^{54}$ separately represent any of hydrogen, an alkyl group having 1 to 4 carbon atoms, and a substituted or unsubstituted aryl group having 6 to 14 carbon atoms.

[Chemical formula 12]

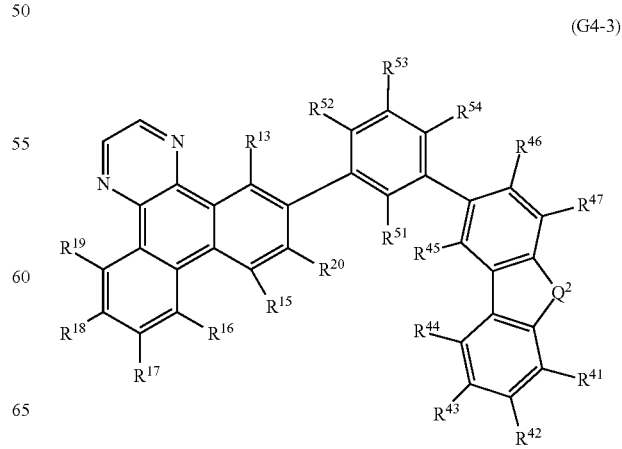

(G4-3)

In General Formula (G4-3), $R^{13}$, $R^{15}$ to $R^{20}$, $R^{41}$ to $R^{47}$, and $R^{51}$ to $R^{54}$ separately represent any of hydrogen, an alkyl group having 1 to 4 carbon atoms, and a substituted or unsubstituted aryl group having 6 to 14 carbon atoms, $Q^2$ represents any of a sulfur atom, an oxygen atom, and a nitrogen atom, and the nitrogen atom has an alkyl group having 1 to 4 carbon atoms or a substituted or unsubstituted aryl group having 6 to 14 carbon atoms as a substituent.

Specifically, the above organic compounds can be represented by General Formulae (G5-1) and (G5-2) below.

[Chemical formula 13]

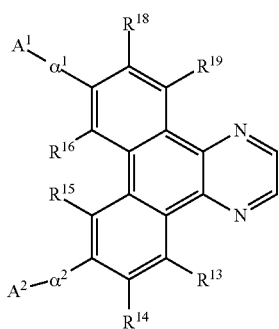

(G5-1)

In General Formula (G5-1), $R^{13}$ to $R^{16}$, $R^{18}$, and $R^{19}$ separately represent hydrogen, an alkyl group having 1 to 6 carbon atoms, a substituted or unsubstituted phenyl group, or a substituted or unsubstituted biphenyl group, $\alpha^1$ and $\alpha^2$ separately represent a substituted or unsubstituted phenylene group or a substituted or unsubstituted biphenyldiyl group, and $A^1$ and $A^2$ separately represent a substituted or unsubstituted carbazolyl group, a substituted or unsubstituted dibenzothiophenyl group, or a substituted or unsubstituted dibenzofuranyl group.

In General Formula (G5-1), in the case where any of $R^{13}$ to $R^{16}$, $R^{18}$, and $R^{19}$ represents a phenyl group or a biphenyl group, the phenyl group or the biphenyl group may have an alkyl group having 1 to 6 carbon atoms as a substituent.

[Chemical formula 14]

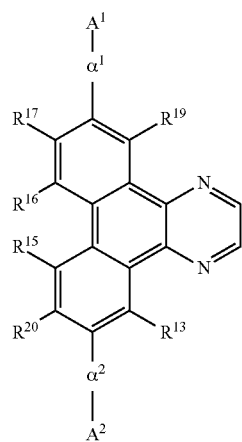

(G5-2)

In General Formula (G5-2), $R^{13}$, $R^{15}$ to $R^{17}$, $R^{19}$, and $R^{20}$ separately represent hydrogen, an alkyl group having 1 to 6 carbon atoms, a substituted or unsubstituted phenyl group, or a substituted or unsubstituted biphenyl group, $\alpha^1$ and $\alpha^2$ separately represent a substituted or unsubstituted phenylene group or a substituted or unsubstituted biphenyldiyl group, and $A^1$ and $A^2$ separately represent a substituted or unsubstituted carbazolyl group, a substituted or unsubstituted dibenzothiophenyl group, or a substituted or unsubstituted dibenzofuranyl group.

In General Formula (G5-2), in the case where any of $R^{13}$, $R^{15}$ to $R^{17}$, $R^{19}$, and $R^{20}$ represents a phenyl group or a biphenyl group, the phenyl group or the biphenyl group may have an alkyl group having 1 to 6 carbon atoms as a substituent.

In General Formulae (G5-1) and (G5-2), it is preferable that $\alpha^1$ and $\alpha^2$ represent a substituted or unsubstituted m-phenylene group or a biphenyldiyl group which is meta-substituted to obtain a high $T_1$ level.

As specific examples of the organic compounds represented by General Formulae (G1-1) to (G1-3), (G2-1) to (G2-3), (G3-1) to (G3-3), (G4-1) to (G4-3), (G5-1), and (G5-2), there are organic compounds represented by Structural Formulae (100) to (131), (200) to (234), (300) to (340), (400) to (453), (500) to (537), (600) to (634), (700) to (726), and (800) to (829). However, it is to be noted that the present invention is not limited to these.

[Chemical formula 15]

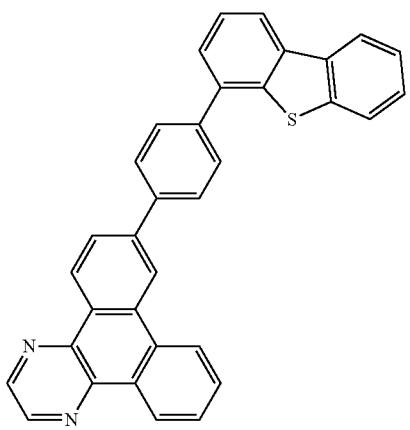

(100)

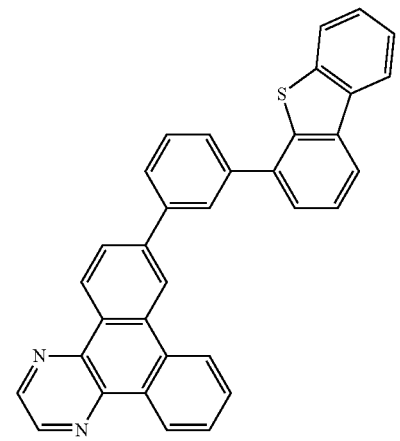

(101)

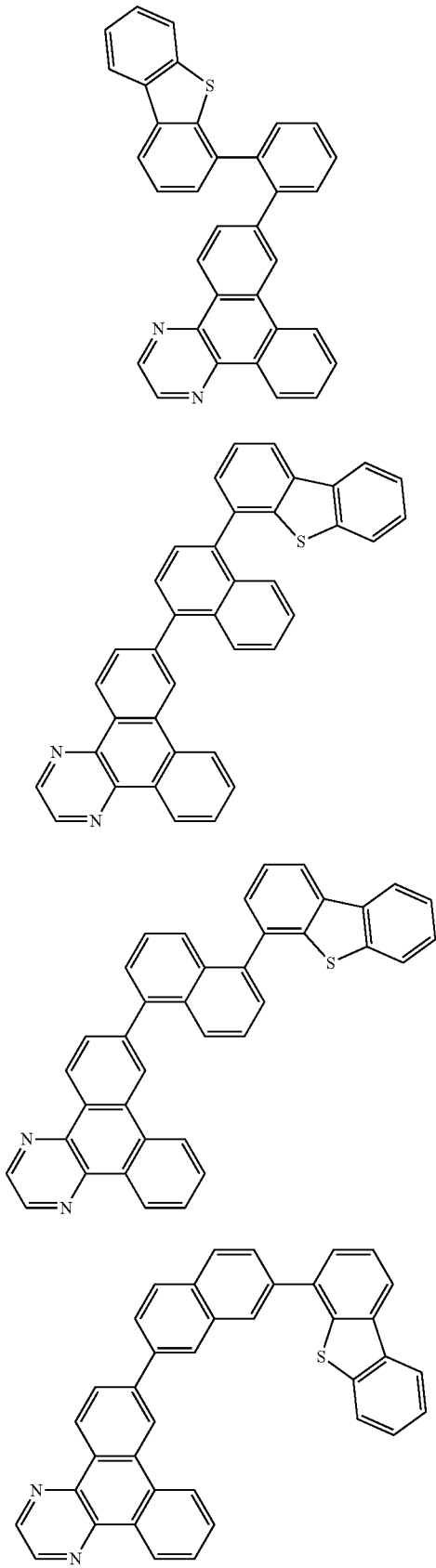
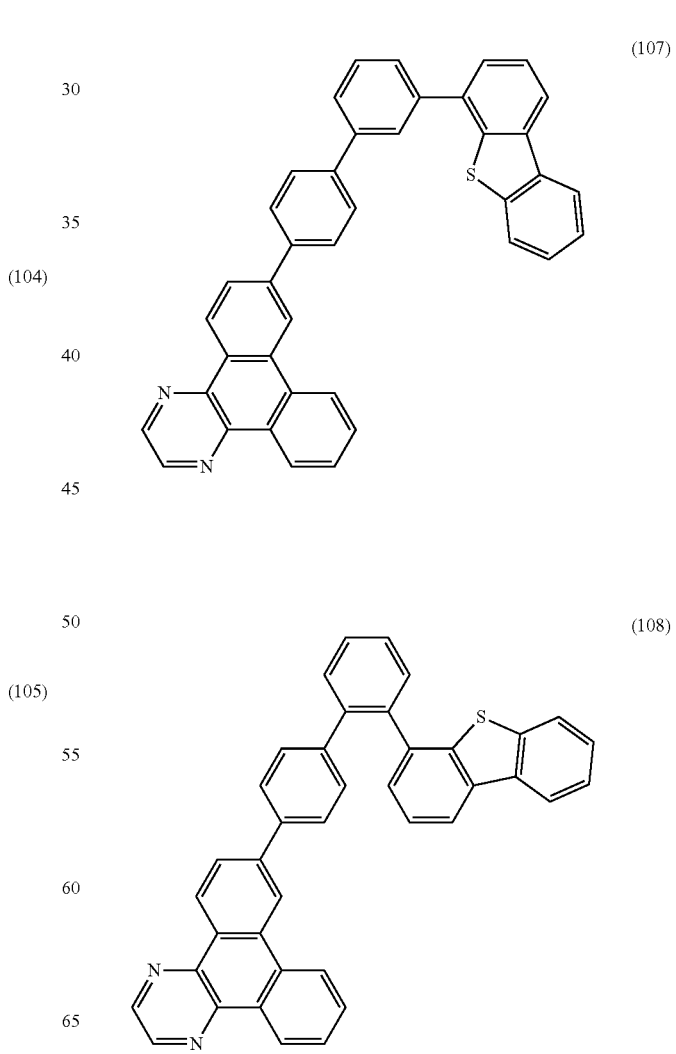

[Chemical formula 16]
(109)
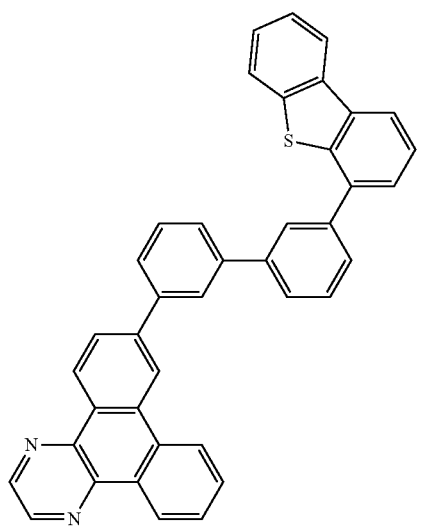
(110)
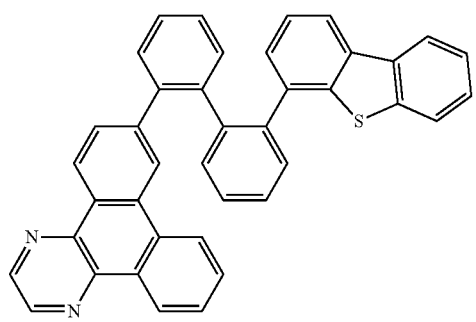
(111)
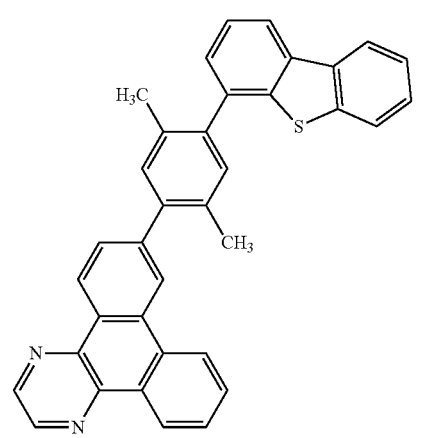
(112)
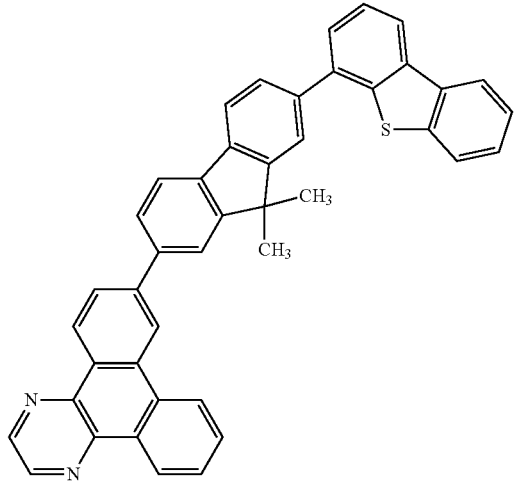
(113)
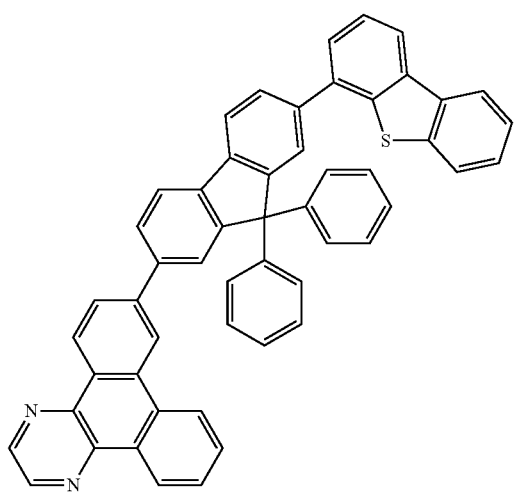
(114)
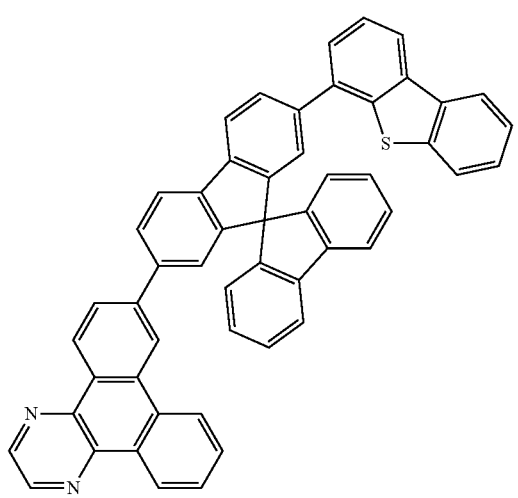

(115)
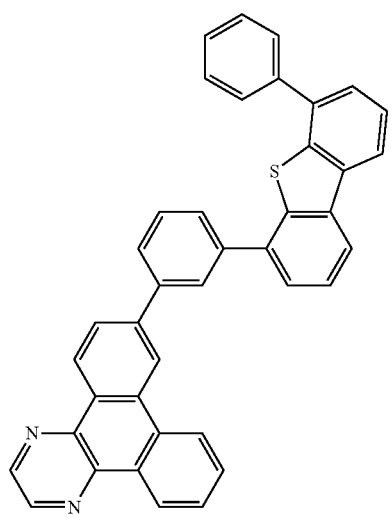
[Chemical formula 17]
(116)
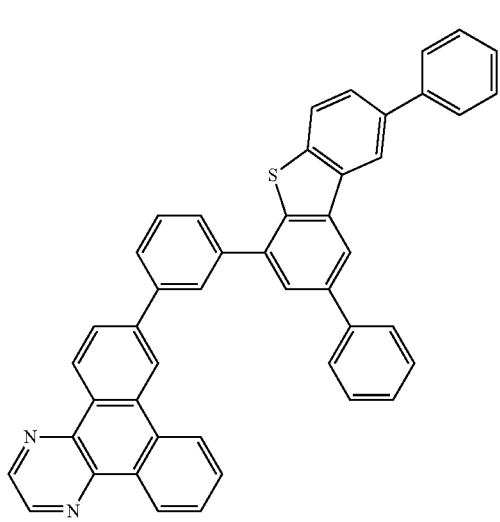
(117)
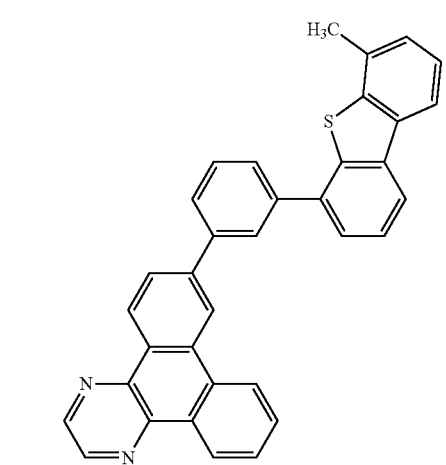
(118)
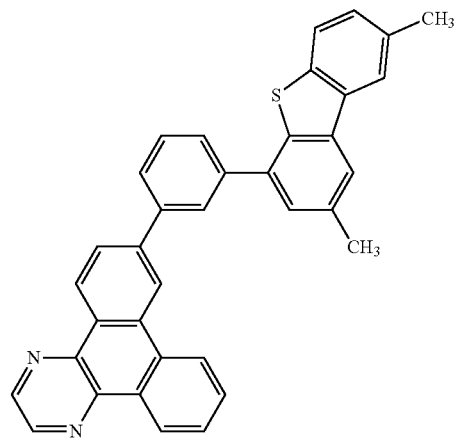
(119)
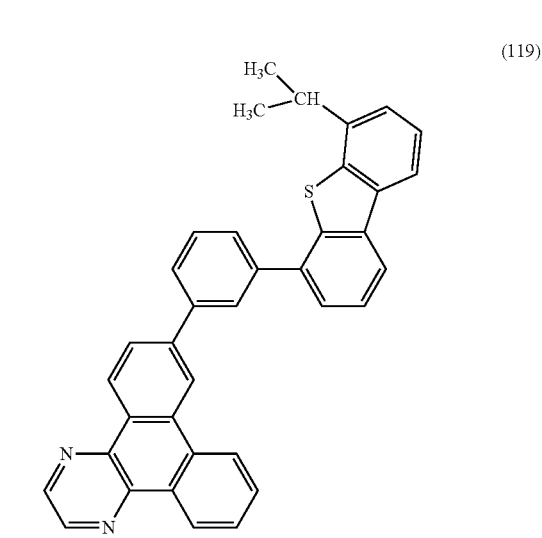
(120)
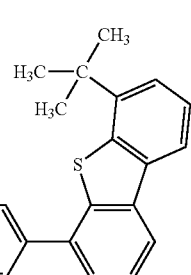

[Chemical formula 18]
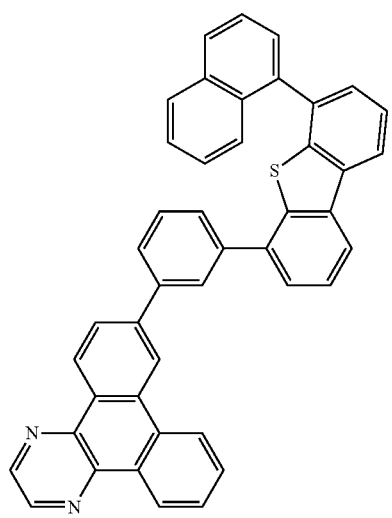 (121)
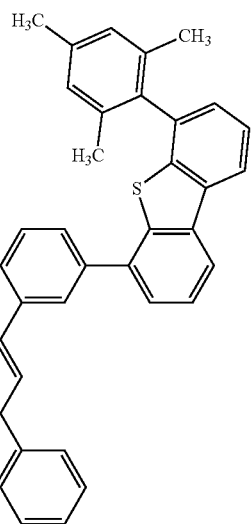 (122)
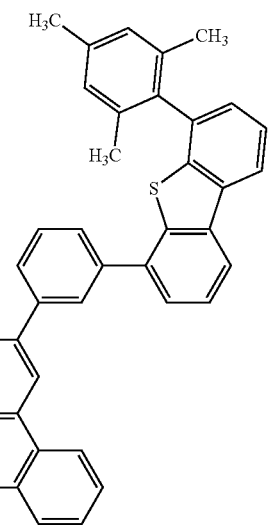 (122)
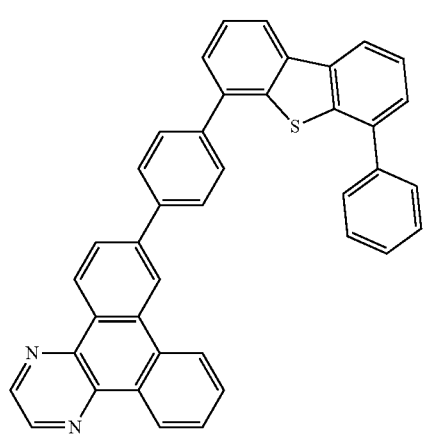 (122)
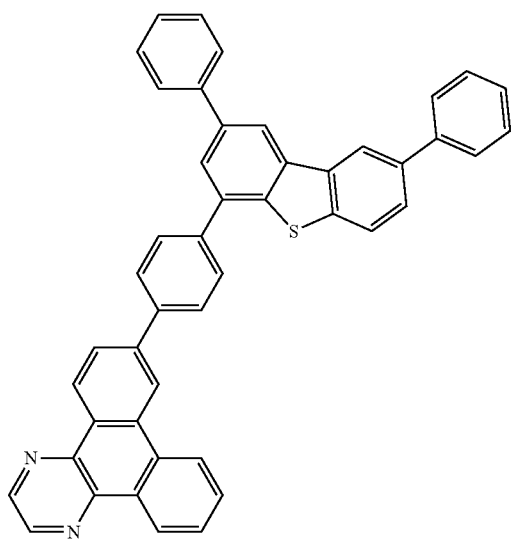 (123)
(124)

-continued
(125)
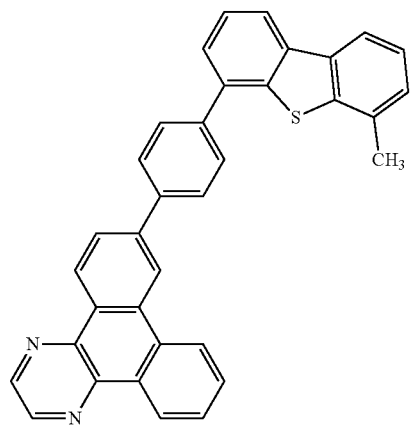
(126)
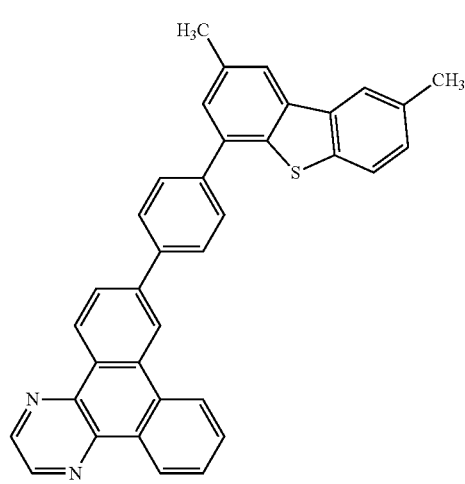
[Chemical formula 19]
(127)
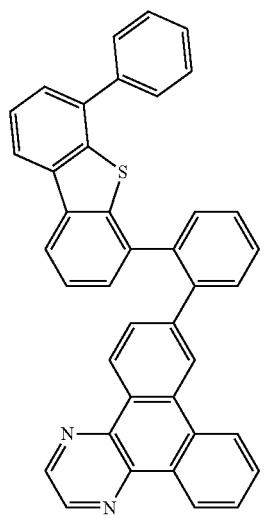
-continued
(128)
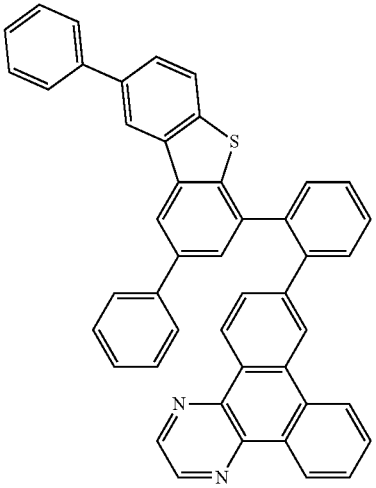
(129)
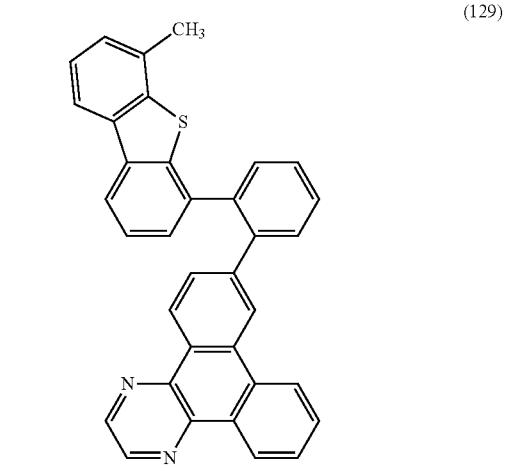
(130)
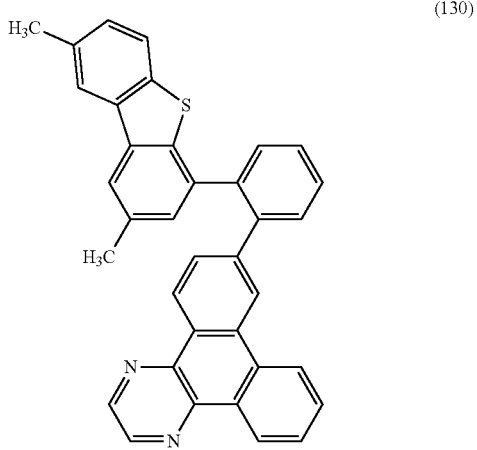

-continued
(131)
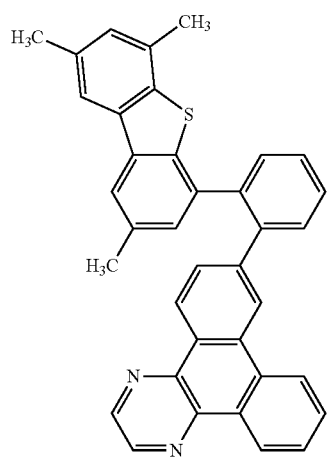
[Chemical formula 20]
(200)
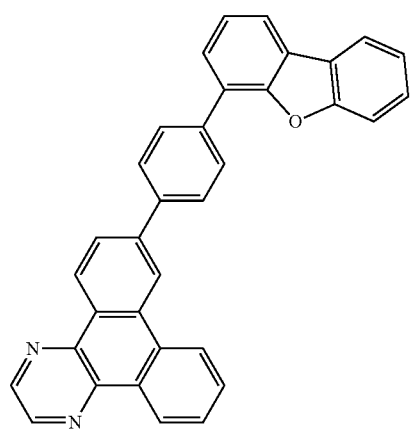
(201)
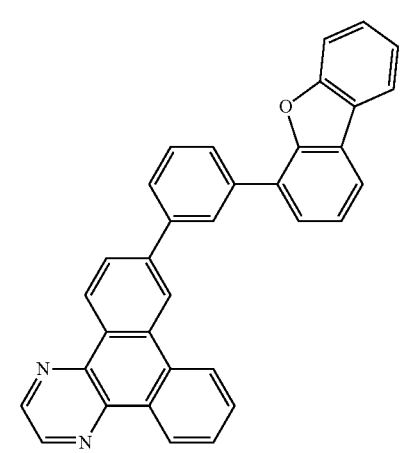
-continued
(202)
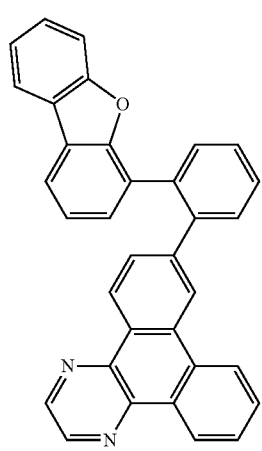
(203)
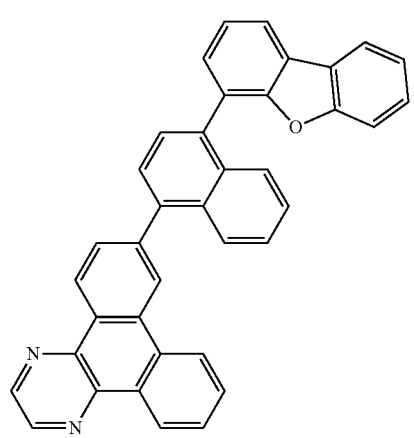
(204)
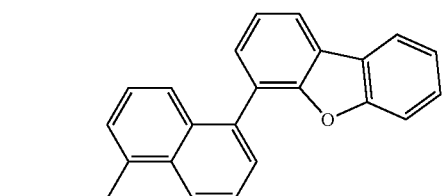
(205)
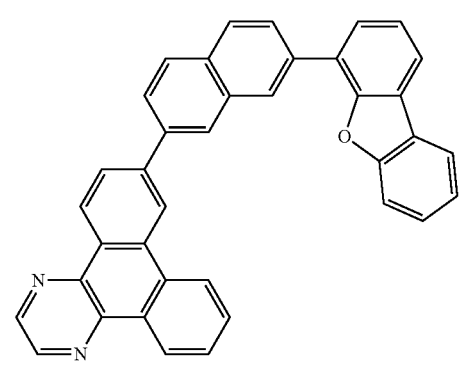

[Chemical formula 21]
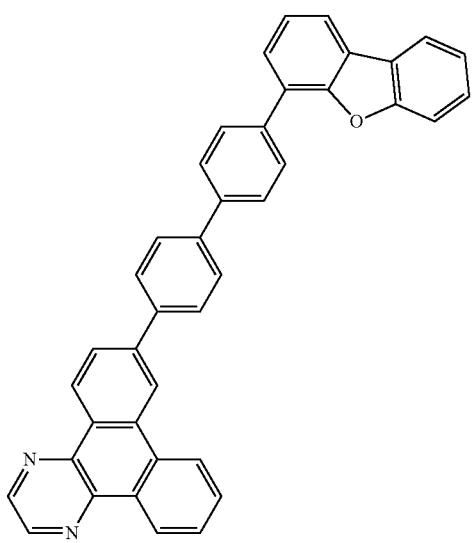 (206)
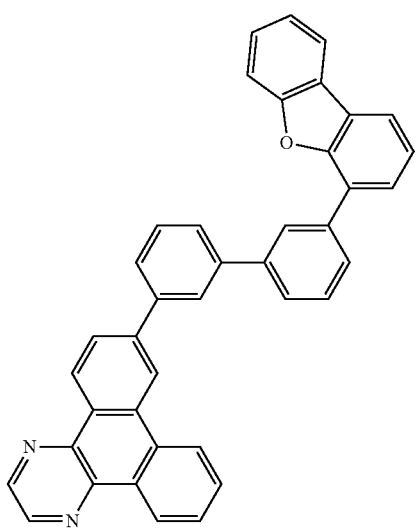 (209)
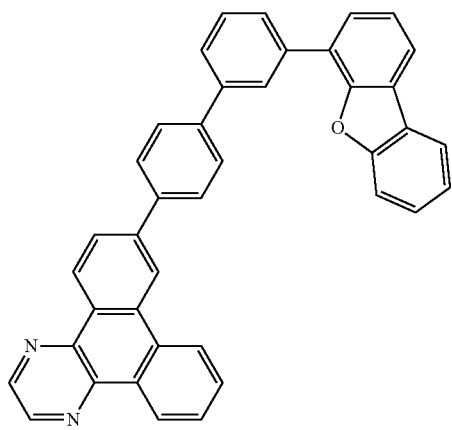 (207)
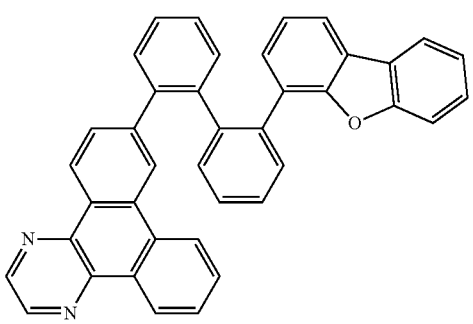 (210)
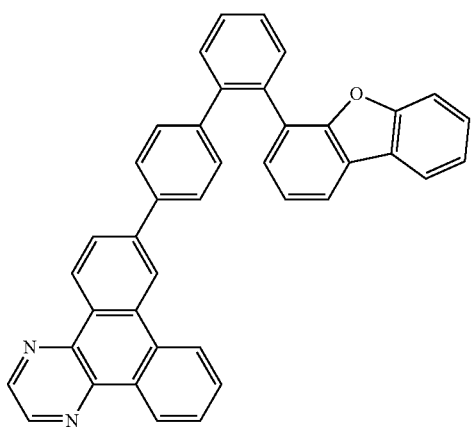 (208)
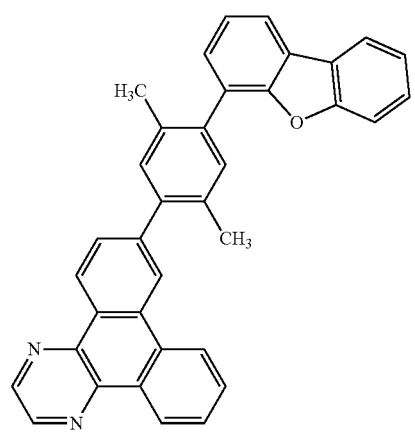 (211)

-continued
(212)
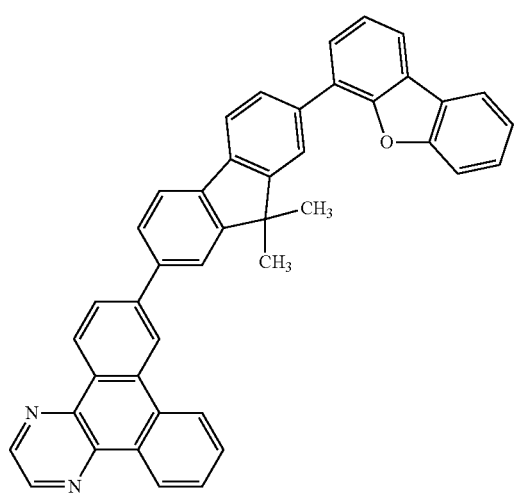
(213)
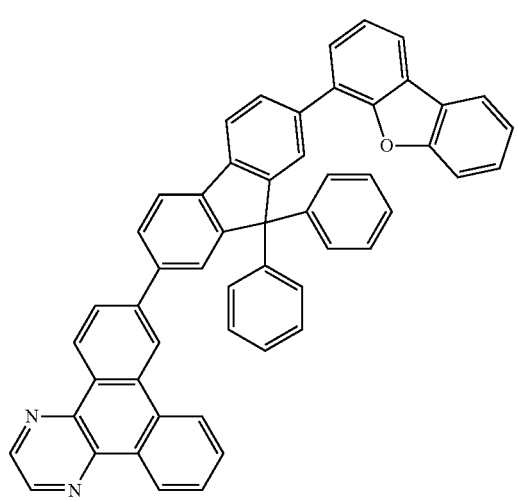
(214)
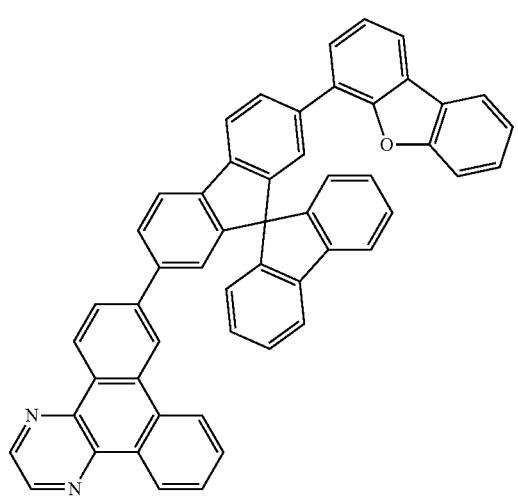
-continued
(215)
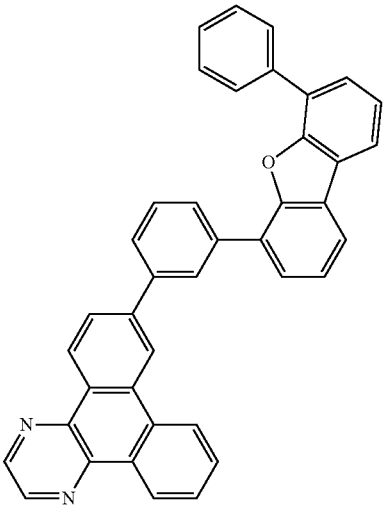
[Chemical formula 22]
(216)
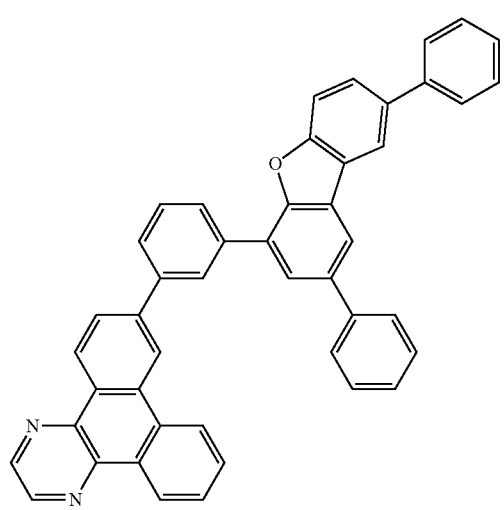
(217)
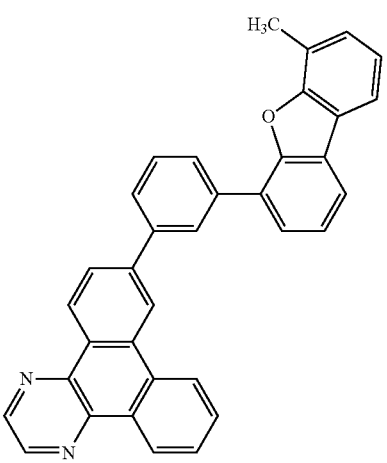

(218)
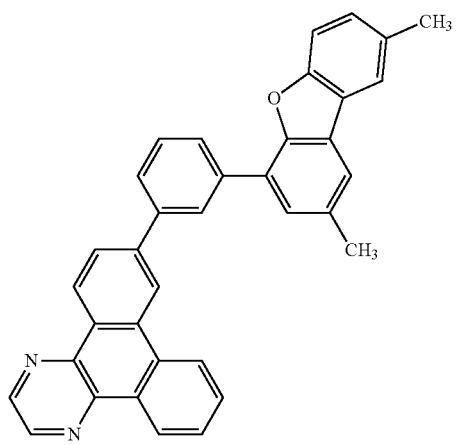
(219)
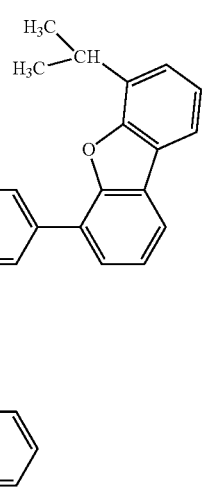
(220)
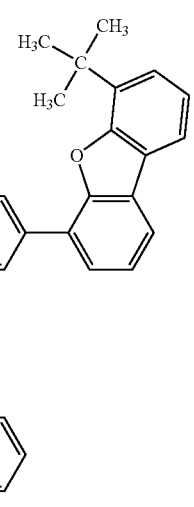
(221)
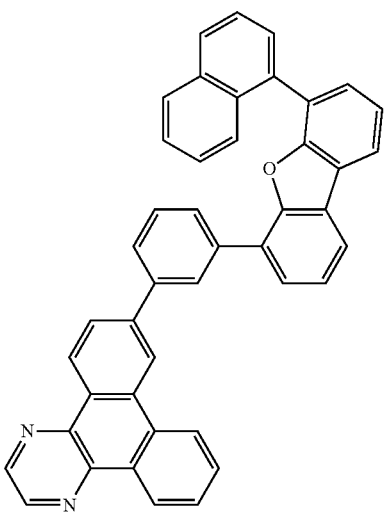
[Chemical formula 23]
(222)
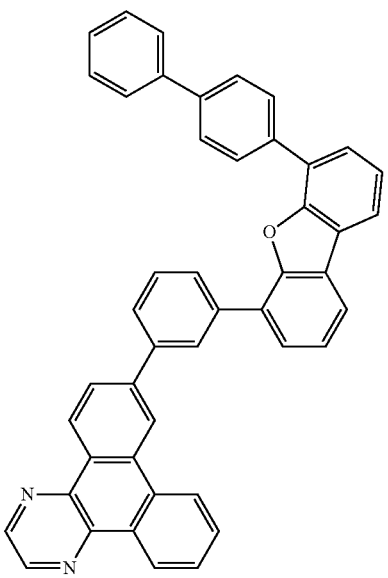
(223)
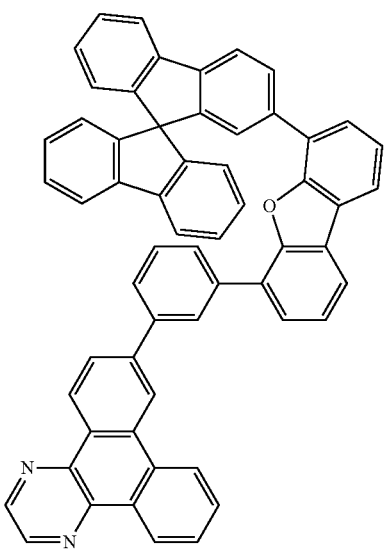

-continued
(224)
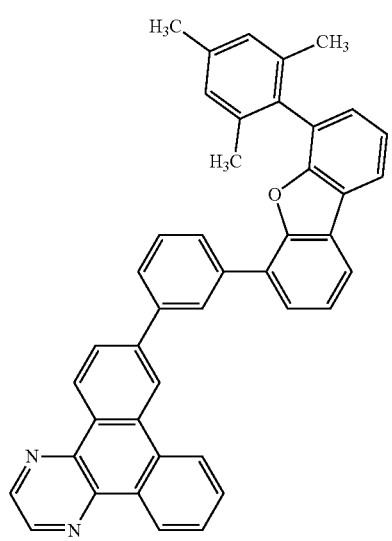
(225)
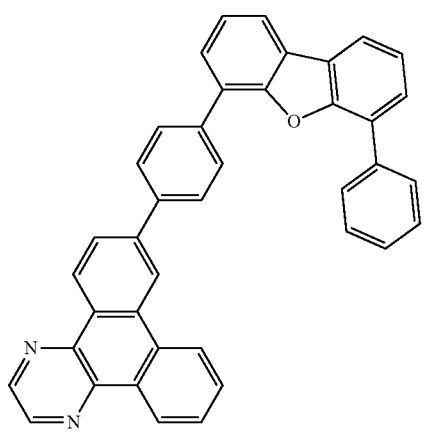
(226)
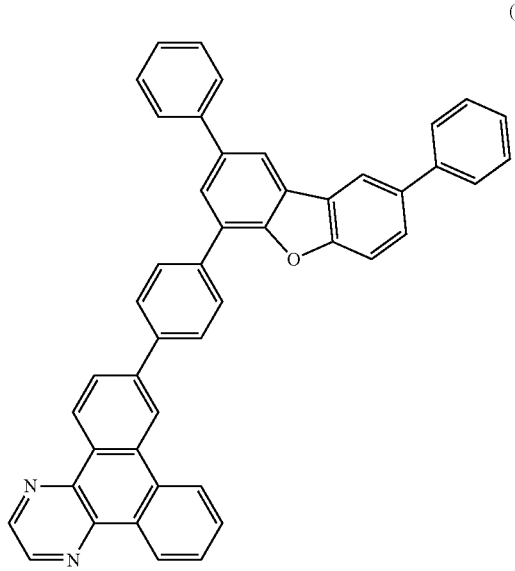
-continued
(227)
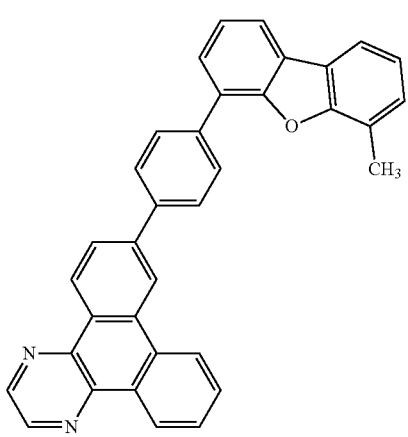
(228)
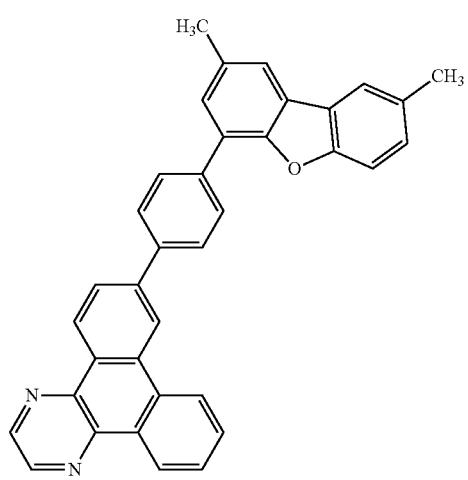
[Chemical formula 24]
(229)
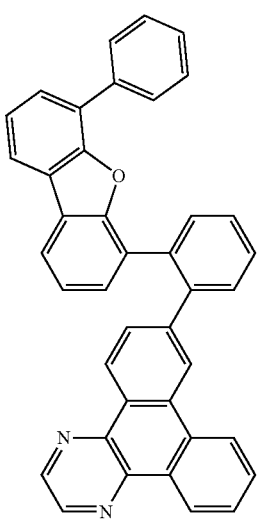

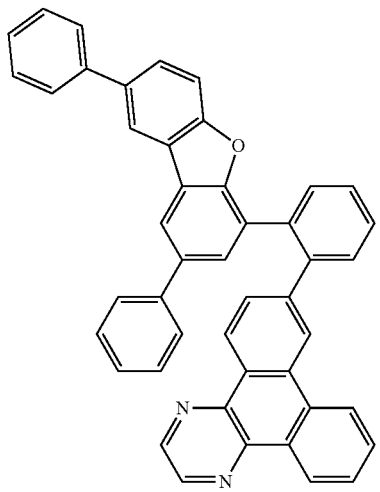
(230)
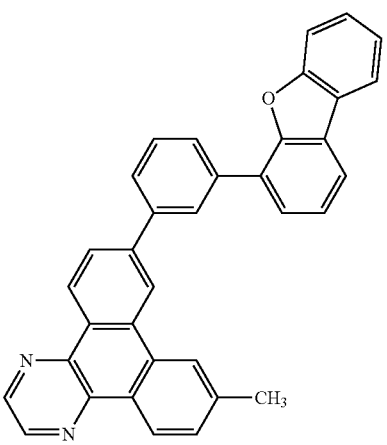
(233)
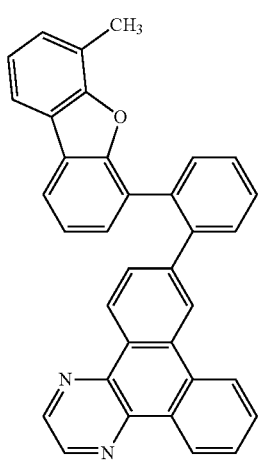
(231)
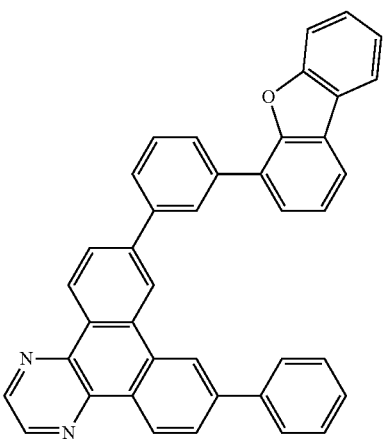
(234)
[Chemical formula 25]
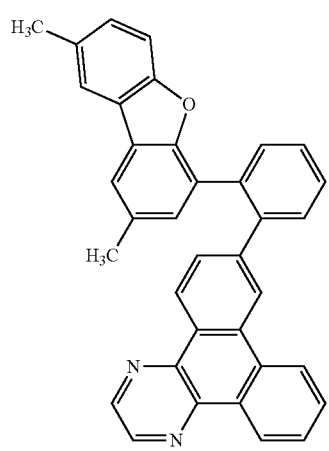
(232)
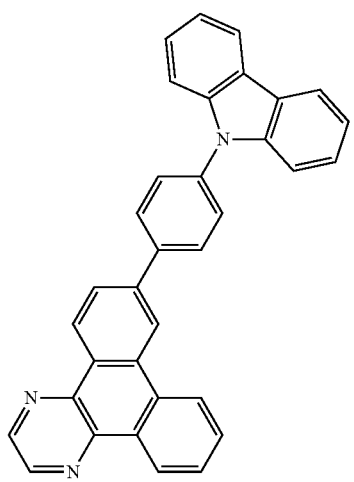
(300)

-continued
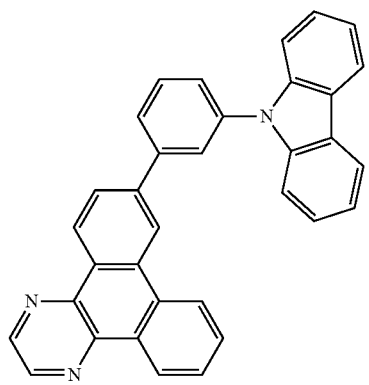
(301)
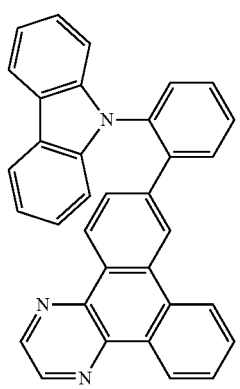
(302)
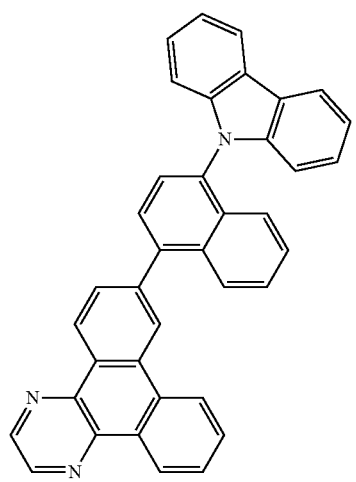
(303)
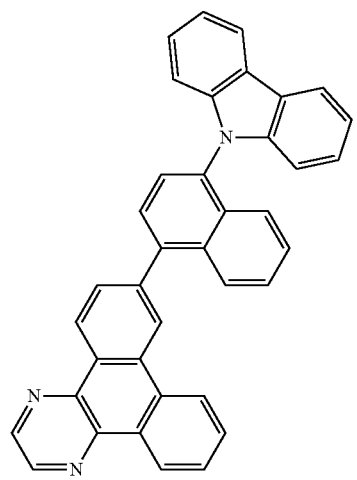
(304)
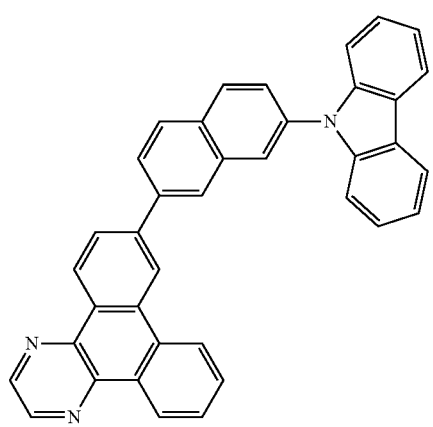
(305)
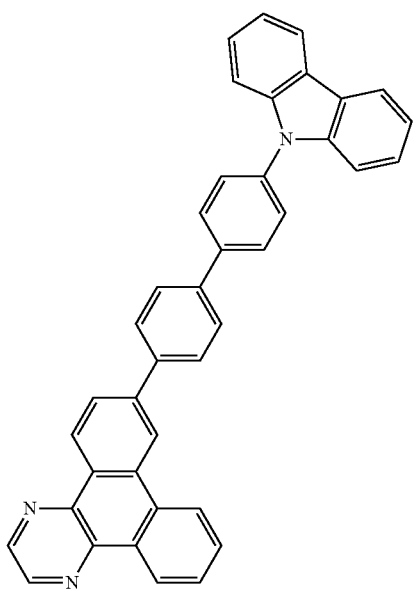
(306)

(307)
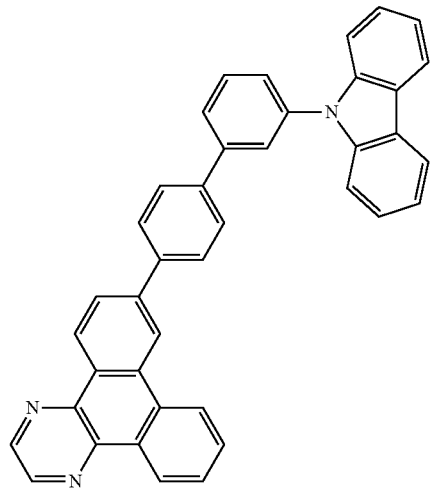
(308)
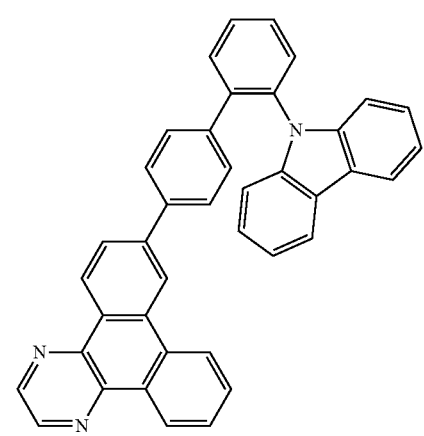
[Chemical formula 26]
(309)
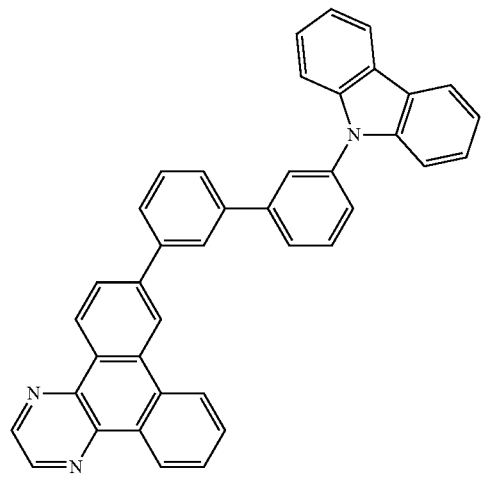
(310)
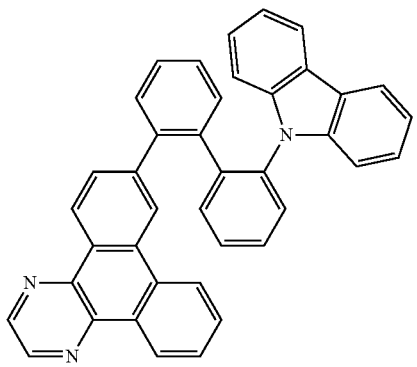
(311)
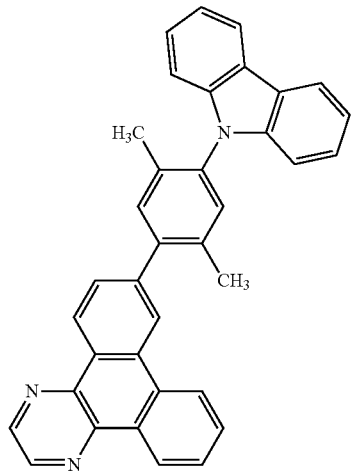
(312)
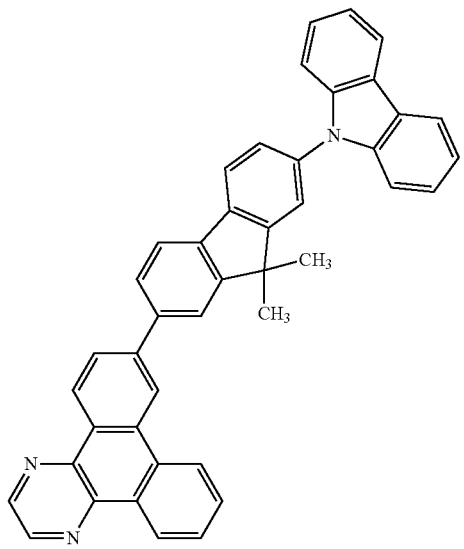

(313)
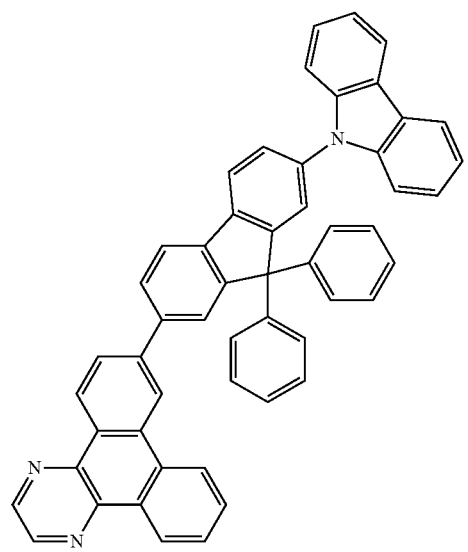
(314)
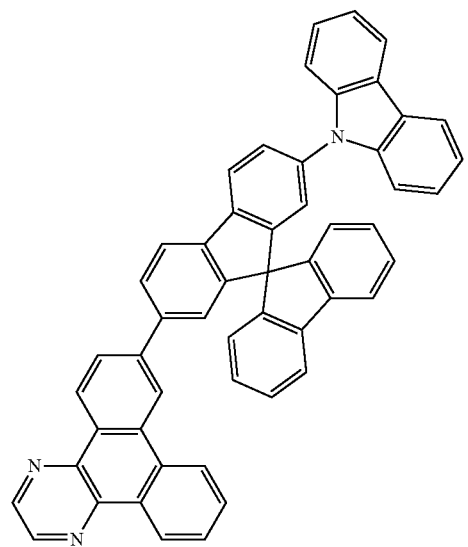
[Chemical formula 27]
(315)
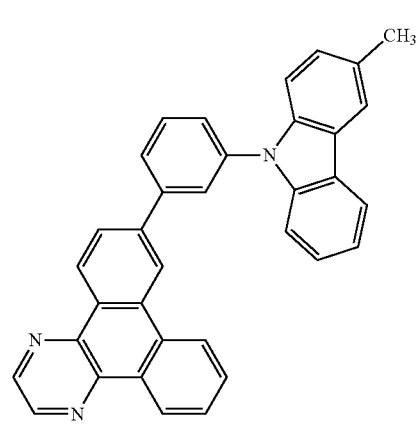
(316)
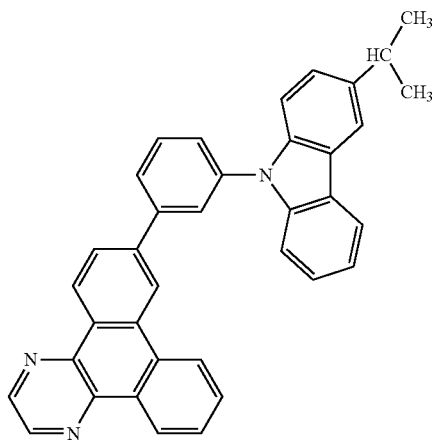
(317)
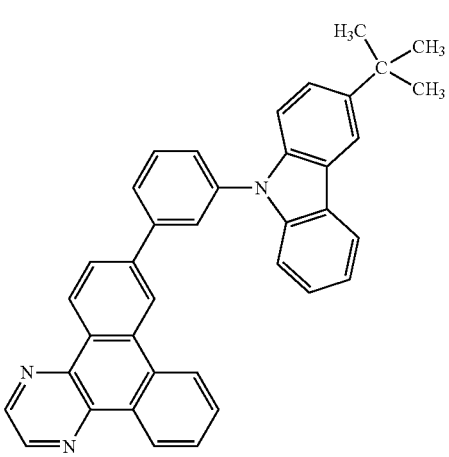
(318)
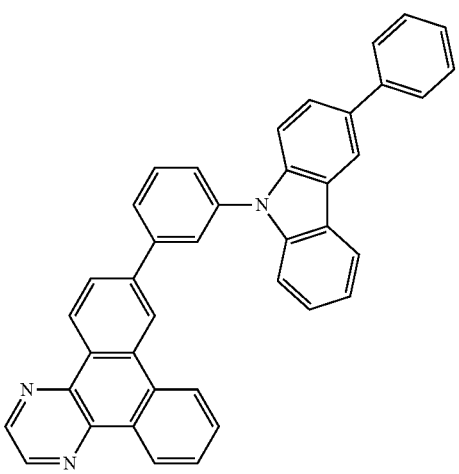

-continued
(319)
(320)
(321)
-continued
(322)
[Chemical formula 28]
(323)
(324)
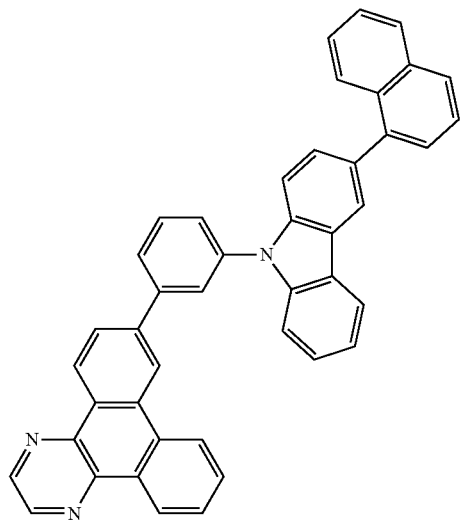
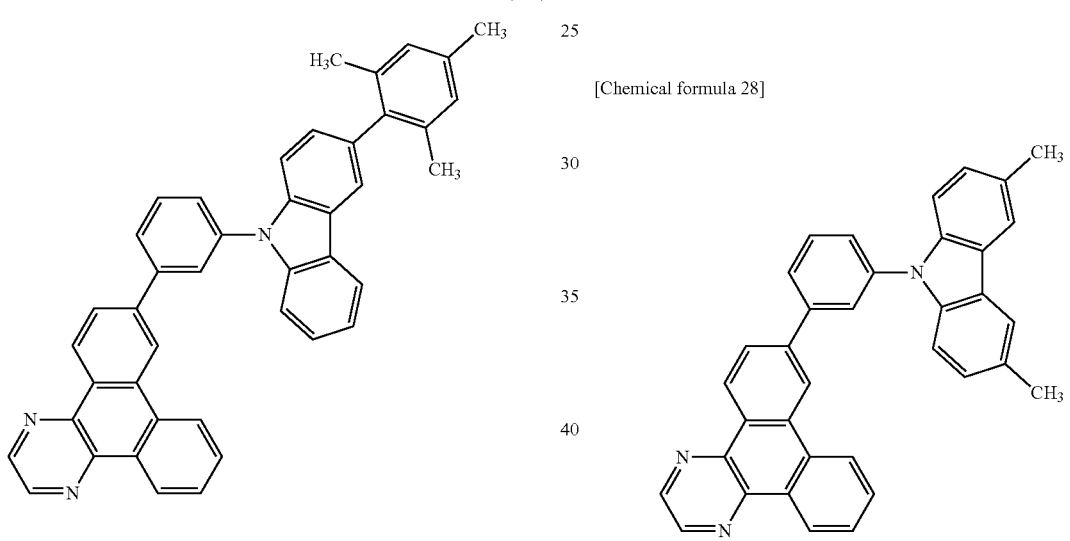
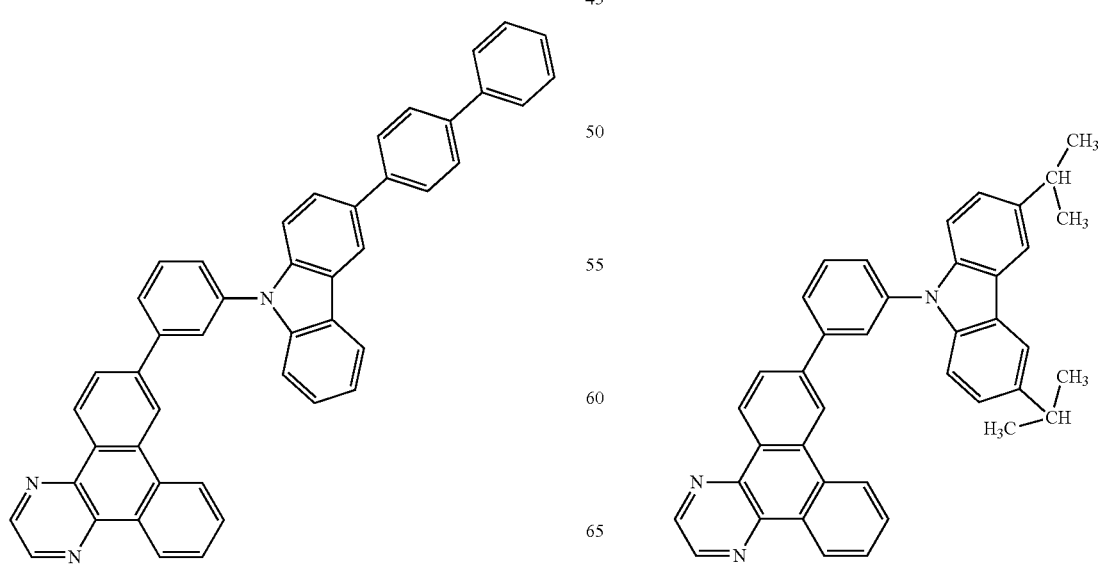

(325)
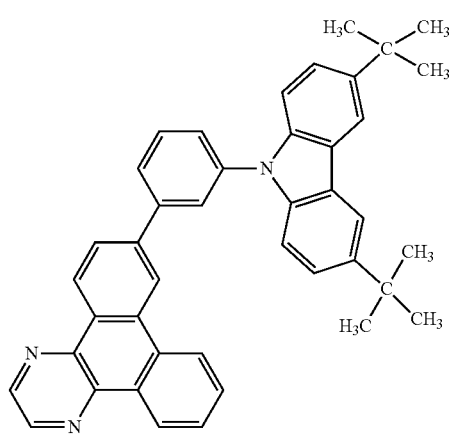
(328)
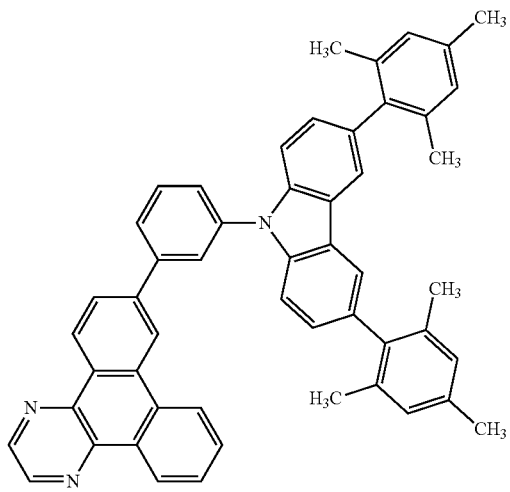
(326)
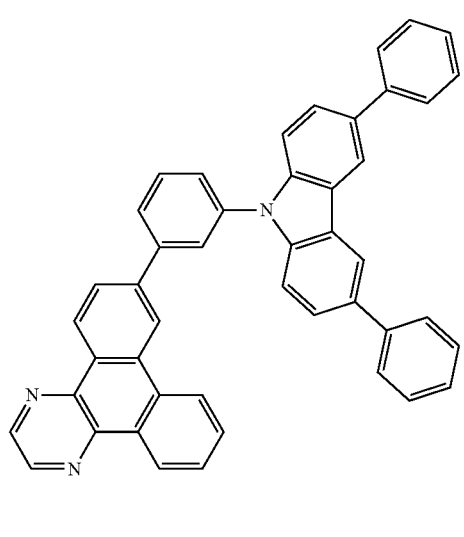
(329)
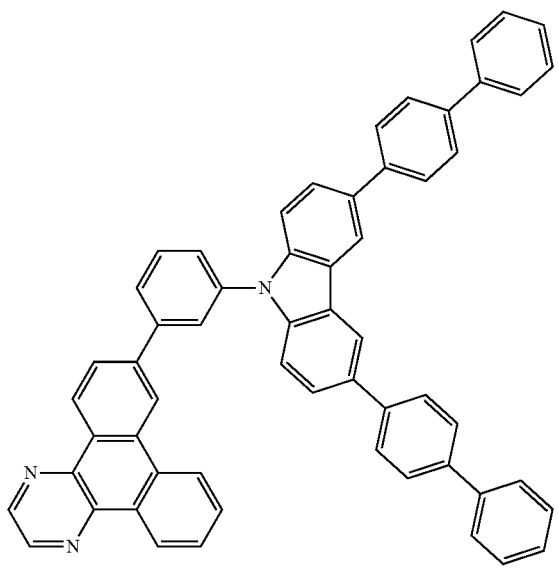
(327)
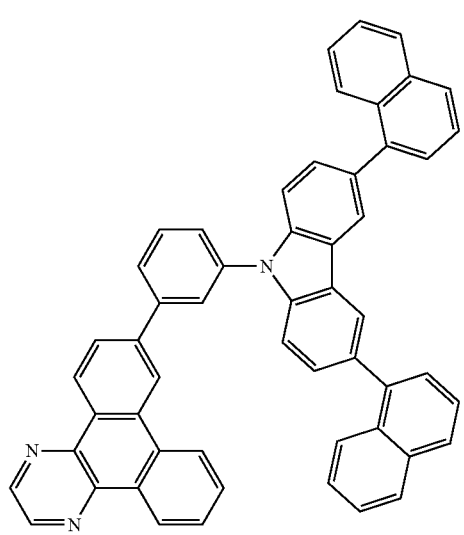
(330)
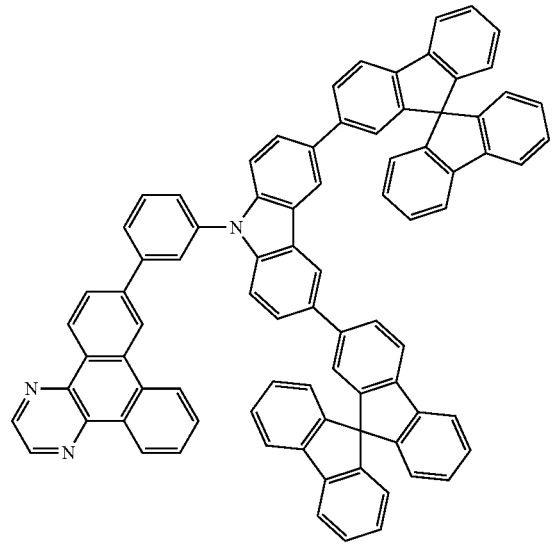

-continued
(331)
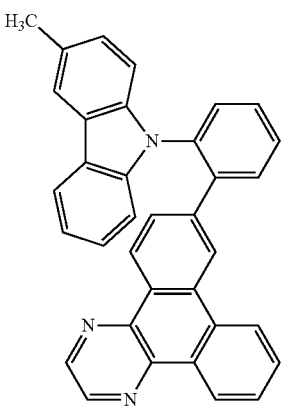
(332)
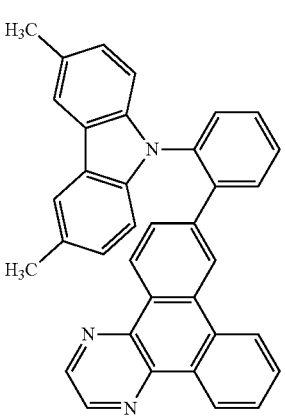
(333)
-continued
(334)
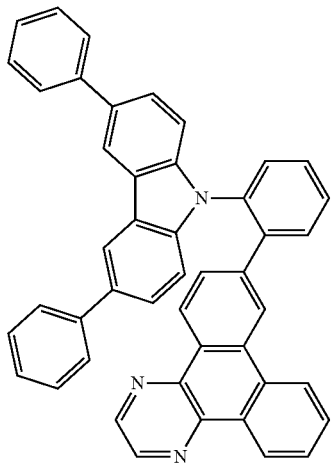
(335)
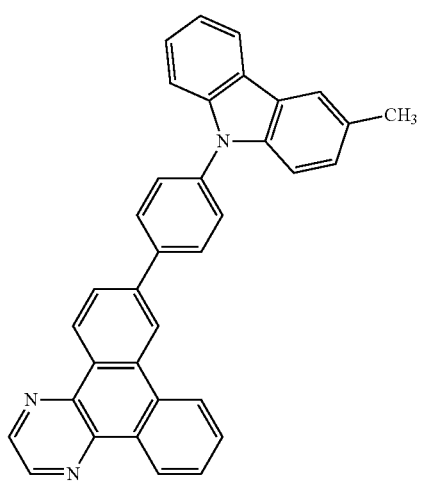
(336)
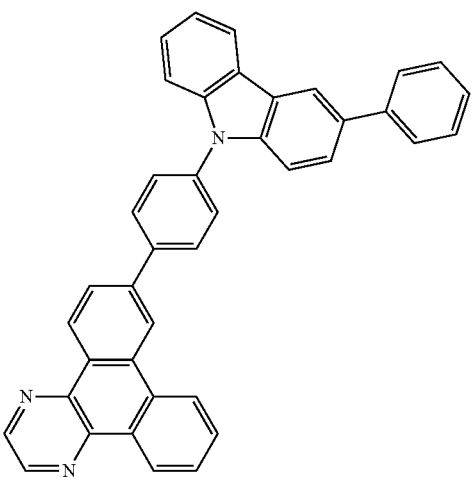

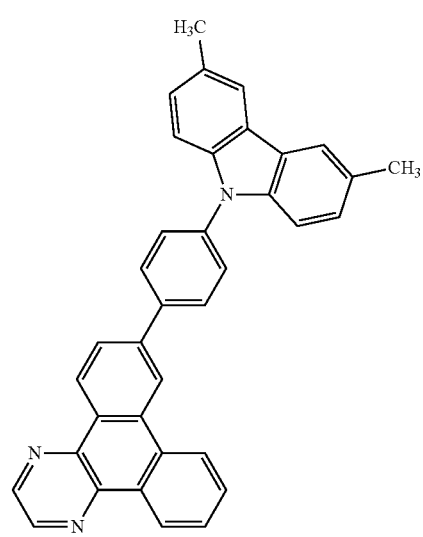
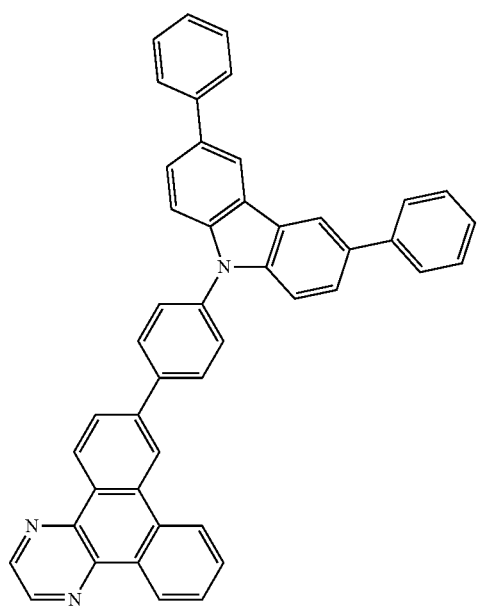
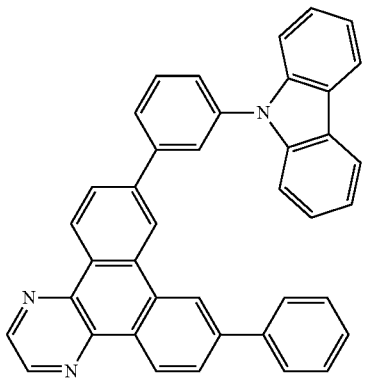
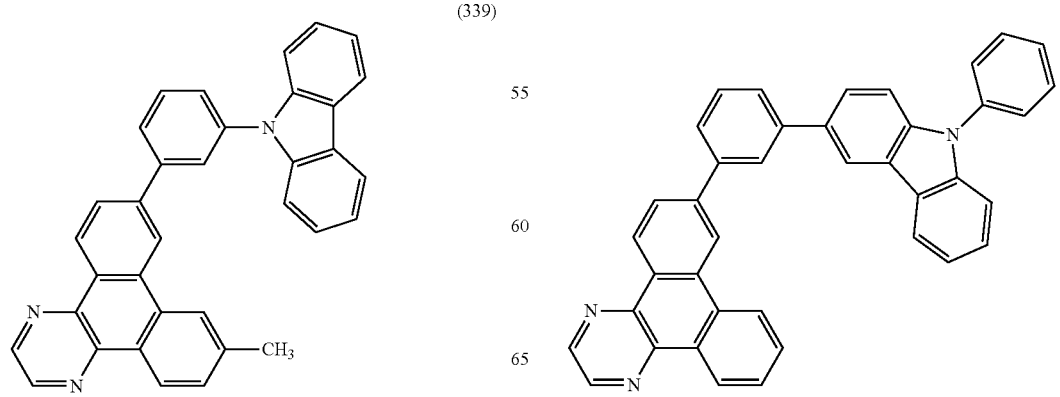
[Chemical formula 30]
[Chemical formula 31]

(402)
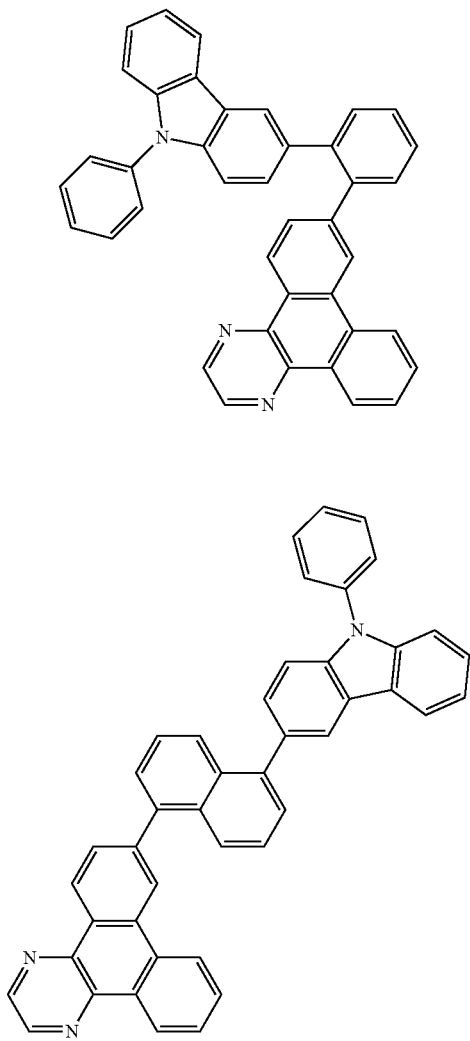
(403)
(404)
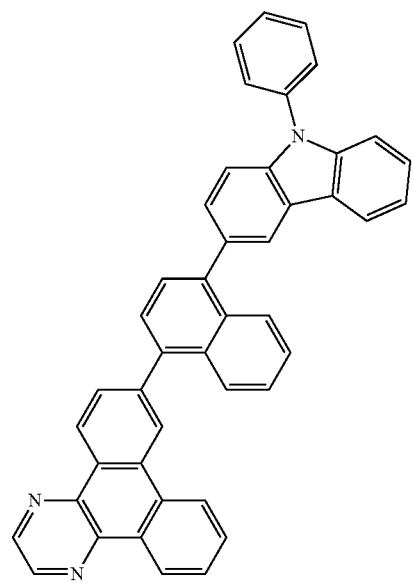
(405)
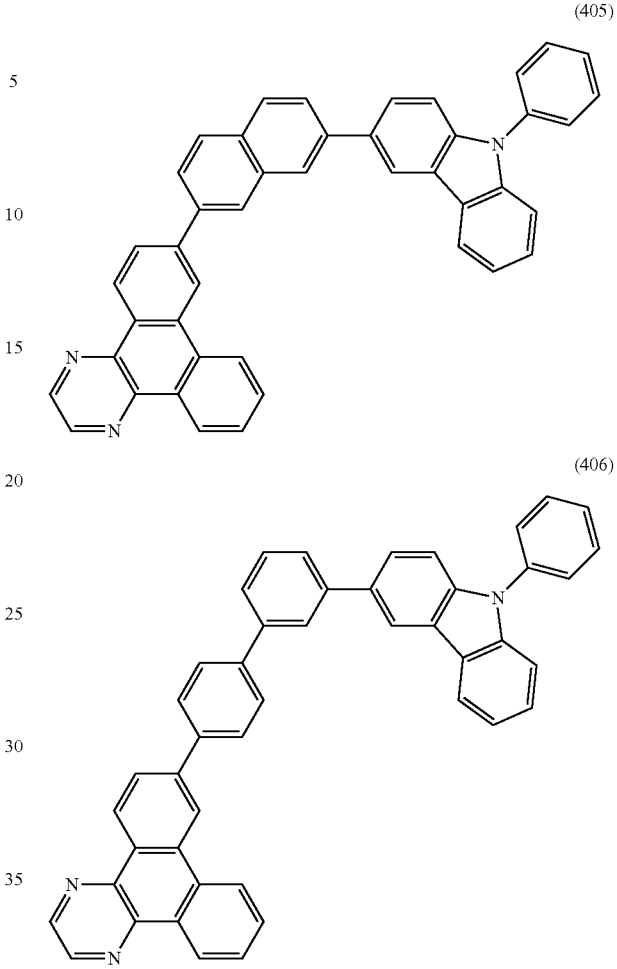
(406)
[Chemical formula 32]
(407)
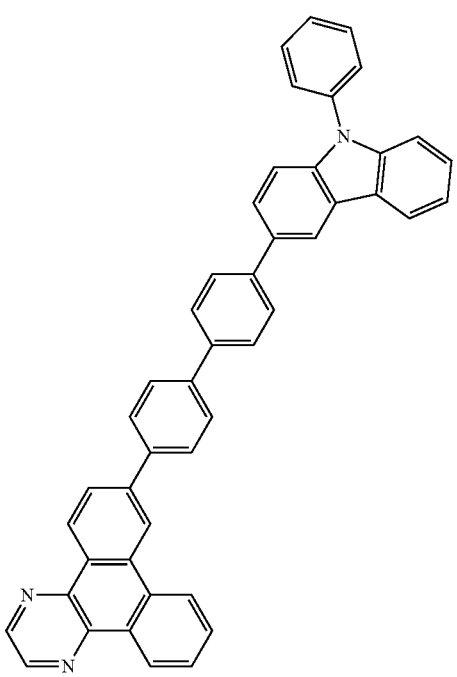

(408)
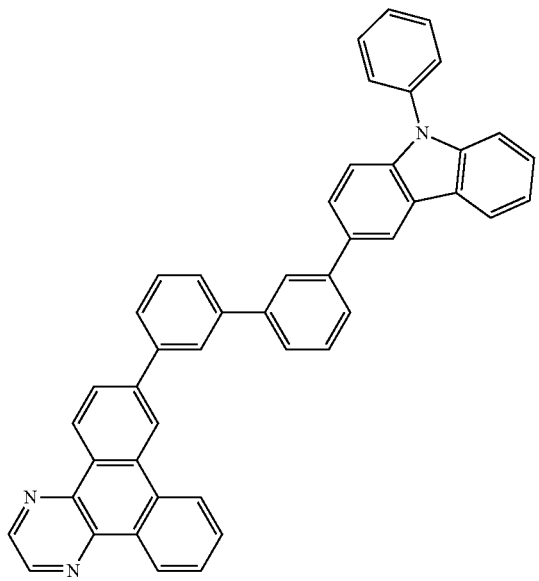
(409)
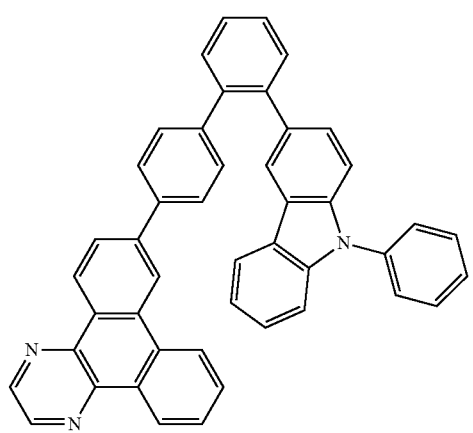
(410)
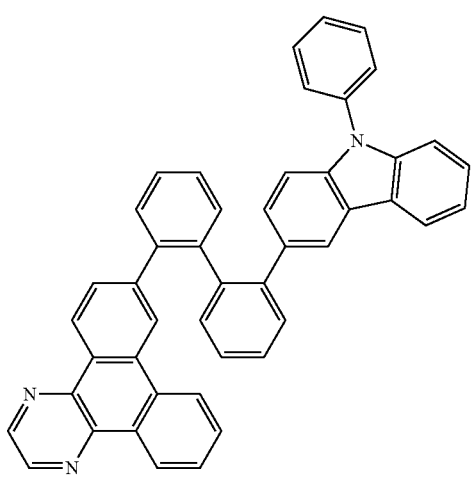
(411)
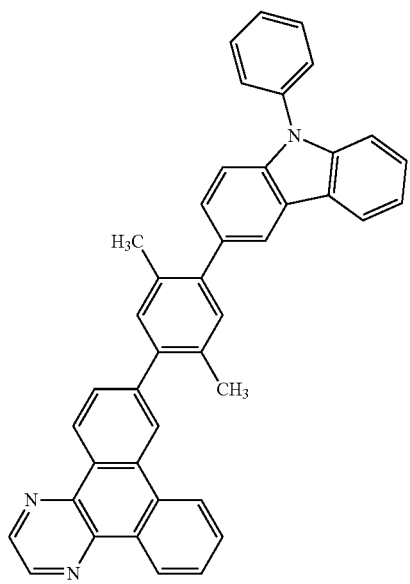
(412)
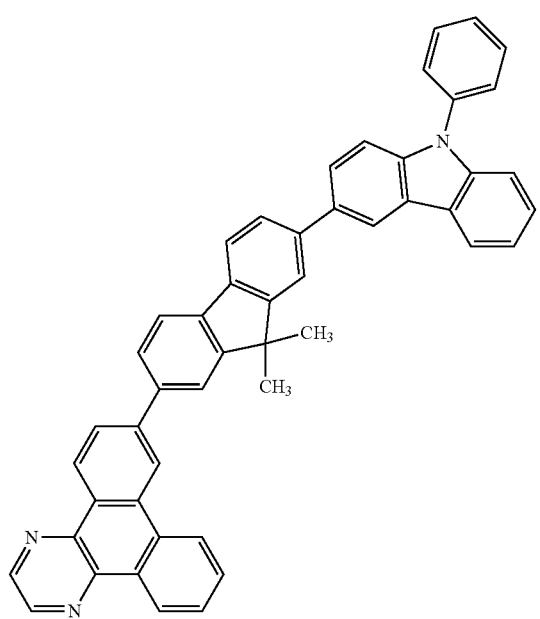

[Chemical formula 33]
(413)
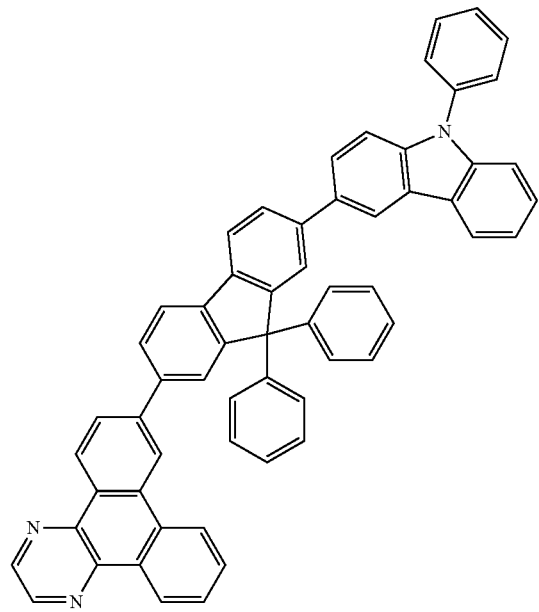
(414)
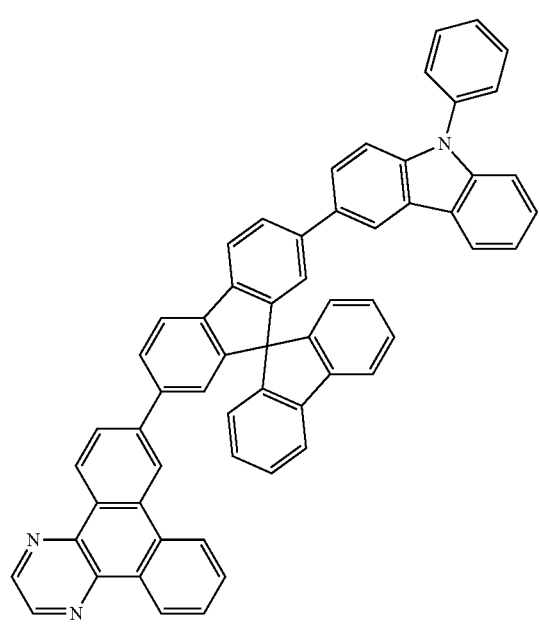
(415)
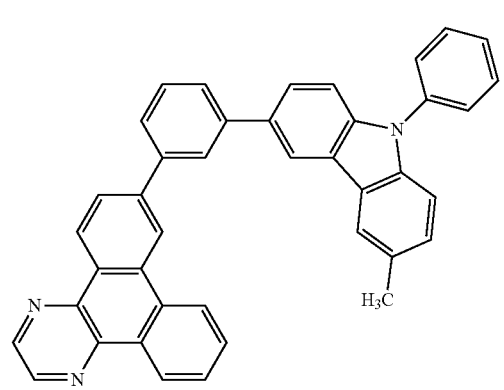
(416)
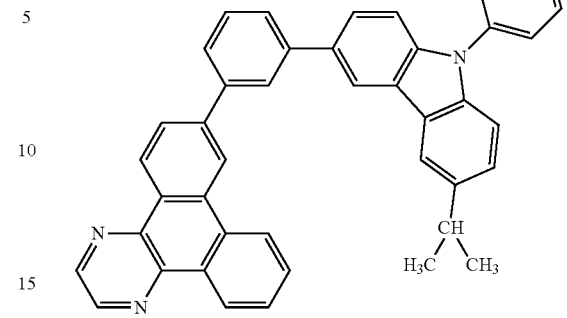
(417)
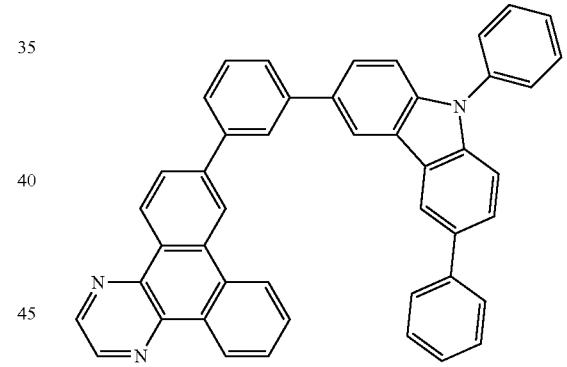
(418)
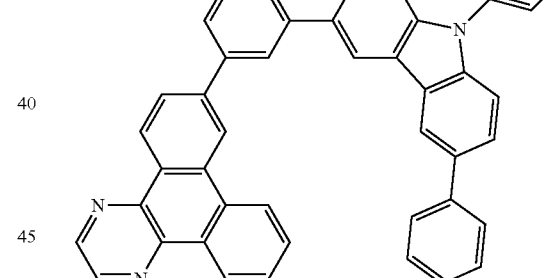
[Chemical formula 34]
(419)
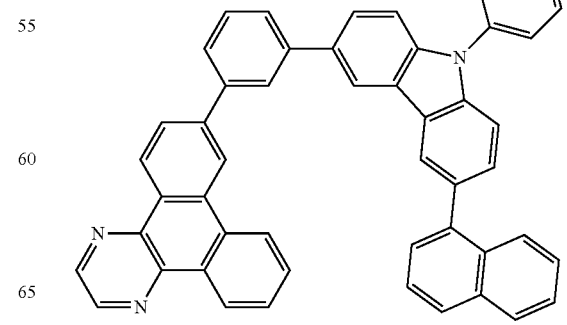

(420)
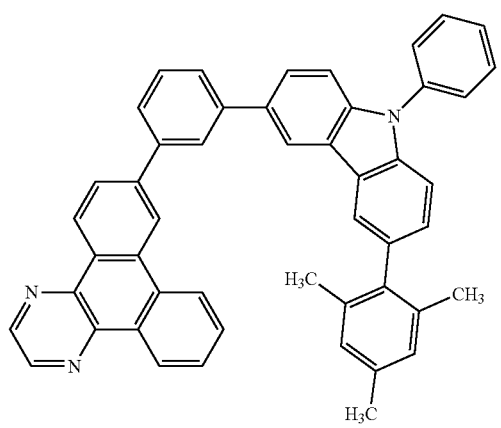
(421)
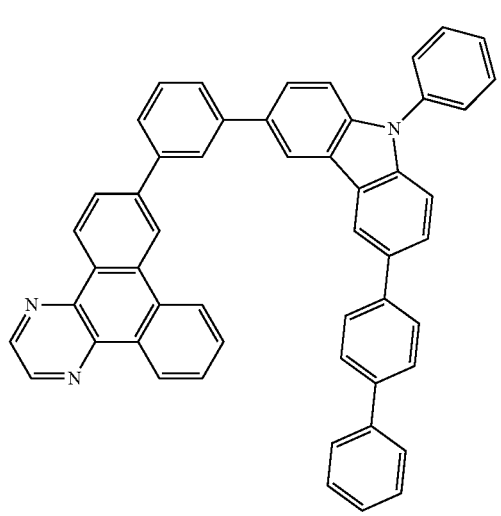
(422)
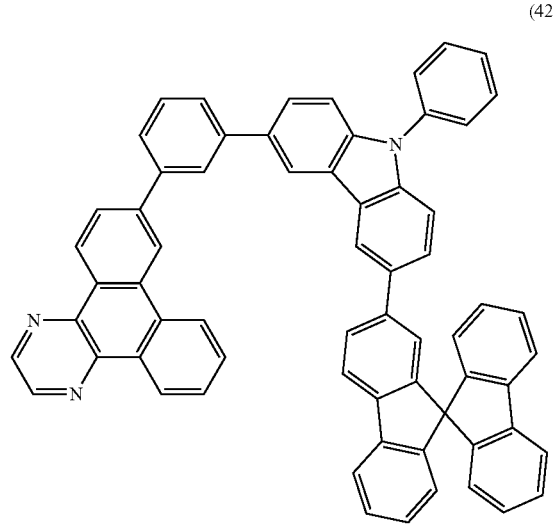
(423)
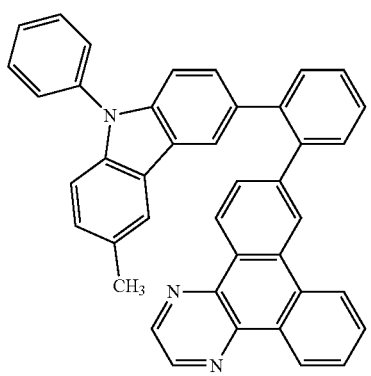
(424)
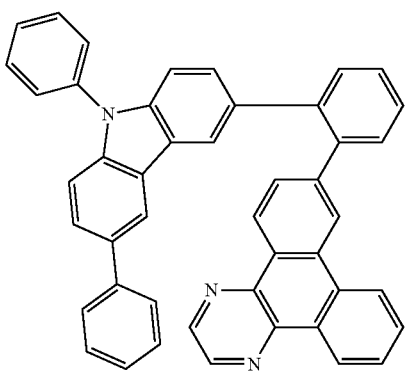
[Chemical formula 35]
(425)

(426)
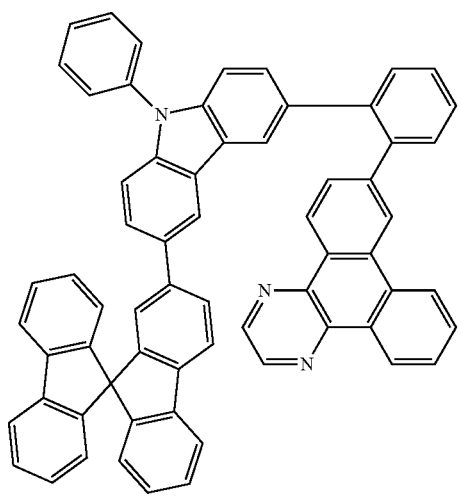
(427)
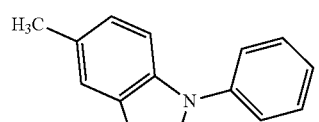
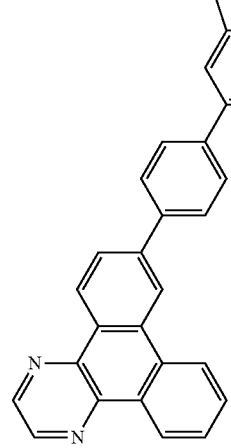
(428)
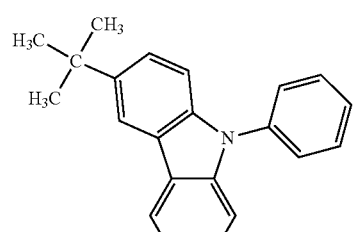
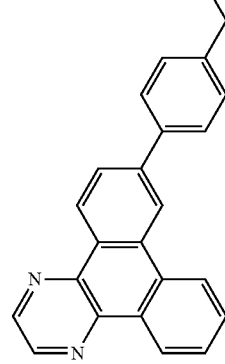
(429)
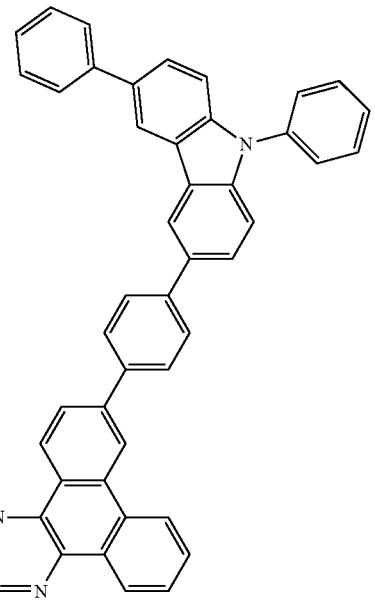
(430)
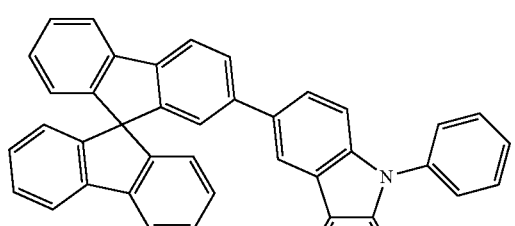
[Chemical formula 36]
(431)
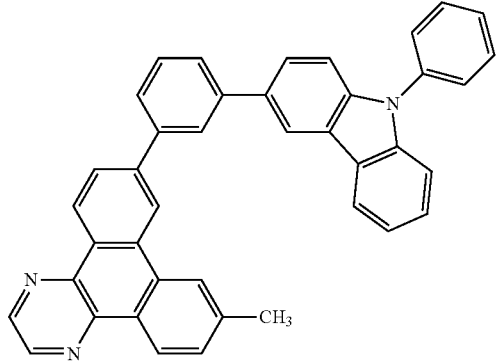

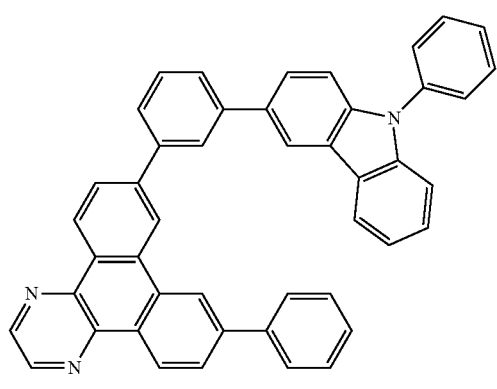
(432)
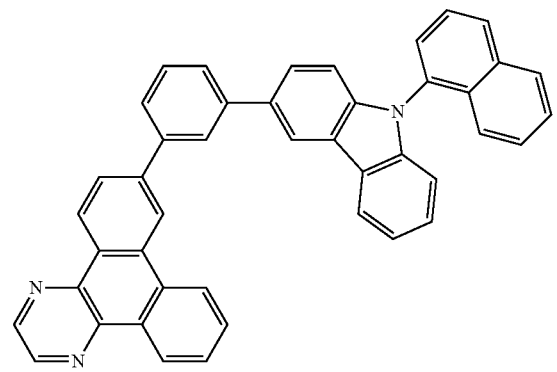
(436)
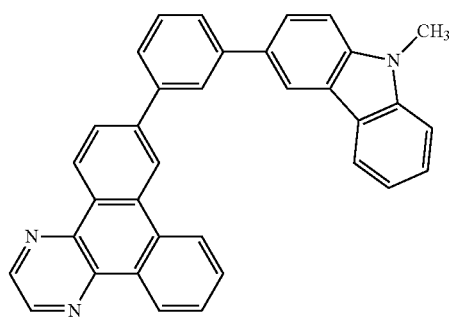
(433)
[Chemical formula 37]
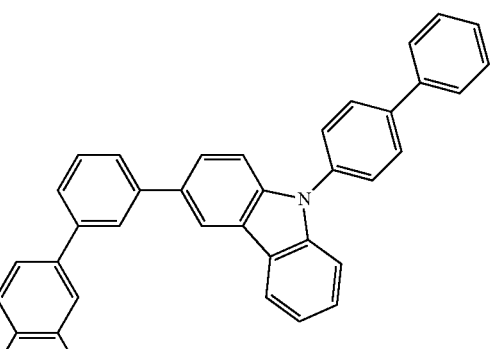
(437)
(434)
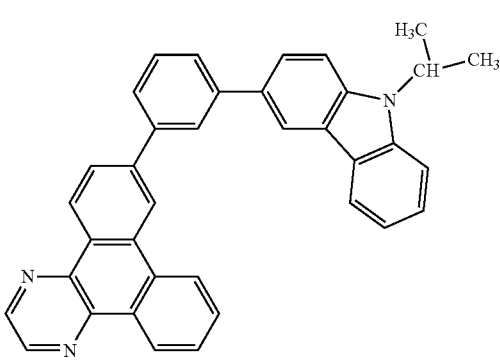
(435)
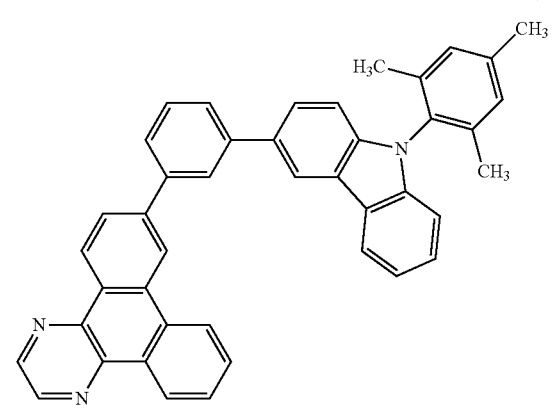
(438)

(439)
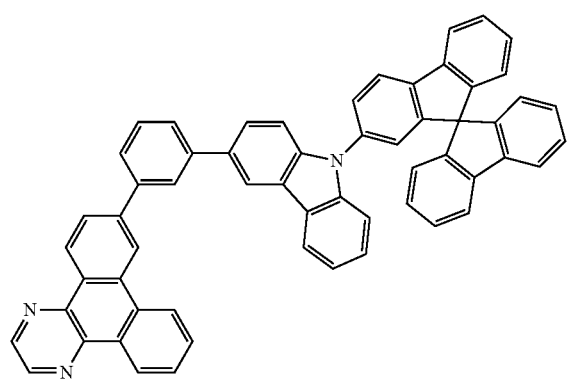
[Chemical formula 38]
(440)
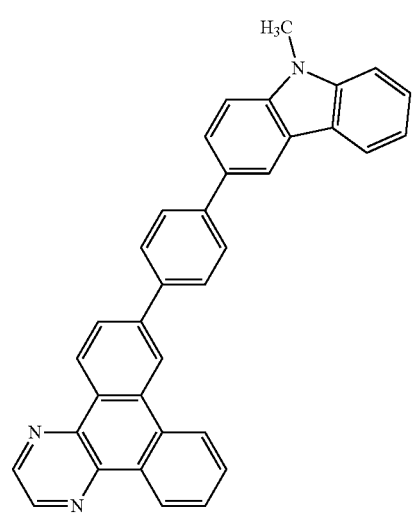
(441)
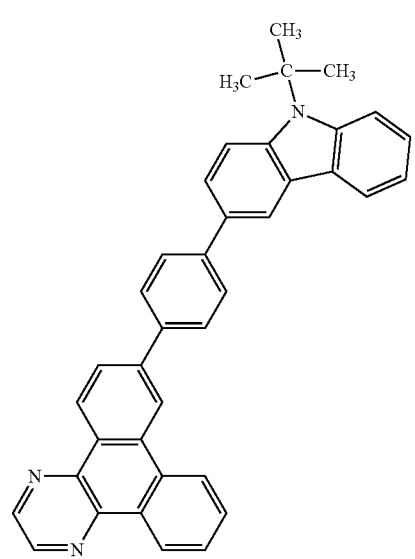
(442)
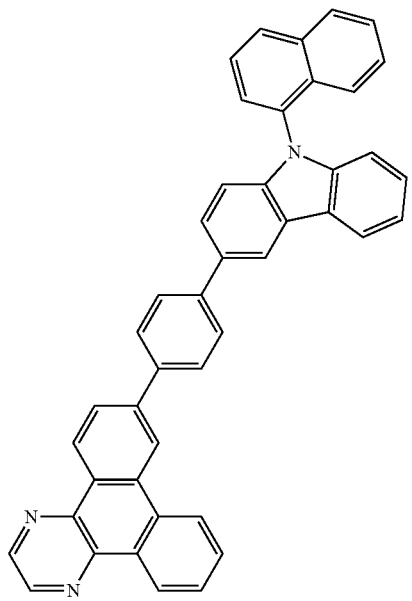
(443)
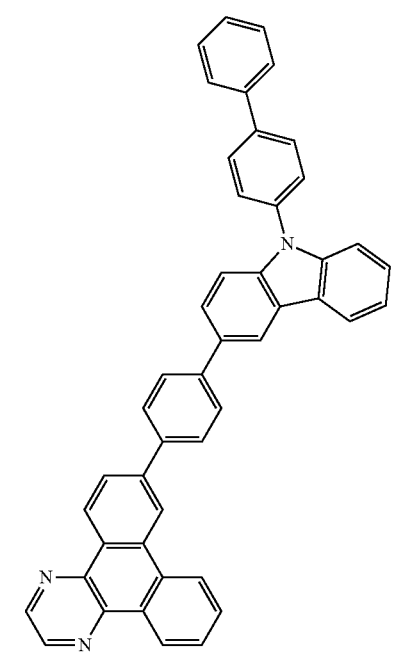

(444)
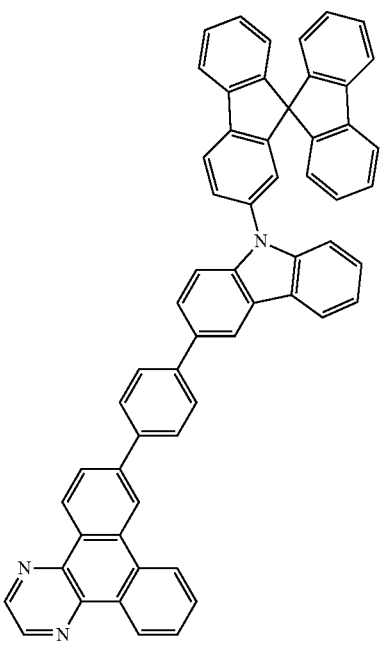
(445)
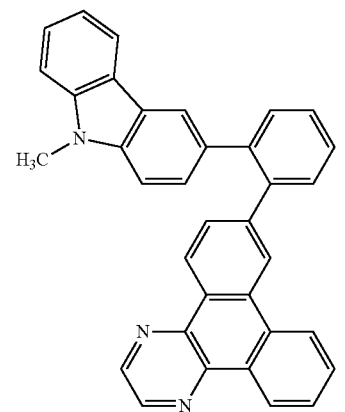
(446)
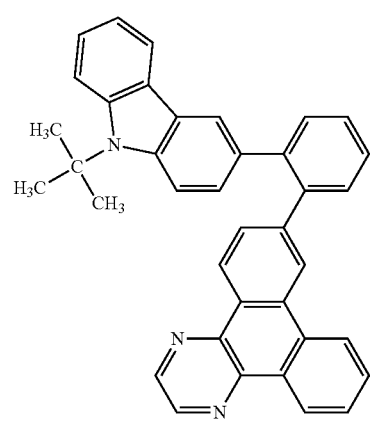
(447)
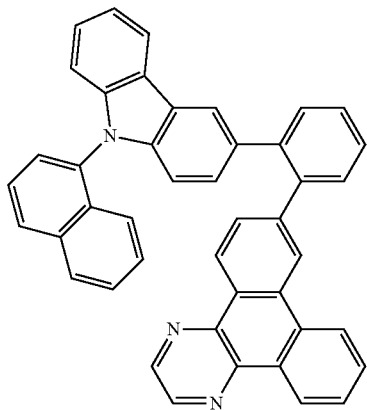
[Chemical formula 39]
(448)
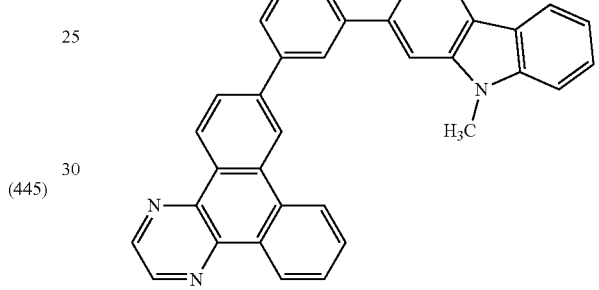
(449)
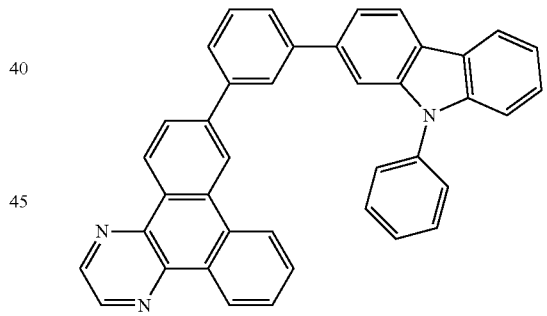
(450)
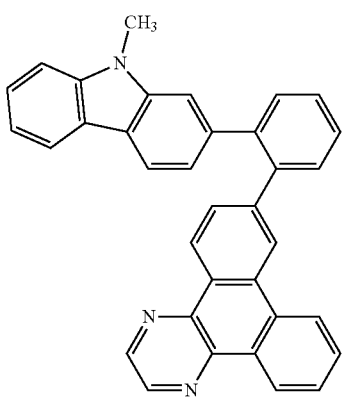

(451)
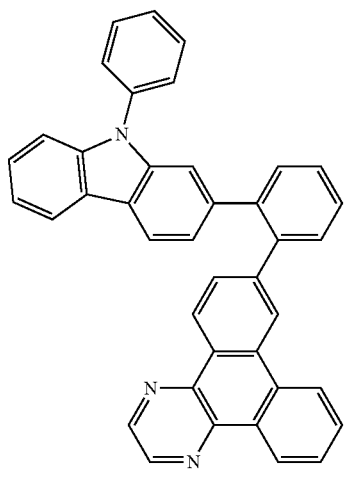
[Chemical formula 40]
(500)
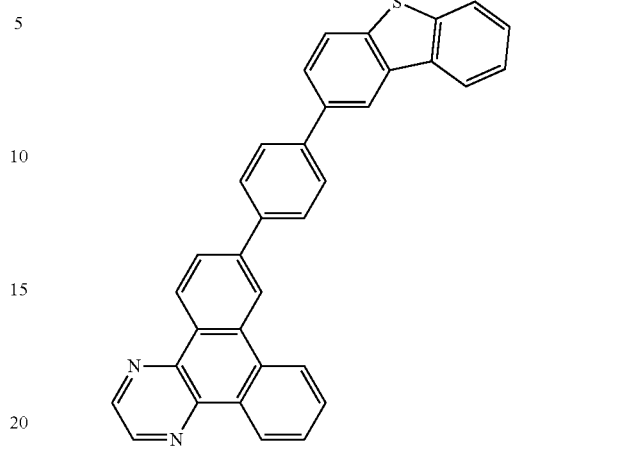
(452)
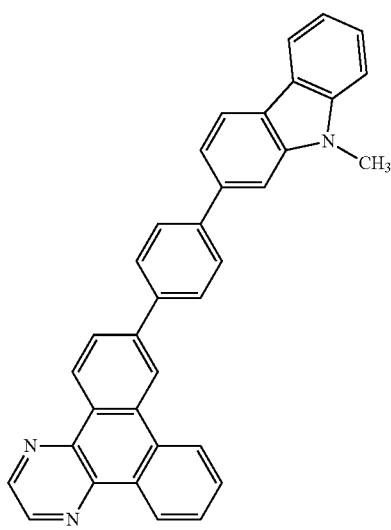
(501)
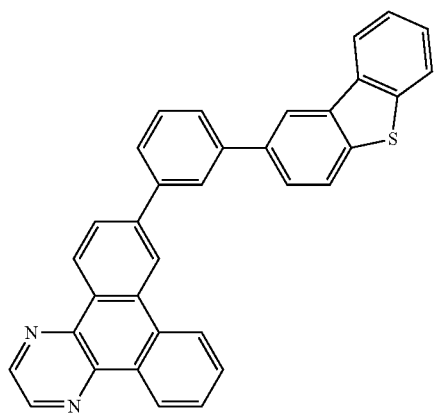
(453)
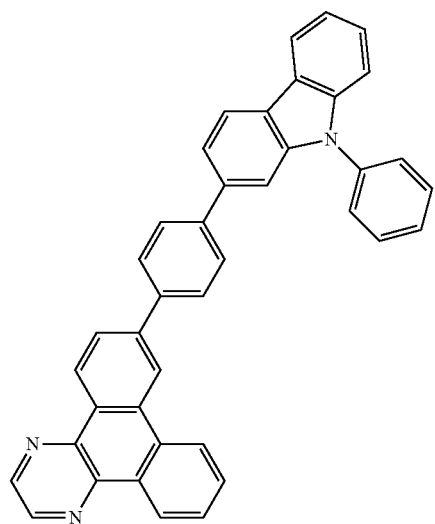
(502)
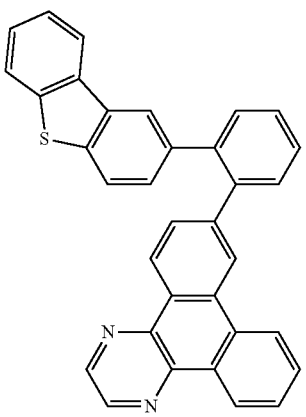

-continued
(503)
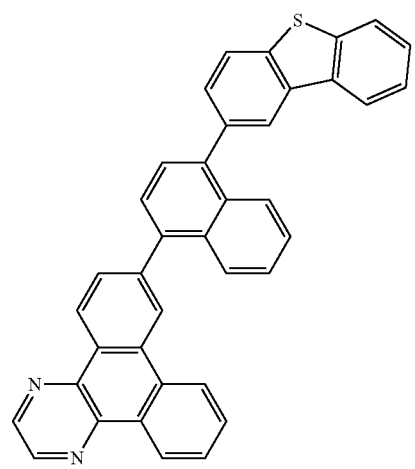
(504)
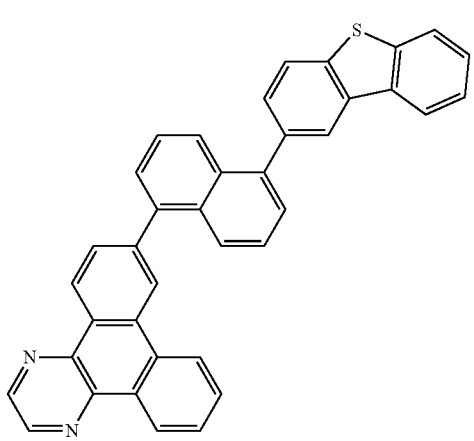
(505)
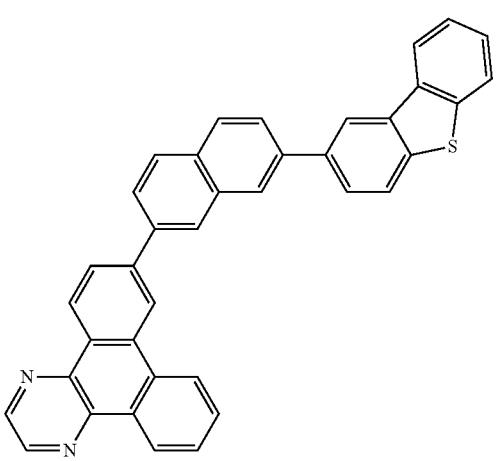
-continued
(506)
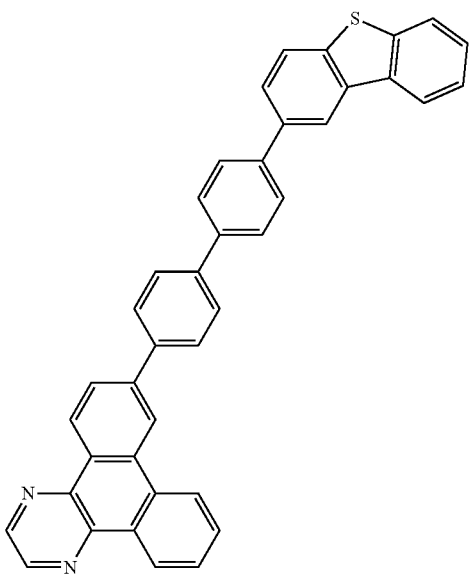
(507)
(508)

[Chemical formula 41]
(509)
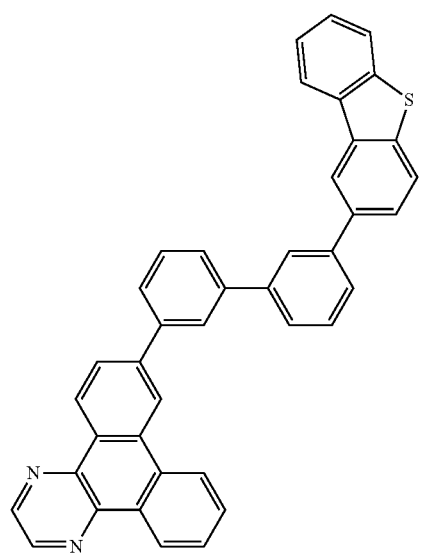
(510)
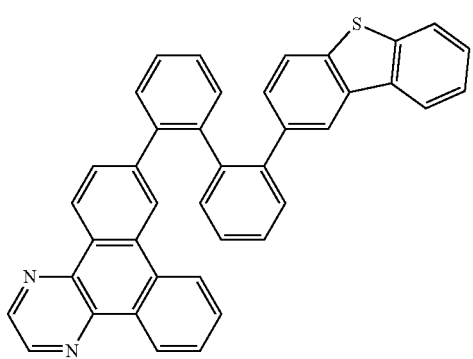
(511)
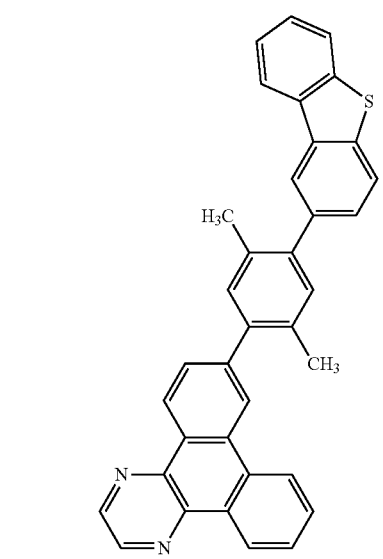
(512)
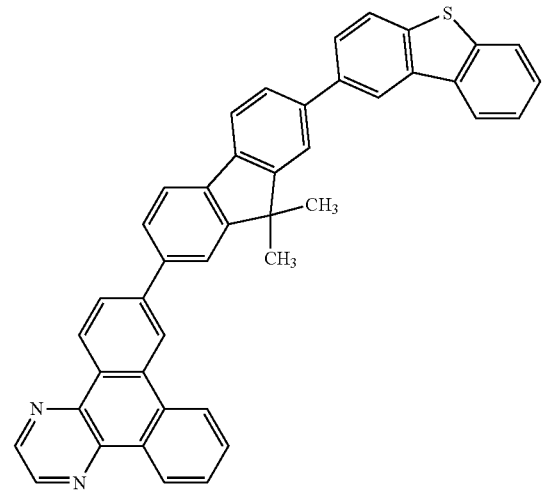
(513)
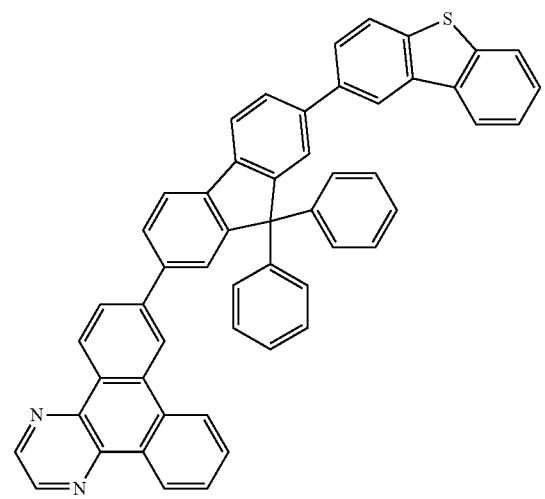
(514)
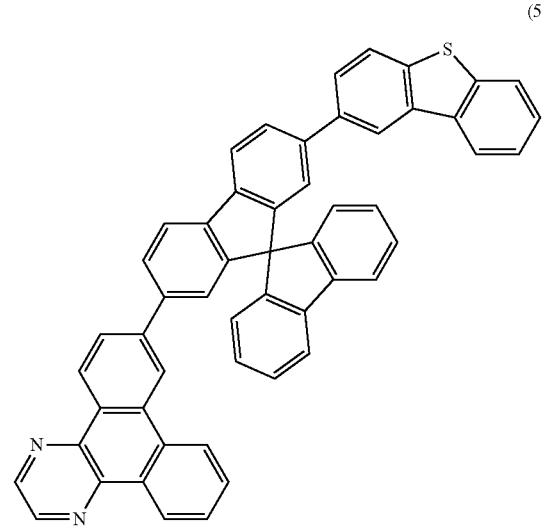

[Chemical formula 42]
(515)
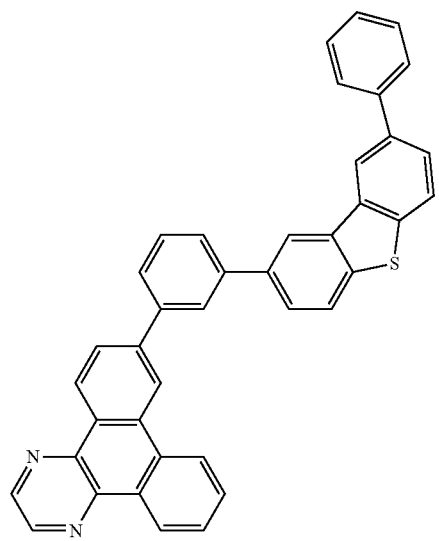
(516)
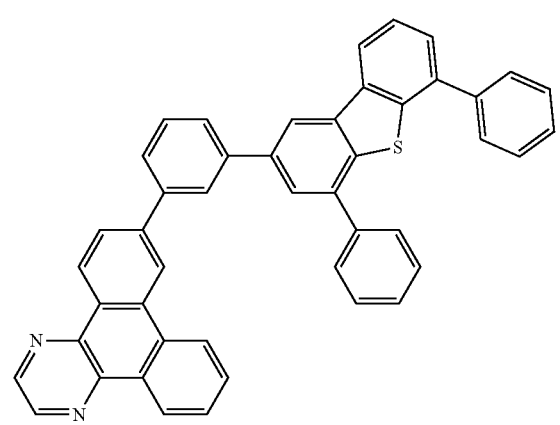
(517)
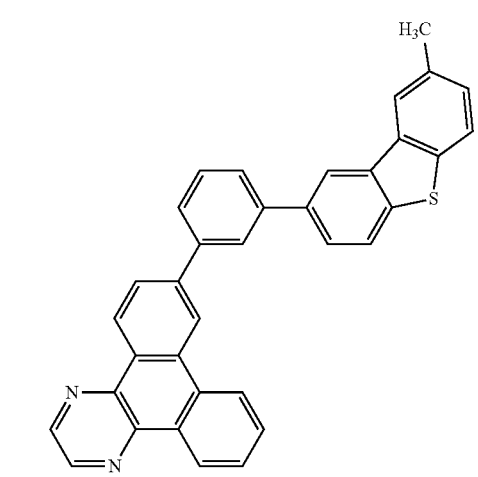
(518)
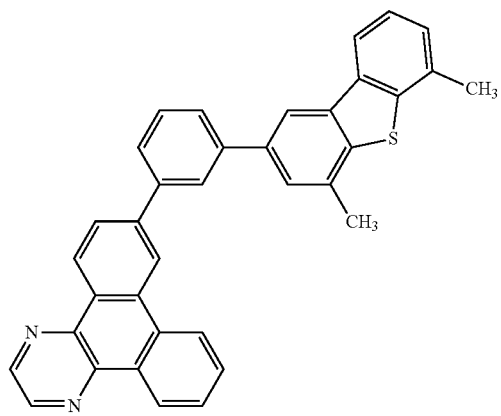
(519)
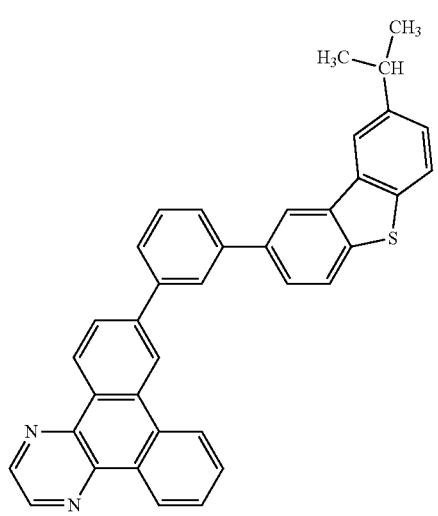
(520)
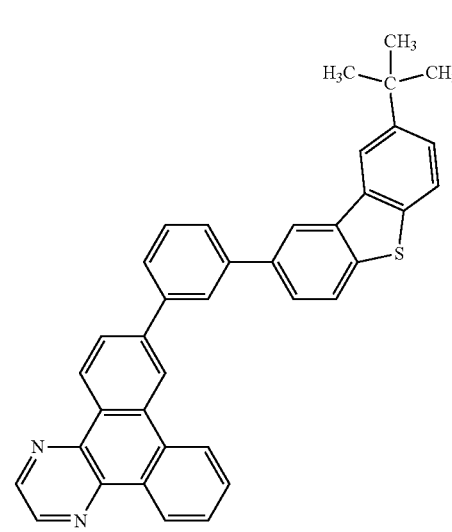

(521)
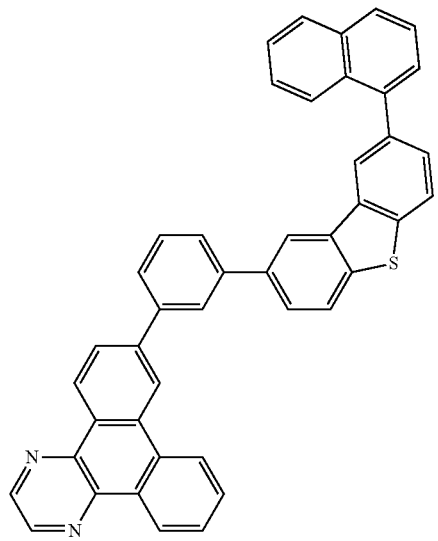
[Chemical formula 43]
(522)
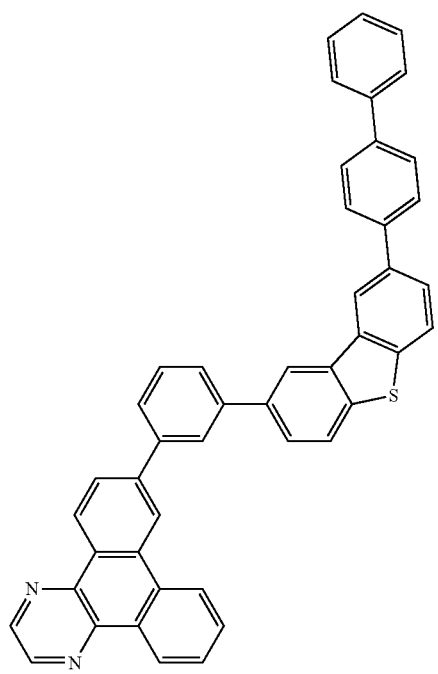
(523)
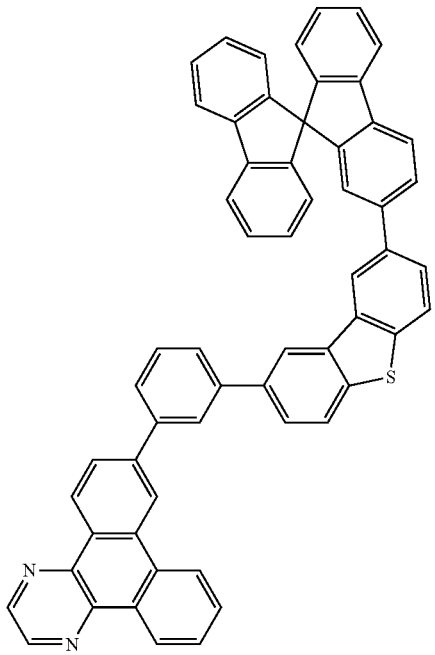
(524)
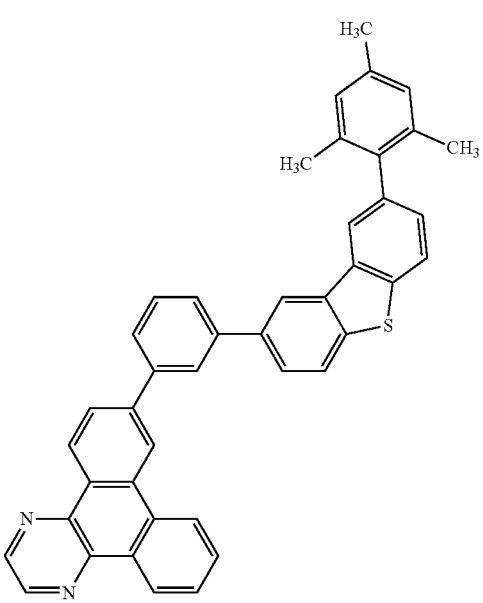

79
-continued
(525)
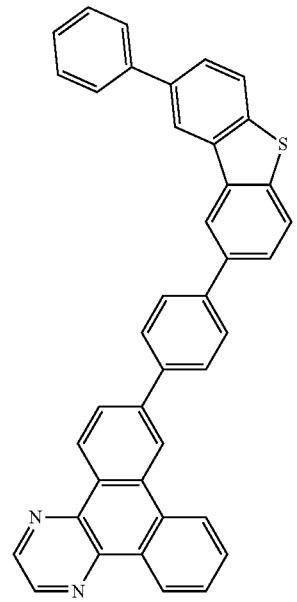
(526)
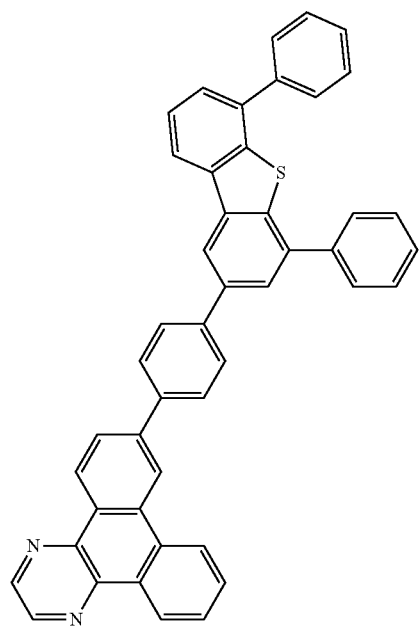
80
-continued
(527)
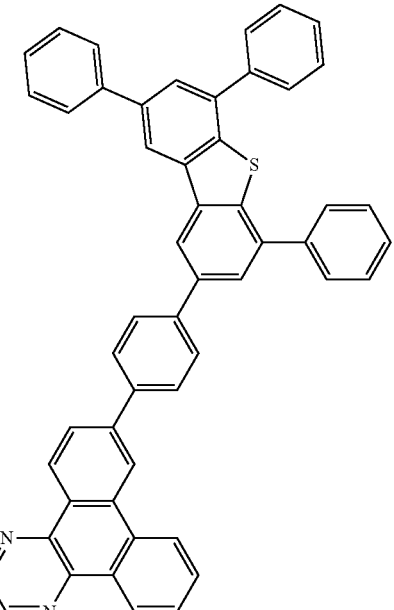
(528)
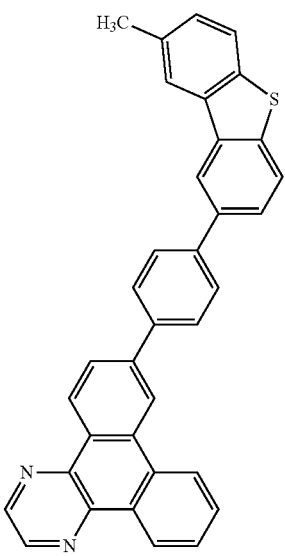

[Chemical formula 44]
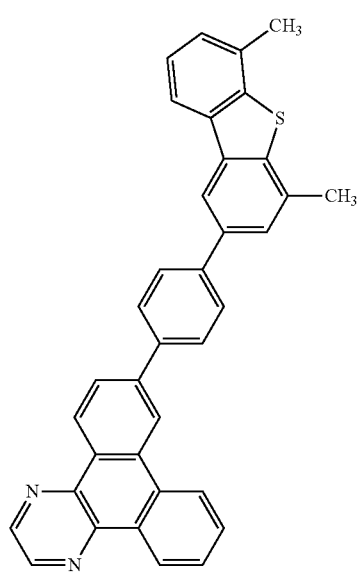
(529)
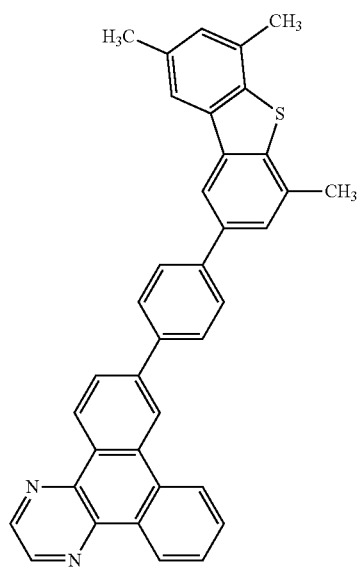
(530)
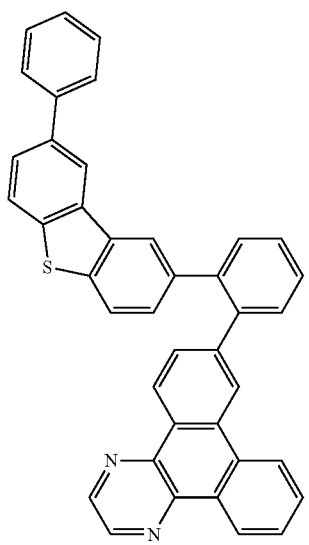
(531)
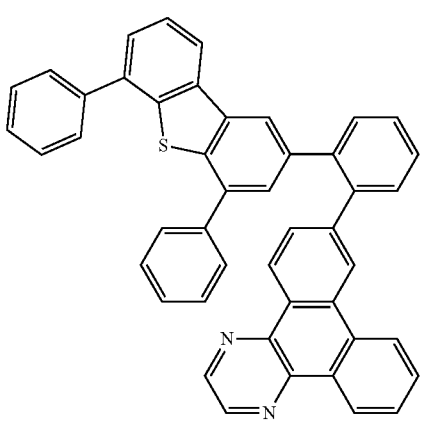
(532)
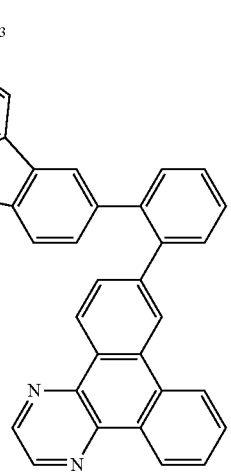
(533)

(534)
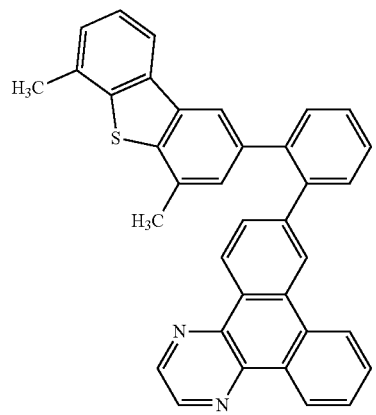
(535)
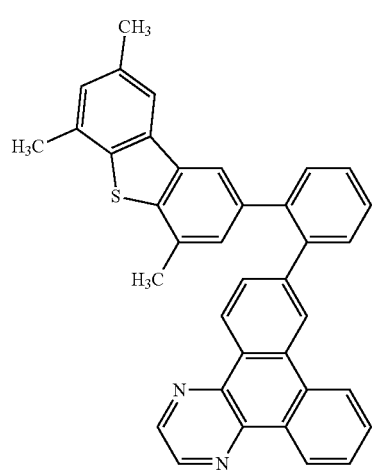
(536)
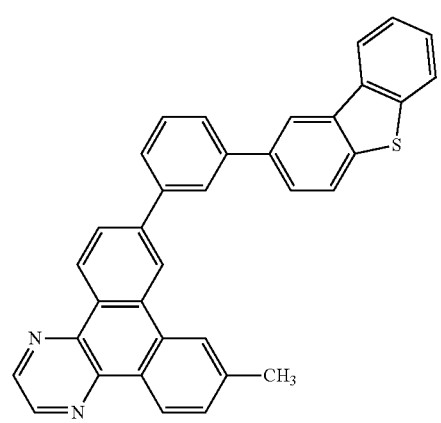
(537)
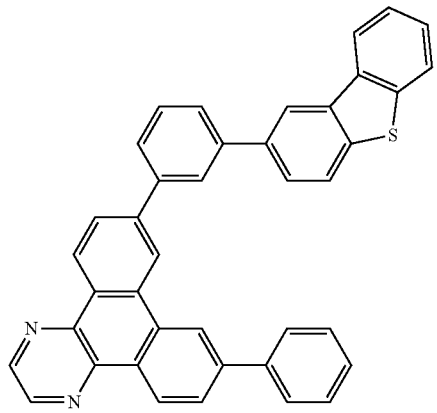
[Chemical formula 45]
(600)
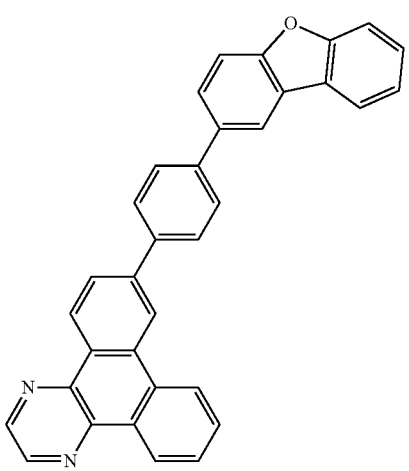
(601)
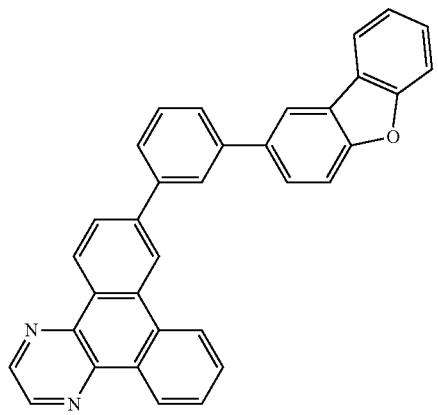

(602) 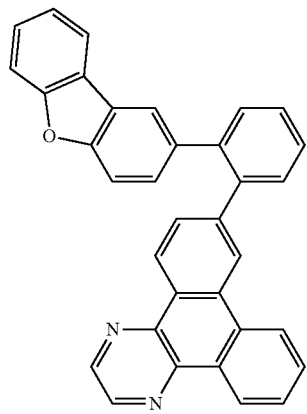
(605) 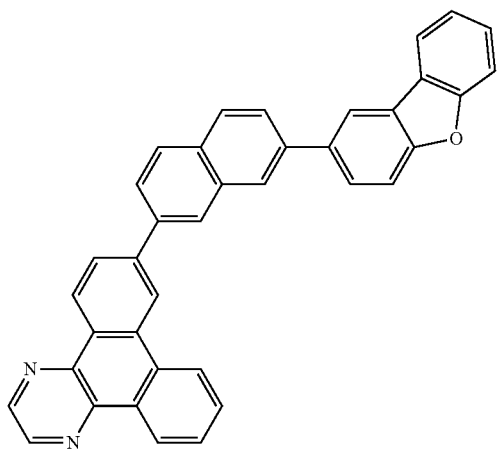
(603) 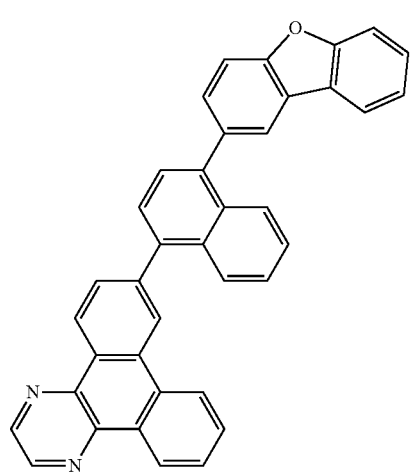
(606) 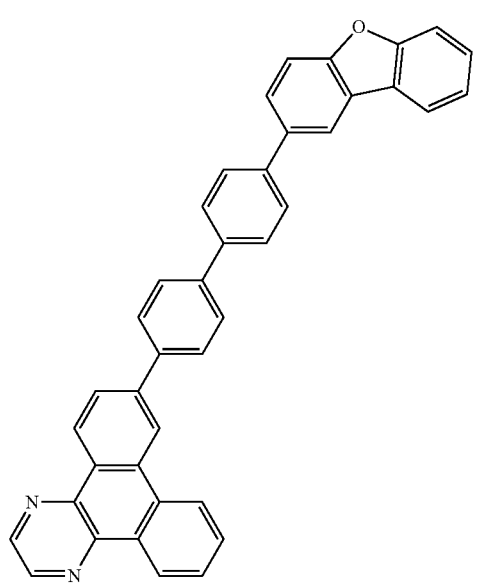
(604) 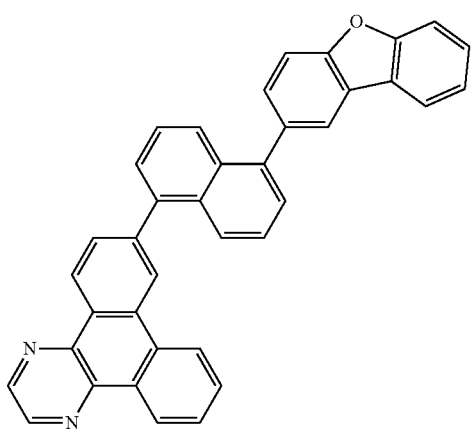
(607) 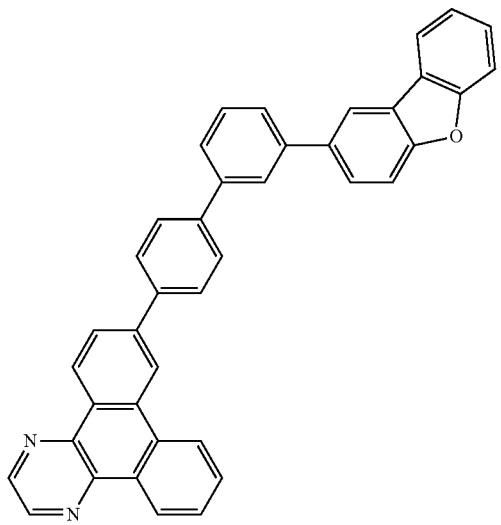

-continued
(608)
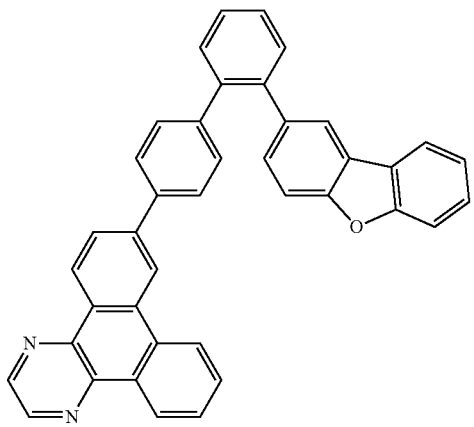
(611)
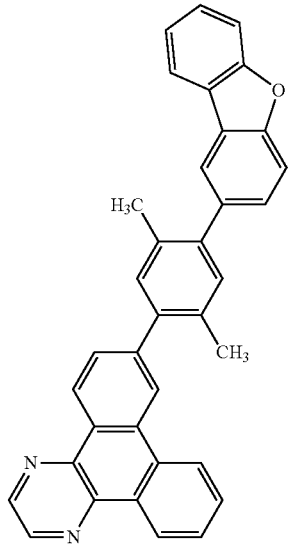
[Chemical formula 46]
(609)
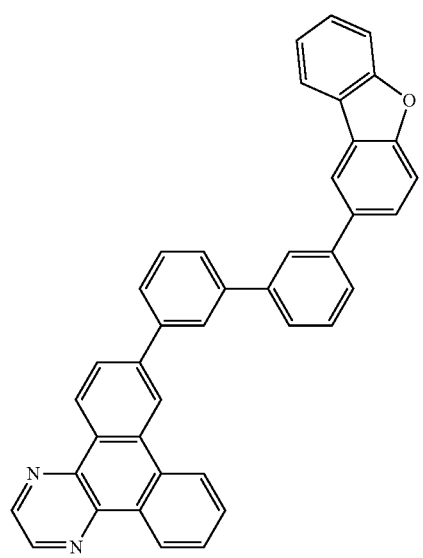
(612)
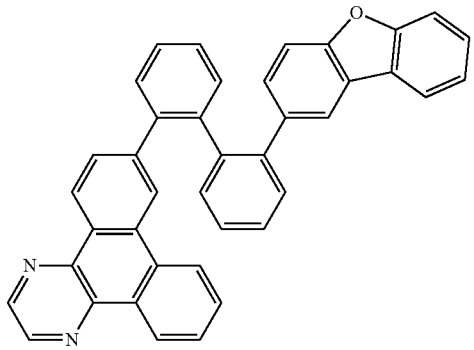
(610)
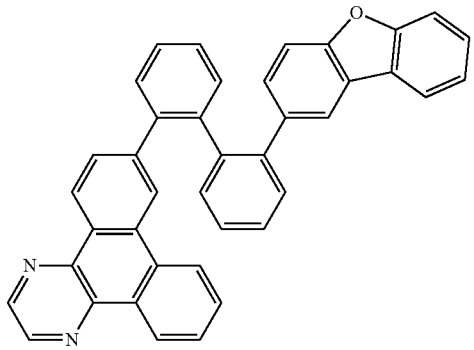
(613)
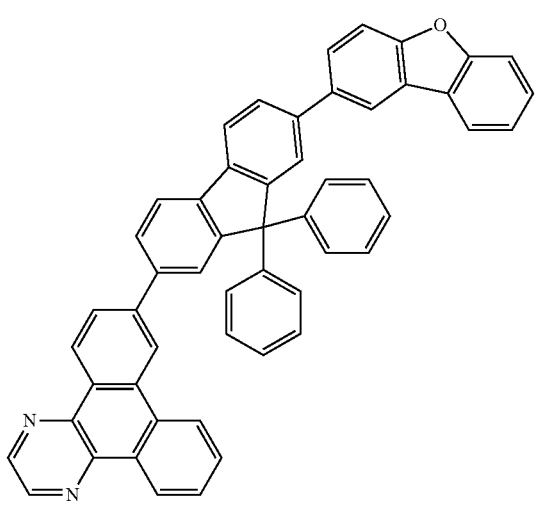

-continued
(614)
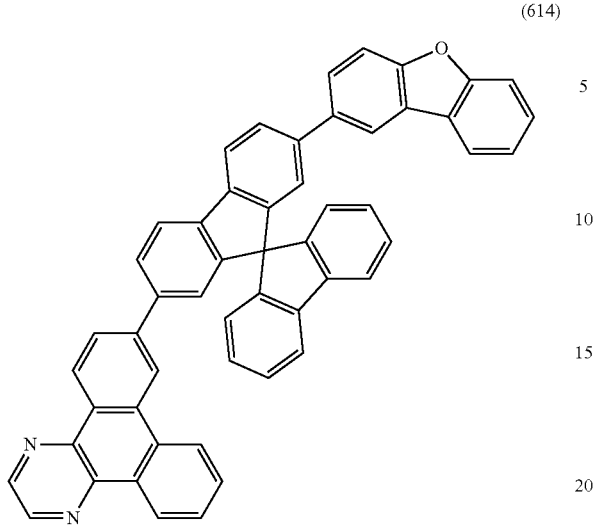
(615)
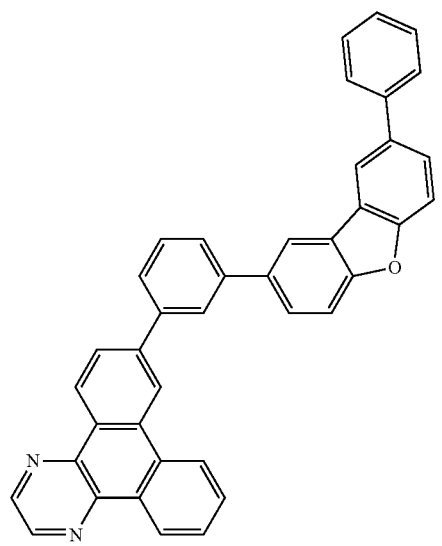
[Chemical formula 47]
(616)
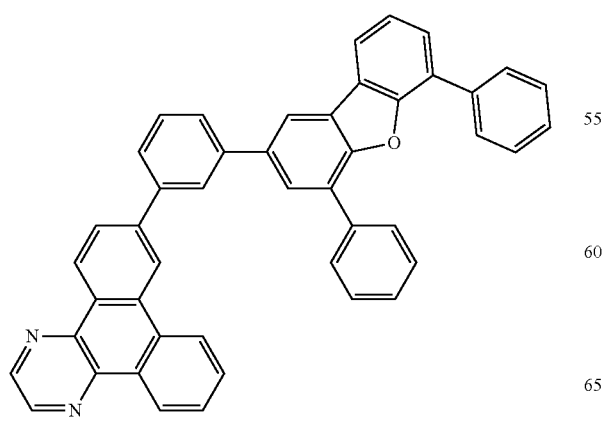
-continued
(617)
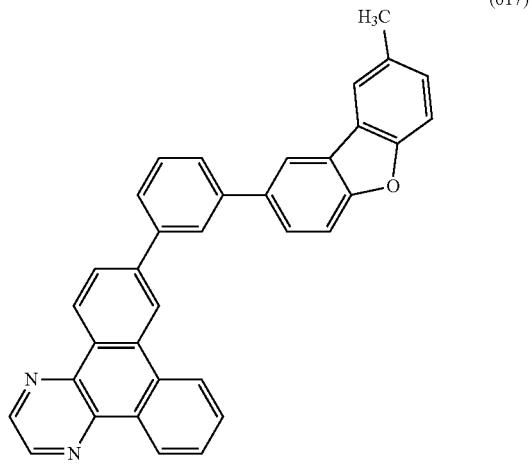
(618)
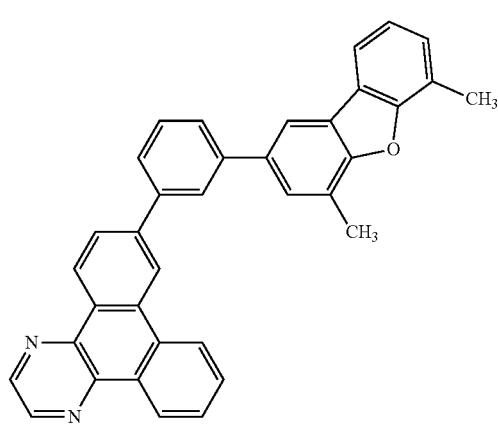
(619)
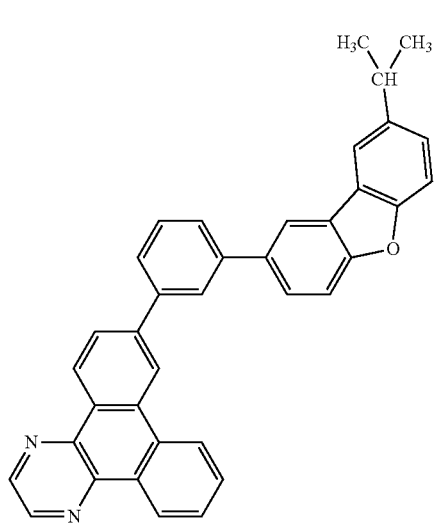

-continued
(620)
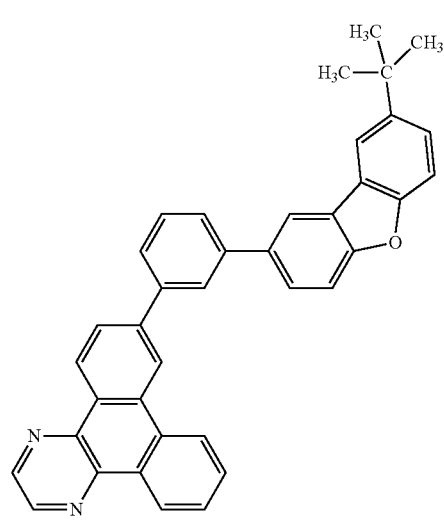
(621)
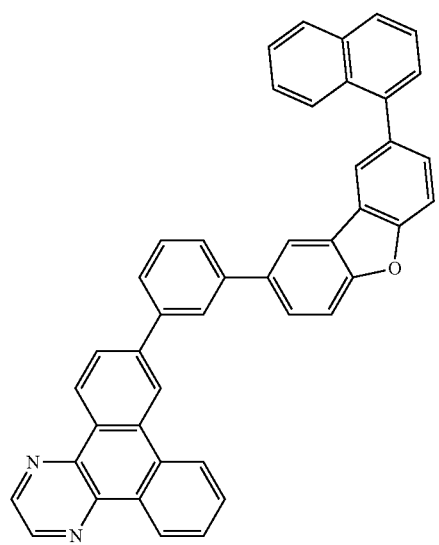
[Chemical formula 48]
(622)
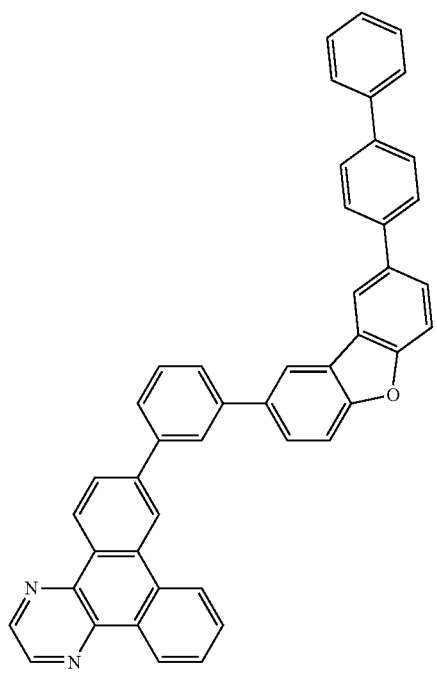
(623)
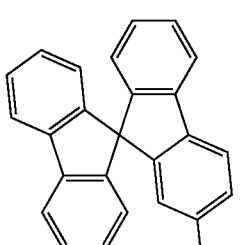
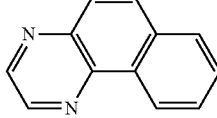

(624)
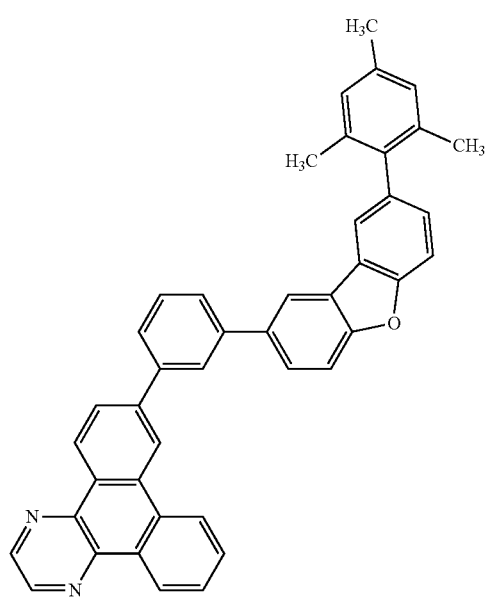
(625)
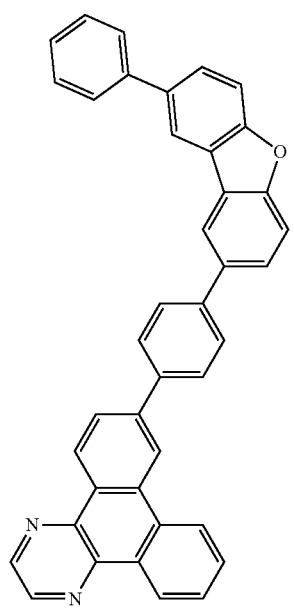
(626)
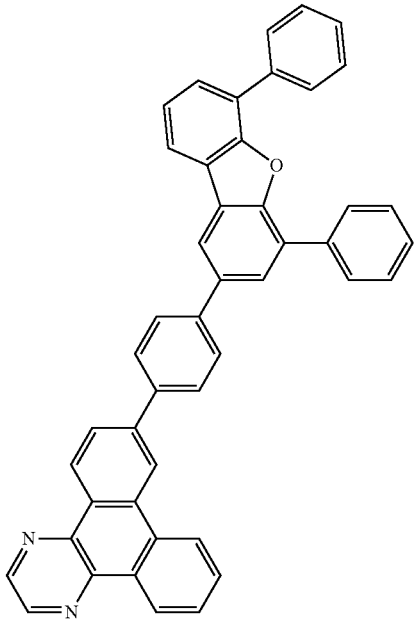
(627)
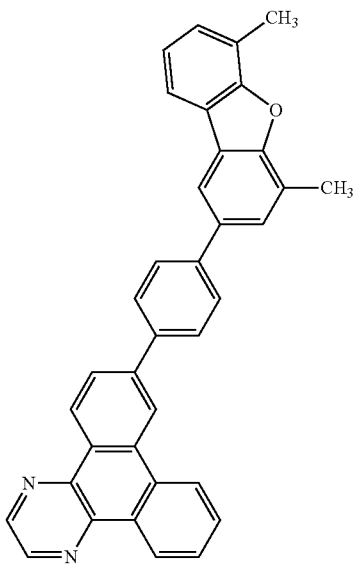

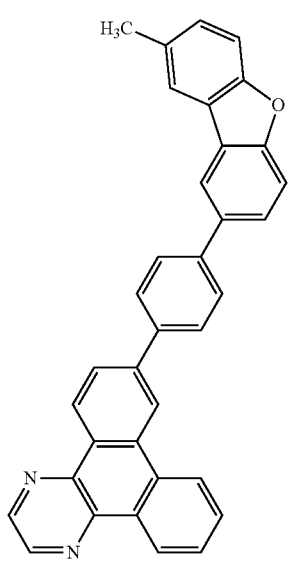
(628)
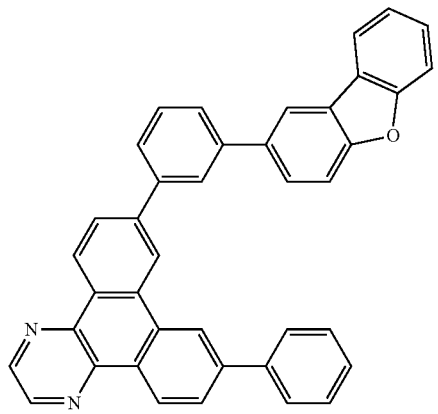
(631)
[Chemical formula 49]
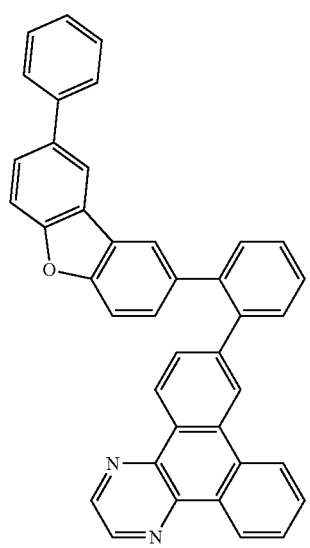
(629)
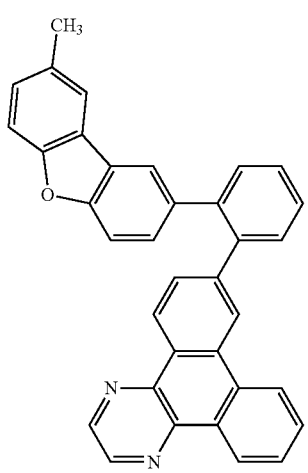
(632)
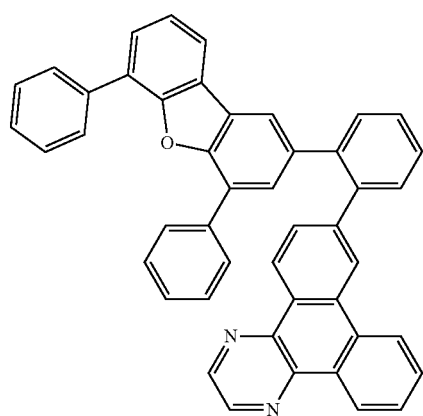
(630)
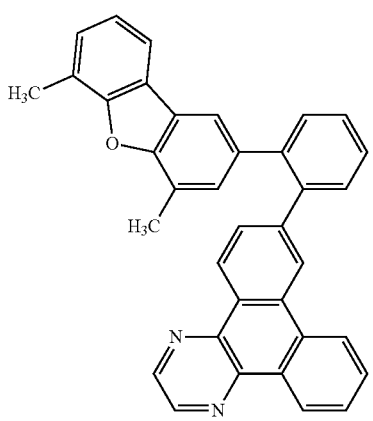
(633)

(634)
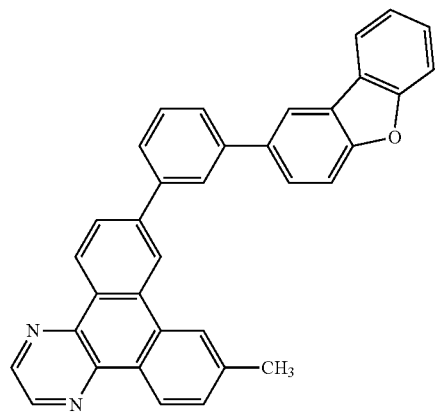
[Chemical formula 50]
(700)
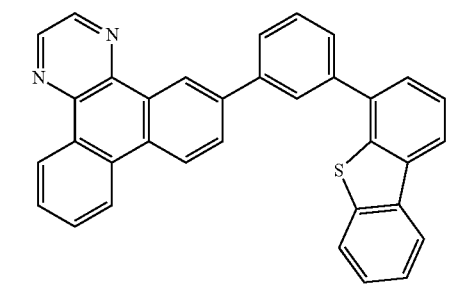
(701)
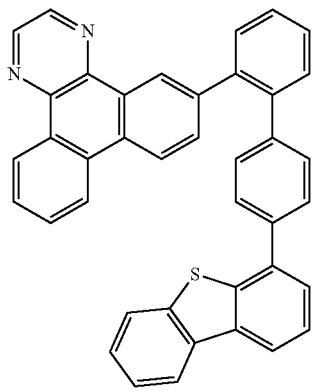
(702)
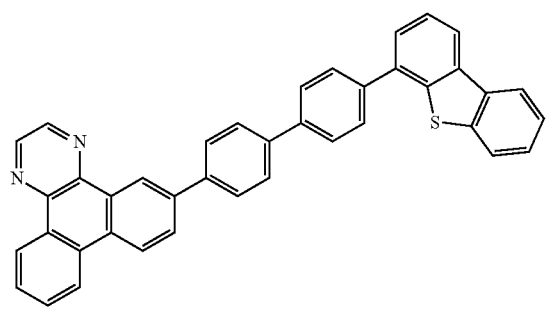
(703)
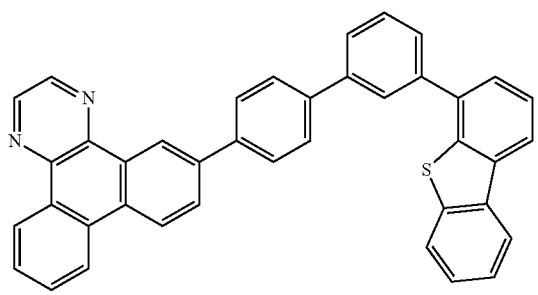
(704)
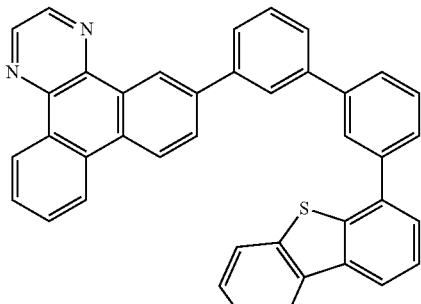
(705)
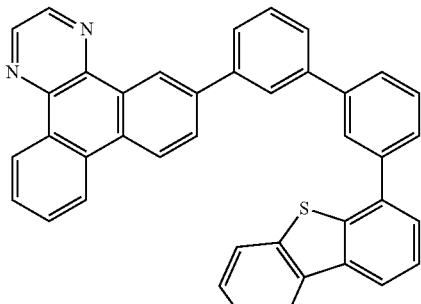
(706)
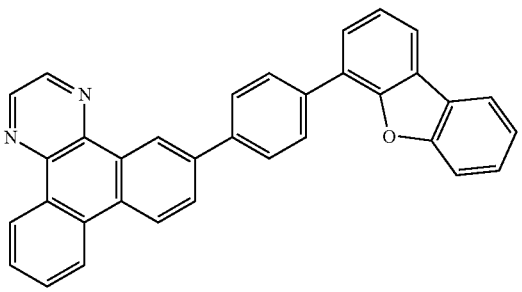
(707)
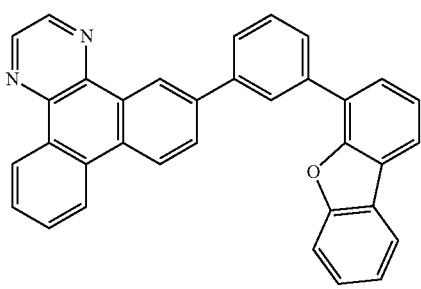

[Chemical formula 51]
(708) 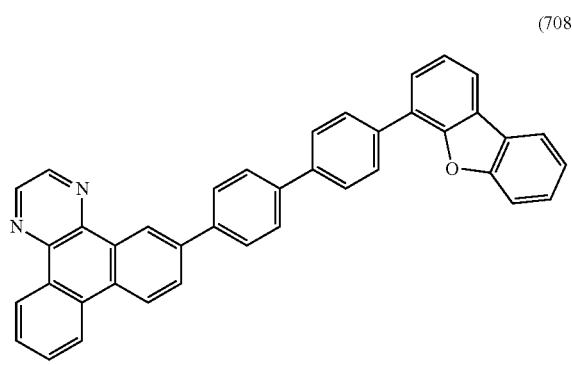
(709) 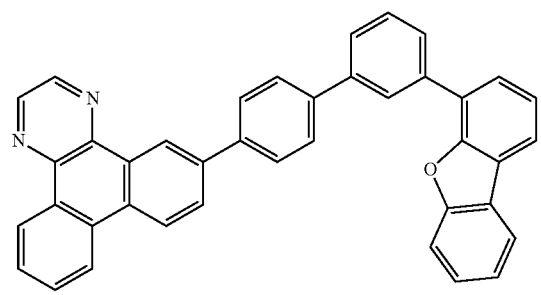
(710) 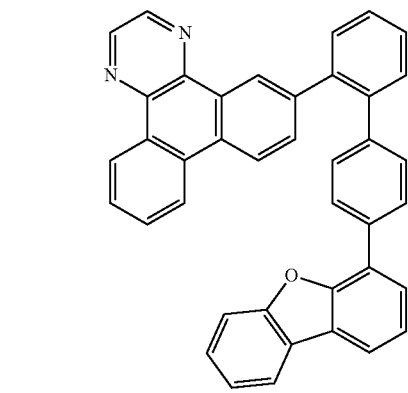
(711) 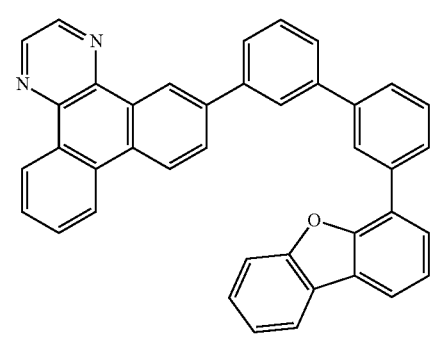
(712) 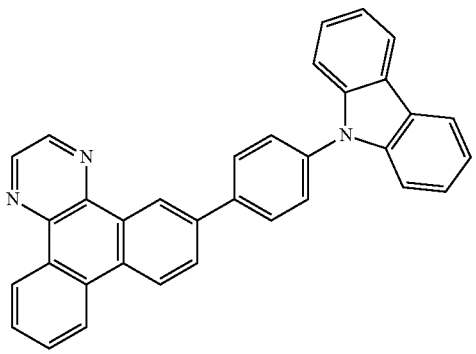
(713) 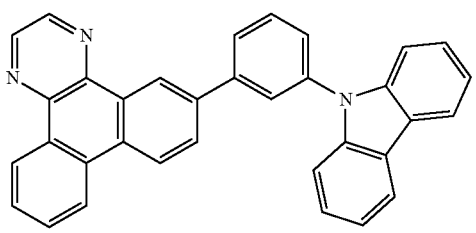
(714) 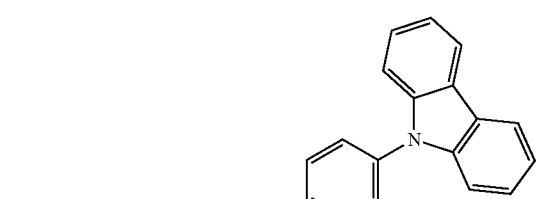
(715) 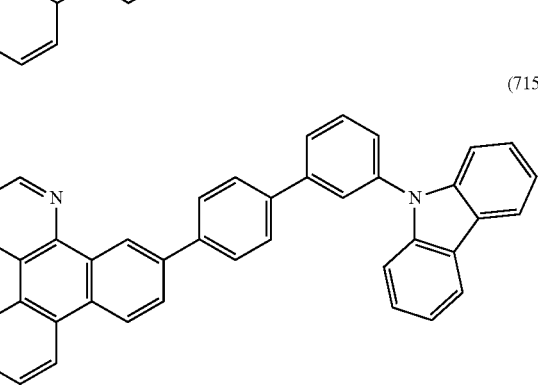
[Chemical formula 52]
(716) 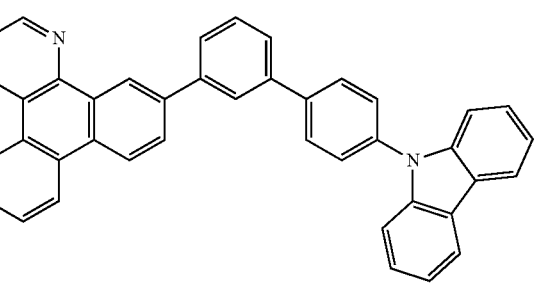

(717)
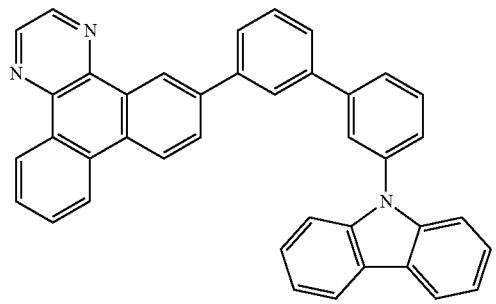
(718)
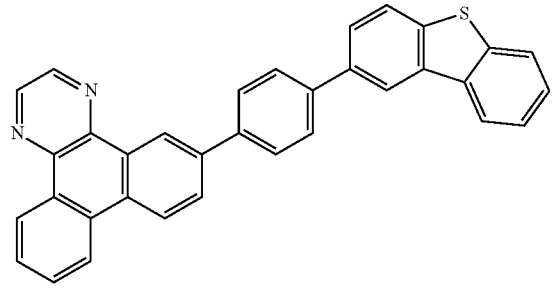
(719)
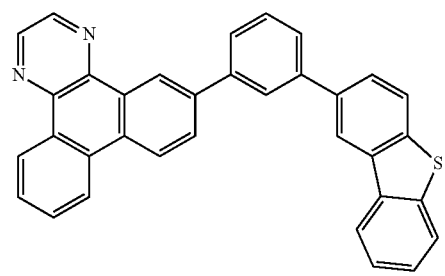
(720)
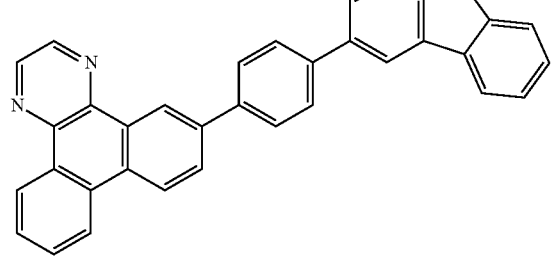
(721)
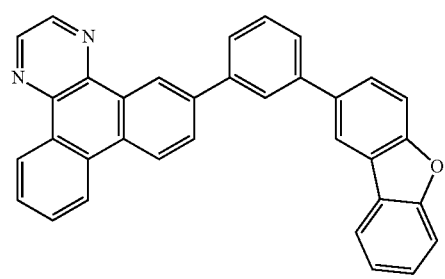
(722)
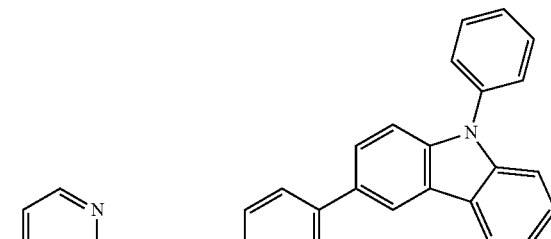
(723)
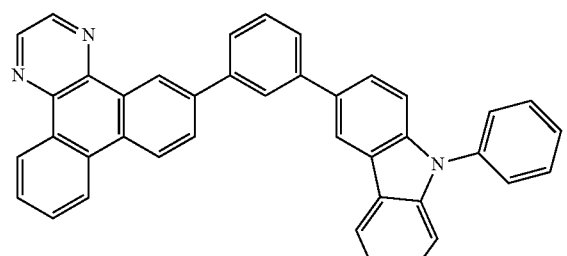
[Chemical formula 53]
(724)
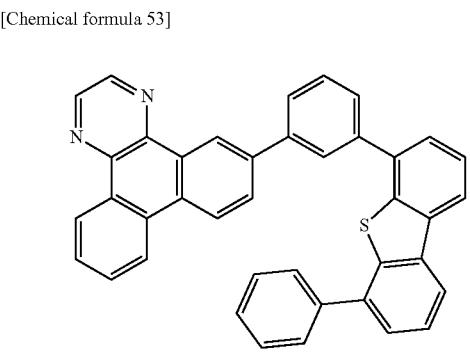
(725)
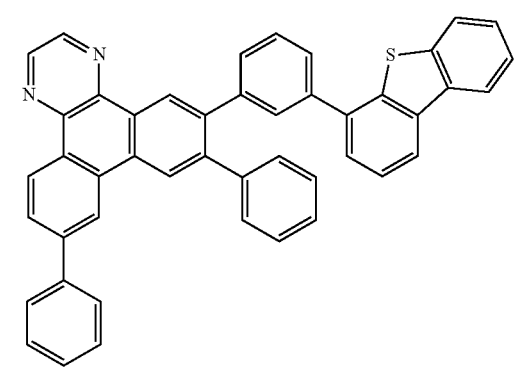

(726)
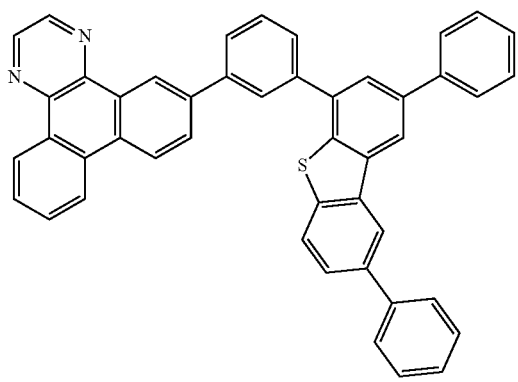
(802)
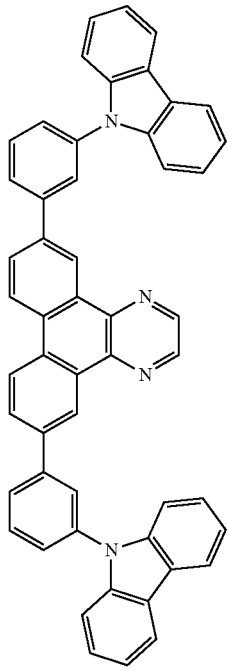
[Chemical formula 54]
(800)
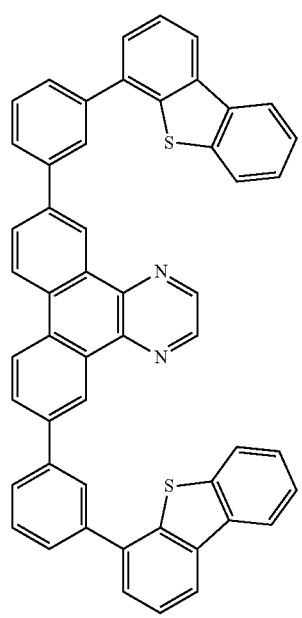
(801)
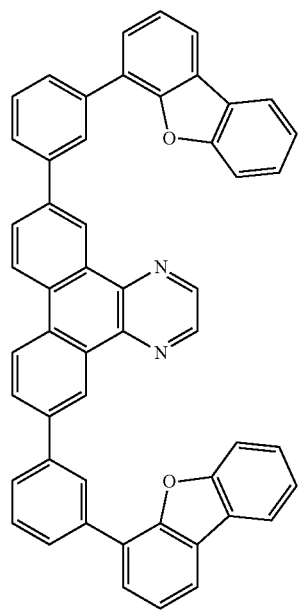
(803)
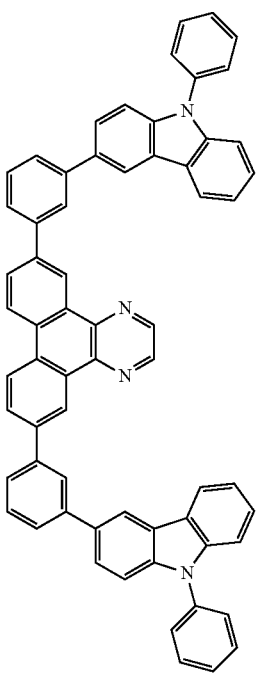

-continued
(804)
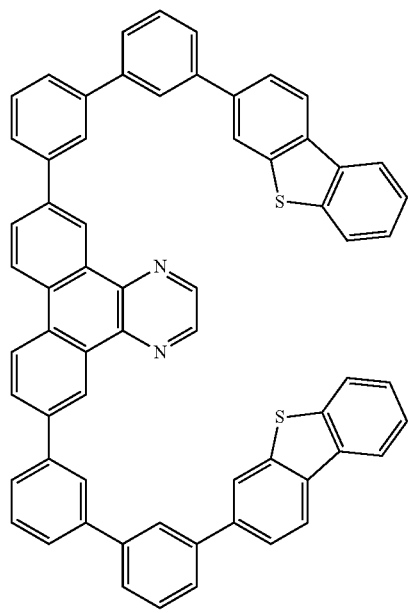
(805)
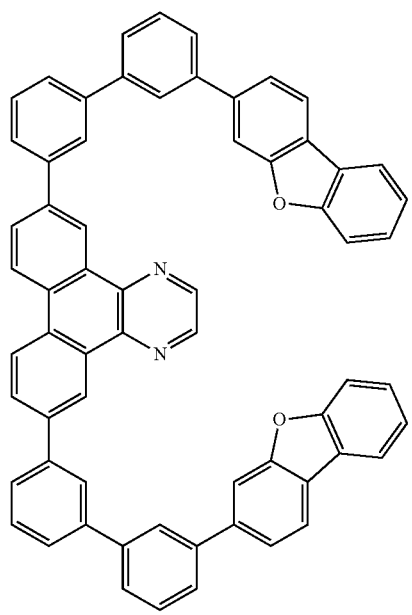
-continued
(806)
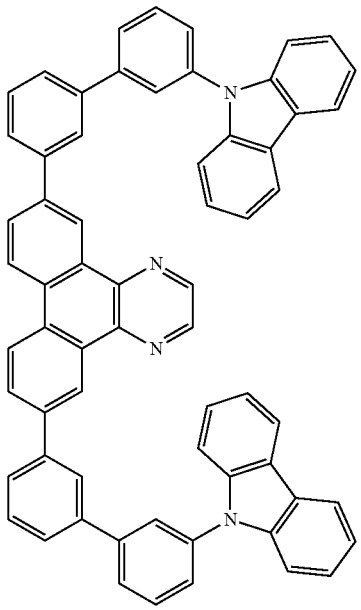
[Chemical formula 55]
(807)
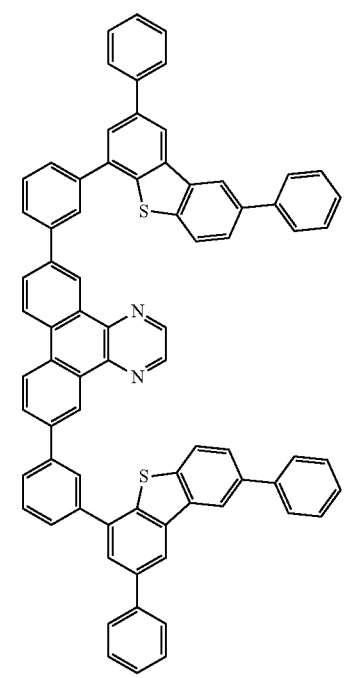

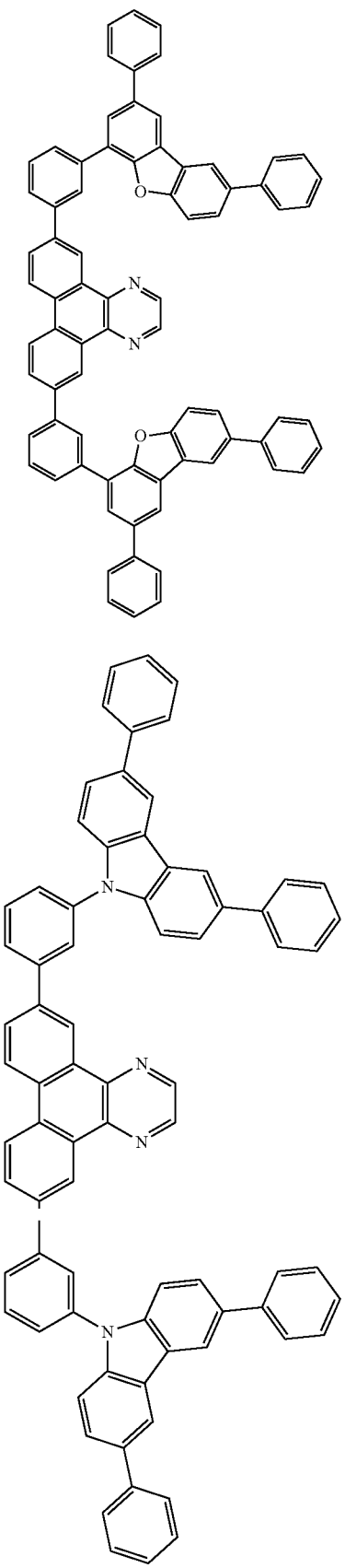

[Chemical formula 56]
(812) 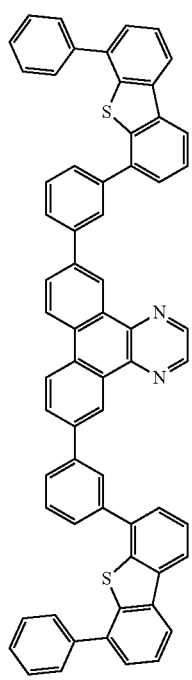
(813) 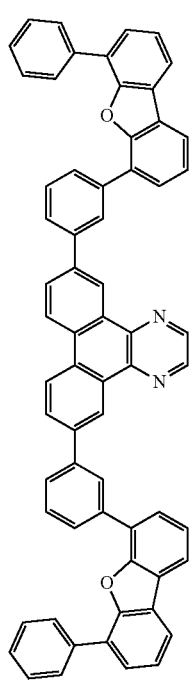
(814) 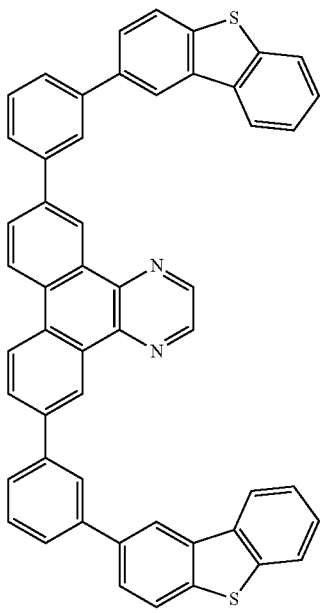
(815) 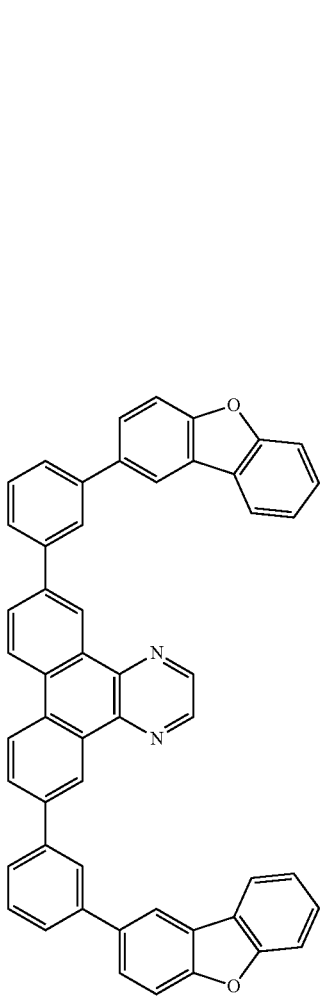

[Chemical formula 57]
(816)
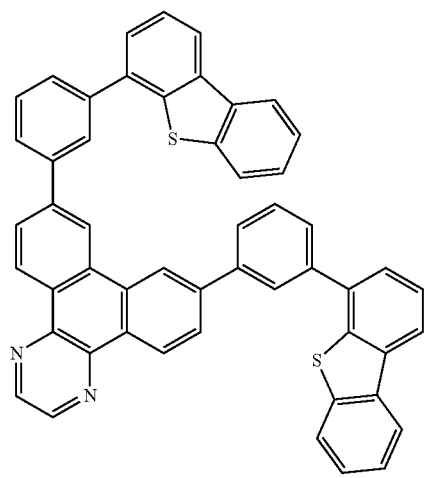
(817)
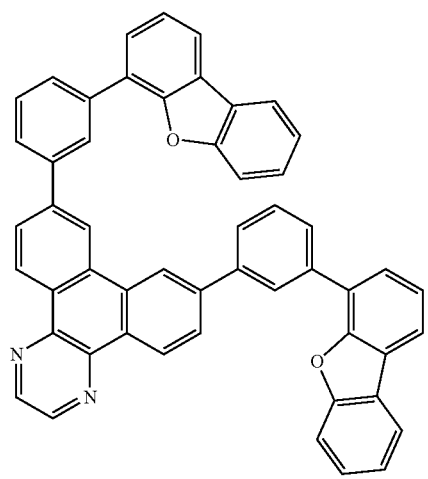
(818)
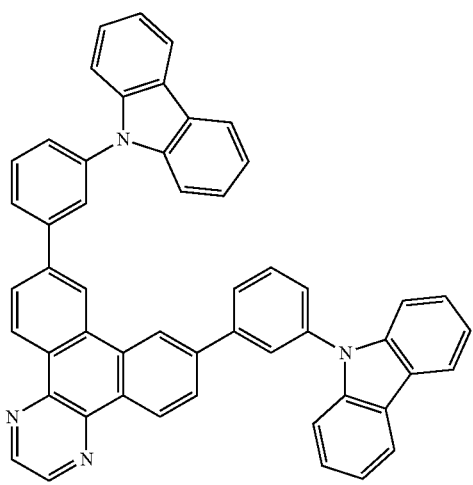
(819)
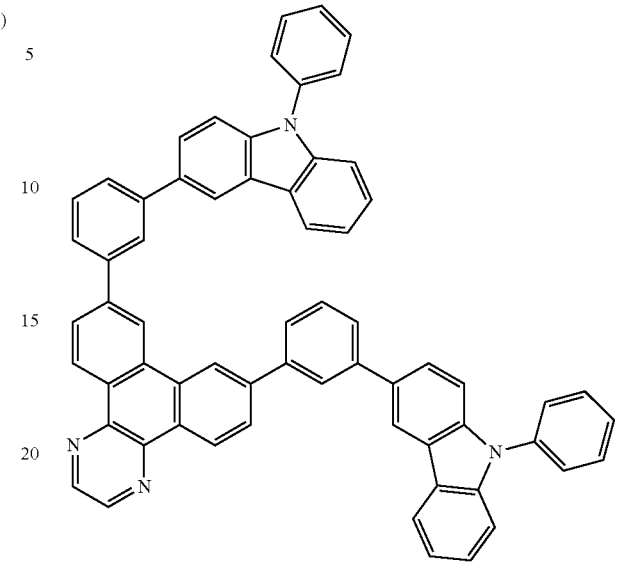
(820)
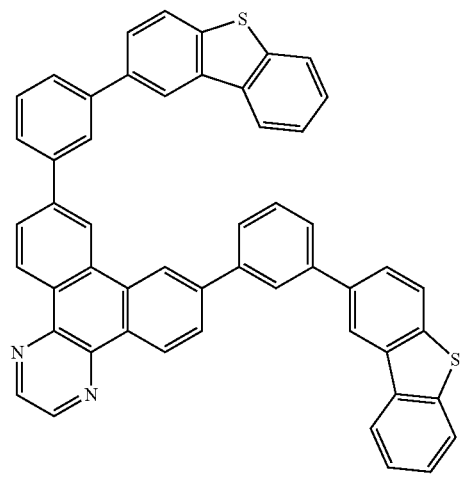
(821)
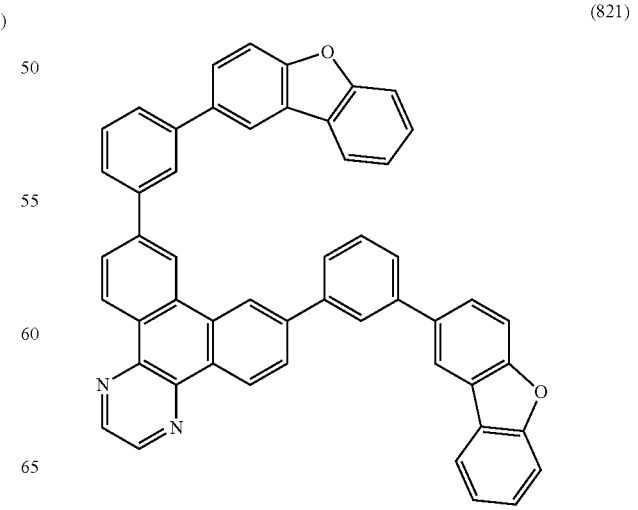

(822)
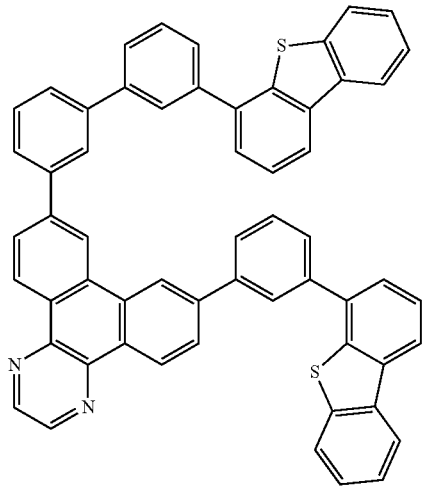
(823)
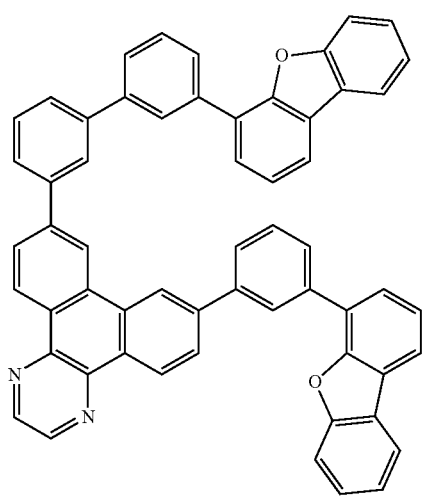
(824)
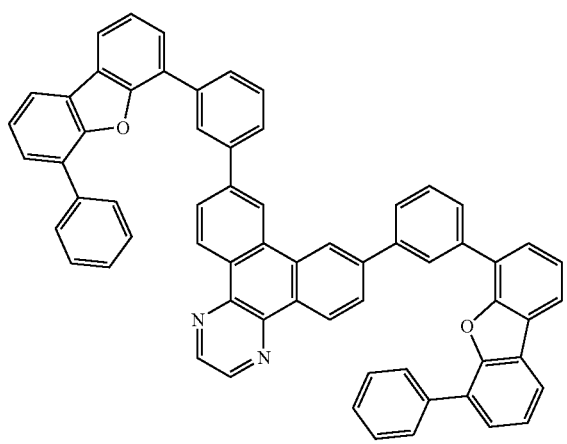
(825)
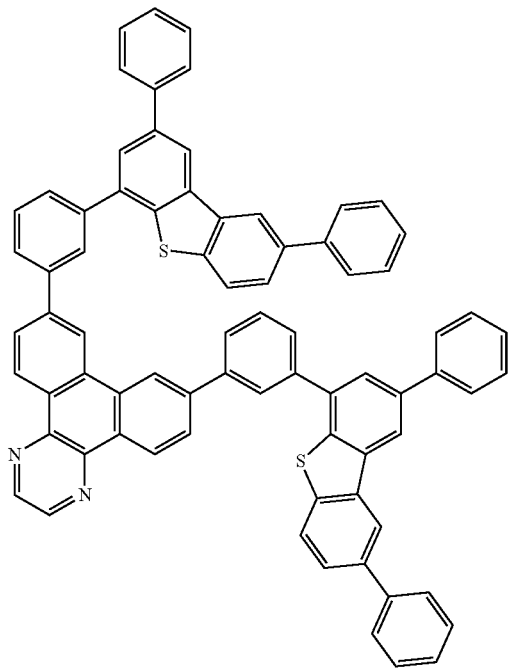
(826)
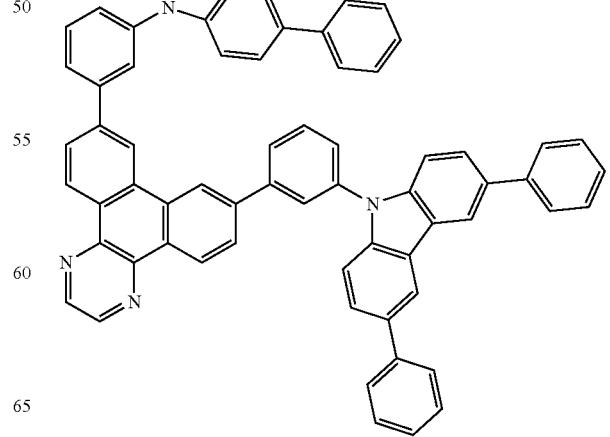

(827)

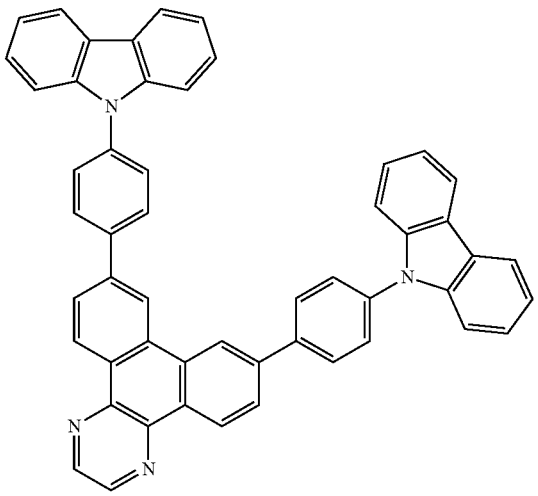

[Chemical formula 59]

(828)

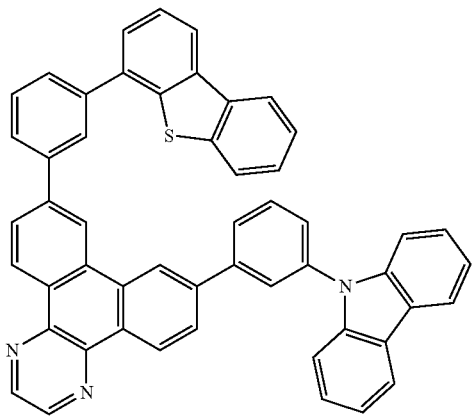

(829)

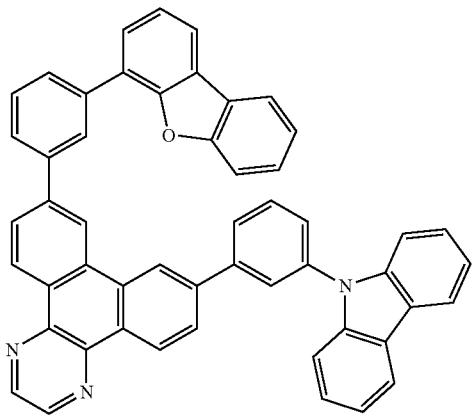

Note that each of the above organic compounds has a high $T_1$ level and thus also has a high $S_1$ level. Thus, any of the above organic compounds can also be used as a host material for a material emitting fluorescence in the visible light range.

As examples of the light-emitting material that is used for the light-emitting layer 113 and converts triplet excitation energy into light, i.e., the guest material (the second organic compound), a phosphorescent material and a thermally activated delayed fluorescent (TADF) material emitting thermally activated delayed fluorescence can be given.

As the phosphorescent material, for example, a phosphorescent material having an emission peak at 440 nm to 520 nm is given, examples of which include organometallic iridium complexes having 4H-triazole skeletons, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: [Ir(Mptz)$_3$], and tris[4-(3-biphenyl)-5-isopropyl-3-phenyl-4H-1,2,4-triazolato]iridium(III) (abbreviation: Ir(iPrptz-3b)$_3$); organometallic iridium complexes having 1H-triazole skeletons, such as tris[3-methyl-1-(2-methylphenyl)-5-phenyl-1H-1,2,4-triazolato]iridium(III) (abbreviation: [Ir(Mptzl-mp)$_3$]) and tris(1-methyl-5-phenyl-3-propyl-1H-1,2,4-triazolato)iridium(III) (abbreviation: Ir(Prptzl-Me)$_3$); organometallic iridium complexes having imidazole skeletons, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-j]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ ppy)$_2$(pic)), and bis[2-(4',6'-difluorophenyl)pyridinato-N,C$^{2'}$]iridium(III) acetylacetonate (abbreviation: FIr(acac)). Among the materials given above, the organometallic iridium complex having a 4H-triazole skeleton has high reliability and high emission efficiency and is thus especially preferable.

Examples of the phosphorescent material having an emission peak at 520 nm to 600 nm include organometallic iridium complexes having pyrimidine skeletons, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[4-(2-norbornyl)-6-phenylpyrimidinato]iridium(III) (endo- and exo-mixture) (abbreviation: Ir(nbppm)$_2$(acac)), (acetylacetonato)bis[5-methyl-6-(2-methylphenyl)-4-phenylpyrimidinato]iridium(III) (abbreviation: [Ir(mpmppm)$_2$(acac)]), and (acetylacetonato)bis(4,6-diphenylpyrimidinato)iridium(III) (abbreviation: [Ir(dppm)$_2$(acac)]); organometallic iridium complexes having pyrazine skeletons, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having pyridine skeletons, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$], and bis(2-phenylquinolinato-N,C$^{2'}$)iridium(III) acetylacetonate (abbreviation: [Ir(pq)$_2$(acac)]); and a rare earth metal complex such as tris(acetylacetonato) (monophenanthroline)terbium(III)

(abbreviation: [Tb(acac)$_3$(Phen)]). Among the materials given above, the organometallic iridium complex having a pyrimidine skeleton has distinctively high reliability and emission efficiency and is thus especially preferable.

Examples of the phosphorescent material having an emission peak at 600 nm to 700 nm include organometallic iridium complexes having pyrimidine skeletons, such as (diisobutyrylmethanato)bis[4,6-bis(3-methylphenyl)pyrimidinato] (abbreviation: [Ir(5mdppm)$_2$(dibm)]), bis[4,6-bis(3-methylphenyl)pyrimidinato](dipivaloylmethanato)iridium (III) (abbreviation: [Ir(5mdppm)$_2$(dpm)]), and bis[4,6-di(naphthalen-1-yl)pyrimidinato](dipivaloylmethanato)iridium(III) (abbreviation: [Ir(d1npm)$_2$(dpm)]); organometallic iridium complexes having pyrazine skeletons, such as (acetylacetonato)bis(2,3,5-triphenylpyrazinato)iridium(III) (abbreviation: [Ir(tppr)$_2$(acac)]), bis(2,3,5-triphenylpyrazinato) (dipivaloylmethanato)iridium(IUU) (abbreviation: [Ir(tppr)$_2$(dpm)]), and (acetylacetonato)bis[2,3-bis(4-fluorophenyl)quinoxalinato]iridium(III) (abbreviation: [Ir(Fdpq)$_2$(acac)]); organometallic iridium complexes having pyridine skeletons, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); a platinum complex such as 2,3,7,8,12,13,17,18-octaethyl-21H,23H-porphyrin platinum (II) (abbreviation: PtOEP); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]). Among the materials given above, the organometallic iridium complex having a pyrimidine skeleton has distinctively high reliability and emission efficiency and is thus especially preferable. Further, the organometallic iridium complex having a pyrazine skeleton can provide red light emission with favorable chromaticity.

Further, as the hole-transport material which is used for the light-emitting layer 113, i.e., the assist material (the third organic compound), a substance with a high hole-transport property which can be used for the hole-injection layer 111 and the hole-transport layer 112 may be used.

Specifically, a compound having a carbazole skeleton is preferably used as the assist material (the third organic compound) which is included in the light-emitting layer 113 because the compound is highly reliable and has a high hole-transport property to contribute to a reduction in drive voltage.

It is preferable that each of the host material (the first organic compound) and the assist material (the third organic compound) do not have its absorption spectrum in a wavelength range of blue light. Specifically, an absorption edge of the absorption spectrum is preferably at 440 nm or less.

The electron-transport layer 114 is a layer containing a substance with a high electron-transport property. For the electron-transport layer 114, a metal complex such as tris(8-quinolinolato)aluminum (abbreviation: Alq$_3$), tris(4-methyl-8-quinolinolato)aluminum (abbreviation: Almq$_3$), bis(10-hydroxybenzo[h]quinolinato)beryllium (abbreviation: BeBq$_2$), BAlq, Zn(BOX)$_2$, or bis[2-(2-hydroxyphenyl)benzothiazolato]zinc (abbreviation: Zn(BTZ)$_2$) can be used in addition to the above-described electron-transport materials. Further, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4"-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs) can be used. Further, a high molecular compound such as poly(2,5-pyridinediyl)(abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can be used. The substances given here are mainly ones having an electron mobility of $10^{-6}$ cm$^2$/Vs or higher. Note that any other substance may be used for the electron-transport layer 114 as long as the substance has an electron-transport property higher than a hole-transport property.

The electron-transport layer 114 is not limited to a single layer, and may be a stack of two or more layers containing any of the above substances.

It is also possible to use, for the electron-transport layer 114, the above-described organic compound which has a 2,3-unsubstituted dibenzo[f,h]quinoxaline skeleton, a hole-transport skeleton selected from a substituted or unsubstituted dibenzothiophene skeleton, a substituted or unsubstituted dibenzofuran skeleton, and a substituted or unsubstituted carbazole skeleton, and an arylene skeleton, and in which the 2,3-unsubstituted dibenzo[f/h]quinoxaline skeleton and the hole-transport skeleton are bonded through the arylene skeleton.

The electron-injection layer 115 is a layer containing a substance with a high electron-injection property. For the electron-injection layer 115, an alkali metal compound or an alkaline earth metal compound, such as lithium fluoride (LiF), cesium fluoride (CsF), calcium fluoride (CaF$_2$), or lithium oxide (LiO$_x$) can be used. A rare earth metal compound such as erbium fluoride (ErF$_3$) can also be used. Any of the substances for forming the electron-transport layer 114, which are given above, can also be used.

Alternatively, a composite material in which an organic compound and an electron donor (donor) are mixed may be used for the electron-injection layer 115. Such a composite material is excellent in an electron-injection property and an electron-transport property because electrons are generated in the organic compound by the electron donor. In this case, the organic compound is preferably a material excellent in a property of transporting the generated electrons. Specifically, for example, the substances for forming the electron-transport layer 114 (e.g., a metal complex and a heteroaromatic compound), which are given above, can be used. As the electron donor, a substance exhibiting an electron-donating property to the organic compound may be used. Specifically, an alkali metal, an alkaline earth metal, and a rare earth metal are preferable, and lithium, cesium, magnesium, calcium, erbium, and ytterbium are given. Further, an alkali metal oxide or an alkaline earth metal oxide is preferable and for example, lithium oxide, calcium oxide, barium oxide, and the like can be given. A Lewis base such as magnesium oxide can also be used. An organic compound such as tetrathiafulvalene (abbreviation: TTF) can also be used.

Note that each of the above-described hole-injection layer 111, hole-transport layer 112, light-emitting layer 113, electron-transport layer 114, and electron-injection layer 115, can be Ruined by a method such as an evaporation method (e.g., a vacuum evaporation method), an inkjet method, or a coating method.

In the above-described light-emitting element, current flows due to a potential difference generated between the first electrode 101 and the second electrode 103 and holes and electrons recombine in the EL layer 102, whereby light is emitted. Then, the emitted light is extracted outside through the first electrode 101, the second electrode 103, or both. Thus, the first electrode 101, the second electrode 103, or both are electrodes having light-transmitting properties.

Next, the light-emitting elements illustrated in FIGS. 1B and 1C will be described.

Figure 1B:
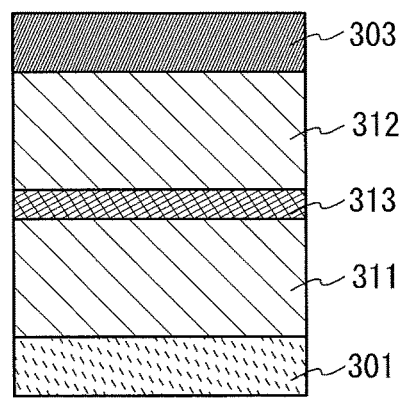

The light-emitting element illustrated in FIG. 1B is a tandem light-emitting element including a plurality of light-emitting layers (a first light-emitting layer 311 and a second light-emitting layer 312) between a first electrode 301 and a second electrode 303.

The first electrode 301 functions as an anode, and the second electrode 303 functions as a cathode. Note that the first electrode 301 and the second electrode 303 can have structures similar to those of the first electrode 101 and the second electrode 103.

In addition, the plurality of light-emitting layers (the first light-emitting layer 311 and the second light-emitting layer 312) can have a structure similar to that of the light-emitting layer 113. Note that the structures of the first light-emitting layer 311 and the second light-emitting layer 312 may be the same or different from each other as long as at least one of the first light-emitting layer 311 and the second light-emitting layer 312 has a structure similar to that of the light-emitting layer 113. Further, in addition to the first light-emitting layer 311 and the second light-emitting layer 312, the hole-injection layer 111, the hole-transport layer 112, the electron-transport layer 114, and the electron-injection layer 115 which are described above may be provided as appropriate.

Further, a charge-generation layer 313 is provided between the plurality of light-emitting layers (the first light-emitting layer 311 and the second light-emitting layer 312). The charge-generation layer 313 has a function of injecting electrons into one of the light-emitting layers and injecting holes into the other of the light-emitting layers when voltage is applied between the first electrode 301 and the second electrode 303. In this embodiment, when voltage is applied such that the potential of the first electrode 301 is higher than that of the second electrode 303, the charge-generation layer 313 injects electrons into the first light-emitting layer 311 and injects holes into the second light-emitting layer 312.

Note that in terms of light extraction efficiency, the charge-generation layer 313 preferably has a light-transmitting property with respect to visible light (specifically, the charge-generation layer 313 has a visible light transmittance of 40% or more). Further, the charge-generation layer 313 functions even if it has lower conductivity than the first electrode 301 or the second electrode 303.

The charge-generation layer 313 may have either a structure in which an electron acceptor (acceptor) is added to an organic compound having a high hole-transport property or a structure in which an electron donor (donor) is added to an organic compound having a high electron-transport property. Alternatively, both of these structures may be stacked.

In the case of the structure in which an electron acceptor is added to an organic compound having a high hole-transport property, as the organic compound having a high hole-transport property, for example, an aromatic amine compound such as NPB, TPD, TDATA, MTDATA, or 4,4'-bis[N-(spiro-9,9'-bifluoren-2-yl)-N-phenylamino]biphenyl (abbreviation: BSPB), or the like can be used. The substances given here are mainly ones having a hole mobility of $10^{-6}$ cm$^2$/Vs or higher. However, substances other than the above substances may be used as long as they are organic compounds having a hole-transport property higher than an electron-transport property.

Further, as the electron acceptor, 7,7,8,8-tetracyano-2,3,5,6-tetrafluoroquinodimethane (abbreviation: F$_4$-TCNQ), chloranil, and the like can be given. In addition, a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting properties. Among these metal oxides, molybdenum oxide is especially preferable since it is stable in the air, has a low hygroscopic property, and is easily handled.

In the case of the structure in which an electron donor is added to an organic compound having a high electron-transport property, as the organic compound having a high electron-transport property, for example, a metal complex having a quinoline skeleton or a benzoquinoline skeleton, such as Alq, Almq$_3$, BeBq$_2$, or BAlq, or the like can be used. Alternatively, a metal complex having an oxazole-based ligand or a thiazole-based ligand, such as Zn(BOX)$_2$ or Zn(BTZ)$_2$, or the like can be used. Other than metal complexes, PBD, OXD-7, TAZ, BPhen, BCP, or the like can be used. The substances given here are mainly ones having an electron mobility of $10^{-6}$ cm$^2$/Vs or higher. Note that substances other than the above substances may be used as long as they are organic compounds having an electron-transport property higher than a hole-transport property.

As the electron donor, an alkali metal, an alkaline earth metal, a rare earth metal, a metal belonging to Group 13 of the periodic table, or an oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may also be used as the electron donor.

Note that forming the charge-generation layer 313 by using any of the above materials can suppress an increase in drive voltage caused by the stack of the light-emitting layers.

Figure 1C:
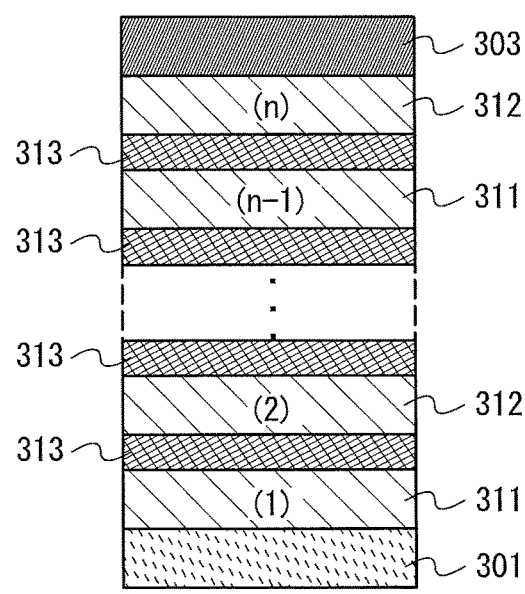

Although the light-emitting element having two light-emitting layers is illustrated in FIG. 1B, the present invention can be similarly applied to a light-emitting element in which n light-emitting layers (n is three or more) are stacked as illustrated in FIG. 1C. In the case where a plurality of light-emitting layers are provided between a pair of electrodes as in the light-emitting element of this embodiment, by providing the charge-generation layer 313 between the light-emitting layers, the light-emitting element can emit light in a high luminance region while the current density is kept low. Since the current density can be kept low, the element can have a long lifetime. When the light-emitting element is applied to lighting, voltage drop due to resistance of an electrode material can be reduced and accordingly homogeneous light emission in a large area is possible. Moreover, a light-emitting device which can be driven at low voltage and has low power consumption can be achieved.

By making emission colors of the light-emitting layers different, light of a desired color can be obtained from the light-emitting element as a whole. For example, by forming a light-emitting element having two light-emitting layers such that the emission color of the first light-emitting layer and the emission color of the second light-emitting layer are complementary colors, the light-emitting element can provide white light emission as a whole. Note that "complementary colors" refer to colors which produce an achromatic color when mixed. In other words, emission of white light can be obtained by mixture of light emitted from substances whose emission colors are complementary colors.

Further, the same can be applied to a light-emitting element having three light-emitting layers. For example, the light-emitting element as a whole can provide white light emission when the emission color of the first light-emitting layer is red, the emission color of the second light-emitting layer is green, and the emission color of the third light-emitting layer is blue.

As described above, in the light-emitting element described in this embodiment, a light-emitting layer containing an organic compound is provided between the pair of electrodes; the organic compound has a 2,3-unsubstituted dibenzo[f,h]quinoxaline skeleton, a hole-transport skeleton selected from a substituted or unsubstituted dibenzothiophene skeleton, a substituted or unsubstituted dibenzofuran skeleton, and a substituted or unsubstituted carbazole skeleton, and an arylene skeleton; and the 2,3-unsubstituted dibenzo[f,h]quinoxaline skeleton and the hole-transport skeleton are bonded through the arylene skeleton. Such an organic compound has a wide energy gap. Accordingly, by the use of the organic compound for a light-emitting element, as a host material of a light-emitting layer in which a light-emitting substance is dispersed, high current efficiency can be obtained. In particular, the organic compound is suitably used as a host material in which a phosphorescent compound is dispersed.

Further, a light-emitting element which includes the above organic compound in a light-emitting layer can be driven at low voltage. The light-emitting element can also have a long lifetime.

Note that the structure described in this embodiment can be combined as appropriate with any of the structures described in the other embodiments.

Embodiment 2

In this embodiment, a light-emitting device which includes the light-emitting element of one embodiment of the present invention will be described with reference to FIGS. 2A and 2B. Note that FIG. 2A is a top view illustrating the light-emitting device, and FIG. 2B is a cross-sectional view taken along lines A-B and C-D of FIG. 2A.

The light-emitting device of this embodiment includes a source side driver circuit 401 and a gate side driver circuit 403 which are driver circuit portions, a pixel portion 402, a sealing substrate 404, a sealing material 405, a flexible printed circuit (FPC) 409, and an element substrate 410. A portion enclosed by the sealing material 405 is a space.

A lead wiring 408 is a wiring for transmitting signals that are to be input to the source side driver circuit 401 and the gate side driver circuit 403, and receives a video signal, a clock signal, a start signal, a reset signal, and the like from the FPC 409 which serves as an external input terminal. Although only the FPC is illustrated here, a printed wiring board (PWB) may be attached to the FPC. The light-emitting device in this specification includes not only a light-emitting device itself but also a light-emitting device to which an FPC or a PWB is attached.

Figure 2A:
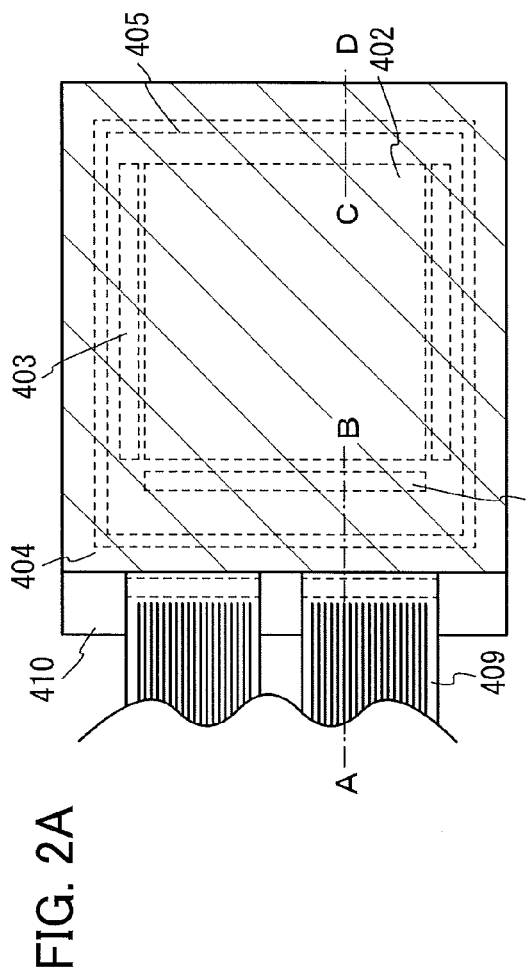
FIGS. 2A and 2B illustrate a light-emitting device of one embodiment of the present invention.
Figure 2B:
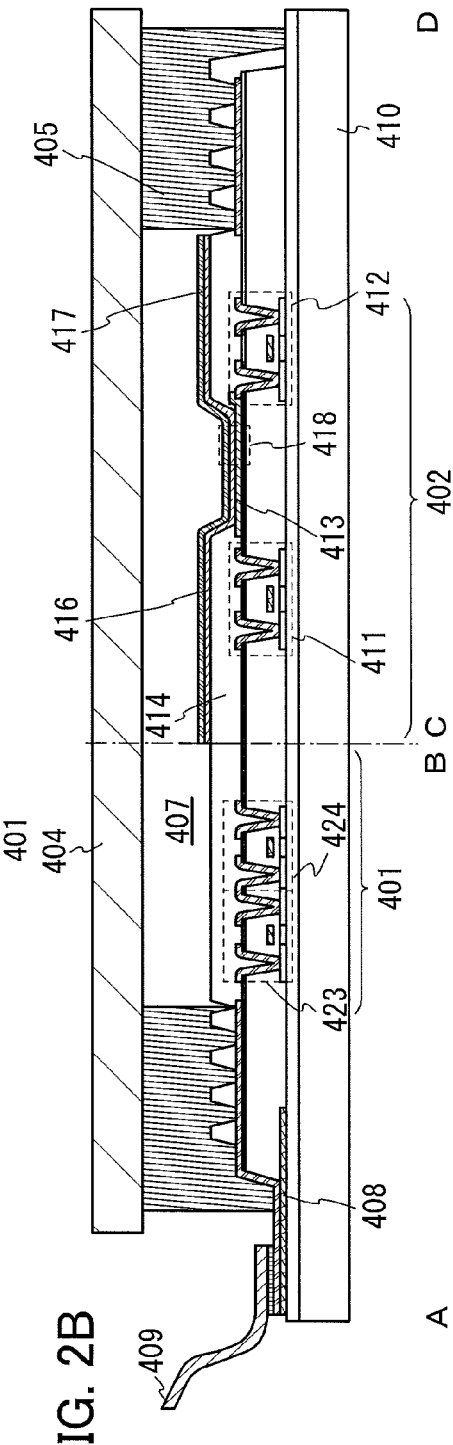

The driver circuit portion and the pixel portion are formed over an element substrate 410 illustrated in FIG. 2A. In FIG. 2B, the source side driver circuit 401 which is the driver circuit portion and one pixel in the pixel portion 402 are illustrated.

Note that as the source side driver circuit 401, a CMOS circuit in which an n-channel TFT 423 and a p-channel TFT 424 are combined is formed. The driver circuit may be any of a variety of circuits formed with TFTs, such as a CMOS circuit, a PMOS circuit, or an NMOS circuit. Although a driver-integrated type in which a driver circuit is formed over the substrate is described in this embodiment, the present invention is not limited to this type, and the driver circuit can be formed outside the substrate.

The pixel portion 402 includes a plurality of pixels having a switching TFT 411, a current control TFT 412, and a first electrode 413 electrically connected to a drain of the current control TFT 412. Note that an insulator 414 is formed to cover an end portion of the first electrode 413. Here, the insulator 414 is formed by the use of a positive photosensitive acrylic resin film.

In order to improve coverage, the insulator 414 is provided such that either an upper end portion or a lower end portion of the insulator 414 has a curved surface with a curvature. For example, when positive photosensitive acrylic is used as a material for the insulator 414, it is preferable that only an upper end portion of the insulator 414 have a curved surface with a radius of curvature (0.2 µm to 3 µm). As the insulator 414, either a negative photosensitive resin or a positive photosensitive resin can be used.

An EL layer 416 and a second electrode 417 are formed over the first electrode 413. The first electrode 413, the EL layer 416, and the second electrode 417 can be formed with materials given in Embodiment 1.

Further, the sealing substrate 404 is attached to the element substrate 410 with the sealing material 405, so that a light-emitting element 418 is provided in a space 407 enclosed by the element substrate 410, the sealing substrate 404, and the sealing material 405. The space 407 is filled with a filler, and may be filled with an inert gas (such as nitrogen or argon) or the sealing material.

Note that an epoxy-based resin is preferably used as the sealing material 405. Such a material preferably allows as little moisture and oxygen as possible to penetrate. As a material used for the sealing substrate 404, a plastic substrate formed of fiberglass-reinforced plastics (FRP), poly (vinyl fluoride) (PVF), a polyester, acrylic, or the like can be used other than a glass substrate or a quartz substrate.

As described above, the active matrix light-emitting device including the light-emitting element of one embodiment of the present invention can be obtained.

Figure 3A:
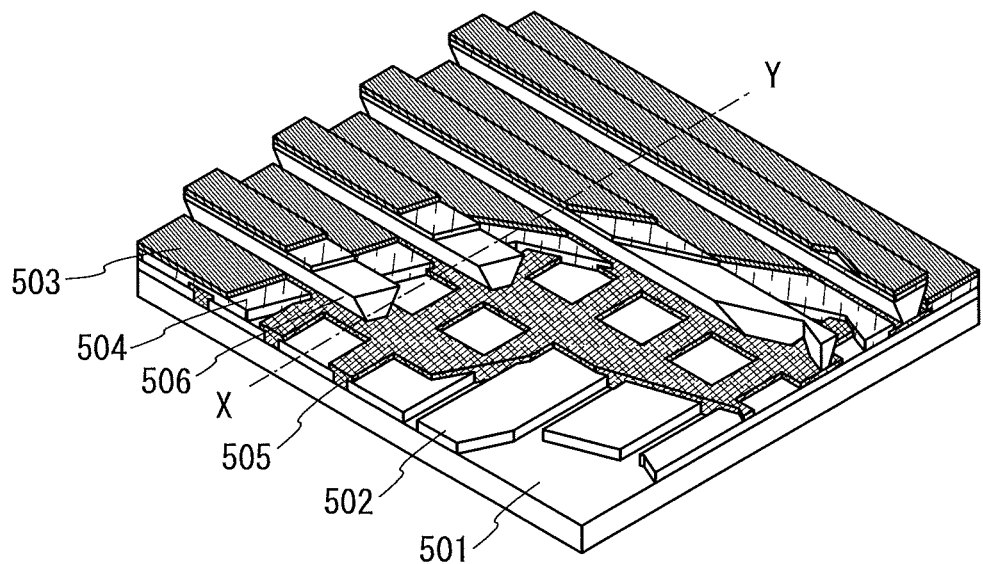
FIGS. 3A and 3B illustrate a light-emitting device of one embodiment of the present invention.
Figure 3B:
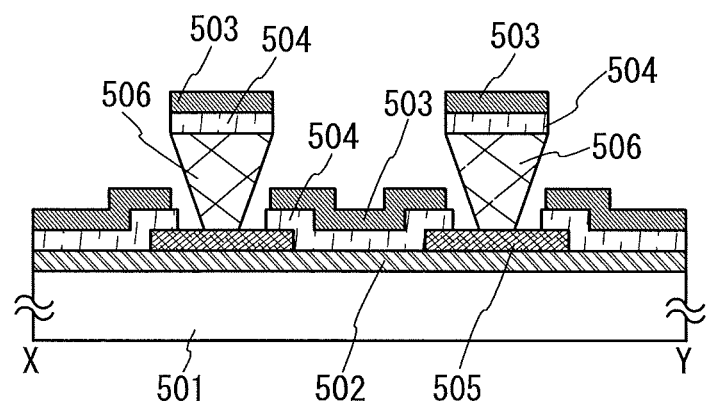

Further, a light-emitting element of one embodiment of the present invention can be used for a passive matrix light-emitting device as well as the above active matrix light-emitting device. FIGS. 3A and 3B illustrate a perspective view and a cross-sectional view of a passive matrix light-emitting device including a light-emitting element of one embodiment of the present invention. Note that FIG. 3A is a perspective view of the light-emitting device, and FIG. 3B is a cross-sectional view taken along line X-Y of FIG. 3A.

In FIGS. 3A and 3B, an EL layer 504 is provided between a first electrode 502 and a second electrode 503 over a substrate 501. An end portion of the first electrode 502 is covered with an insulating layer 505. In addition, a partition layer 506 is provided over the insulating layer 505. The sidewalls of the partition layer 506 slope so that a distance between both the sidewalls is gradually narrowed toward the surface of the substrate. In other words, a cross section taken along the direction of the short side of the partition layer 506 is trapezoidal, and the base (side in contact with the insulating layer 505) is shorter than the upper side (side not in contact with the insulating layer 505). With the partition layer 506 provided in such a way, a defect of a light-emitting element due to crosstalk or the like can be prevented.

Thus, the light-emitting device which includes the light-emitting element of one embodiment of the present invention can be obtained.

The light-emitting devices described in this embodiment are formed using the light-emitting element of one embodiment of the present invention, and accordingly, the light-emitting devices can have low power consumption.

Note that this embodiment can be implemented in appropriate combination with any of the other embodiments.

Embodiment 3

In this embodiment, with reference to FIGS. 4A to 4E and FIGS. 5A and 5B, examples of a variety of electronic devices and lighting devices that are each completed by the use of a light-emitting device of one embodiment of the present invention will be described.

Examples of the electronic devices are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pachinko machines, and the like.

An electronic device or a lighting device that has a light-emitting portion with a curved surface can be obtained with a light-emitting element including any of the heterocyclic compounds of embodiments of the present invention, which is fabricated over a substrate having flexibility.

In addition, an electronic device or a lighting device that has a see-through light-emitting portion can be obtained with a light-emitting element including any of the heterocyclic compounds of embodiments of the present invention, in which a pair of electrodes are formed using a material having a property of transmitting visible light.

Further, a light-emitting device to which one embodiment of the present invention is applied can also be applied to lighting for motor vehicles, examples of which are lighting for a dashboard, a windshield, a ceiling, and the like.

Figure 4A:
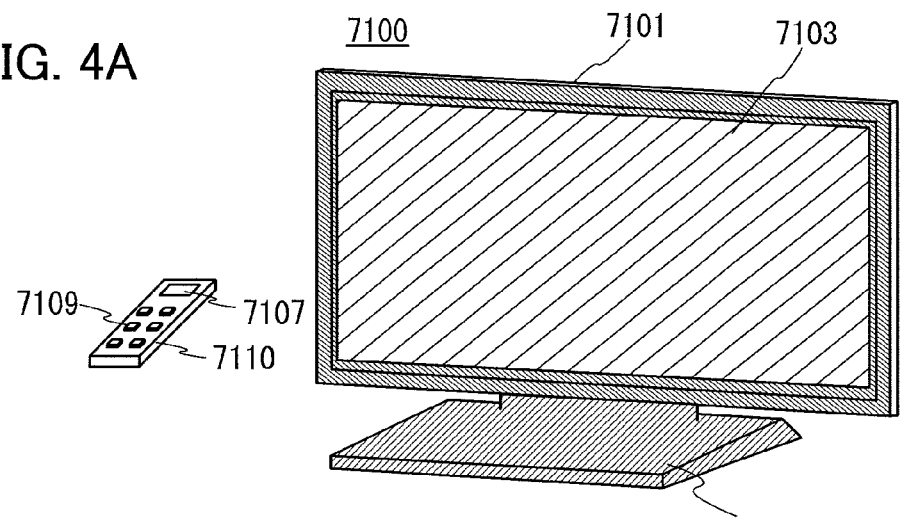
FIGS. 4A to 4E each illustrate an electronic device of one embodiment of the present invention.

In FIG. 4A, an example of a television device is illustrated. In a television device 7100, a display portion 7103 is incorporated in a housing 7101. The display portion 7103 is capable of displaying images, and the light-emitting device can be used for the display portion 7103. In addition, here, the housing 7101 is supported by a stand 7105.

The television device 7100 can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, general television broadcasting can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 4B:
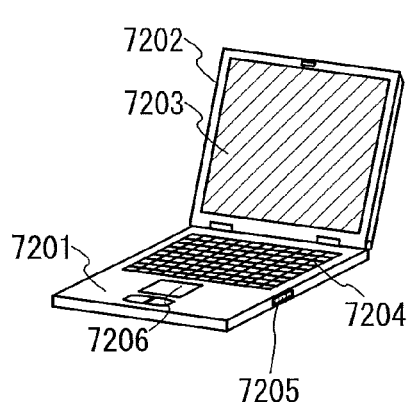

In FIG. 4B, a computer is illustrated, which includes a main body 7201, a housing 7202, a display portion 7203, a keyboard 7204, an external connection port 7205, a pointing device 7206, and the like. This computer is manufactured with the use of the light-emitting device for the display portion 7203.

Figure 4C:
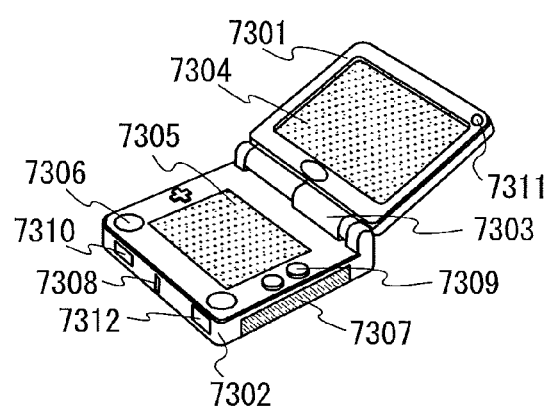

In FIG. 4C, a portable amusement machine is illustrated, which includes two housings, a housing 7301 and a housing 7302, connected with a joint portion 7303 so that the portable amusement machine can be opened or closed. A display portion 7304 is incorporated in the housing 7301 and a display portion 7305 is incorporated in the housing 7302. In addition, the portable amusement machine illustrated in FIG. 4C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substances, sound, time, hardness, electric field, current, voltage, electric power, radiation, flow rate, humidity, gradient, oscillation, odor, or infrared rays), and a microphone 7312), and the like. It is needless to say that the structure of the portable amusement machine is not limited to the above as long as the light-emitting device is used for at least either the display portion 7304 or the display portion 7305, or both, and may include other accessories as appropriate. The portable amusement machine illustrated in FIG. 4C has a function of reading out a program or data stored in a storage medium to display it on the display portion, and a function of sharing information with another portable amusement machine by wireless communication. Note that functions of the portable amusement machine illustrated in FIG. 4C are not limited to the above, and the portable amusement machine can have a variety of functions.

Figure 4D:
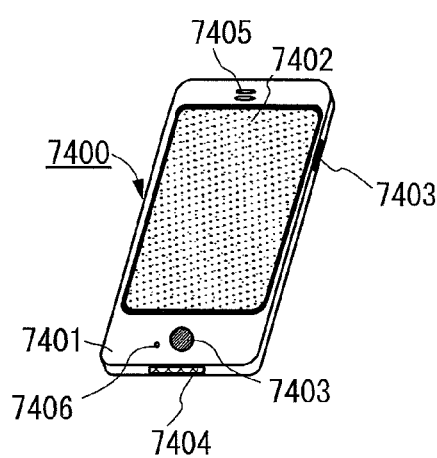

In FIG. 4D, an example of a cellular phone is illustrated. A cellular phone 7400 is provided with a display portion 7402 incorporated in a housing 7401, operation buttons 7403, an external connection port 7404, a speaker 7405, a microphone 7406, and the like. Note that the cellular phone 7400 is manufactured with the use of the light-emitting device for the display portion 7402.

When the display portion 7402 of the cellular phone 7400 illustrated in FIG. 4D is touched with a finger or the like, data can be input to the cellular phone 7400. Further, operations such as making a phone call and creating e-mail can be performed by touch on the display portion 7402 with a finger or the like.

There are mainly three screen modes of the display portion 7402. The first mode is a display mode mainly for displaying an image. The second mode is an input mode mainly for inputting information such as a character. The third mode is a display-and-input mode in which two modes of the display mode and the input mode are mixed.

For example, in the case of making a phone call or creating e-mail, the character input mode mainly for inputting a character is selected for the display portion 7402 so that a character displayed on a screen can be input. In this case, it is preferable to display a keyboard or number buttons on almost the entire screen of the display portion 7402.

When a detection device including a sensor for detecting inclination, such as a gyroscope or an acceleration sensor, is provided inside the cellular phone 7400, display on the screen of the display portion 7402 can be automatically changed by determining the orientation of the cellular phone 7400 (whether the cellular phone is placed horizontally or vertically for a landscape mode or a portrait mode).

The screen modes are switched by touch on the display portion 7402 or operation with the operation buttons 7403 of the housing 7401. The screen modes can also be switched depending on kinds of images displayed on the display portion 7402. For example, when a signal for an image to be displayed on the display portion is for moving images, the screen mode is switched to the display mode; when the signal is for text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, so that personal identification can be performed. Furthermore, by provision of a backlight or a sensing light source emitting near-infrared light for the display portion, an image of a finger vein, a palm vein, or the like can also be taken.

Figure 4E:
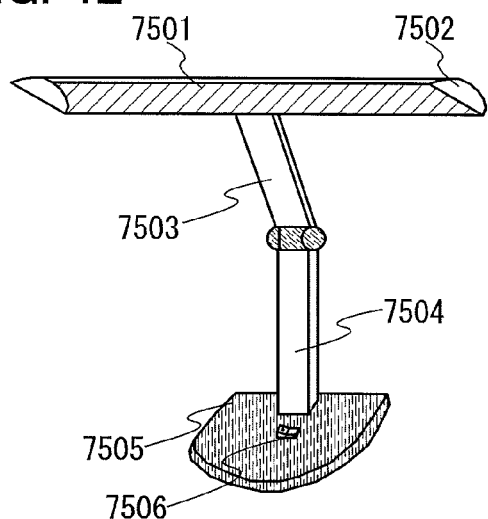

In FIG. 4E, a desk lamp 603 is illustrated, which includes a lighting portion 7501, a shade 7502, an adjustable atm 7503, a support 7504, a base 7505, and a power switch 7506. The desk lamp is manufactured with the use of the light-emitting device for the lighting portion 7501. Note that the "lighting device" also includes ceiling lights, wall lights, and the like.

Figure 5A:
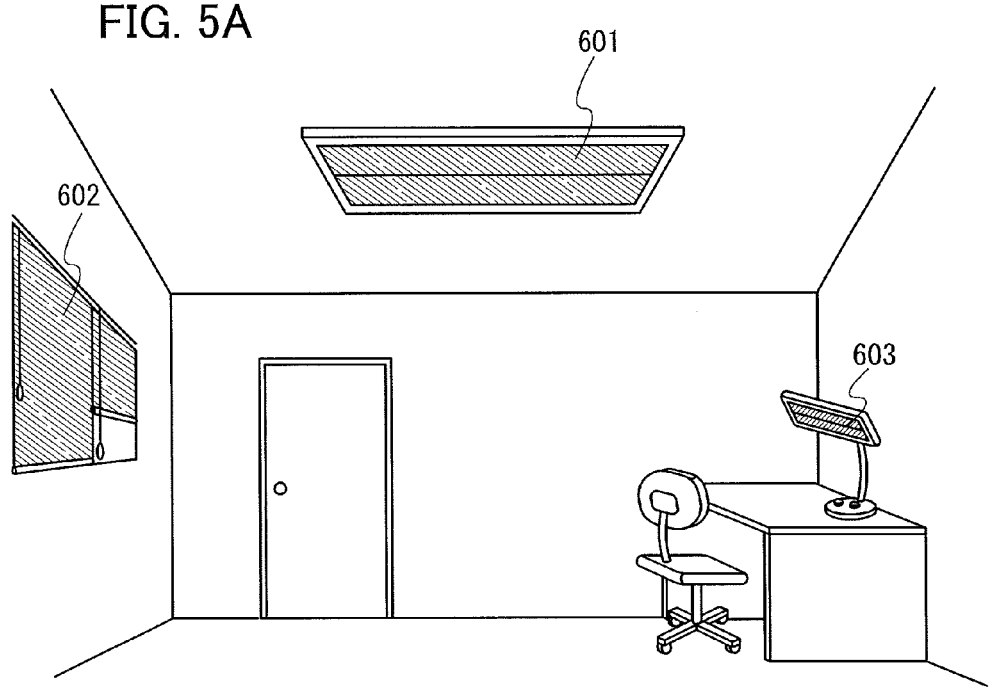
FIGS. 5A and 5B illustrate lighting devices of embodiments of the present invention.

In FIG. 5A, an example in which the light-emitting device is used for an interior lighting device 601 is illustrated. Since the light-emitting device can have a larger area, it can be used as a lighting device having a large area. Furthermore, the light-emitting device can be used as a roll-type lighting device 602. As illustrated in FIG. 5A, the desk lamp 603 described with reference to FIG. 4E may also be used in a room provided with the interior lighting device 601.

Figure 5B:
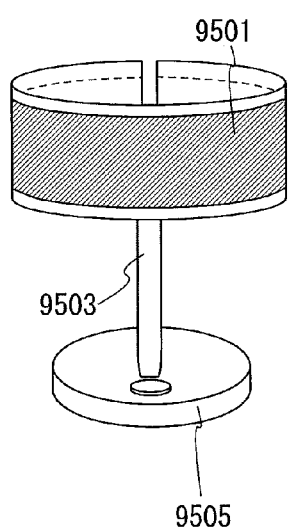

In FIG. 5B, an example of another lighting device is illustrated. A table lamp illustrated in FIG. 5B includes a lighting portion 9501, a support 9503, a support base 9505, and the like. The lighting portion 9501 includes any of the heterocyclic compounds of embodiments of the present invention. Thus, a lighting device that has a curved surface or a lighting portion that can be flexibly bent can be provided by fabrication of a light-emitting element over a substrate having flexibility. Such use of a flexible light-emitting device for a lighting device enables a place having a curved surface, such as the ceiling or dashboard of a motor vehicle, to be provided with the lighting device, as well as increases the degree of freedom in design of the lighting device.

In the above-described manner, electronic devices or lighting devices can be obtained by application of the light-emitting device. Application range of the light-emitting device is so wide that the light-emitting device can be applied to electronic devices in a variety of fields.

Note that the structure described in this embodiment can be combined with any of the structures described in the other embodiments as appropriate.

Example 1

Synthesis Example 1

This example will specifically describe a method of synthesizing 7-[3-(dibenzothiophen-4-yl)phenyl]dibenzo[f,h]quinoxaline (abbreviation: 7mDBTPDBq-II) represented by Structural Formula (101) in Embodiment 1. A structure of 7mDBTPDBq-II (abbreviation) is illustrated below.

[Chemical formula 60]

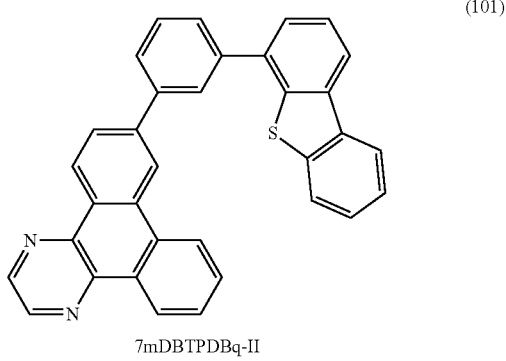

7mDBTPDBq-II

Synthesis Scheme (A-1) of 7mDBTPDBq-II (abbreviation) is shown below.

[Chemical formula 61]

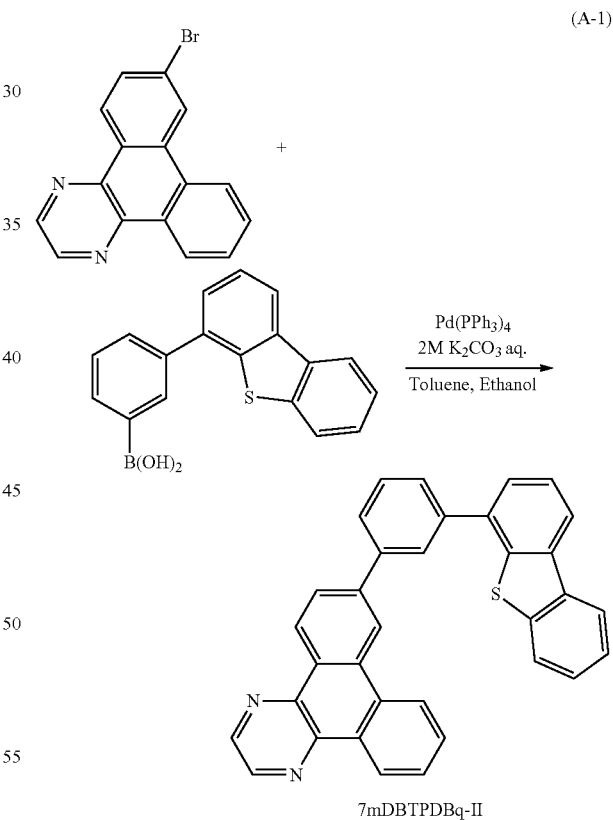

7mDBTPDBq-II

In a 50-mL three-neck flask were put 1.2 g (4.0 mmol) of 7-bromodibenzo[f,h]quinoxaline, 1.3 g (4.3 mmol) of 3-(dibenzothiophen-4-yl)phenylboronic acid, 20 mL of toluene, 4 mL of ethanol, and 4 mL of a 2M aqueous solution of potassium carbonate. This mixture was degassed by being stirred under reduced pressure, and the air in the flask was replaced with nitrogen. To this mixture was added 93 mg (81 μmol) of tetrakis(triphenylphosphine)palladium(0). This mixture was stirred at 80° C. under a nitrogen stream for 7 hours. After the predetermined time elapsed, water was added to the obtained mixture, and organic substances were extracted from the aqueous layer with toluene. The obtained solution of the extract combined with the organic layer was washed with water and a saturated aqueous solution of sodium chloride, followed by drying over magnesium sulfate. This mixture was gravity-filtered, and the filtrate was concentrated to give a solid. The obtained solid was purified by silica gel column chromatography (developing solvent: toluene), and further, recrystallization from toluene was performed to give 1.4 g of a pale yellow powder in a yield of 61%, which was the object of the synthesis.

By a train sublimation method, 1.4 g of the obtained pale yellow powder which was the object of the synthesis was purified. In the sublimation purification, the object of the synthesis was heated at 255° C. under a pressure of 2.5 Pa with a flow rate of argon gas of 5 mL/min. After the sublimation purification, 0.60 g of a pale yellow powder, which was the object of the synthesis, was obtained at a collection rate of 42%.

Nuclear magnetic resonance ($^1$H NMR) spectroscopy identified this compound as 7-[3-(dibenzothiophen-4-yl)phenyl]dibenzo[f,h]quinoxaline (abbreviation: 7mDBTP-DBq-II), which was the object of the synthesis.

$^1$H NMR data of the obtained compound are as follows:
$^1$H NMR (CDCl$_3$, 300 MHz): δ=7.47-7.51 (m, 2H), 7.62 (d, J=4.8 Hz, 2H), 7.68-7.92 (m, 6H), 8.08 (dd, J=8.4 Hz, 1.5 Hz, 1H), 8.19-8.24 (m, 3H), 8.74 (dd, J=7.8 Hz, 1.5 Hz, 1H), 8.91-8.93 (m, 3H), 9.24 (dd, J=7.2 Hz, 2.1 Hz, 1H), 9.31 (d, J=8.4 Hz, 1H).

Figure 6A:
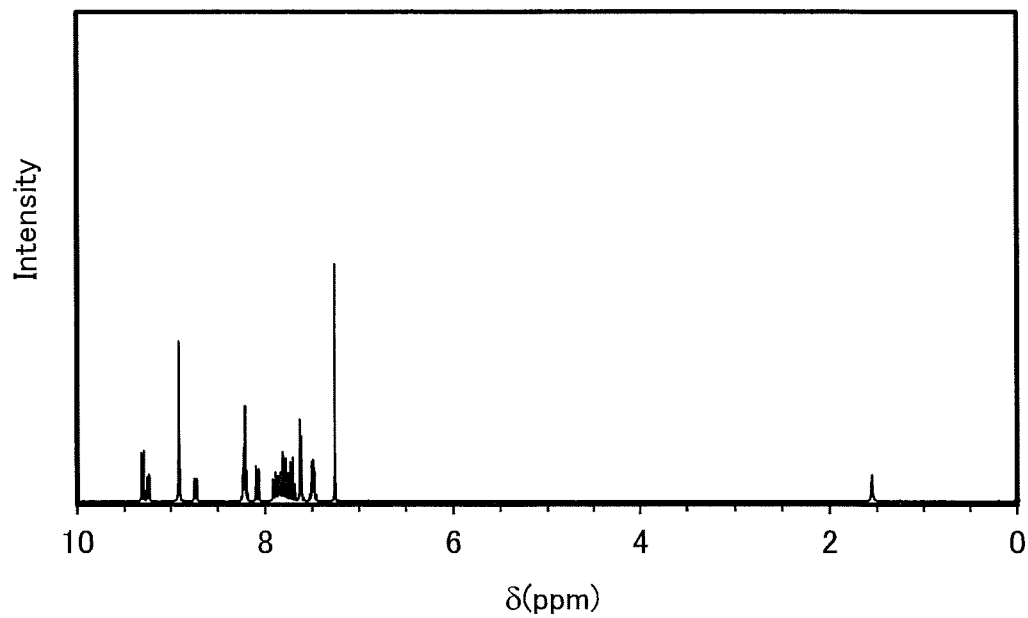
FIGS. 6A and 6B show $^1$H NMR charts of 7mDBTPDBq-II (abbreviation).
Figure 6B:
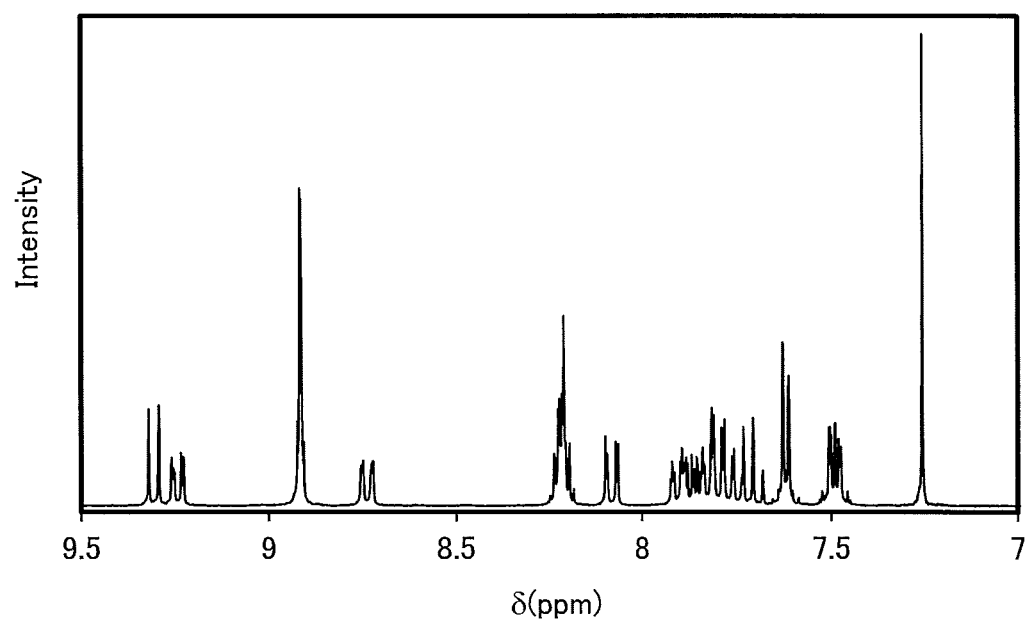

Further, $^1$H NMR charts are shown in FIGS. 6A and 6B. Note that FIG. 6B is an enlarged chart showing a range of 7.0 ppm to 9.5 ppm of FIG. 6A.

Next, 7mDBTPDBq-II (abbreviation) obtained in this example was analyzed by liquid chromatography mass spectrometry (LC/MS).

The analysis by LC/MS was carried out with Acquity UPLC (produced by Waters Corporation) and Xevo G2 T of MS (produced by Waters Corporation).

In the MS analysis, ionization was carried out by an electrospray ionization (ESI) method. Capillary voltage and sample cone voltage were set to 3.0 kV and 30 V, respectively. Detection was performed in a positive mode. A component which underwent the ionization under the above-mentioned conditions was collided with an argon gas in a collision cell to dissociate into product ions. Energy (collision energy) for the collision with argon was 70 eV. A mass range for the measurement was m/z=100-1200.

Figure 7:
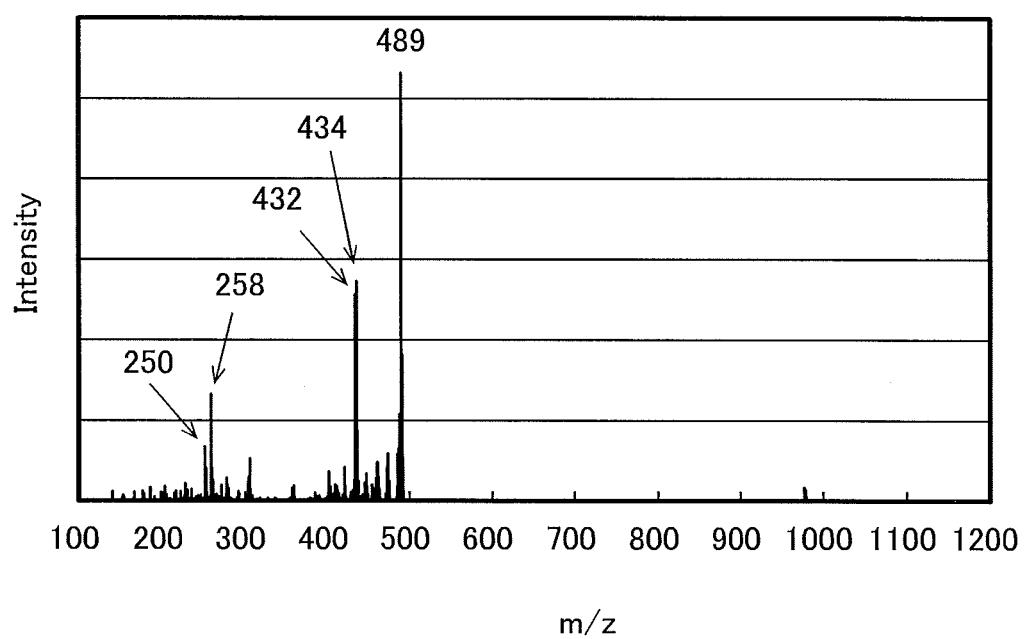
FIG. 7 shows results of LC/MS analysis of 7mDBTPDBq-II (abbreviation).

FIG. 7 shows results of the MS analysis. The results in FIG. 7 show that as for 7mDBTPDBq-II (abbreviation) which is one embodiment of the present invention, peaks of product ions are detected mainly around m/z=250, m/z=258, m/z=432, and m/z=434, and a peak derived from a precursor ion is detected around m/z=489. Here, in the analysis by LC/MS, "around" is used to express changes in values of product ions and precursor ions due to the existence and absence of hydrogen ions and the existence of isotopes, and these changes in values are in an acceptable range included in similar skeletons. Note that the results in FIG. 7 show characteristics derived from 7mDBTPDBq-II (abbreviation) and therefore can be regarded as important data for identifying 7mDBTPDBq-II (abbreviation) contained in a mixture.

Further, the peak of the product ion is detected around m/z=434, which is a value obtained by subtracting m/z=55 from the precursor ion around m/z=489. This peak represents one of characteristic product ions which show that the 2-position and the 3-position of the dibenzo[f,h]quinoxaline skeleton are unsubstituted.

Figure 8A:
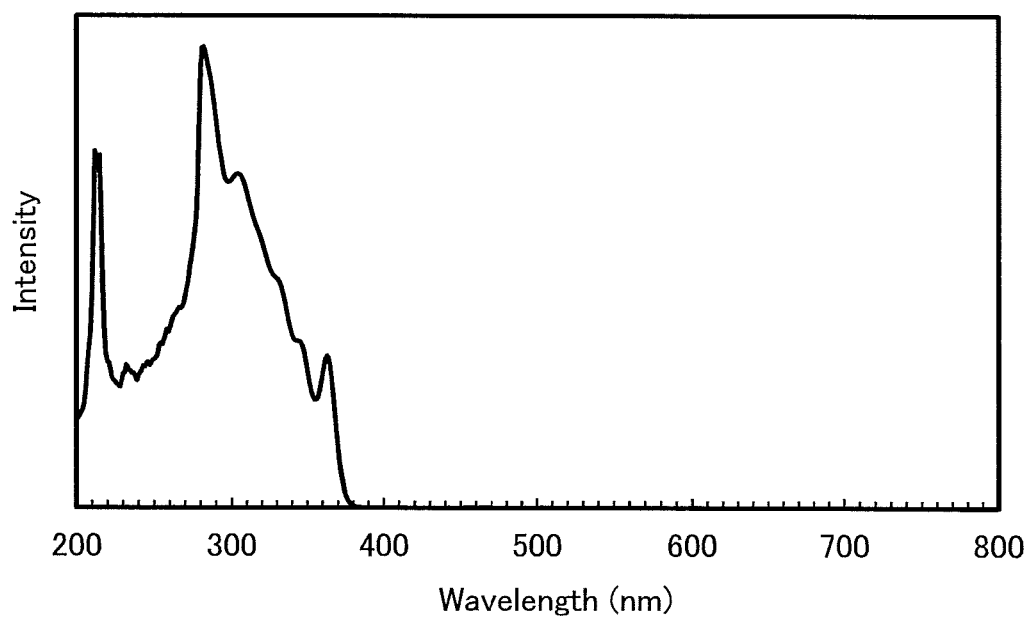
FIGS. 8A and 8B show an absorption spectrum and an emission spectrum of 7mDBTPDBq-II (abbreviation) in a toluene solution of 7mDBTPDBq-II.
Figure 8B:
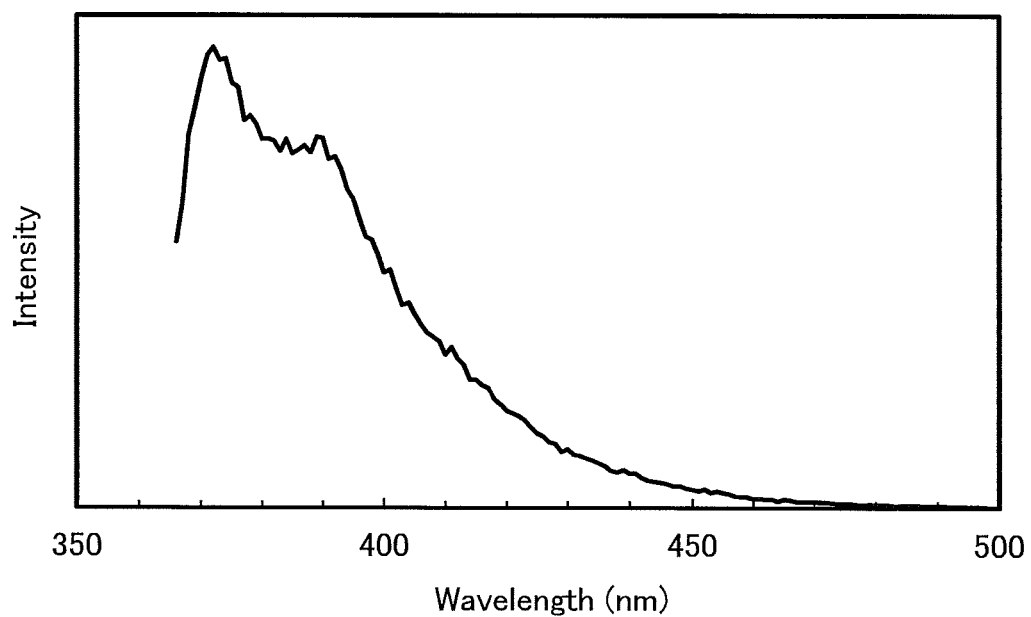
Figure 9A:
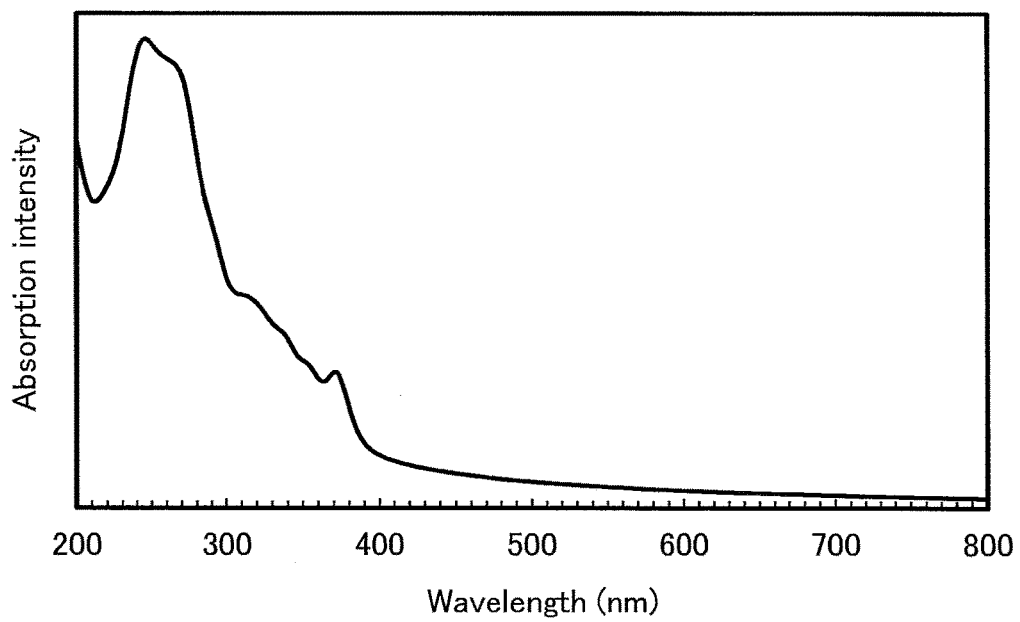
FIGS. 9A and 9B show an absorption spectrum and an emission spectrum of a thin film of 7mDBTPDBq-II (abbreviation).
Figure 9B:
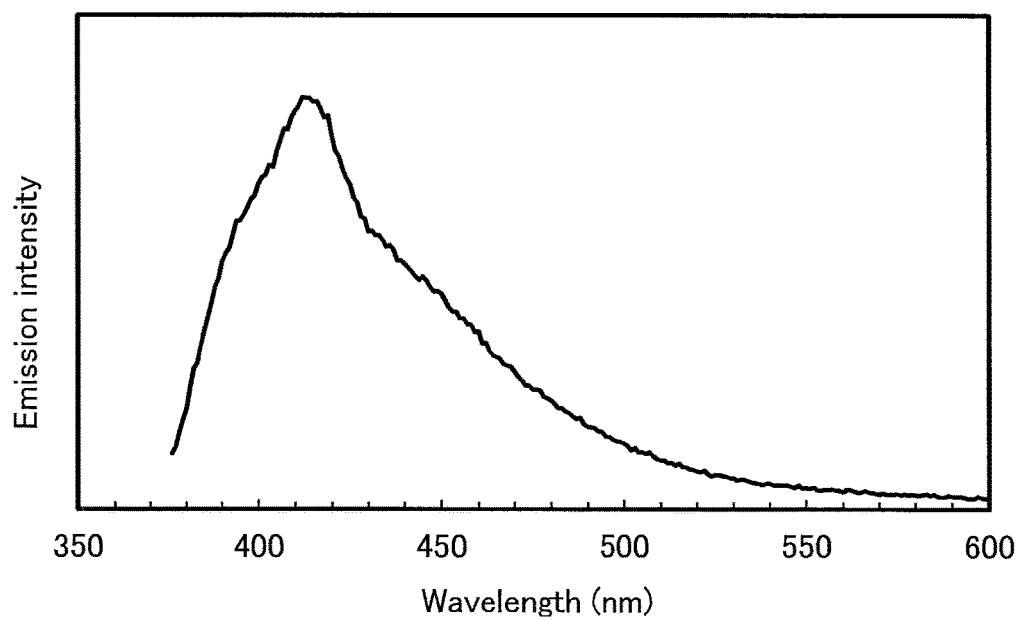

Further, FIG. 8A shows an absorption spectrum of 7mDBTPDBq-II (abbreviation) in a toluene solution of 7mDBTPDBq-II, and FIG. 8B shows an emission spectrum thereof. Furthermore, FIG. 9A shows an absorption spectrum of a thin film of 7mDBTPDBq-II (abbreviation), and FIG. 9B shows an emission spectrum thereof. The absorption spectrum was measured using an ultraviolet-visible spectrophotometer (V-550, produced by JASCO Corporation). The measurements were performed with samples prepared in such a way that the solution was put in a quartz cell and the thin film was obtained by evaporation onto a quartz substrate. The figures show the absorption spectrum of the solution which was obtained by subtracting the absorption spectra of quartz and toluene from the absorption spectra of quartz and the solution, and the absorption spectrum of the thin film which was obtained by subtracting the absorption spectrum of a quartz substrate from the absorption spectra of the quartz substrate and the thin film. In FIG. 8A and FIG. 9A, the horizontal axis represents wavelength (nm) and the vertical axis represents absorption intensity (arbitrary unit). In FIG. 8B and FIG. 9B, the horizontal axis represents wavelength (nm) and the vertical axis represents emission intensity (arbitrary unit). In the case of the toluene solution, absorption peaks are around 304 nm and 363 nm, and emission wavelength peaks are at 372 nm and 389 nm (excitation wavelength: 360 nm). In the case of the thin film, absorption peaks are around 246 nm, 263 nm, 312 nm, 335 nm, 350 nm, and 371 nm, and an emission wavelength peak is at 413 mu (excitation wavelength: 371 nm).

Example 2

Synthesis Example 2

This example will specifically describe a method of synthesizing 7-[3'-(dibenzothiophen-4-yl)biphenyl-3-yl]dibenzo[f,h]quinoxaline (abbreviation: 7mDBTBPDBq-II) represented by Structural Formula (109) in Embodiment 1. A structure of 7mDB1BPDBq-II (abbreviation) is illustrated below.

[Chemical formula 62]

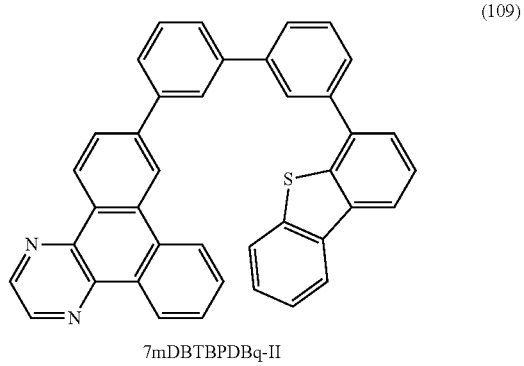

(109)

7mDBTBPDBq-II

Synthesis Scheme (B-1) of 7mDBTBPDBq-II (abbreviation) is shown below.

[Chemical formula 63]

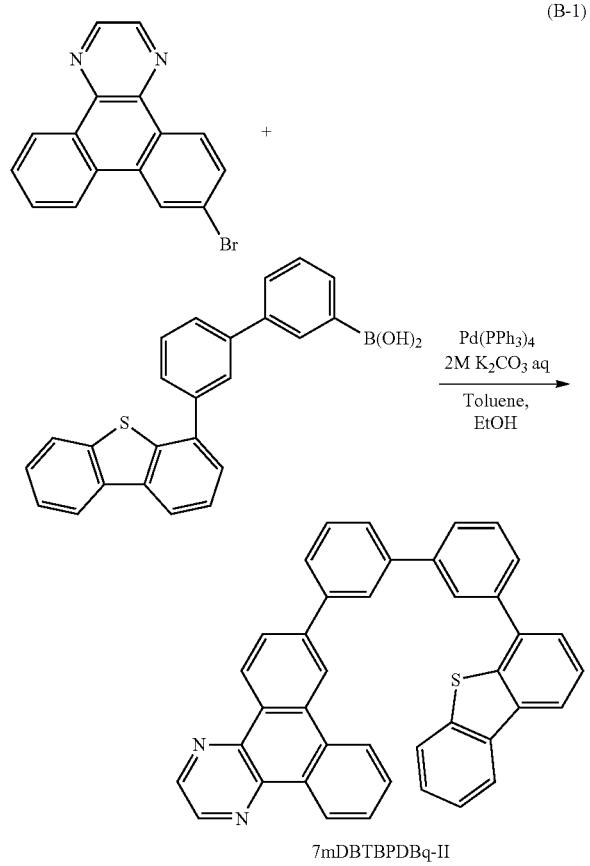

7mDBTBPDBq-II

In a 100-mL three-neck flask were put 0.71 g (2.3 mmol) of 7-bromodibenzo[f,h]quinoxaline, 1.0 g (2.5 mmol) of 3-[3-(dibenzothiophen-4-yl)phenyl]phenylboronic acid, 30 mL of toluene, 3 mL of ethanol, and 3.5 mL of a 2M aqueous solution of potassium carbonate. This mixture was degassed by being stirred under reduced pressure, and the air in the flask was replaced with nitrogen. To this mixture was added 53 mg (46 μmol) of tetrakis(triphenylphosphine)palladium (0). This mixture was stirred at 80° C. under a nitrogen stream for 18 hours. Water was added to this mixture, and a solid precipitated in the system was collected by suction filtration to give a solid. Further, organic substances were extracted from the aqueous layer of the obtained filtrate with toluene. The obtained solution of the extract and the organic layer were combined and washed with an aqueous solution of sodium hydrogen carbonate and a saturated aqueous solution of sodium chloride, and the organic layer was dried over magnesium sulfate. The obtained mixture was gravity-filtered, and the filtrate was concentrated to give a solid. A toluene solution of these solids was suction-filtered through Celite (produced by Wako Pure Chemical Industries, Ltd., Catalog No. 531-16855) and alumina, and the filtrate was concentrated to give a solid. The obtained solid was purified by silica gel column chromatography (toluene:hexane=2:1), and further, recrystallization from toluene was performed to give 0.70 g of a pale yellow powder in a yield of 53%.

By a train sublimation method, 0.70 g of the obtained pale yellow powder was purified. In the sublimation purification, the pale yellow powder was heated at 280° C. for 20 hours under a pressure of 3.1 Pa with a flow rate of argon gas of 5 mL/min. After the sublimation purification, 0.62 g of a pale yellow powder, which was the object of the synthesis, was obtained at a collection rate of 88%.

Nuclear magnetic resonance ($^1$H NMR) spectroscopy identified this compound as 7-[3'-(dibenzothiophen-4-yl)biphenyl-3-yl]dibenzo[f,h]quinoxaline (abbreviation: 7mDBTBPDBq-II), which was the object of the synthesis.

$^1$H NMR data of the obtained compound are as follows: $^1$H NMR (CDCl$_3$, 300 MHz): δ=7.42-7.51 (m, 2H), 7.58-7.69 (m, 4H), 7.74-7.85 (m, 7H), 8.05 (dd, J=8.1 Hz, 1.5 Hz, 1H), 8.12-8.13 (m, 2H), 8.17-8.22 (m, 2H), 8.73-8.76 (m, 1H), 8.90-8.93 (m, 3H), 9.23-9.28 (m, 1H), 9.31 (d, J=8.4 Hz, 1H).

Figure 10A:
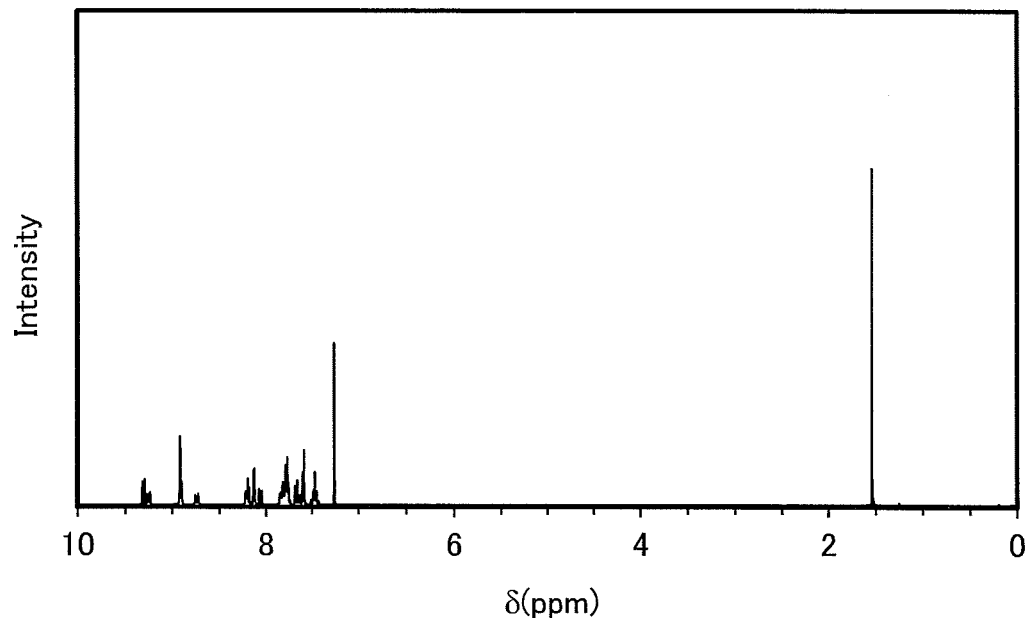
FIGS. 10A and 10B show $^1$H NMR charts of 7mDBTBPDBq-II (abbreviation).
Figure 10B:
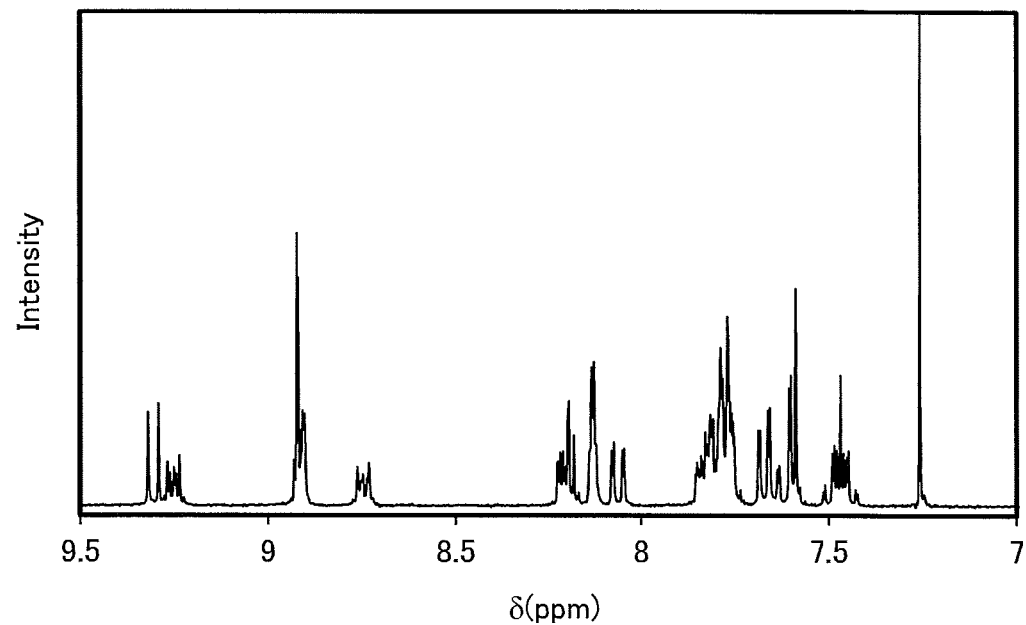

Further, $^1$H NMR charts are shown in FIGS. 10A and 10B. Note that FIG. 10B is an enlarged chart showing a range of 7.0 ppm to 9.5 ppm of FIG. 10A.

Next, 7mDBTBPDBq-II (abbreviation) obtained in this example was analyzed by liquid chromatography mass spectrometry (LC/MS).

The analysis by LC/MS was carried out with Acquity UPLC (produced by Waters Corporation) and Xevo G2 T of MS (produced by Waters Corporation).

In the MS analysis, ionization was carried out by an electrospray ionization (ESI) method. Capillary voltage and sample cone voltage were set to 3.0 kV and 30 V, respectively. Detection was performed in a positive mode. A component which underwent the ionization under the above-mentioned conditions was collided with an argon gas in a collision cell to dissociate into product ions. Energy (collision energy) for the collision with argon was 70 eV. A mass range for the measurement was m/z=100-1200.

Figure 11:
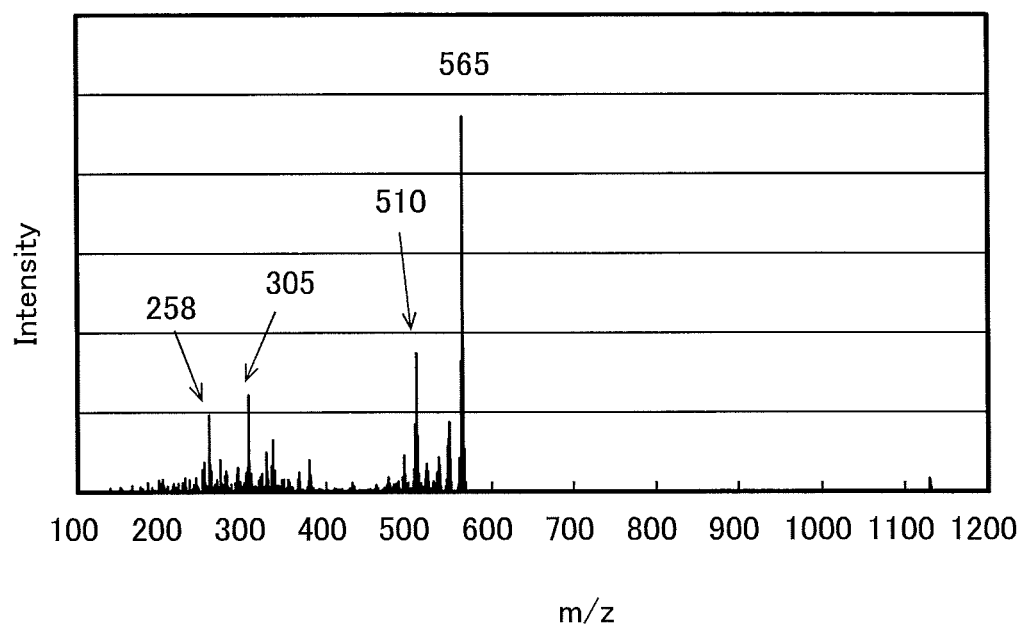
FIG. 11 shows results of LC/MS analysis of 7mDBTBPDBq-II (abbreviation).

FIG. 11 shows results of the MS analysis. The results in FIG. 11 show that as for 7mDBTBPDBq-II (abbreviation) which is one embodiment of the present invention, peaks of product ions are detected mainly around m/z=258, m/z=305, and m/z=510, and a peak derived from a precursor ion is detected around m/z=565. Here, in the analysis by LC/MS, "around" is used to express changes in values of product ions and precursor ions due to the existence and absence of hydrogen ions and the existence of isotopes, and these changes in values are in an acceptable range included in similar skeletons. Note that the results in FIG. 11 show characteristics derived from 7mDBTBPDBq-II (abbreviation) and therefore can be regarded as important data for identifying 7mDBTBPDBq-II (abbreviation) contained in a mixture.

Further, the peak of the product ion is detected around m/z=510, which is a value obtained by subtracting m/z=55 from the precursor ion around m/z=565. The peak suggests a product ion in which NC$_2$H$_2$N (from the nitrogen atom at the 1-position to the nitrogen atom at the 4-position) is removed from the dibenzo[f,h]quinoxaline skeleton as a result of cleavage of bonds of j and d of the dibenzo[f,h]quinoxaline skeleton. That is, this peak suggests one of characteristic product ions which show that the 2-position and the 3-position of the dibenzo[f,h]quinoxaline skeleton are unsubstituted.

Figure 12A:
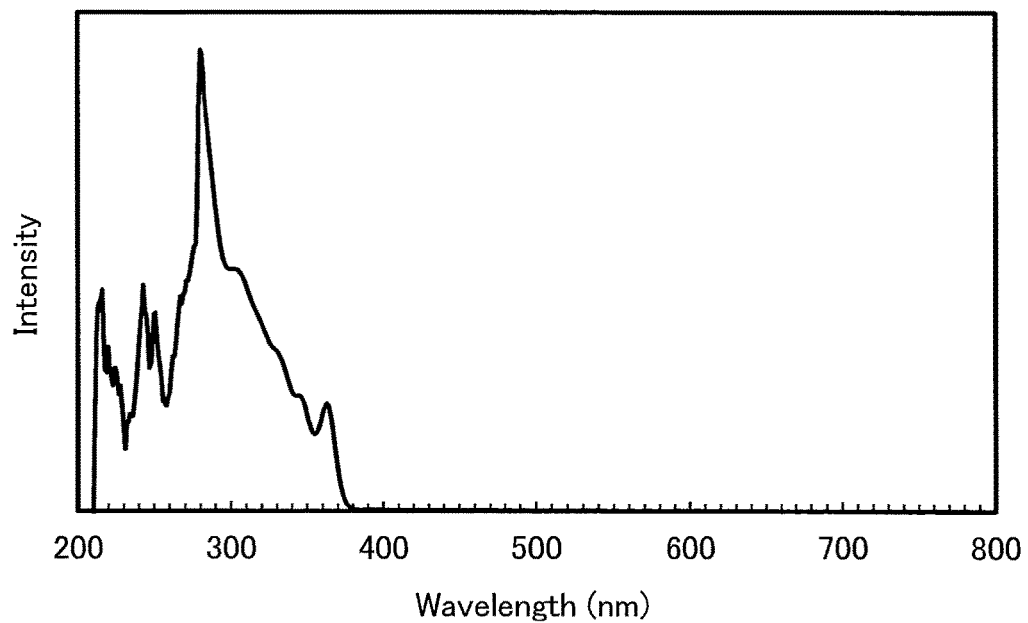
FIGS. 12A and 12B show an absorption spectrum and an emission spectrum of 7mDBTBPDBq-II (abbreviation) in a toluene solution of 7mDBTBPDBq-II.
Figure 12B:
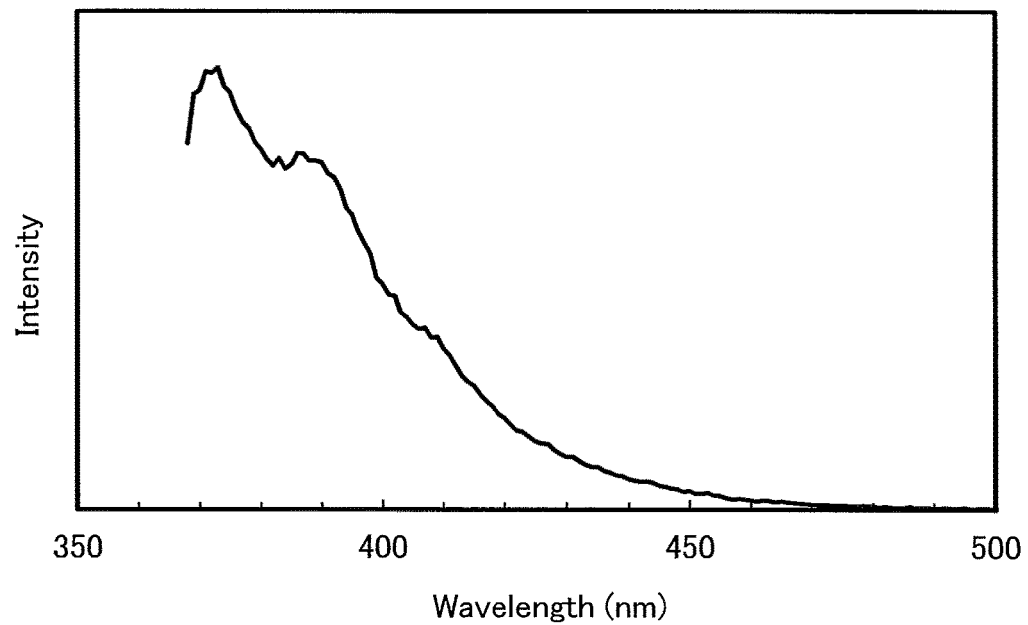
Figure 13A:
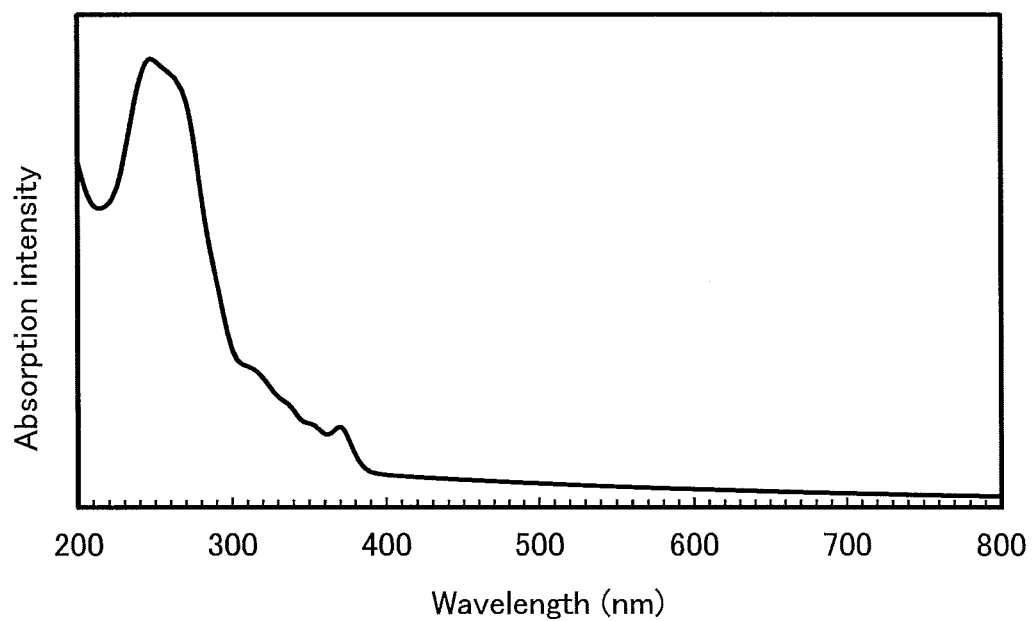
FIGS. 13A and 13B show an absorption spectrum and an emission spectrum of a thin film of 7mDBTBPDBq-II (abbreviation).
Figure 13B:
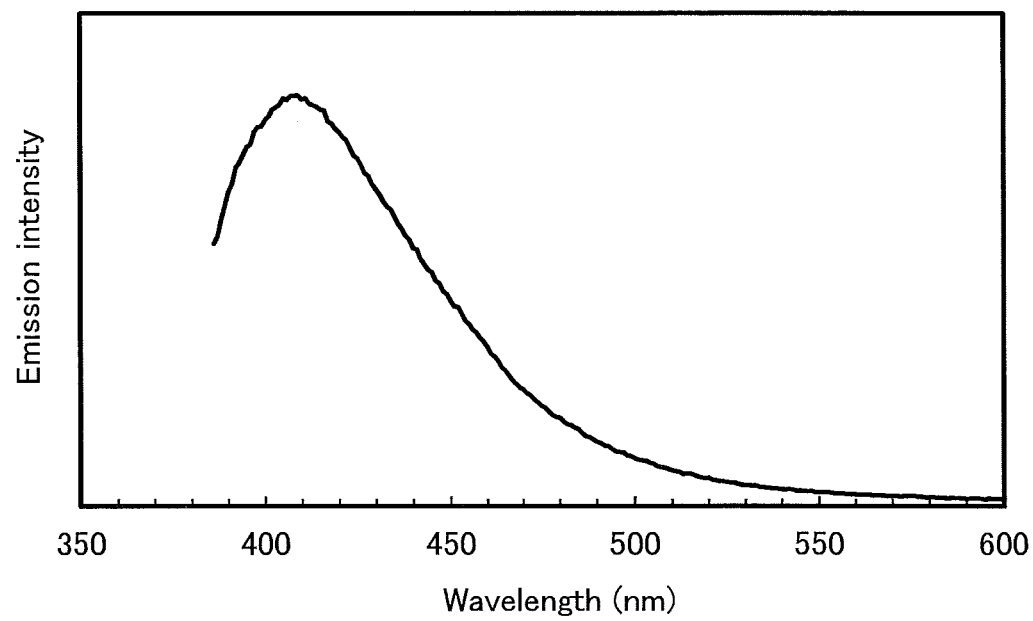

Further, FIG. 12A shows an absorption spectrum of 7mDBTBPDBq-II (abbreviation) in a toluene solution of 7mDBTBPDBq-II, and FIG. 12B shows an emission spectrum thereof. Furthermore, FIG. 13A shows an absorption spectrum of a thin film of 7mDBTBPDBq-II, and FIG. 13B shows an emission spectrum thereof. The absorption spectrum was measured using an ultraviolet-visible spectrophotometer (V-550, produced by JASCO Corporation). The measurements were performed with samples prepared in such a way that the solution was put in a quartz cell and the thin film was obtained by evaporation onto a quartz substrate. The figures show the absorption spectrum of the solution which was obtained by subtracting the absorption spectra of quartz and toluene from the absorption spectra of quartz and the solution, and the absorption spectrum of the thin film which was obtained by subtracting the absorption spectrum of a quartz substrate from the absorption spectra of the quartz substrate and the thin film. In FIG. 12A and FIG. 13A, the horizontal axis represents wavelength (nm) and the vertical axis represents absorption intensity (arbitrary unit). In FIG. 12B and FIG. 13B, the horizontal axis represents wavelength (nm) and the vertical axis represents emission intensity (arbitrary unit). In the case of the toluene solution, absorption peaks are around 281 nm, 303 nm, and 363 nm, and emission wavelength peaks are at 372 nm and 387 nm (excitation wavelength: 364 nm). In the case of the thin film, absorption peaks are around 247 nm, 260 nm, 312 nm, 331 nm, 351 nm, and 370 nm, and an emission wavelength peak is at 408 nm (excitation wavelength: 370 nm).

Example 3

Synthesis Example 3

This example will specifically describe a method of synthesizing 6-[3-(dibenzothiophen-4-yl)phenyl]dibenzo[f,h]quinoxaline (abbreviation: 6mDBTPDBq-II) represented by Structural Formula (701) in Embodiment 1. A structure of 6mDBTPDBq-II (abbreviation) is illustrated below.

[Chemical formula 64]

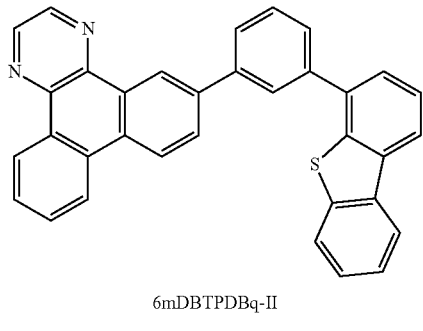

6mDBTPDBq-II (701)

Step 1: Method of Synthesizing 6-Iododibenzo[f,h]quinoxaline

Synthesis Scheme (C-1) of Step 1 is shown below.

[Chemical formula 65]

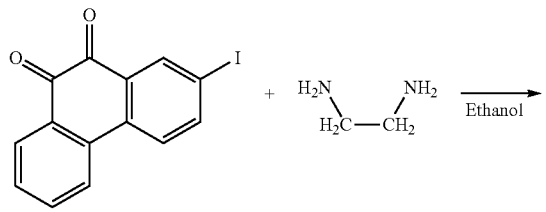

(C-1)

-continued

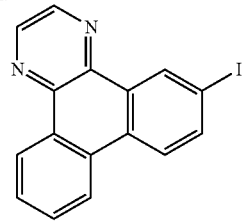

In a 200-mL three-neck flask, 10.6 g (32 mmol) of 2-iodo-9,10-phenanthrenedione, 3.7 g (62 mmol) of ethylenediamine, and 100 mL of ethanol were reacted by being heated and stirred while being refluxed under a nitrogen atmosphere for 5 hours. After the reaction, this reaction mixture solution was filtered and washed with water and toluene in this order. The obtained residue was purified by silica gel column chromatography. At this time, a mixed solution of toluene and hexane was used as a developing solvent for the chromatography. The obtained fraction was concentrated, and toluene was added thereto. The mixture was irradiated with ultrasonic waves and then recrystallized to give 3.0 g of a white powder that was an object of the synthesis in a yield of 26%.

The compound obtained in Step 1 was subjected to nuclear magnetic resonance ($^1$H NMR) spectroscopy. The measurement data are shown below.

$^1$H NMR (CDCl$_3$, 300 MHz): δ (ppm)=7.77-7.82 (m, 2H), 8.07 (dd, J=9.0 Hz, J=2.1 Hz, 1H), 8.34 (d, J=8.7 Hz, 1H), 8.68 (dd, J=7.2 Hz, J=2.1 Hz, 1H), 8.92 (dd, J=6.3 Hz, J=1.8 Hz, 2H), 9.22 (dd, J=7.2 Hz, J=1.5 Hz, 1), 9.59 (d, J=1.5 Hz, 1H).

Figure 14A:
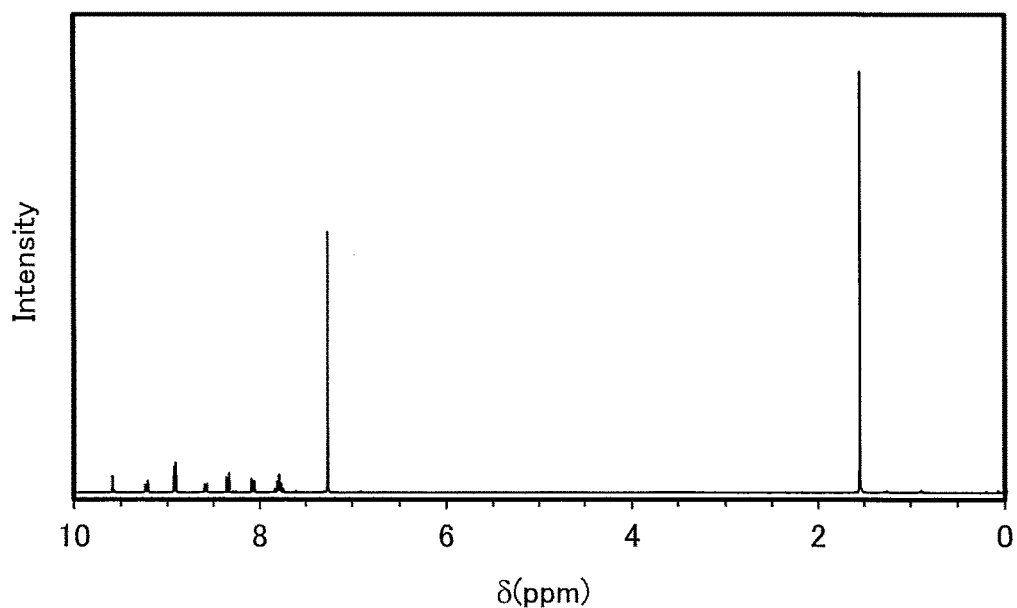
FIGS. 14A and 14B show $^1$H NMR charts of 6-iododibenzo[f,h]quinoxaline.
Figure 14B:
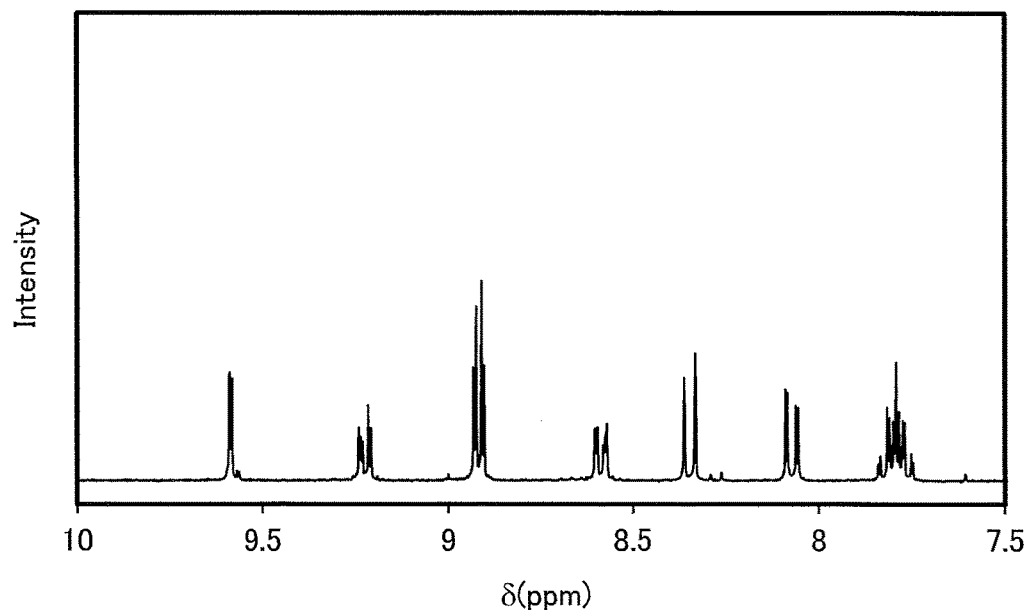

FIGS. 14A and 14B show the $^1$H NMR charts. Note that FIG. 14B is an enlarged chart showing a range of 7.5 ppm to 10.0 ppm of FIG. 14A. The measurement results confirmed that the object of the synthesis, 6-iododibenzo[f,h]quinoxaline, was obtained.

The molecular weight of the above compound was measured by a GC-MS detector (ITQ1100 ion trap GC-MS system, produced by Thermo Fisher Scientific Inc.). With this, a main peak at a molecular weight of 481.8 (the mode was EI+) was detected, and thus it was confirmed that the object of the synthesis, 6-iododibenzo[f,h]quinoxaline, was obtained.

Step 2: Method of Synthesizing 6-[3-(Dibenzothiophen-4-yl)phenyl]dibenzo[f,h]quinoxaline (abbreviation: 6mDBTPDBq-II)

Synthesis Scheme (C-2) of Step 2 is shown below.

[Chemical formula 66]

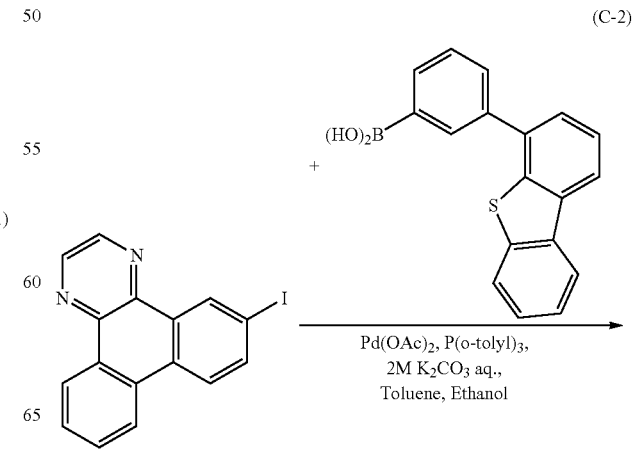

(C-2)

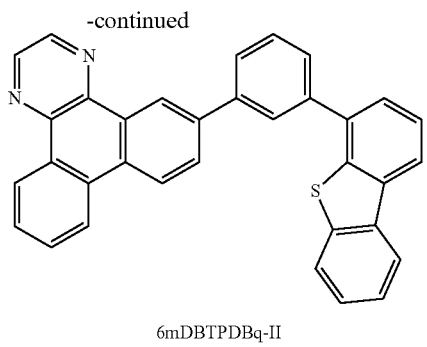

6mDBTPDBq-II

In a 200-mL three-neck flask, a mixture of 1.1 g (3.0 mmol) of 6-iododibenzo[f,h]quinoxaline, 1.0 g (3.3 mmol) of 3-(dibenzothiophen-4-yl)phenylboronic acid, 6.0 mg (30 μmol) of palladium(II) acetate, 9.0 mg (30 μmol) of tri(ortho-tolyl)phosphine, 30 mL of toluene, 3 mL of ethanol, and 3 mL of an aqueous solution of potassium carbonate (2 mol/L) was degassed while being stirred under reduced pressure, and was then reacted by being heated and stirred at 85° C. under a nitrogen atmosphere for 40 hours.

After the reaction, this reaction mixture solution was filtered and washed with water and toluene in this order. The obtained residue was purified by silica gel column chromatography. At this time, toluene was used as a developing solvent for the chromatography. The obtained fraction was concentrated, and toluene was added thereto. The mixture was irradiated with ultrasonic waves and then recrystallized to give 1.1 g of a pale yellow powder that was the object of the synthesis in a yield of 75%.

The Rf values of the object of the synthesis and 6-iododibenzo[f,h]quinoxaline were respectively 0.33 and 0.72, which were found by silica gel thin layer chromatography (TLC) (with a developing solvent of ethyl acetate and hexane in a ratio of 1:5).

Nuclear magnetic resonance ($^1$H NMR) spectroscopy identified the compound obtained in Step 2 as 6-[3-(dibenzothiophen-4-yl)phenyl]dibenzo[f,h]quinoxaline (abbreviation: 6mDBTPDBq-II), which was the object of the synthesis.

$^1$H NMR data of the obtained compound are as follows: $^1$H NMR (CDCl$_3$, 300 MHz): δ (ppm)=7.46-7.48 (m, 2H), 7.59-7.86 (m, 7H), 7.95 (d, J=7.8 Hz, 1H), 8.14-8.23 (m, 4H), 8.66 (d, J=7.8 Hz, 1H), 8.73 (d, J=8.7 Hz, 1H), 8.91 (s, 2H), 9.26 (d, J=8.4 Hz, 1H), 9.59 (s, 1H).

Figure 15A:
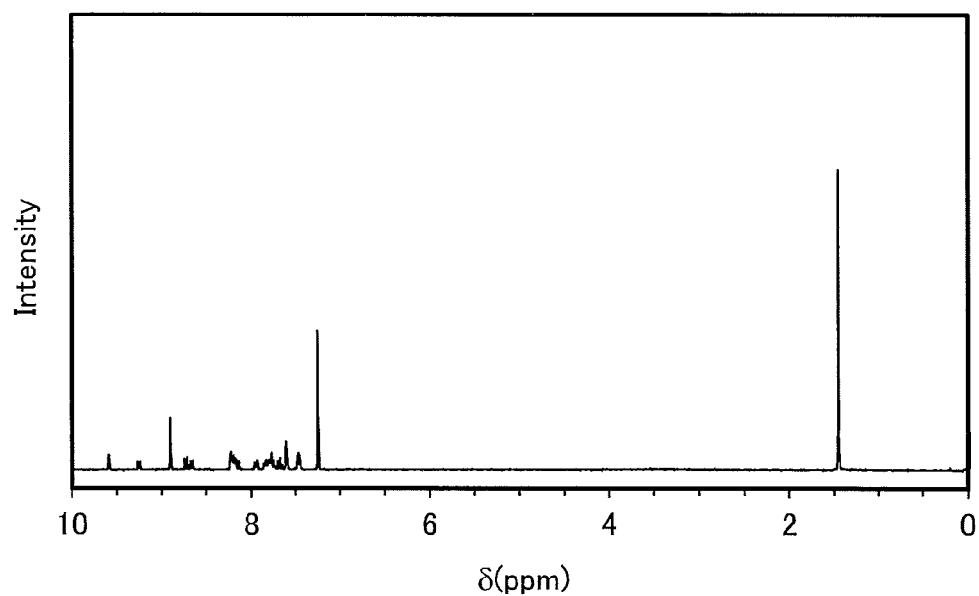
FIGS. 15A and 15B show $^1$H NMR charts of 6mDBTPDBq-II (abbreviation).
Figure 15B:
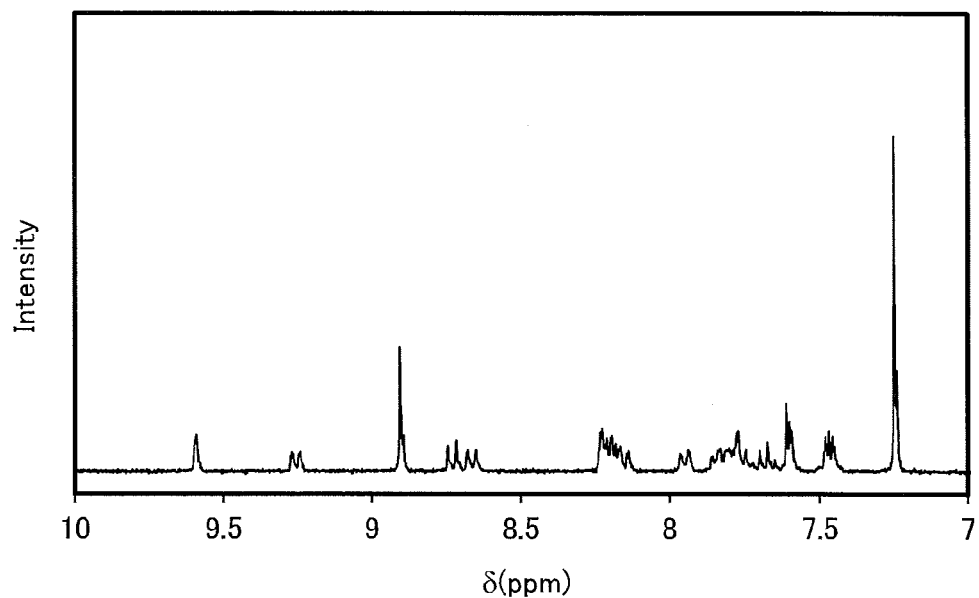

FIGS. 15A and 15B show the $^1$H NMR charts. Note that FIG. 15B is an enlarged chart showing a range of 7.0 ppm to 10.0 ppm of FIG. 15A. The measurement results confirmed that the object of the synthesis, 6mDBTPDBq-II (abbreviation), was obtained.

Next, 6mDBTPDBq-II (abbreviation) obtained in this example was analyzed by liquid chromatography mass spectrometry (LC/MS).

The analysis by LC/MS was carried out with Acquity UPLC (produced by Waters Corporation) and Xevo G2 T of MS (produced by Waters Corporation).

In the MS analysis, ionization was carried out by an electrospray ionization (ESI) method. Capillary voltage and sample cone voltage were set to 3.0 kV and 30 V, respectively. Detection was performed in a positive mode. A component which underwent the ionization under the above-mentioned conditions was collided with an argon gas in a collision cell to dissociate into product ions. Energy (collision energy) for the collision with argon was 70 eV. A mass range for the measurement was m/z=100-1200.

Figure 16:
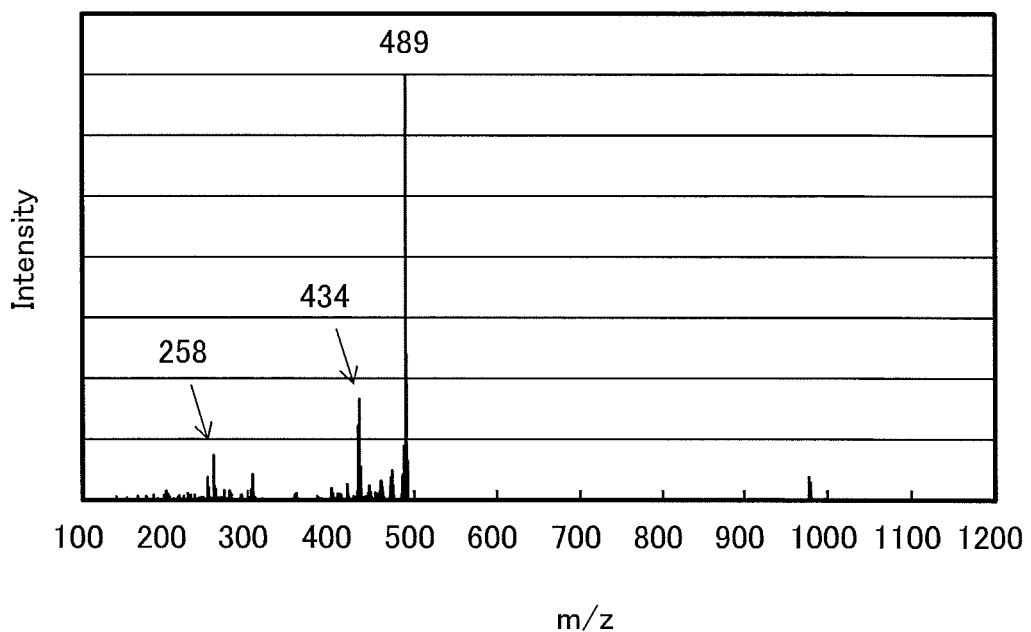
FIG. 16 shows results of LC/MS analysis of 6mDBTPDBq-II (abbreviation).

FIG. 16 shows results of the MS analysis. The results in FIG. 16 show that as for 6mDBTPDBq-II (abbreviation) which is one embodiment of the present invention, peaks of product ions are detected mainly around m/z=258 and m/z=434, and a peak derived from a precursor ion is detected around m/z=489. Here, in the analysis by LC/MS, "around" is used to express changes in values of product ions and precursor ions due to the existence and absence of hydrogen ions and the existence of isotopes, and these changes in values are in an acceptable range included in similar skeletons. Note that the results in FIG. 16 show characteristics derived from 6mDBTPDBq-II (abbreviation) and therefore can be regarded as important data for identifying 6mDBTPDBq-II (abbreviation) contained in a mixture.

Further, the peak of the product ion is detected around m/z=434, which is a value obtained by subtracting m/z=55 from the precursor ion around m/z=489. The peak suggests a product ion in which NC$_2$H$_2$N (from the nitrogen atom at the 1-position to the nitrogen atom at the 4-position) is removed from the dibenzo[f,h]quinoxaline skeleton as a result of cleavage of bonds of j and d of the dibenzo[f,h]quinoxaline skeleton. That is, this peak suggests one of characteristic product ions which show that the 2-position and the 3-position of the dibenzo[f,h]quinoxaline skeleton are unsubstituted.

The molecular weight of the above compound was measured by a TOF-MS detector (Waters Micromass LCT Premier, produced by Waters Corporation). A mixture solution containing acetonitrile and a 0.1% formic acid solution (a mixture ratio of acetonitrile to the formic acid solution, 80:20 (volume ratio)) was used as a solvent. Thus, a peak mainly from a compound with a molecular weight of 562 (the mode was ES+) was detected, so that it was confirmed that 6mDBTPDBq-II (abbreviation) that was the object of the synthesis was obtained.

Figure 17A:
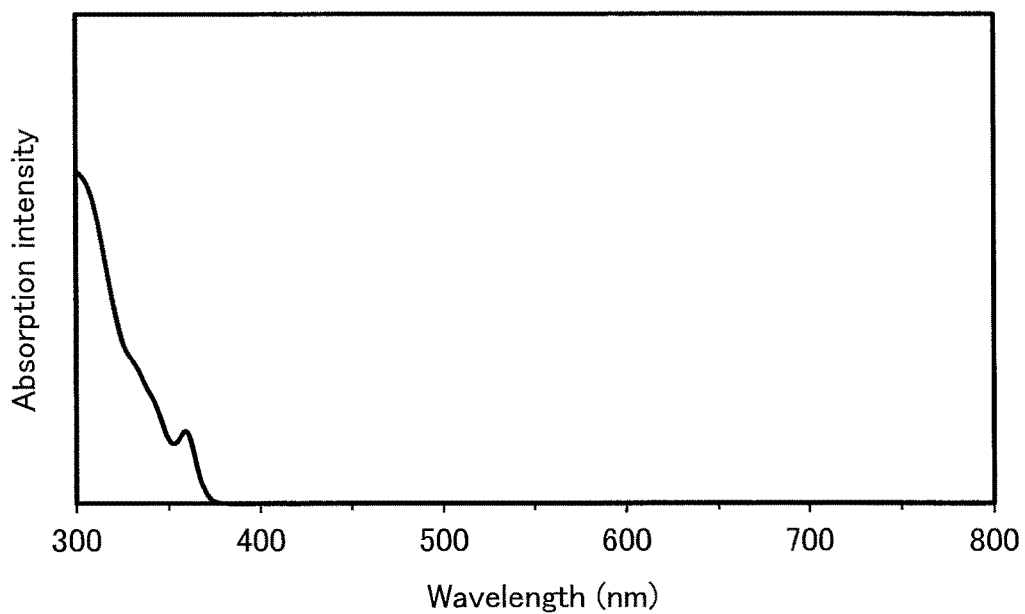
FIGS. 17A and 17B show an absorption spectrum and an emission spectrum of 6mDBTPDBq-II (abbreviation) in a toluene solution of 6mDBTPDBq-II.
Figure 17B:
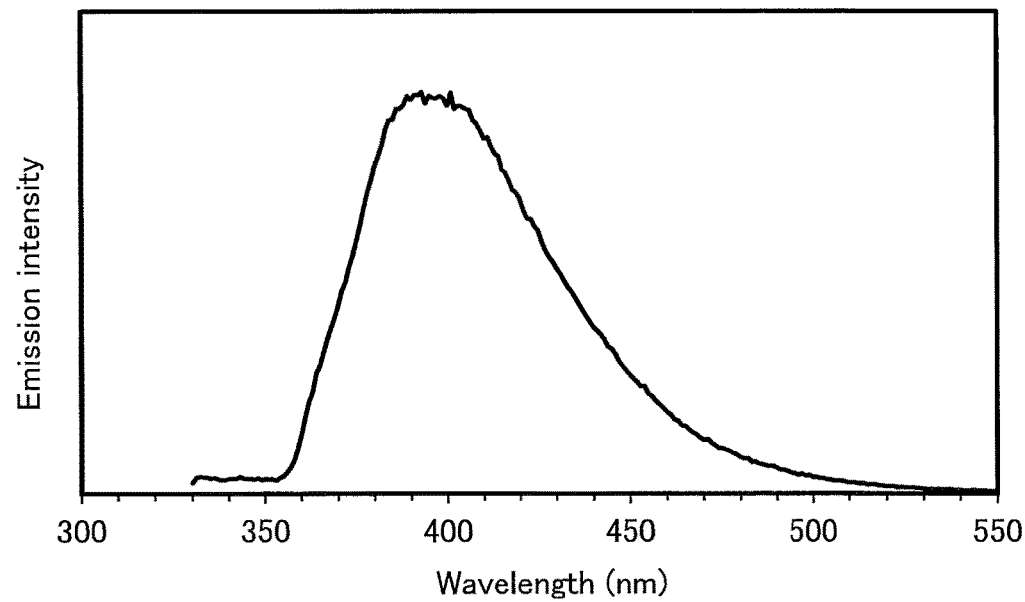
Figure 18A:
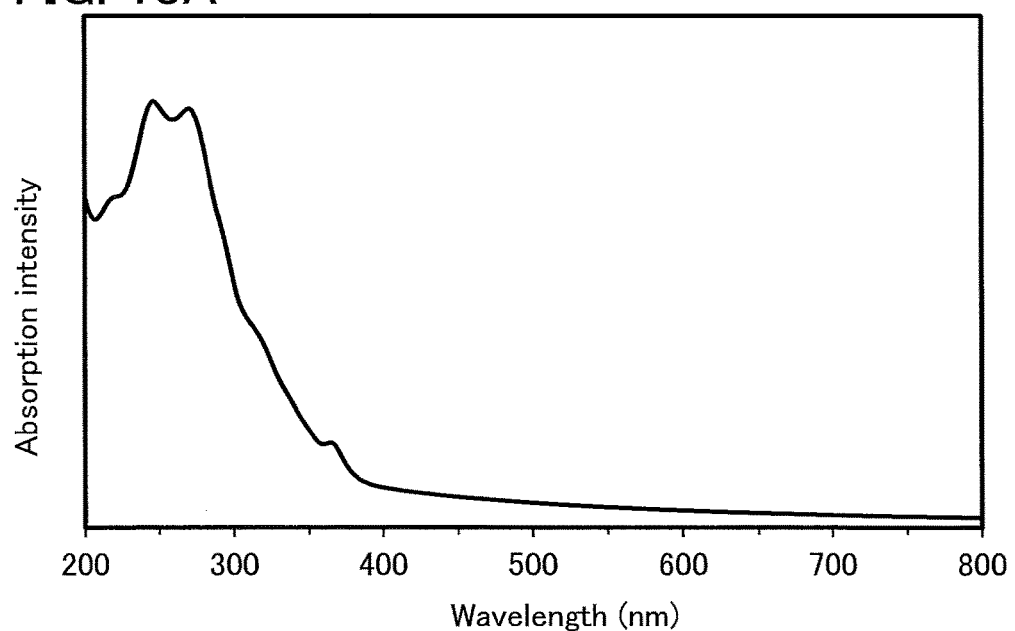
FIGS. 18A and 18B show an absorption spectrum and an emission spectrum of a thin film of 6mDBTPDBq-II (abbreviation).
Figure 18B:
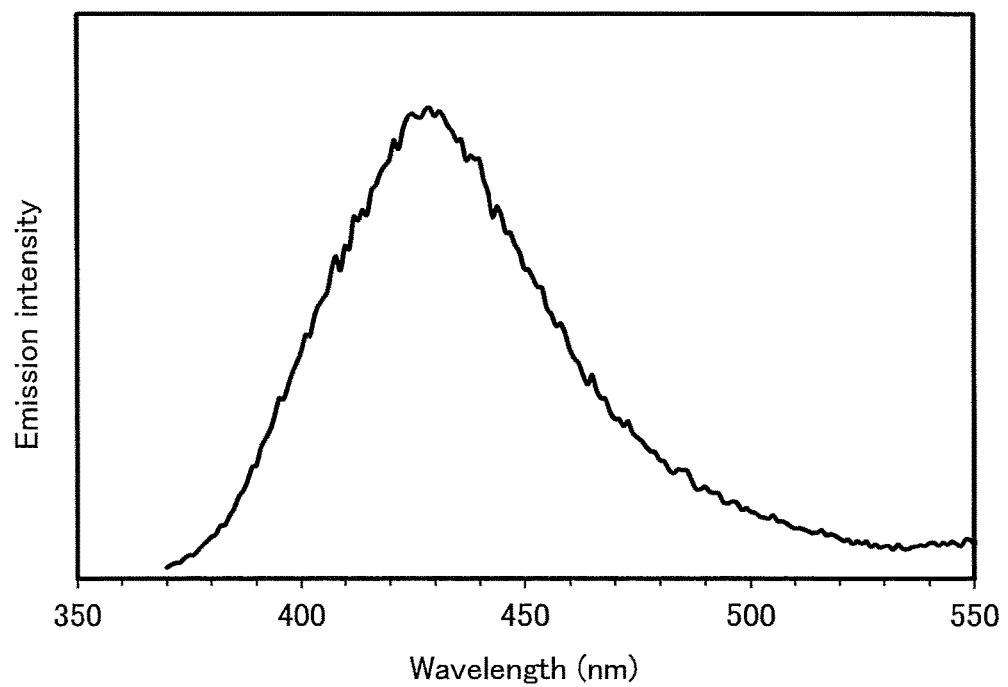

Further, FIG. 17A shows an absorption spectrum of 6mDBTPDBq-II (abbreviation) in a toluene solution of 6mDBTPDBq-II, and FIG. 17B shows an emission spectrum thereof. FIG. 18A shows an absorption spectrum of a thin film of 6mDBTPDBq-II (abbreviation), and FIG. 18B shows an emission spectrum thereof. The absorption spectrum was measured using an ultraviolet-visible spectrophotometer (V-550, produced by JASCO Corporation). The measurements were performed with samples prepared in such a way that the solution was put in a quartz cell and the thin film was obtained by evaporation onto a quartz substrate. The figures show the absorption spectrum of the solution which was obtained by subtracting the absorption spectra of quartz and toluene from the absorption spectra of quartz and the solution, and the absorption spectrum of the thin film which was obtained by subtracting the absorption spectrum of a quartz substrate from the absorption spectra of the quartz substrate and the thin film. In each of FIG. 17A and FIG. 18A, the horizontal axis represents wavelength (nm) and the vertical axis represents absorption intensity (arbitrary unit). In each of FIG. 17B and FIG. 18B, the horizontal axis represents wavelength (nm) and the vertical axis represents emission intensity (arbitrary unit). In the case of the toluene solution, an absorption peak is around 358 nm, and an emission wavelength peak is at 395 nm (excitation wavelength: 290 nm). In the case of the thin film, an absorption peak is around 365 nm, and an emission wavelength peak is at 429 nm (excitation wavelength: 366 nm).

Example 4

Synthesis Example 4

This example will describe a method of synthesizing 7,10-bis[3-(9H-carbazol-9-yl)phenyl]dibenzo[f,h]quinoxaline (abbreviation: 7,10mCzP2 DBq) represented by Structural Formula (818).

[Chemical formula 67]

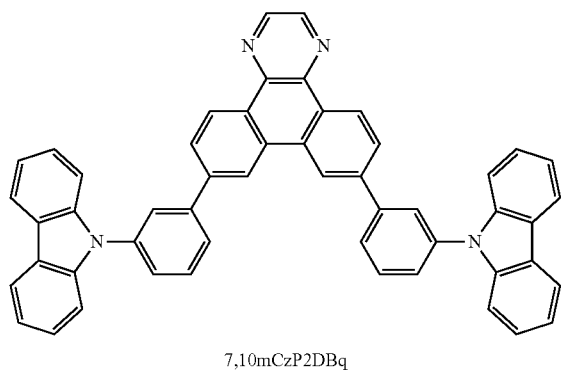

(818)

7,10mCzP2DBq

Synthesis of 7,10mCzP2 DBq (abbreviation)

Synthesis Scheme (D-1) of 7,10mCzP2 DBq (abbreviation) is shown below.

[Chemical formula 68]

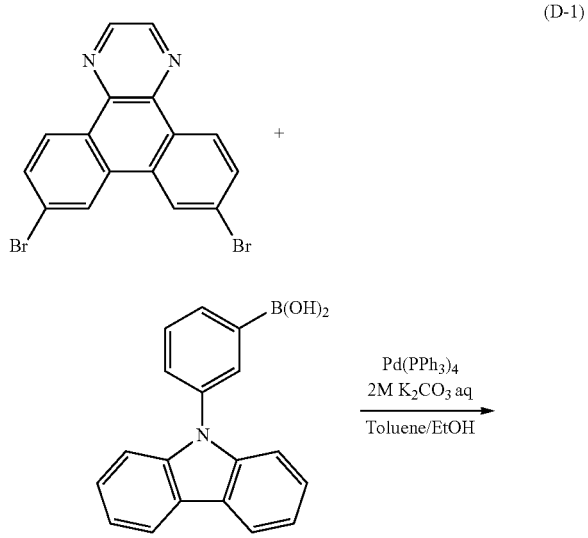

(D-1)

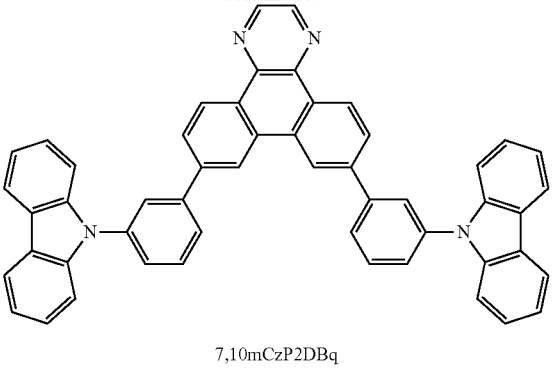

7,10mCzP2DBq

In a 100-mL three-neck flask were put 0.94 g (2.4 mmol) of 7,10-dibromodibenzo[f,h]quinoxaline, 1.5 g (5.2 mmol) of 3-(9H-carbazol-9-yl)phenylboronic acid, 56 mL of toluene, 6 mL of ethanol, and 4.0 mL of a 2M aqueous solution of potassium carbonate. The mixture was degassed by being stirred under reduced pressure, and the air in the flask was replaced with nitrogen. To this mixture was added 64 mg (0.06 mmol) of tetrakis(triphenylphosphine)palladium(0). The mixture was stirred at 80° C. under a nitrogen stream for 8 hours. After the predetermined time elapsed, the precipitated solid was separated by filtration to give a white solid. A toluene solution of the obtained solid was suction-filtered through alumina and Celite, and the filtrate was concentrated to give a white solid. The obtained solid was recrystallized from toluene to give a white solid. Ethanol was added, followed by irradiation with ultrasonic waves. The solid was collected by suction filtration, so that 0.75 g of a solid powder was obtained in a yield of 44%.

By a train sublimation method, 0.75 g of the obtained solid powder was purified. In the sublimation purification, the powder was heated at 330° C. under a pressure of 4.2 Pa with a flow rate of argon gas of 5.0 mL/min. After the sublimation purification, 0.54 g of a white powder, which was the object of the synthesis, was obtained at a collection rate of 72%.

Nuclear magnetic resonance ($^1$H NMR) spectroscopy identified this compound as 7,10-bis[3-(9H-carbazol-9-yl)phenyl]dibenzo[f,h]quinoxaline (abbreviation: 7,10mCzP2 DBq), which was the object of the synthesis.

$^1$H NMR data of the obtained substance are as follows: $^1$H NMR (CDCl$_3$, 500 MHz): δ (ppm)=7.23-7.29 (m, 4H), 7.42 (t, J=7.5 Hz, 4H), 7.54 (d, J=8.0 Hz, 4H), 7.66 (d, J=8.6 Hz, 2H), 7.79 (t, J=8.1 Hz, 2H), 7.93 (d, J=7.5 Hz, 2H), 8.03-8.07 (m, 4H), 8.18 (d, J=7.5 Hz, 4H), 8.94-8.95 (m, 4H), 9.35 (d, J=8.1 Hz, 2H).

Figure 19A:
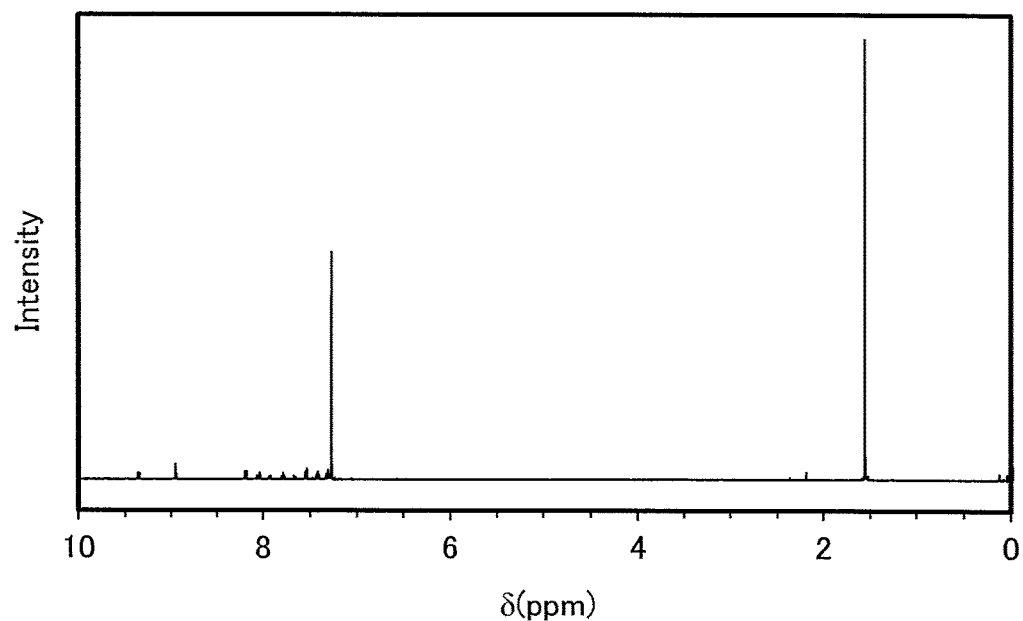
FIGS. 19A and 19B show $^1$H NMR charts of 7,10mCzP2 DBq (abbreviation).
Figure 19B:
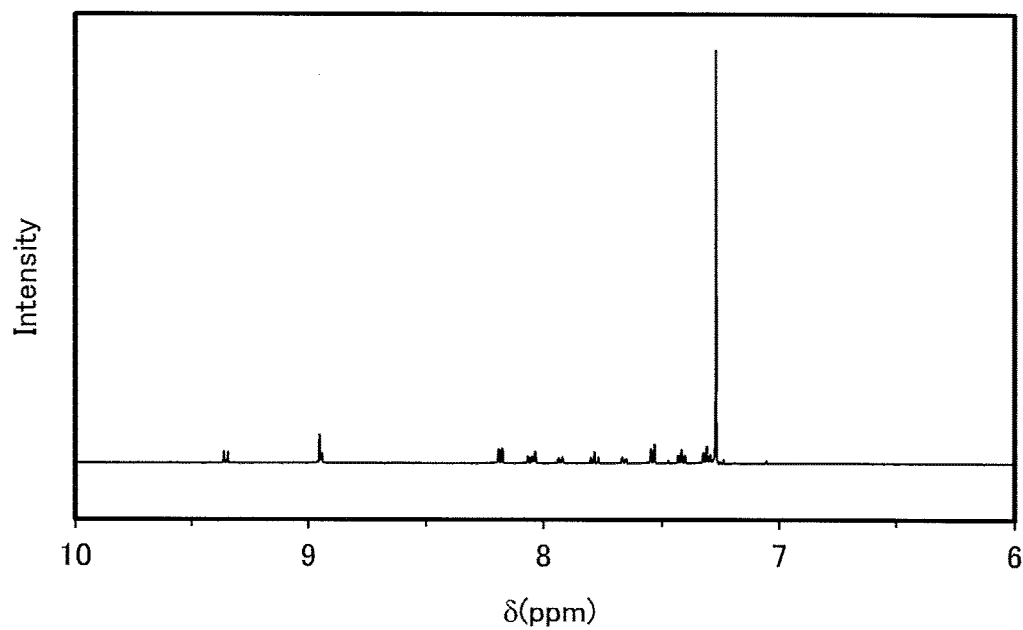

FIGS. 19A and 19B are $^1$H NMR charts. Note that FIG. 19B is an enlarged chart showing a range of 6.00 ppm to 10.0 ppm of FIG. 19A.

Next, 7,10mCzP2 DBq (abbreviation) obtained in this example was analyzed by liquid chromatography mass spectrometry (LC/MS).

The analysis by LC/MS was carried out with Acquity UPLC (produced by Waters Corporation) and Xevo G2 T of MS (produced by Waters Corporation).

In the MS analysis, ionization was carried out by an electrospray ionization (ESI) method. Capillary voltage and sample cone voltage were set to 3.0 kV and 30 V, respectively. Detection was performed in a positive mode. A component which underwent the ionization under the above-mentioned conditions was collided with an argon gas in a collision cell to dissociate into product ions. Energy (collision energy) for the collision with argon was 70 eV. A mass range for the measurement was m/z=100-1200.

Figure 20A:
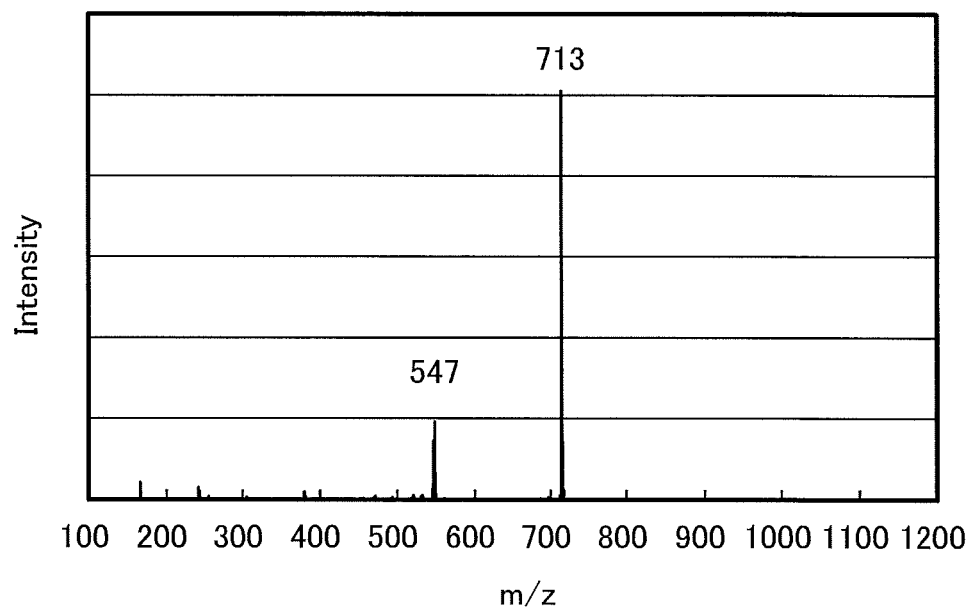
FIGS. 20A and 20B show results of LC/MS analysis of 7,10mCzP2 DBq (abbreviation).
Figure 20B:
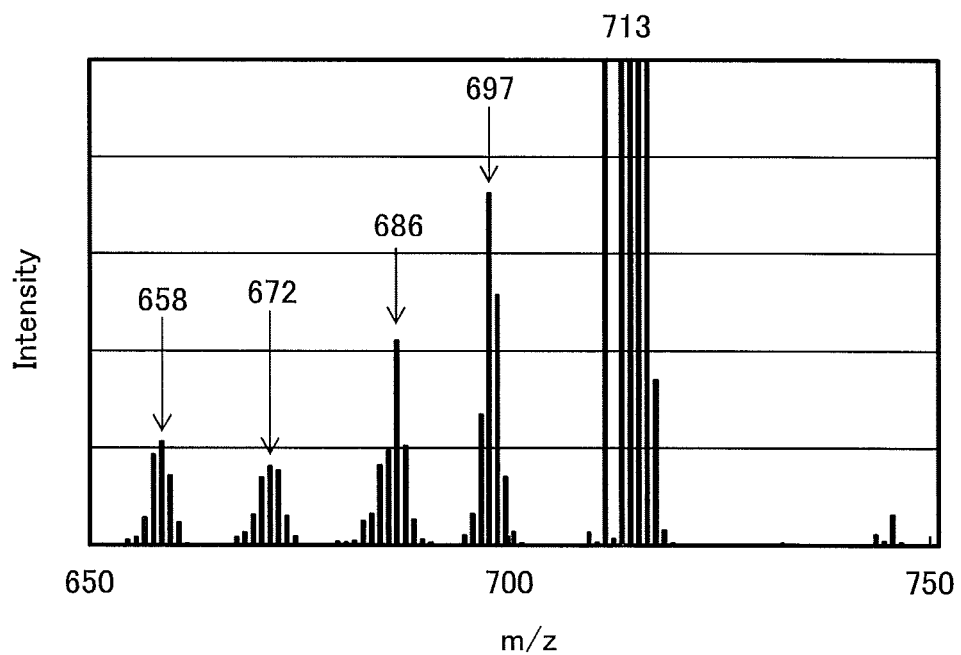

Results of the MS analysis are shown in FIGS. 20A and 20B. Note that in FIG. 20A, the horizontal axis shows a range of m/z=100-1200, and the vertical axis represents intensity (arbitrary unit). In FIG. 20B, a range of m/z=650-700 on the horizontal axis in FIG. 20A and the vertical axis in FIG. 20A are enlarged. The results in FIGS. 20A and 20B show that as for 7,10mCzP2 DBq (abbreviation) which is one embodiment of the present invention, peaks of product ions are detected mainly around m/z=547, m/z=658, m/z=672, m/z=686, and m/z=697, and a peak derived from a precursor ion is detected around m/z=713. Here, in the analysis by LC/MS, "around" is used to express changes in values of product ions and precursor ions due to the existence and absence of hydrogen ions and the existence of isotopes, and these changes in values are in an acceptable range included in similar skeletons. Note that the results in FIGS. 20A and 20B show characteristics derived from 7,10mCzP2 DBq (abbreviation) and therefore can be regarded as important data for identifying 7,10mCzP2 DBq (abbreviation) contained in a mixture.

Further, the peak of the product ion is detected around m/z=658, which is a value obtained by subtracting m/z=55 from the precursor ion around m/z=713. The peak suggests a product ion in which $NC_2H_2N$ (from the nitrogen atom at the 1-position to the nitrogen atom at the 4-position) is removed from the dibenzo[f,h]quinoxaline skeleton as a result of cleavage of bonds of j and d of the dibenzo[f,h]quinoxaline skeleton. That is, this peak suggests one of characteristic product ions which show that the 2-position and the 3-position of the dibenzo[f,h]quinoxaline skeleton are unsubstituted.

Figure 21A:
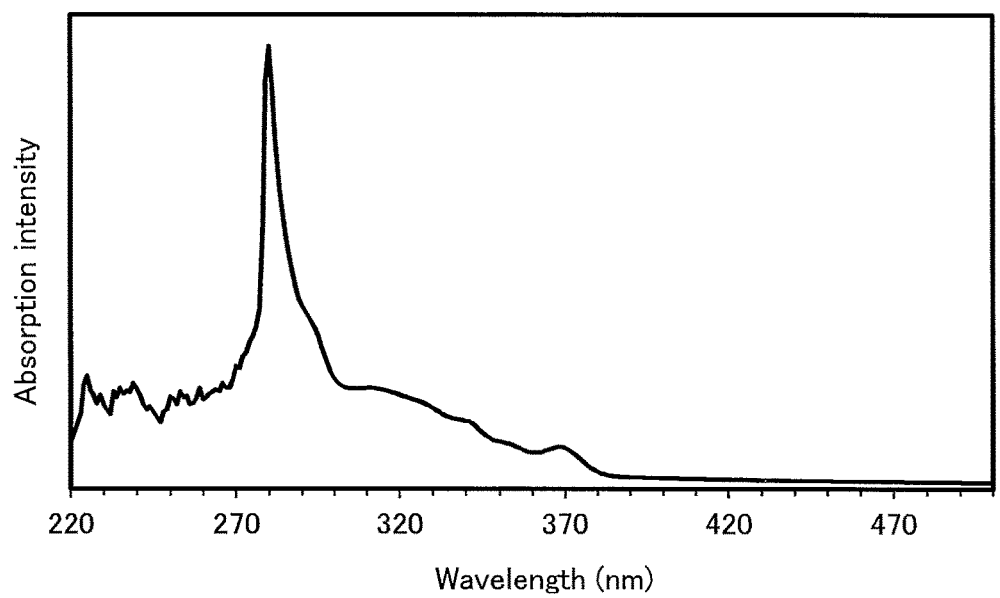
FIGS. 21A and 21B show an absorption spectrum and an emission spectrum of 7,10mCzP2 DBq (abbreviation) in a toluene solution of 7,10mCzP2 DBq.
Figure 21B:
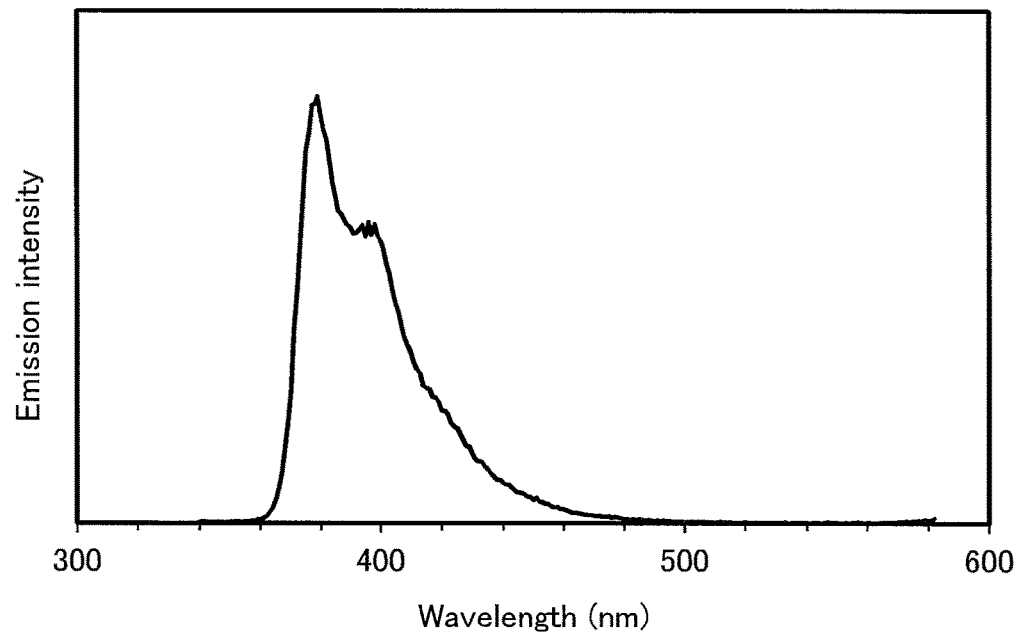
Figure 22A:
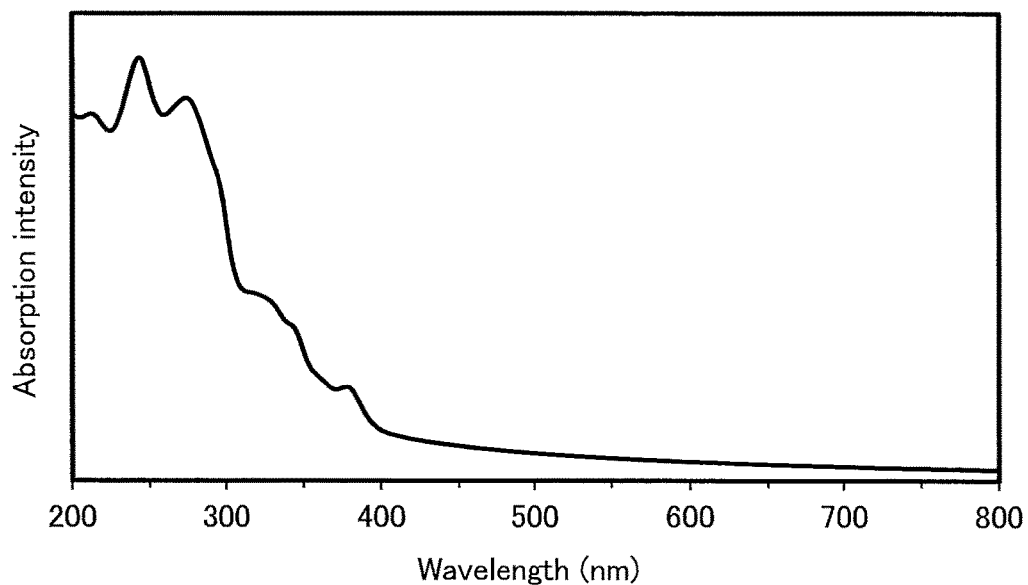
FIGS. 22A and 22B show an absorption spectrum and an emission spectrum of a thin film of 7,10mCzP2 DBq (abbreviation).
Figure 22B:
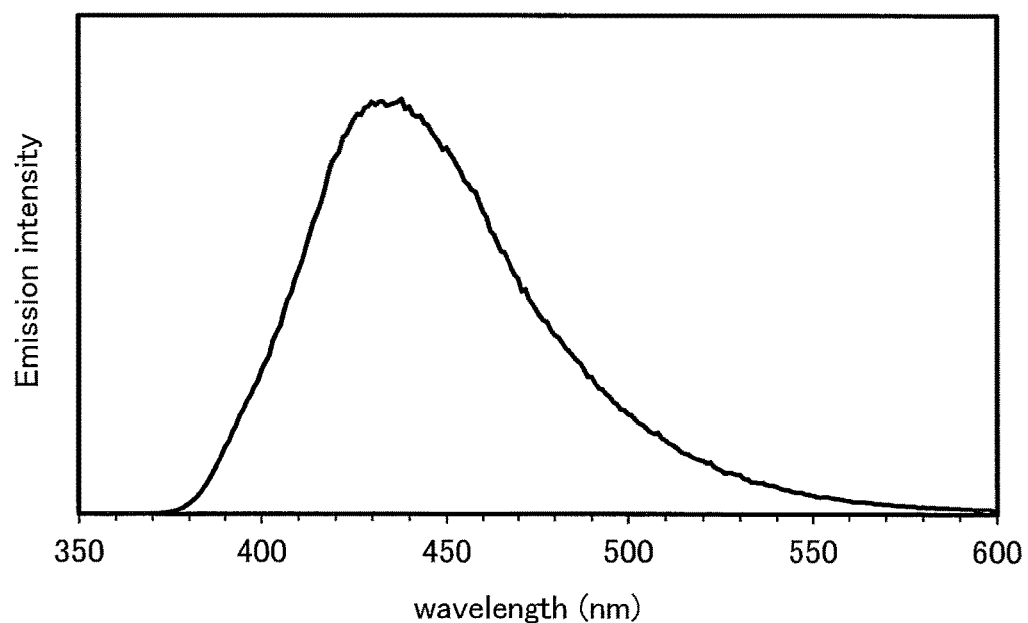

Further, FIG. 21A shows an absorption spectrum of 7,10mCzP2 DBq (abbreviation) in a toluene solution of 7,10mCzP2 DBq, and FIG. 21B shows an emission spectrum thereof. FIG. 22A shows an absorption spectrum of a thin film of 7,10mCzP2 DBq (abbreviation) and FIG. 22B shows an emission spectrum thereof. The absorption spectrum was measured using an ultraviolet-visible spectrophotometer (V-550, produced by JASCO Corporation). The measurements were performed with samples prepared in such a way that the solution was put in a quartz cell and the thin film was obtained by evaporation onto a quartz substrate. The figures show the absorption spectrum of the solution which was obtained by subtracting the absorption spectra of quartz and toluene from the absorption spectra of quartz and the solution, and the absorption spectrum of the thin film which was obtained by subtracting the absorption spectrum of a quartz substrate from the absorption spectra of the quartz substrate and the thin film. In FIGS. 21A and 21B and FIGS. 22A and 22B, the horizontal axis represents wavelength (nm) and the vertical axis represents intensity (arbitrary unit). In the case of the toluene solution, an absorption peak is around 369 nm, and an emission wavelength peak is at 379 nm (excitation wavelength: 369 nm). In the case of the thin film, an absorption peak is around 378 nm, and an emission wavelength peak is at 432 nm (excitation wavelength: 342 nm).

Example 5

Synthesis Example 5

This example will describe a method of synthesizing 6,11-bis[3-(9H-carbazol-9-yl)phenyl]dibenzo[f,h]quinoxaline (abbreviation: 6,11mCzP2 DBq) represented by Structural Formula (802).

[Chemical formula 69]

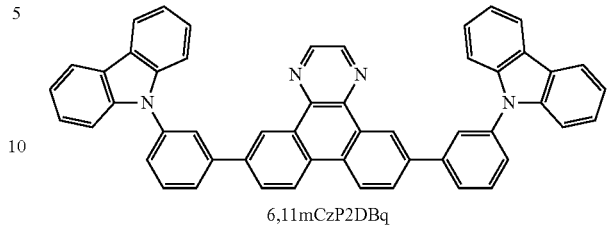

(802)

6,11mCzP2DBq

Synthesis of 6,11mCzP2 DBq (abbreviation)

Synthesis Scheme (E-1) of 6,11mCzP2 DBq (abbreviation) is shown below.

[Chemical formula 70]

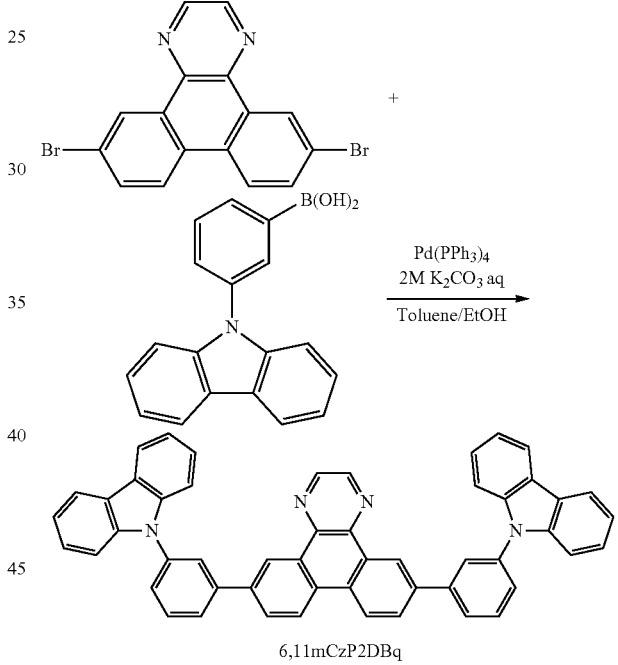

(E-1)

6,11mCzP2DBq

In a 100-mL three-neck flask were put 1.1 g (2.8 mmol) of 6,11-dibromodibenzo[f,h]quinoxaline, 1.7 g (5.9 mmol) of 3-(9H-carbazol-9-yl)phenylboronic acid, 56 mL of toluene, 6 mL of ethanol, and 4.0 mL of a 2M aqueous solution of potassium carbonate. The mixture was degassed by being stirred under reduced pressure, and the air in the flask was replaced with nitrogen. To this mixture was added 64 mg (0.06 mmol) of tetrakis(triphenylphosphine)palladium(0). The mixture was stirred at 80° C. under a nitrogen stream for 8 hours. After the predetermined time elapsed, the precipitated solid was separated by filtration to give a white solid. A toluene solution of the obtained solid was suction-filtered through alumina and Celite, and the filtrate was concentrated to give a white solid. The obtained solid was recrystallized from toluene to give a white solid. Ethanol was added, followed by irradiation with ultrasonic waves. The solid was collected by suction filtration, so that 1.1 g of a solid powder was obtained in a yield of 55%.

By a train sublimation method, 0.84 g of the obtained solid powder was purified. In the sublimation purification, the powder was heated at 365° C. under a pressure of 4.2 Pa with a flow rate of argon gas of 5.0 mL/min. After the sublimation purification, 0.64 g of a white powder, which was the object of the synthesis, was obtained at a collection rate of 76%.

Nuclear magnetic resonance ($^1$H NMR) spectroscopy identified this compound as 6,11-bis[3-(9H-carbazol-9-yl)phenyl]dibenzo[f,h]quinoxaline (abbreviation: 6,11mCzP2 DBq), which was the object of the synthesis.

$^1$H NMR data of the obtained substance are as follows: $^1$H NMR (CDCl$_3$, 500 MHz): δ (ppm)=7.32 (t, J=6.9 Hz, 4H), 7.45 (t, J=7.2 Hz, 4H), 7.53 (d, J=8.1 Hz, 4H), 7.64 (d, J=8.0 Hz, 2H), 7.78 (t, J=7.8 Hz, 2H), 8.01 (d, J=7.5 Hz, 2H), 8.09 (s, 2H), 8.13 (dd, J=8.6 Hz, 2.3 Hz, 2H), 8.19 (d, J=7.5 Hz, 4H), 8.76 (d, J=8.6 Hz, 2H), 8.92 (s, 2H), 9.56 (d, J=2.3 Hz, 2H).

Figure 23A:
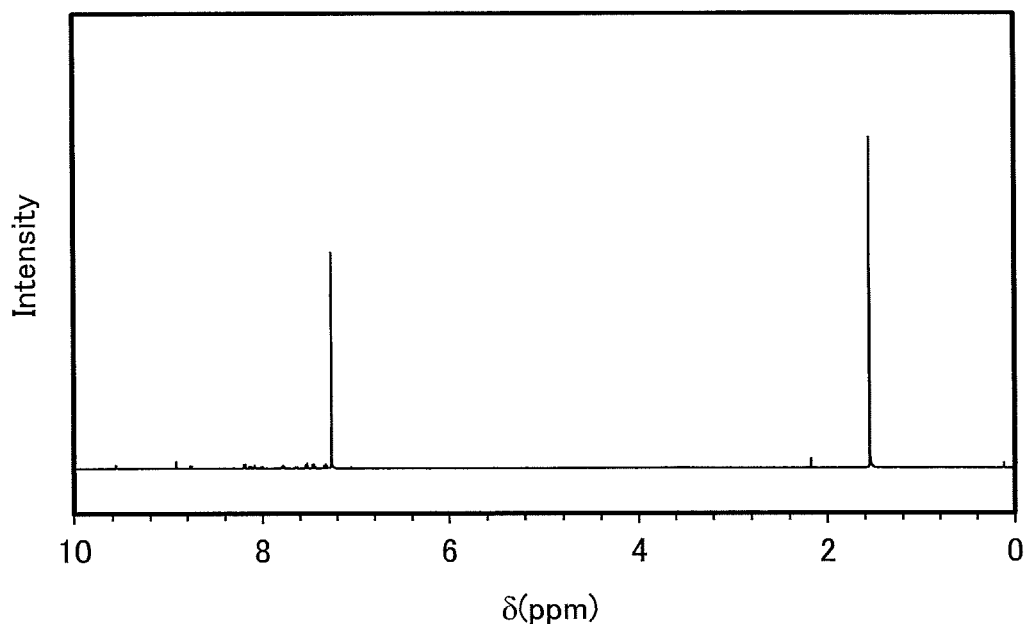
FIGS. 23A and 23B show $^1$H NMR charts of 6,11mCzP2 DBq (abbreviation).
Figure 23B:
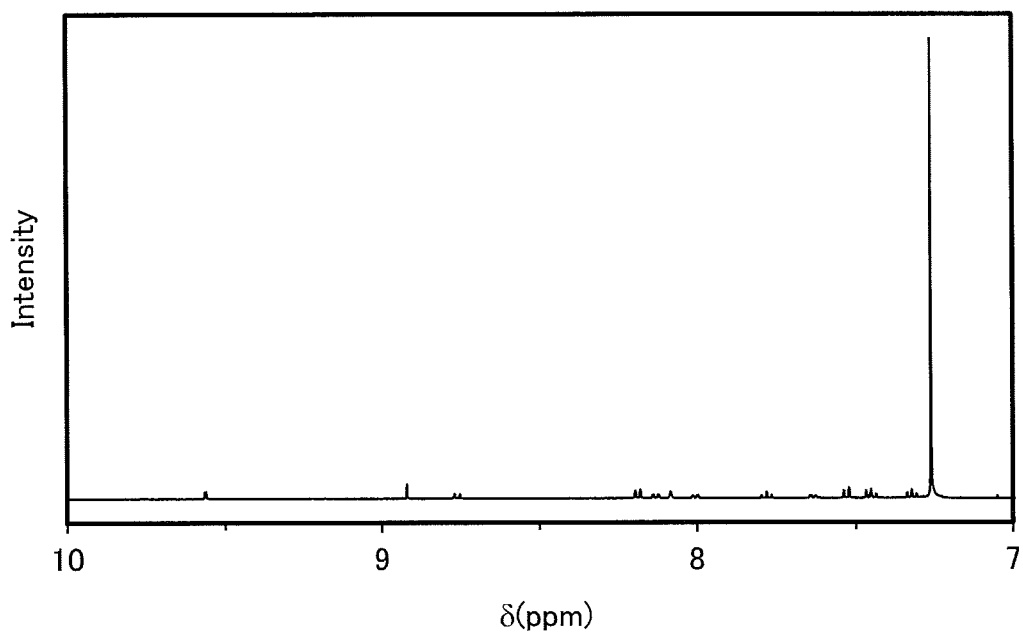

FIGS. 23A and 23B are $^1$H NMR charts. Note that FIG. 23B is an enlarged chart showing a range of 7.00 ppm to 10.0 ppm of FIG. 23A.

Next, 6,11mCzP2 DBq (abbreviation) obtained in this example was analyzed by liquid chromatography mass spectrometry (LC/MS).

The analysis by LC/MS was carried out with Acquity UPLC (produced by Waters Corporation) and Xevo G2 T of MS (produced by Waters Corporation).

In the MS analysis, ionization was carried out by an electrospray ionization (ESI) method. Capillary voltage and sample cone voltage were set to 3.0 kV and 30 V, respectively. Detection was performed in a positive mode. A component which underwent the ionization under the above-mentioned conditions was collided with an argon gas in a collision cell to dissociate into product ions. Energy (collision energy) for the collision with argon was 70 eV. A mass range for the measurement was m/z=100-1200.

Figure 24A:
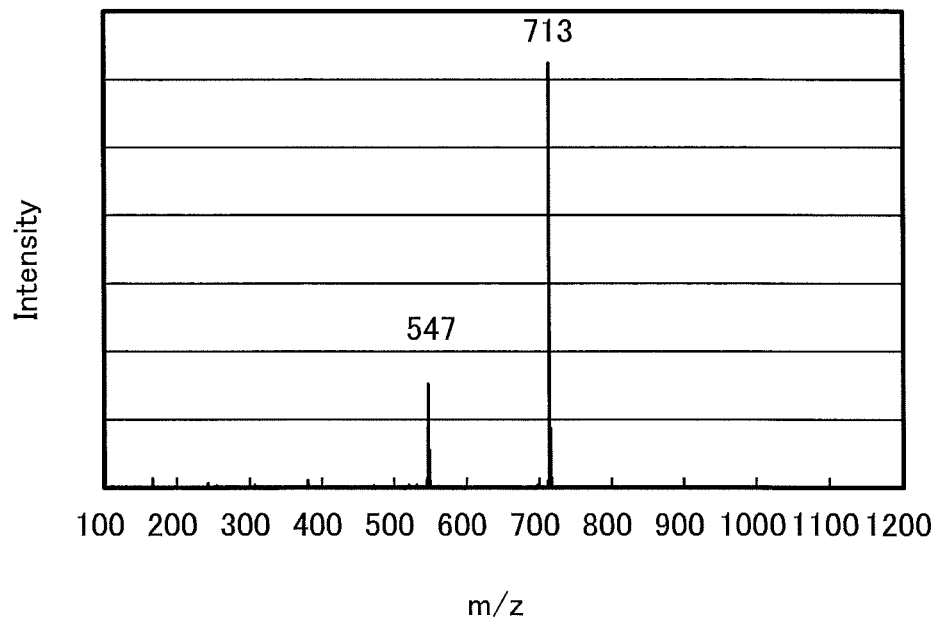
FIGS. 24A and 24B show results of LC/MS analysis of 6,11mCzP2 DBq (abbreviation).
Figure 24B:
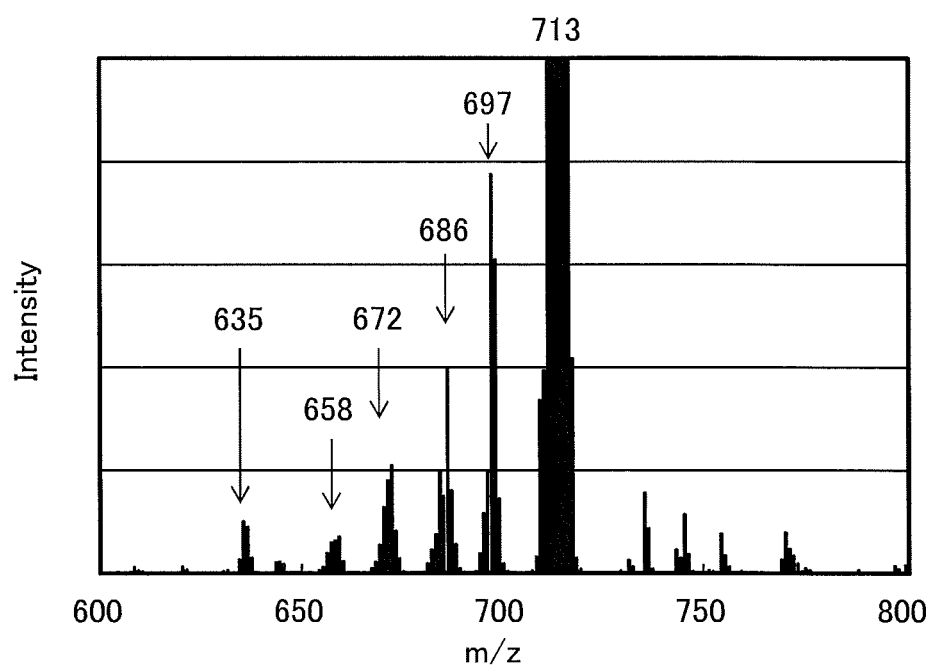

Results of the MS analysis are shown in FIGS. 24A and 24B. Note that in FIG. 24A, the horizontal axis shows a range of m/z=100-1200, and the vertical axis represents intensity (arbitrary unit). In FIG. 24B, a range of nil z=600-800 on the horizontal axis in FIG. 24A and the vertical axis in FIG. 24A are enlarged. The results in FIGS. 24A and 24B show that as for 6,11mCzP2 DBq (abbreviation) which is one embodiment of the present invention, peaks of product ions are detected mainly around m/z=547, m/z=635, m/z=658, m/z=672, m/z=686, and m/z=697, and a peak derived from a precursor ion is detected around m/z=713. Here, in the analysis by LC/MS, "around" is used to express changes in values of product ions and precursor ions due to the existence and absence of hydrogen ions and the existence of isotopes, and these changes in values are in an acceptable range included in similar skeletons. Note that the results in FIGS. 24A and 24B show characteristics derived from 6,11mCzP2 DBq (abbreviation) and therefore can be regarded as important data for identifying 6,11mCzP2 DBq (abbreviation) contained in a mixture.

Further, the peak of the product ion is detected around m/z=658, which is a value obtained by subtracting m/z=55 from the precursor ion around m/z=713. The peak suggests a product ion in which NC$_2$H$_2$N (from the nitrogen atom at the 1-position to the nitrogen atom at the 4-position) is removed from the dibenzo[f,h]quinoxaline skeleton as a result of cleavage of bonds of j and d of the dibenzo[f,h]quinoxaline skeleton. That is, this peak suggests one of characteristic product ions which show that the 2-position and the 3-position of the dibenzo[f,h]quinoxaline skeleton are unsubstituted.

Figure 25A:
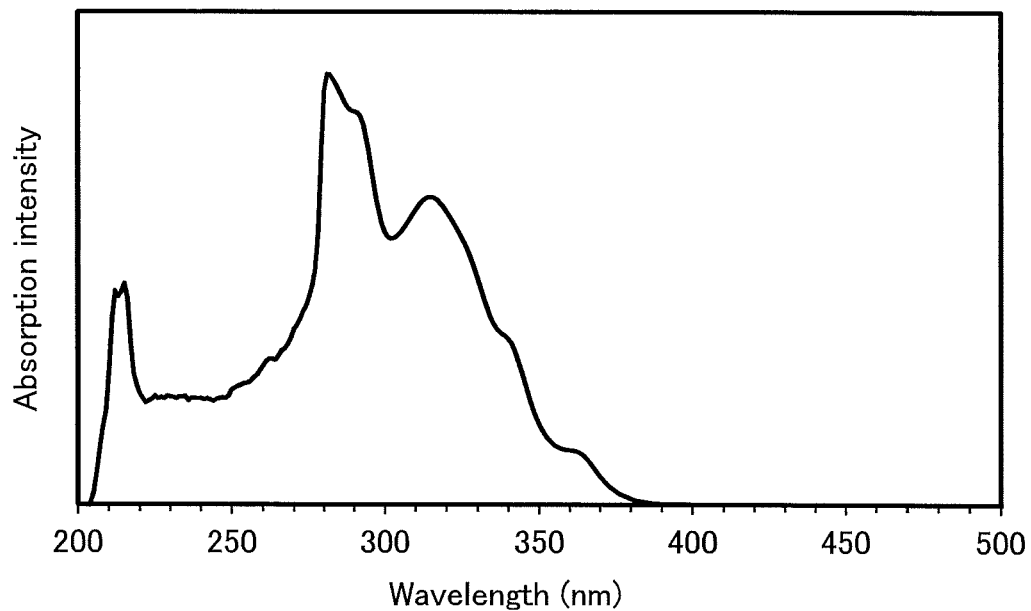
FIGS. 25A and 25B show an absorption spectrum and an emission spectrum of 6,11mCzP2 DBq (abbreviation) in a toluene solution of 6,11mCzP2 DBq.
Figure 25B:
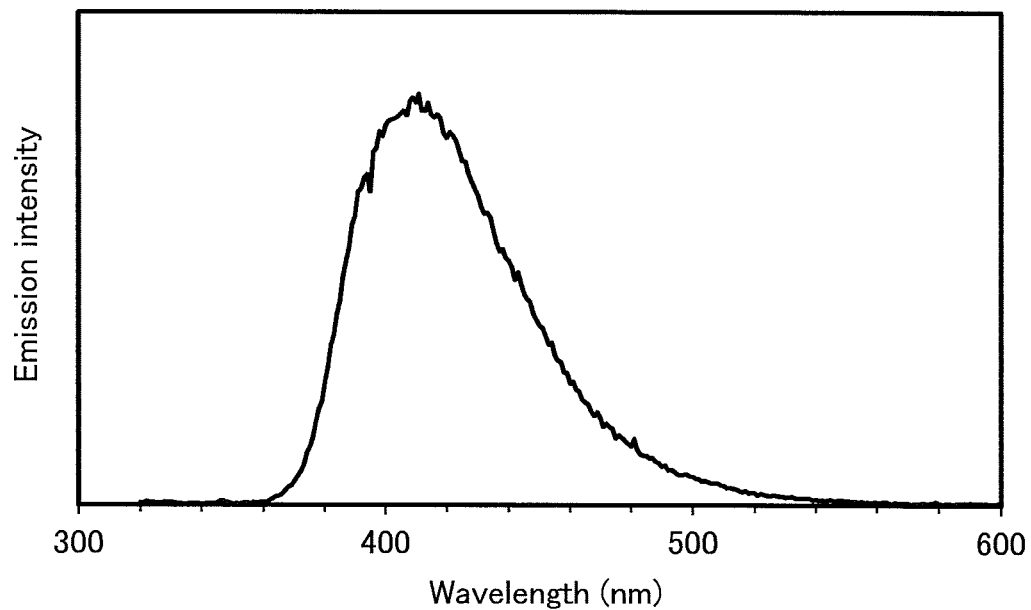
Figure 26A:
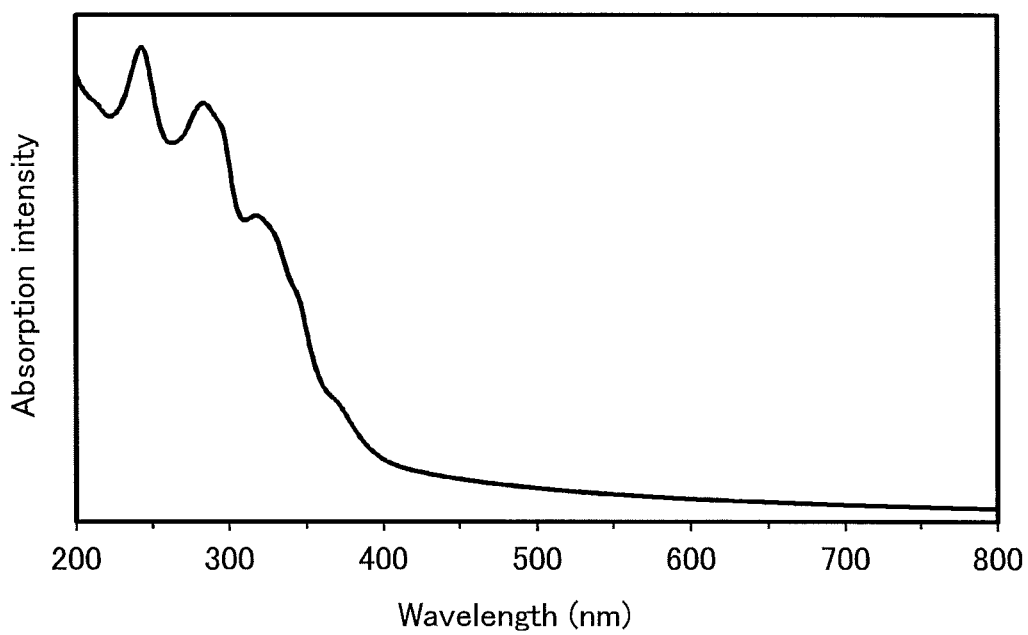
FIGS. 26A and 26B show an absorption spectrum and an emission spectrum of a thin film of 6,11mCzP2 DBq (abbreviation).
Figure 26B:
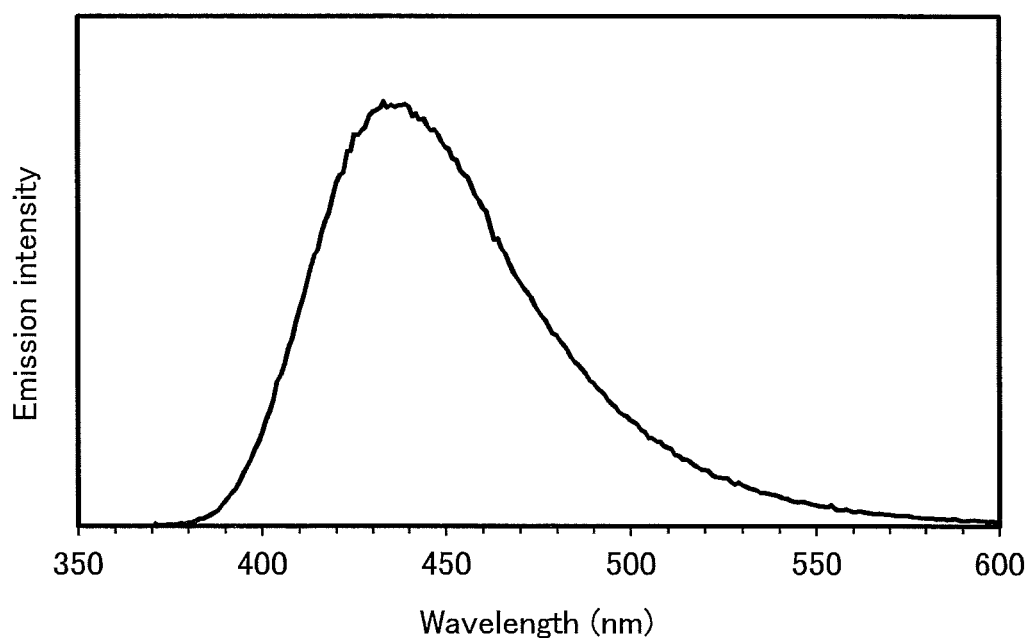

Further, FIG. 25A shows an absorption spectrum of 6,11mCzP2 DBq (abbreviation) in a toluene solution of 6,11mCzP2 DBq, and FIG. 25B shows an emission spectrum thereof. FIG. 26A shows an absorption spectrum of a thin film of 6,11mCzP2 DBq (abbreviation) and FIG. 26B shows an emission spectrum thereof. The absorption spectrum was measured using an ultraviolet-visible spectrophotometer (V-550, produced by JASCO Corporation). The measurements were performed with samples prepared in such a way that the solution was put in a quartz cell and the thin film was obtained by evaporation onto a quartz substrate. The figures show the absorption spectrum of the solution which was obtained by subtracting the absorption spectra of quartz and toluene from the absorption spectra of quartz and the solution, and the absorption spectrum of the thin film which was obtained by subtracting the absorption spectrum of a quartz substrate from the absorption spectra of the quartz substrate and the thin film. In FIGS. 25A and 25B and FIGS. 26A and 26B, the horizontal axis represents wavelength (nm) and the vertical axis represents intensity (arbitrary unit). In the case of the toluene solution, an absorption peak is around 315 nm, and an emission wavelength peak is at 411 nm (excitation wavelength: 315 nm). In the case of the thin film, an absorption peak is around 367 nm, and an emission wavelength peak is at 434 nm (excitation wavelength: 369 nm).

Example 6

This example will describe results of liquid chromatography mass spectrometry (LC/MS) analysis of dibenzo[f,h]quinoxaline (abbreviation: DBq) represented by Structural Formula (900) that is one mode of a 2,3-unsubstituted dibenzo[f,h]quinoxaline skeleton, and 2-phenyldibenzo[f,h]quinoxaline (abbreviation: 2PDBq) represented by Structural Formula (901) that is one mode of a dibenzo[f,h]quinoxaline skeleton having a substituent at the 2-position.

[Chemical formula 71]

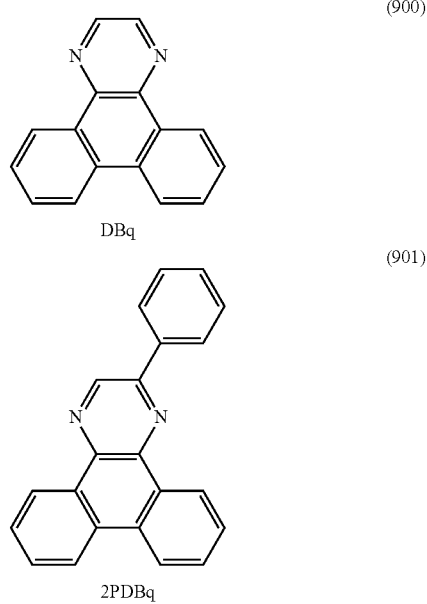

The substances represented by Structural Formula (900) and Structural Formula (901) were analyzed by LC/MS. The analysis by LC/MS was carried out with Acquity UPLC (produced by Waters Corporation) and Xevo G2 T of MS (produced by Waters Corporation).

In the MS analysis, ionization was carried out by an electrospray ionization (ESI) method. Capillary voltage and sample cone voltage were set to 3.0 kV and 30 V, respectively. Detection was performed in a positive mode. A component which underwent the ionization under the above-mentioned conditions was collided with an argon gas in a collision cell to dissociate into product ions. Energy (collision energy) for the collision with argon was 70 eV. A mass range for the measurement was m/z=100-1200.

Figure 48A:
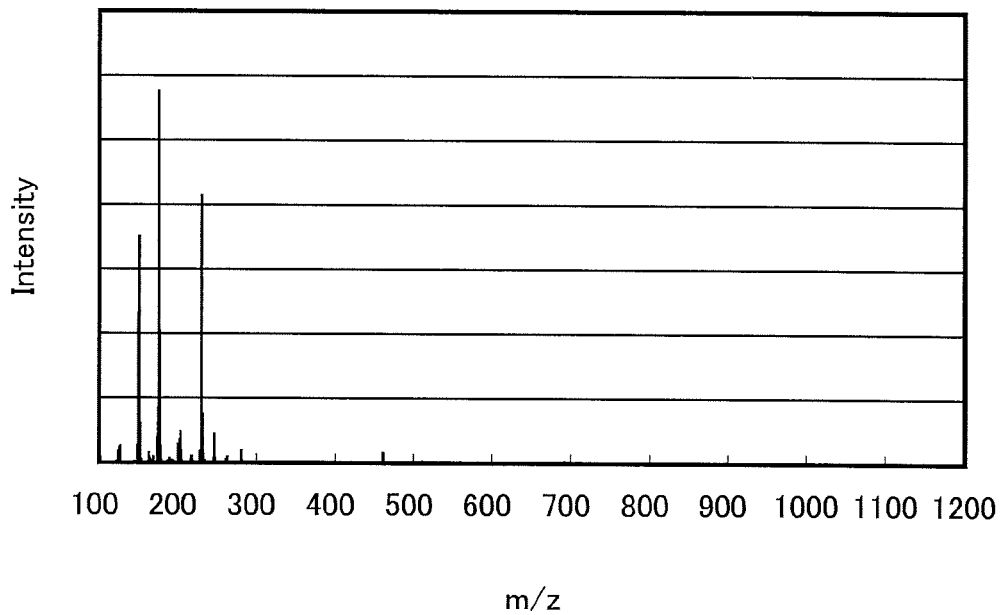
FIGS. 48A and 48B show results of LC/MS analysis of DBq (abbreviation).
Figure 48B:
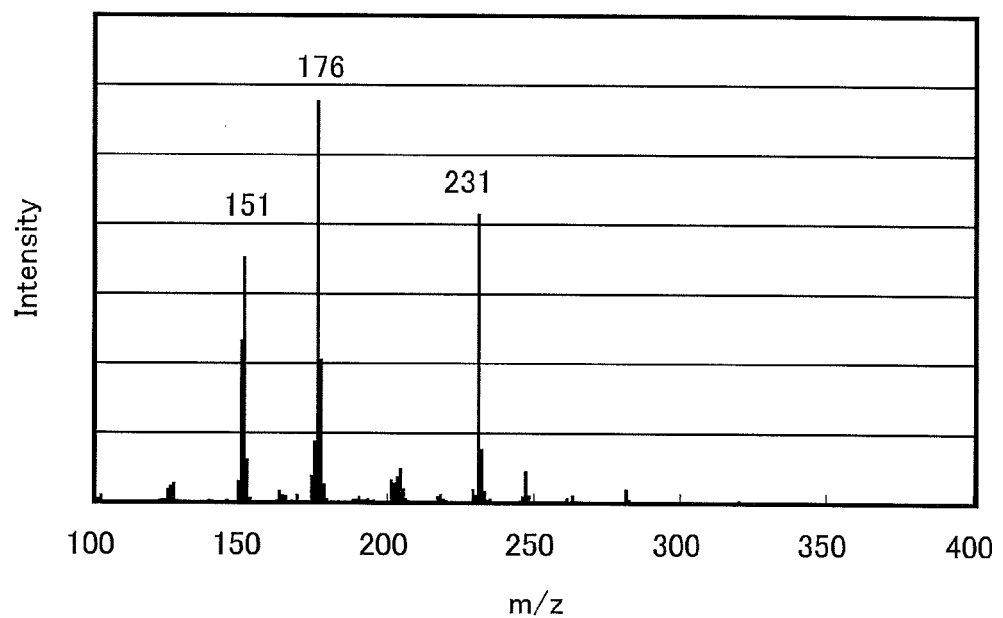

First, results of the MS analysis of DBq (abbreviation) represented by Structural Formula (900) are shown in FIGS. 48A and 48B. Note that in FIG. 48A, the horizontal axis shows a range of m/z=100-1200, and the vertical axis represents intensity (arbitrary unit). In FIG. 48B, the horizontal axis shows a range of m/z=100-400, and the vertical axis represents intensity (arbitrary unit). The results in FIGS. 48A and 48B show that as for DBq (abbreviation), peaks of product ions are detected mainly around m/z=151 and m/z=176, and a peak derived from a precursor ion is detected around m/z=231. Here, in the analysis by LC/MS, "around" is used to express changes in values of product ions and precursor ions due to the existence and absence of hydrogen ions and the existence of isotopes, and these changes in values are in an acceptable range included in similar skeletons. Note that the results in FIGS. 48A and 48B show characteristics derived from DBq (abbreviation).

Figure 49A:
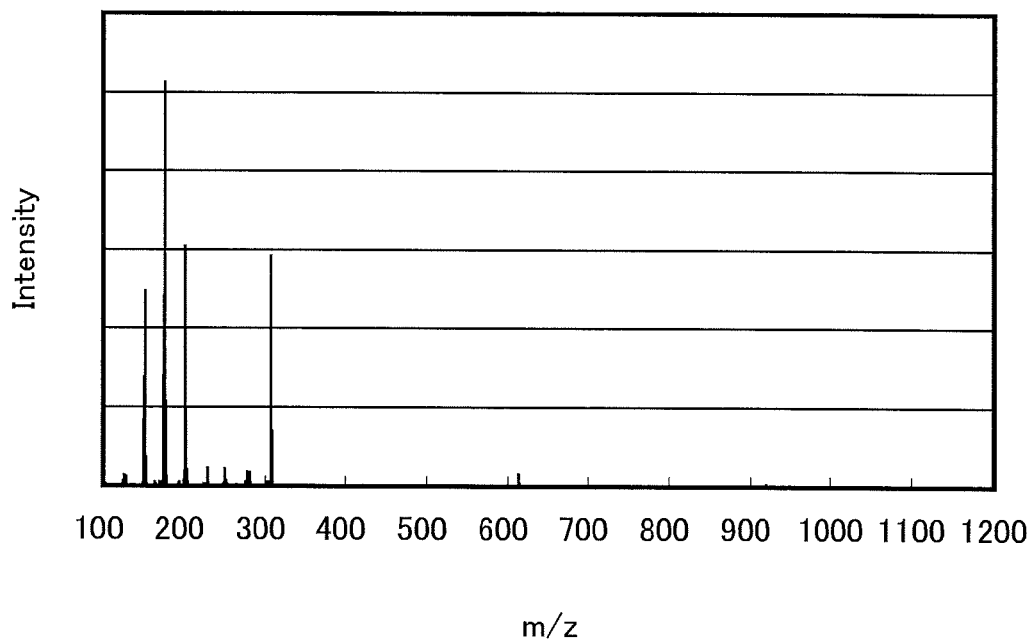
FIGS. 49A and 49B show results of LC/MS analysis of 2PDBq (abbreviation).
Figure 49B:
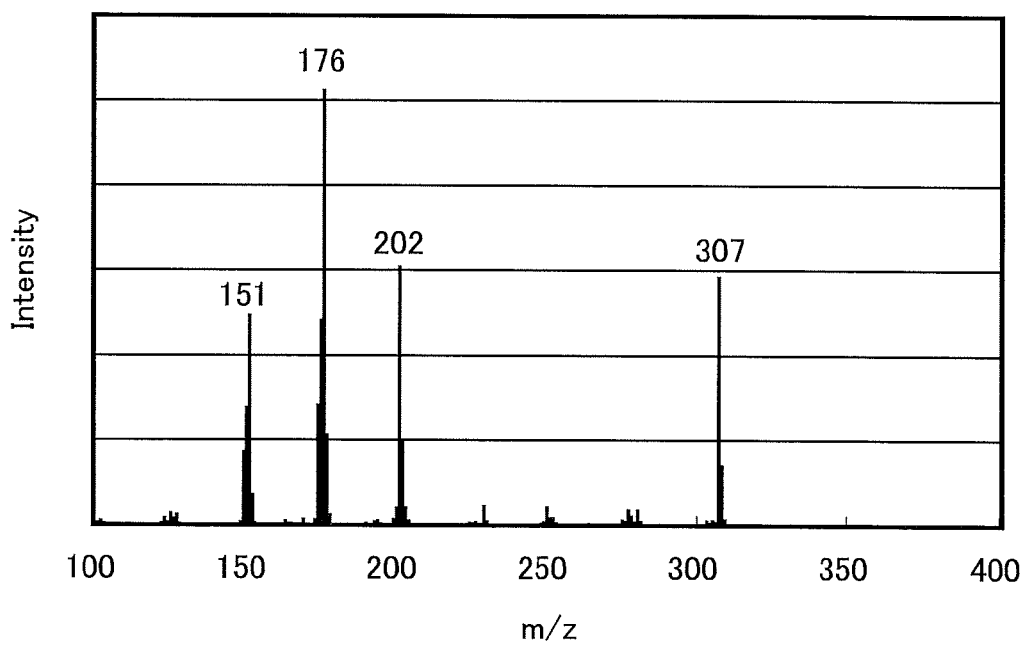

Next, results of the MS analysis of 2PDBq (abbreviation) represented by Structural Formula (901) are shown in FIGS. 49A and 49B. Note that in FIG. 49A, the horizontal axis shows a range of m/z=100-1200, and the vertical axis represents intensity (arbitrary unit). In FIG. 49B, the horizontal axis shows a range of m/z=100-400, and the vertical axis represents intensity (arbitrary unit). The results in FIGS. 49A and 49B show that as for 2PDBq (abbreviation), peaks of product ions are detected mainly around m/z=151, m/z=176, and m/z=202, and a peak derived from a precursor ion is detected around m/z=307. Here, in the analysis by LC/MS, "around" is used to express changes in values of product ions and precursor ions due to the existence and absence of hydrogen ions and the existence of isotopes, and these changes in values are in an acceptable range included in similar skeletons. Note that the results in FIGS. 49A and 49B show characteristics derived from 2PDBq (abbreviation).

Here, results of the LC/MS analysis of DBq (abbreviation) in FIGS. 48A and 48B and results of the LC/MS analysis of 2PDBq (abbreviation) in FIGS. 49A and 49B are compared. As for DBq (abbreviation), the peak of the product ion was detected around m/z=176, which is a value obtained by subtracting m/z=55 from the precursor ion around m/z=231. As for 2PDBq (abbreviation), no noticeable peak was detected around m/z=252, which is a value obtained by subtracting m/z=55 from the precursor ion around m/z=307, but the peak of the product ion was detected around m/z=176, which is a value obtained by subtracting m/z=131 from the precursor ion around m/z=307. The above suggests that as for DBq (abbreviation), a product ion was detected in which NC$_2$H$_2$N (from the nitrogen atom at the 1-position to the nitrogen atom at the 4-position) is removed from the dibenzo[f,h]quinoxaline skeleton as a result of cleavage of bonds of j and d of the dibenzo[f,h]quinoxaline skeleton, and as for 2PDBq (abbreviation), a product ion was detected in which NC$_2$H$_2$(C$_6$H$_5$)N (from the nitrogen atom at the 1-position to the nitrogen atom at the 4-position) and the phenyl group at the 2-position are removed from the dibenzo[f,h]quinoxaline skeleton as a result of cleavage of bonds of j and d of the dibenzo[f,h]quinoxaline skeleton. This can be seen as important data in determination of the presence and absence of substituents at the 2- and 3-positions of the dibenzo[f,h] quinoxaline skeleton contained in a mixture.

As described above, in the case where the organic compound has a 2,3-unsubstituted dibenzo[f,h]quinoxaline skeleton, a product ion derived from the 2,3-unsubstituted dibenzo[f,h]quinoxaline skeleton with a value obtained by subtracting m/z=55 from a precursor ion is detected. The above analysis of DBq (abbreviation) and 2PDBq (abbreviation) in this example by LC/MS thus suggested that when a light-emitting element which includes any of the organic compounds of embodiments of the present invention in Embodiments 1 to 5 is analyzed by LC/MS, a skeleton of the organic compound in a mixture can be identified.

Example 7

Figure 27:
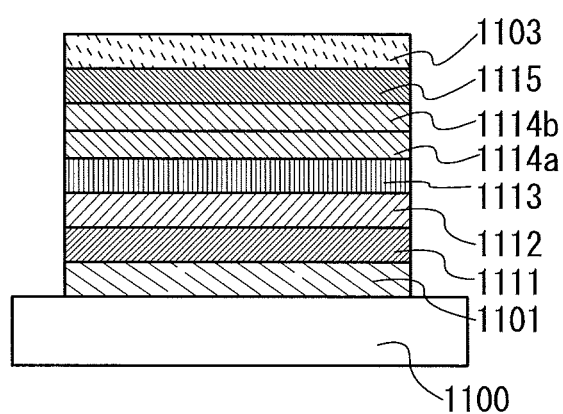
FIG. 27 illustrates a light-emitting element of Examples.

In this example, a light-emitting element of one embodiment of the present invention will be described with reference to FIG. 27. Chemical formulae of materials used in this example are shown below.

[Chemical formula 72]

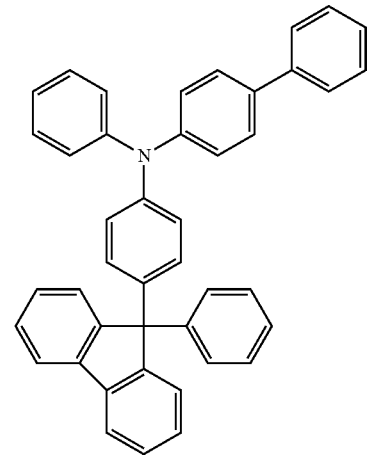

BPAFLP

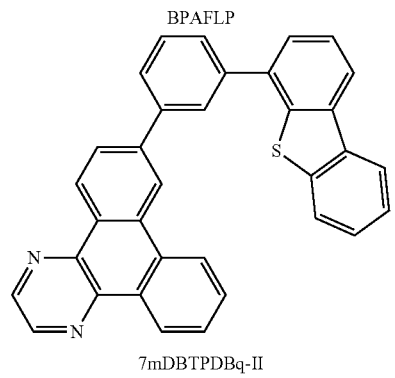

7mDBTPDBq-II

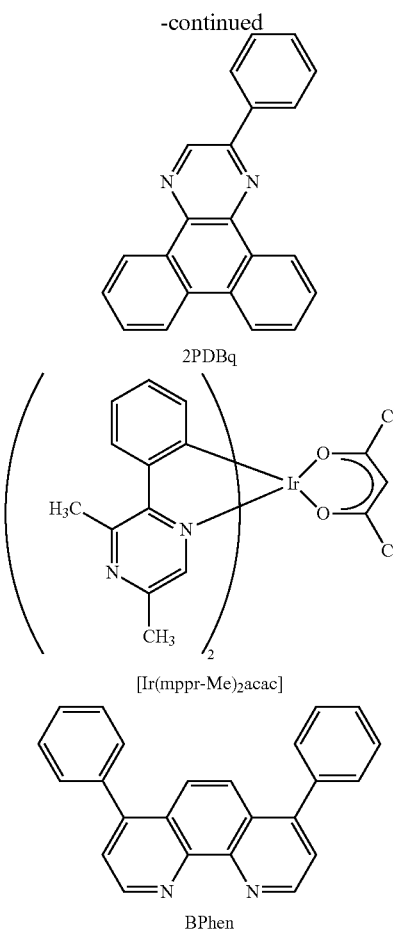

to about $10^{-4}$ Pa. After that, over the first electrode 1101, 4-phenyl-4'-(9-phenylfluoren-9-yl)triphenylamine (abbreviation: BPAFLP) and molybdenum oxide were co-evaporated by an evaporation method using resistance heating, so that a hole-injection layer 1111 was formed. The thickness of the hole-injection layer 1111 was set to 40 nm, and the weight ratio of BPAFLP (abbreviation) to molybdenum oxide was adjusted to 4:2 (=BPAFLP:molybdenum oxide). Note that the co-evaporation method refers to an evaporation method in which evaporation is carried out from a plurality of evaporation sources at the same time in one treatment chamber.

Next, over the hole-injection layer 1111, a film of BPAFLP (abbreviation) was formed to a thickness of 20 nm, so that a hole-transport layer 1112 was formed.

Further, 7-[3-(dibenzothiophen-4-yl)phenyl]dibenzo[f,h]quinoxaline (abbreviation: 7mDBTPDBq-II) synthesized in Example 1 and (acetylacetonato)bis(3,5-dimethyl-2-phenylpyrazinato)iridium(III) (abbreviation: [Ir(mppr-Me)$_2$(acac)]) were co-evaporated to form a light-emitting layer 1113 over the hole-transport layer 1112. The weight ratio of 7mDBTPDBq-II (abbreviation) to [Ir(mppr-Me)$_2$(acac)] (abbreviation) was adjusted to 1:0.06 (=7mDBTPDBq-II: [Ir(mppr-Me)$_2$(acac)]). The thickness of the light-emitting layer 1113 was set to 40 nm.

Further, a film of 7mDBTPDBq-II (abbreviation) was formed to a thickness of 10 nm over the light-emitting layer 1113, so that a first electron-transport layer 1114a was formed.

Then, a film of bathophenanthroline (abbreviation: BPhen) was formed to a thickness of 20 nm over the first electron-transport layer 1114a, so that a second electron-transport layer 1114b was formed.

Further, a film of lithium fluoride (LiF) was formed to a thickness of 1 nm over the second electron-transport layer 1114b using evaporation, so that an electron-injection layer 1115 was formed.

Lastly, an aluminum film was formed to a thickness of 200 nm using evaporation as a second electrode 1103 functioning as a cathode. Thus, the light-emitting element 1 of this example was fabricated.

Note that in all the above evaporation steps, evaporation was performed by a resistance heating method.

(Comparative Light-Emitting Element 2)

The light-emitting layer 1113 of the comparative light-emitting element 2 was formed by co-evaporation of 2-phenyldibenzo[f,h]quinoxaline (abbreviation: 2PDBq) and [Ir(mppr-Me)$_2$(acac)]. The weight ratio of 2PDBq (abbreviation) to [Ir(mppr-Me)$_2$(acac)] (abbreviation) was adjusted to 1:0.06 (=2PDBq: [Ir(mppr-Me)$_2$(acac)]). The thickness of the light-emitting layer 1113 was set to 40 nm.

A film of 2PDBq (abbreviation) was formed to a thickness of 10 nm, so that the first electron-transport layer 1114a of the comparative light-emitting element 2 was formed. The components other than the light-emitting layer 1113 and the first electron-transport layer 1114a were formed in the same way as those of the light-emitting element 1.

Element structures of the light-emitting element 1 and the comparative light-emitting element 2 obtained as described above are shown in Table 1.

Methods of fabricating a light-emitting element 1 and a comparative light-emitting element 2 of this example will be described below.

(Light-Emitting Element 1)

First, over a substrate 1100, an indium oxide-tin oxide compound containing silicon or silicon oxide (ITO—SiO$_2$, hereinafter abbreviated to ITSO) was deposited by a sputtering method, whereby a first electrode 1101 was formed. Note that the composition ratio of In$_2$O$_3$ to SnO$_2$ and SiO$_2$ in the target used was 85:10:5 [wt %]. The thickness of the first electrode 1101 was 110 nm and the electrode area was 2 mm×2 mm. Here, the first electrode 1101 is an electrode that functions as an anode of the light-emitting element.

In pretreatment for forming the light-emitting element over the substrate 1100, UV ozone treatment was performed for 370 seconds after washing of a surface of the substrate with water and baking that was performed at 200° C. for 1 hour.

After that, the substrate was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 1100 was cooled down for about 30 minutes.

Then, the substrate 1100 over which the first electrode 1101 was formed was fixed to a substrate holder provided in a vacuum evaporation apparatus so that the surface on which the first electrode 1101 was formed faced downward. The pressure in the vacuum evaporation apparatus was reduced

TABLE 1

|  | First Electrode | Hole-injection Layer | Hole-transport Layer | Light-emitting Layer | First Electron-transport Layer | Second Electron-transport Layer | Electron-injection Layer | Second Electrode |
|---|---|---|---|---|---|---|---|---|
| Light-emitting Element 1 | ITSO 110 nm | BPAFLP:MoO$_x$ (=4:2) 40 nm | BPAFLP 20 nm | 7mDBTPDBq-II:[Ir(mppr-Me)$_2$(acac)] (=1:0.06) 40 nm | 7mDBTPDBq-II 10 nm | BPhen 20 nm | LiF 1 nm | Al 200 nm |
| Comparative Light-emitting Element 2 | ITSO 110 nm | BPAFLP:MoO$_x$ (=4:2) 40 nm | BPAFLP 20 nm | 2PDBq:[Ir(mppr-Me)$_2$(acac)] (=1:0.06) 40 nm | 2PDBq 10 nm | BPhen 20 nm | LiF 1 nm | Al 200 nm |

In a glove box containing a nitrogen atmosphere, the light-emitting element 1 and the comparative light-emitting element 2 were each sealed with a glass substrate so as not to be exposed to the air (specifically, a sealant was applied onto an outer edge of the element and heat treatment was performed at 80° C. for 1 hour at the time of sealing). Then, operation characteristics of the light-emitting elements were measured. Note that the measurements were carried out at room temperature (in the atmosphere kept at 25° C.).

Figure 28:
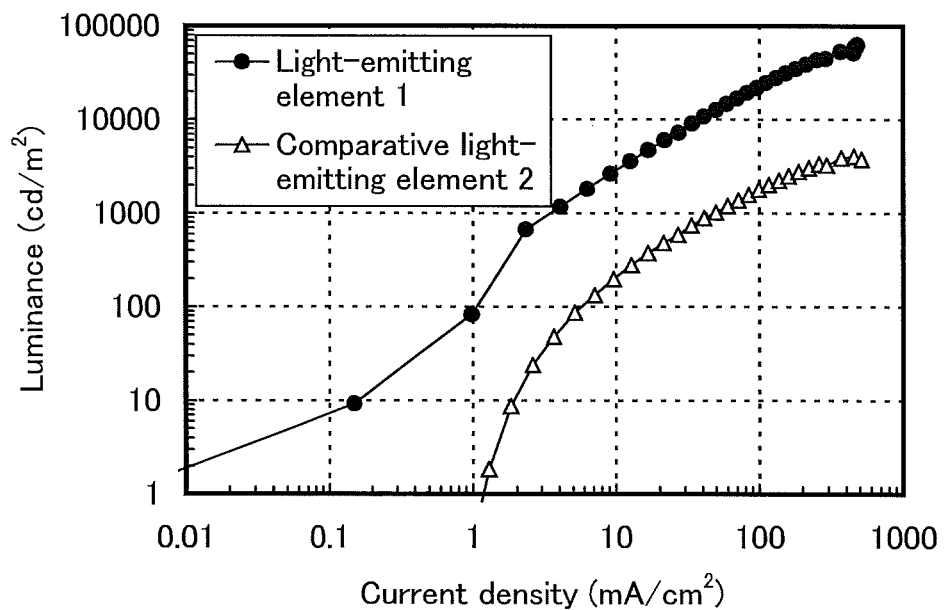
FIG. 28 shows current density-luminance characteristics of light-emitting elements of Example.
Figure 29:
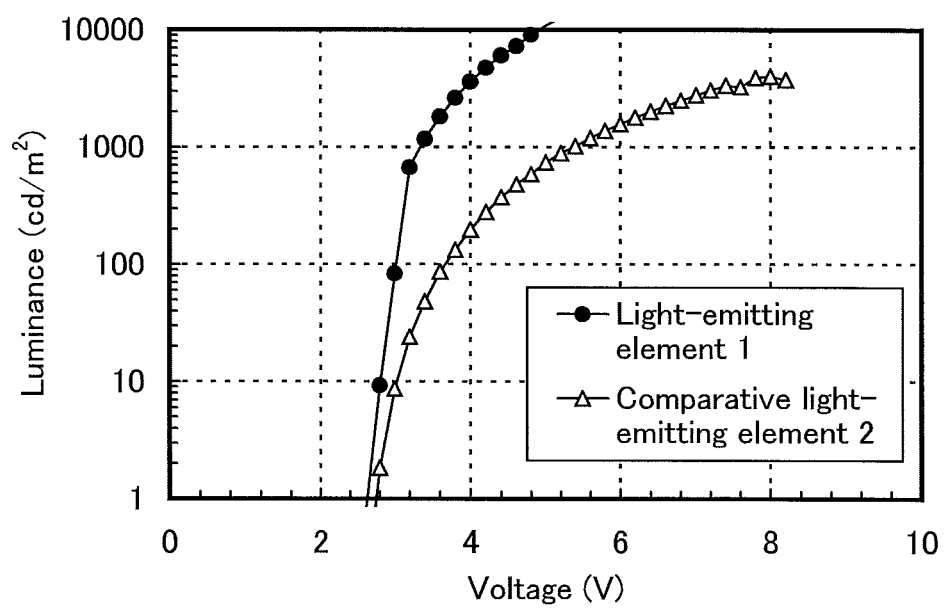
FIG. 29 shows voltage-luminance characteristics of light-emitting elements of Example.
Figure 30:
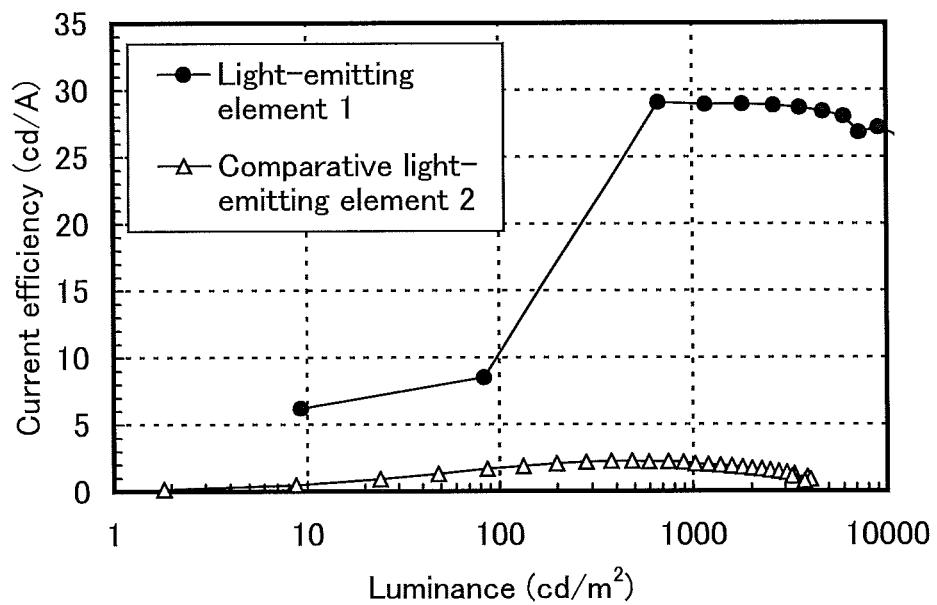
FIG. 30 shows luminance-current efficiency characteristics of light-emitting elements of Example.
Figure 31:
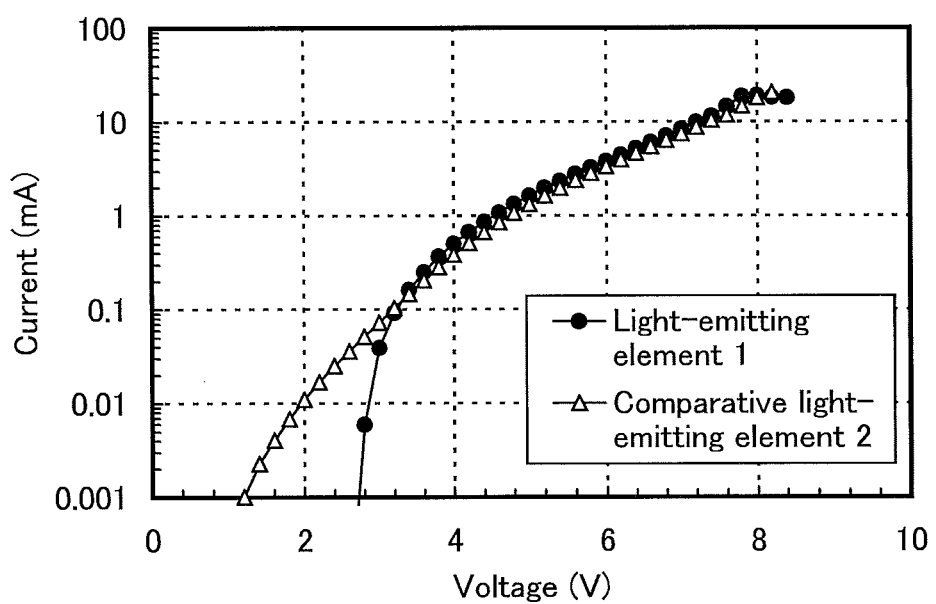
FIG. 31 shows voltage-current characteristics of light-emitting elements of Example.

Current density-luminance characteristics of the light-emitting element 1 and the comparative light-emitting element 2 are shown in FIG. 28. In FIG. 28, the horizontal axis represents current density (mA/cm$^2$) and the vertical axis represents luminance (cd/m$^2$). Further, voltage-luminance characteristics of the elements are shown in FIG. 29. In FIG. 29, the horizontal axis represents voltage (V) and the vertical axis represents luminance (cd/m$^2$). In addition, luminance-current efficiency characteristics of the elements are shown in FIG. 30. In FIG. 30, the horizontal axis represents luminance (cd/m$^2$) and the vertical axis represents current efficiency (cd/A). Further, voltage-current characteristics of the elements are shown in FIG. 31. In FIG. 31, the horizontal axis represents voltage (V) and the vertical axis represents current (mA). Further, Table 2 shows the voltage (V), current density (mA/cm$^2$), CIE chromaticity coordinates (x, y), current efficiency (cd/A), and external quantum efficiency (%) of the light-emitting elements at a luminance of around 1000 cd/m$^2$.

As shown in Table 2, the CIE chromaticity coordinates of the light-emitting element 1 were (x, y)=(0.54, 0.45) at a luminance of 670 cd/m$^2$. Further, the CIE chromaticity coordinates of the comparative light-emitting element 2 were (x, y)=(0.52, 0.47) at a luminance of 1000 cd/m$^2$. It is found that light emission originating from [Ir(mppr-Me)$_2$(acac)] (abbreviation) was obtained from each of the light-emitting element 1 and the comparative light-emitting element 2.

As can be seen from FIG. 31, at lower voltage than the voltage (about 2V) at which light emission starts, a larger current flows in the comparative light-emitting element 2 fabricated in this example than in the light-emitting element 1. In addition, Table 2 indicates that the current efficiency of the comparative light-emitting element 2 is significantly low. This is considered to be because 2PDBq (abbreviation) used for the light-emitting layer 1113 of the comparative light-emitting element 2 was crystallized and current leakage occurred.

As can be seen from FIG. 28, FIG. 29, FIG. 30, and FIG. 31, the light-emitting element 1 has low drive voltage and high current efficiency. It is thus confirmed that an organic compound to which one embodiment of the present invention is applied is effective in achieving excellent voltage-luminance characteristics and excellent luminance-current efficiency characteristics.

As described above, by the use of 7mDBTPDBq-II (abbreviation) for a host material in the light-emitting layer and for the electron-transport layer, a light-emitting element having low drive voltage and high current efficiency was able to be fabricated.

TABLE 2

|  | Voltage (V) | Current Density (mA/cm$^2$) | Chromaticity x | Chromaticity y | Luminance (cd/m$^2$) | Current Efficiency (cd/A) | External Quantum Efficiency (%) |
|---|---|---|---|---|---|---|---|
| Light-emitting Element 1 | 3.2 | 2.3 | 0.54 | 0.45 | 670 | 29 | 11 |
| Comparative Light-emitting Element 2 | 5.4 | 50 | 0.52 | 0.47 | 1000 | 2.0 | 0.7 |

Example 8

In this example, a light-emitting element of one embodiment of the present invention will be described with reference to FIG. 27. Chemical formulae of materials used in this example are shown below. Note that the chemical formulae of the materials which are shown above are omitted.

[Chemical formula 73]

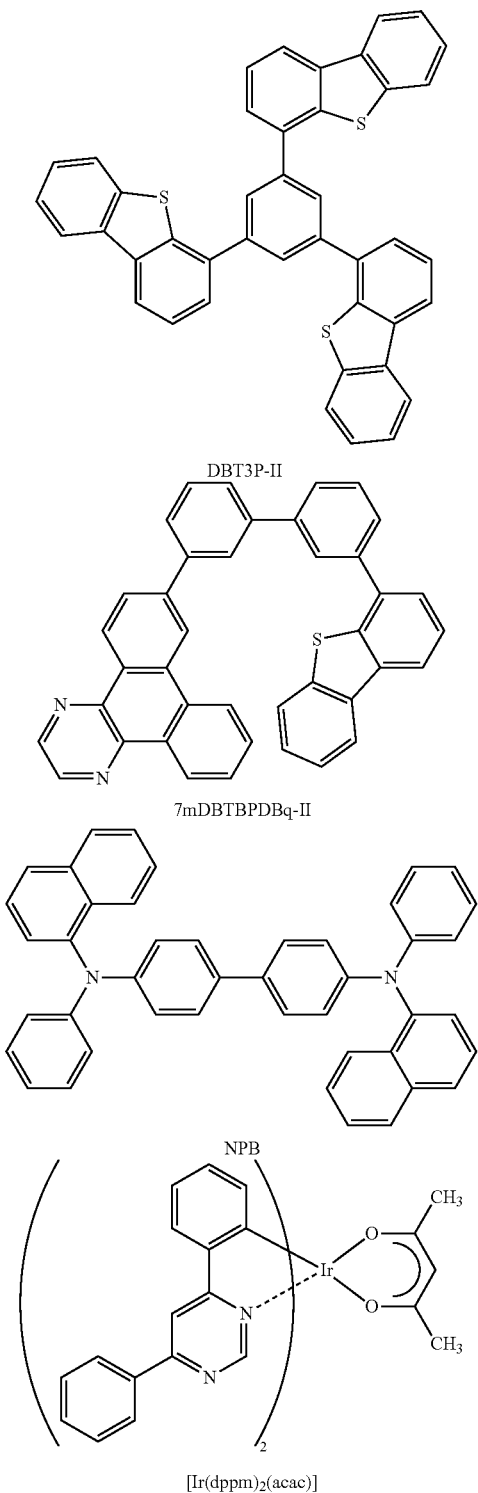

A method of fabricating a light-emitting element 3 will be described below.

(Light-Emitting Element 3)

First, over the substrate 1100, an indium oxide-tin oxide compound containing silicon or silicon oxide (ITSO) was deposited by a sputtering method, whereby the first electrode 1101 was formed. Note that the composition ratio of $In_2O_3$ to $SnO_2$ and $SiO_2$ in the target used was 85:10:5 [wt %]. The thickness of the first electrode 1101 was 110 nm and the electrode area was 2 mm×2 mm. Here, the first electrode 1101 is an electrode that functions as an anode of the light-emitting element.

In pretreatment for forming the light-emitting element over the substrate 1100, UV ozone treatment was performed for 370 seconds after washing of a surface of the substrate with water and baking that was performed at 200° C. for 1 hour.

After that, the substrate was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 1100 was cooled down for about 30 minutes.

Then, the substrate 1100 over which the first electrode 1101 was formed was fixed to a substrate holder provided in a vacuum evaporation apparatus so that the surface on which the first electrode 1101 was formed faced downward. The pressure in the vacuum evaporation apparatus was reduced to about $10^{-4}$ Pa. After that, over the first electrode 1101, 4,4',4"-(1,3,5-benzenetriyl)tri(dibenzothiophene) (abbreviation: DBT3P-II) and molybdenum oxide were co-evaporated by an evaporation method using resistance heating, so that the hole-injection layer 1111 was formed. The thickness of the hole-injection layer 1111 was set to 40 nm, and the weight ratio of DBT3P-II (abbreviation) to molybdenum oxide was adjusted to 4:2 (=DBT3P-II:molybdenum oxide).

Next, over the hole-injection layer 1111, a BPAFLP film was formed to a thickness of 20 nm, so that the hole-transport layer 1112 was formed.

Further, 7-[3'-(dibenzothiophen-4-yl)biphenyl-3-yl]dibenzo[f,h]quinoxaline (abbreviation: 7mDBTBPDBq-II) synthesized in Example 2, 4,4'-bis[N-(1-naphthyl)-N-phenylamino]biphenyl (abbreviation: NPB), and (acetylacetonato)bis(4,6-diphenylpyrimidinato)iridium(III) (abbreviation: [Ir(dppm)$_2$(acac)]) were co-evaporated to form the light-emitting layer 1113 over the hole-transport layer 1112. The weight ratio of 7mDBTBPDBq-II (abbreviation) to NPB (abbreviation) and [Ir(dppm)$_2$(acac)] (abbreviation) was adjusted to 0.8:0.2:0.05 (=7mDBTBPDBq-II:NPB:[Ir(dppm)$_2$(acac)]). The thickness of the light-emitting layer 1113 was set to 40 nm.

Further, a film of 7mDBTBPDBq-II (abbreviation) was formed to a thickness of 10 nm over the light-emitting layer 1113, so that the first electron-transport layer 1114a was formed.

Then, a film of BPhen (abbreviation) was formed to a thickness of 20 nm over the first electron-transport layer 1114a, so that the second electron-transport layer 1114b was formed.

Further, a LiF film was formed to a thickness of 1 nm over the second electron-transport layer 1114b using evaporation, so that the electron-injection layer 1115 was formed.

Lastly, an aluminum film was formed to a thickness of 200 nm using evaporation as the second electrode 1103 functioning as a cathode. Thus, the light-emitting element 3 of this example was fabricated.

Note that in all the above evaporation steps, evaporation was performed by a resistance heating method.

An element structure of the light-emitting element 3 obtained as described above is shown in Table 3.

TABLE 3

|  | First Electrode | Hole-injection Layer | Hole-transport Layer | Light-emitting Layer | First Electron-transport Layer | Second Electron-transport Layer | Electron-injection Layer | Second Electrode |
|---|---|---|---|---|---|---|---|---|
| Light-emitting Element 3 | ITSO 110 nm | DBT3P-II: $MoO_x$ (=4:2) 40 nm | BPAFLP 20 nm | 7mDBTBPDBq-II: NPB: [Ir(dppm)$_2$(acac)] (=0.8:0.2:0.05) 40 nm | 7mDBTBPDBq-II 10 nm | BPhen 20 nm | LiF 1 nm | Al 200 nm |

In a glove box containing a nitrogen atmosphere, the light-emitting element 3 was sealed with a glass substrate so as not to be exposed to the air (specifically, a sealant was applied onto an outer edge of the element and heat treatment was performed at 80° C. for 1 hour at the time of sealing). Then, operation characteristics of the light-emitting element were measured. Note that the measurement was carried out at room temperature (in the atmosphere kept at 25° C.).

Figure 32:
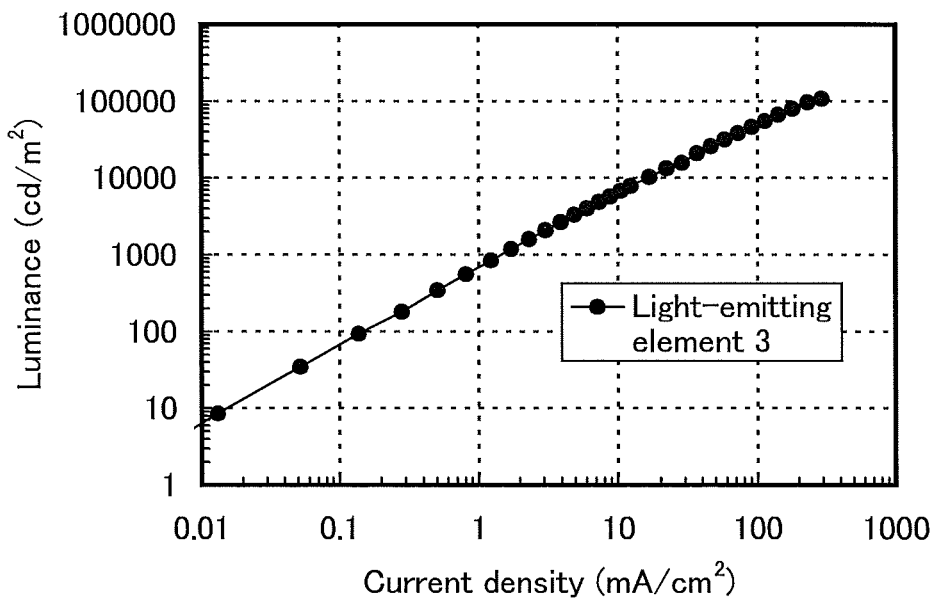
FIG. 32 shows current density-luminance characteristics of a light-emitting element of Example.
Figure 33:
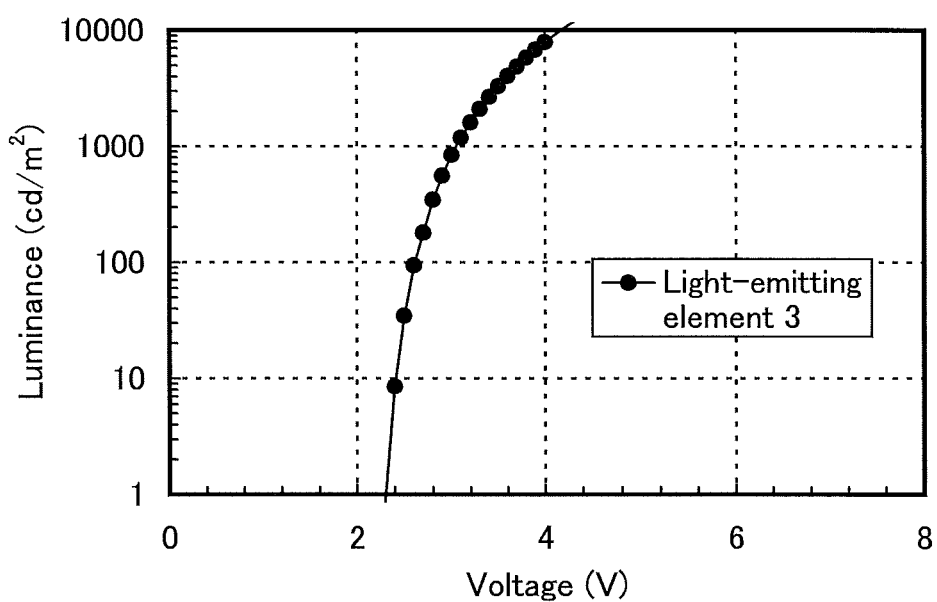
FIG. 33 shows voltage-luminance characteristics of a light-emitting element of Example.
Figure 34:
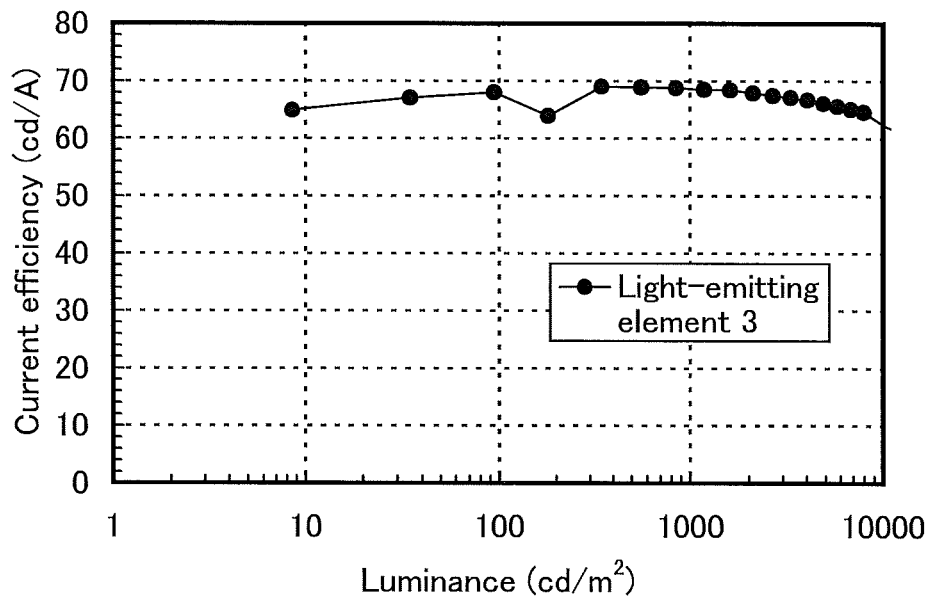
FIG. 34 shows luminance-current efficiency characteristics of a light-emitting element of Example.
Figure 35:
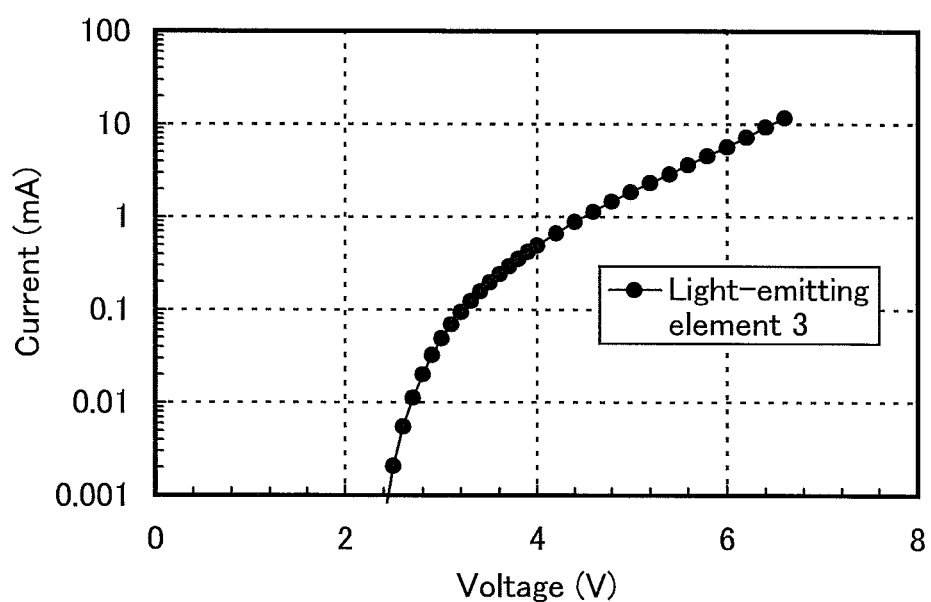
FIG. 35 shows voltage-current characteristics of a light-emitting element of Example.

Current density-luminance characteristics of the light-emitting element 3 are shown in FIG. 32. In FIG. 32, the horizontal axis represents current density (mA/cm$^2$) and the vertical axis represents luminance (cd/m$^2$). Further, voltage-luminance characteristics of the element are shown in FIG. 33. In FIG. 33, the horizontal axis represents voltage (V) and the vertical axis represents luminance (cd/m$^2$). In addition, luminance-current efficiency characteristics of the element are shown in FIG. 34. In FIG. 34, the horizontal axis represents luminance (cd/m$^2$) and the vertical axis represents current efficiency (cd/A). Further, voltage-current characteristics of the element are shown in FIG. 35. In FIG. 35, the horizontal axis represents voltage (V) and the vertical axis represents current (mA). Further, Table 4 shows the voltage (V), current density (mA/cm$^2$), CIE chromaticity coordinates (x, y), current efficiency (cd/A), and external quantum efficiency (%) of the light-emitting element 3 at a luminance of 850 cd/m$^2$.

TABLE 4

|  | Voltage (V) | Current Density (mA/cm$^2$) | Chromaticity x | Chromaticity y | Luminance (cd/m$^2$) | Current Efficiency (cd/A) | External Quantum Efficiency (%) |
|---|---|---|---|---|---|---|---|
| Light-emitting Element 3 | 3.0 | 1.2 | 0.57 | 0.43 | 850 | 69 | 28 |

As shown in Table 4, the CIE chromaticity coordinates of the light-emitting element 3 were (x, y)=(0.57, 0.43) at a luminance of 850 cd/m². It is found that light emission originating from [Ir(dppm)₂(acac)] was obtained from the light-emitting element 3.

As can be seen from FIG. 32, FIG. 33, FIG. 34, FIG. 35, and Table 4, the light-emitting element 3 has low drive voltage, high current efficiency, and high external quantum efficiency. It is thus confirmed that an organic compound to which one embodiment of the present invention is applied is effective in achieving excellent voltage-luminance characteristics and excellent luminance-current efficiency characteristics.

As described above, by the use of 7mDBTBPDBq-II (abbreviation) for a host material in the light-emitting layer and for the electron-transport layer, a light-emitting element having low drive voltage, high current efficiency, and high external quantum efficiency was able to be fabricated.

Figure 36:
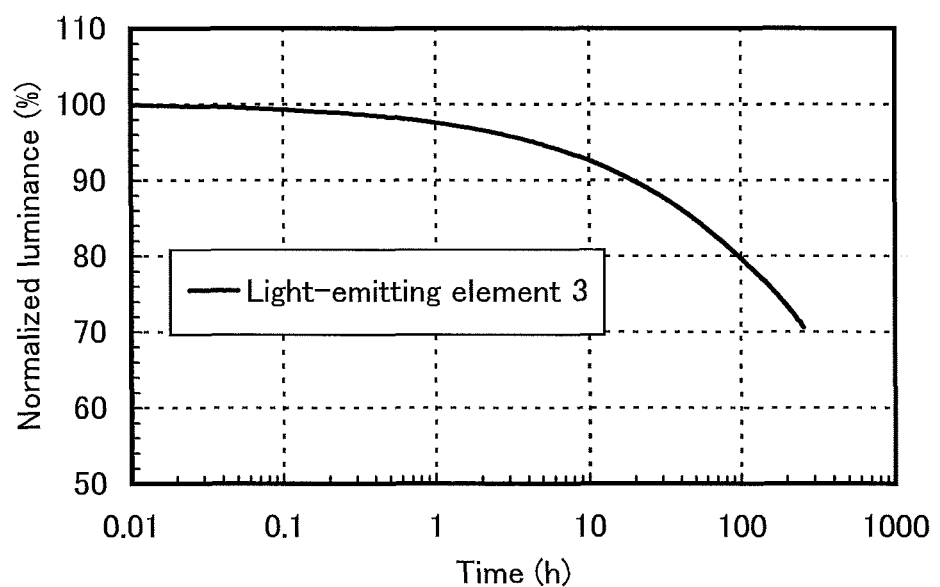
FIG. 36 shows results of a reliability test of a light-emitting element of Example.

Next, the light-emitting element 3 was subjected to a reliability test. Results of the reliability test are shown in FIG. 36. In FIG. 36, the vertical axis represents normalized luminance (%) with an initial luminance of 100%, and the horizontal axis represents driving time (h) of the element.

In the reliability test, the light-emitting element 3 was driven under the conditions where the initial luminance was set to 5000 cd/m² and the current density was constant.

The light-emitting element 3 kept 71% of the initial luminance after 260 hours elapsed.

The above results suggest that an element having high reliability and a long lifetime can be obtained by the use of 7mDBTBPDBq-II (abbreviation) for the host material of the light-emitting layer and for the electron-transport layer.

Example 9

In this example, a light-emitting element of one embodiment of the present invention will be described with reference to FIG. 27. Chemical formulae of materials used in this example are shown below.

[Chemical formula 74]

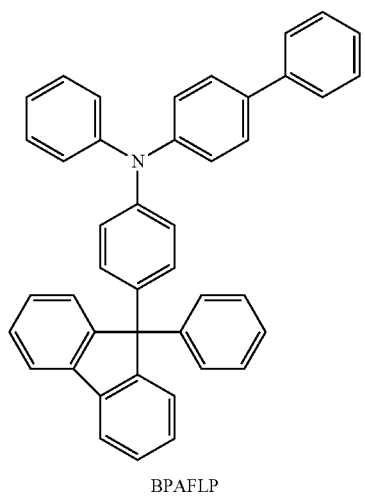

BPAFLP

-continued

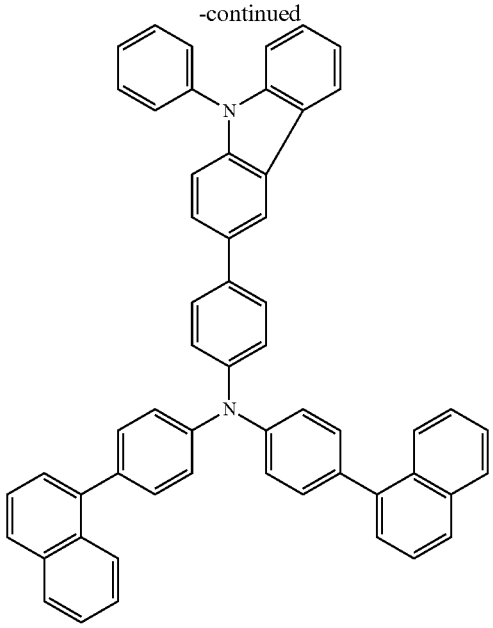

PCBNBB

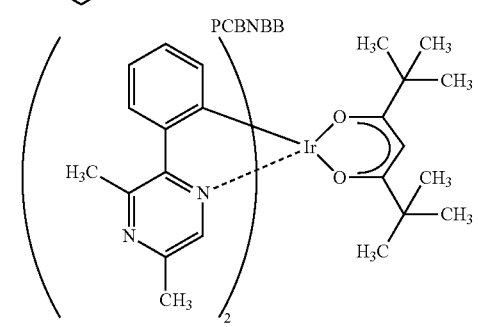

[Ir(mppr-Me)₂(dpm)]

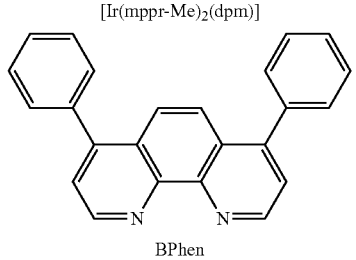

BPhen

Methods of fabricating a light-emitting element 4 and a light-emitting element 5 of this example will be described below.

(Light-Emitting Element 4)

First, over the substrate 1100, an indium oxide-tin oxide compound containing silicon or silicon oxide (ITSO) was deposited by a sputtering method, whereby the first electrode 1101 was formed. Note that the composition ratio of In₂O₃ to SnO₂ and SiO₂ in the target used was 85:10:5 [wt %]. The thickness of the first electrode 1101 was 110 nm and the electrode area was 2 mm×2 mm. Here, the first electrode 1101 is an electrode that functions as an anode of the light-emitting element.

Next, in pretreatment for forming the light-emitting element over the substrate 1100, UV ozone treatment was performed for 370 seconds after washing of a surface of the substrate with water and baking that was performed at 200° C. for 1 hour.

After that, the substrate was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 1100 was cooled down for about 30 minutes.

Then, the substrate 1100 over which the first electrode 1101 was formed was fixed to a substrate holder provided in a vacuum evaporation apparatus so that the surface on which the first electrode 1101 was formed faced downward. The pressure in the vacuum evaporation apparatus was reduced to about $10^{-4}$ Pa. After that, over the first electrode 1101, 4-phenyl-4'-(9-phenylfluoren-9-yl)triphenylamine (abbreviation: BPAFLP) and molybdenum oxide were co-evaporated by an evaporation method using resistance heating, so that the hole-injection layer 1111 was for rued. The thickness of the hole-injection layer 1111 was set to 40 nm, and the weight ratio of BPAFLP (abbreviation) to molybdenum oxide was adjusted to 4:2 (=BPAFLP:molybdenum oxide).

Lastly, an aluminum film was formed to a thickness of 200 nm using evaporation as the second electrode 1103 functioning as a cathode. Thus, the light-emitting element 4 of this example was fabricated.

Note that in all the above evaporation steps, evaporation was performed by a resistance heating method.

(Light-Emitting Element 5)

The light-emitting layer 1113 of the light-emitting element 5 was formed by co-evaporation of 6mDBTPDBq-II (abbreviation) and [Ir(mppr-Me)$_2$(dpm)] (abbreviation). The weight ratio of 6mDBTPDBq-II (abbreviation) to [Ir(mppr-Me)$_2$(dpm)] (abbreviation) was adjusted to 1:0.05 (=6mDBTPDBq-II:[Ir(mppr-Me)$_2$(dpm)]). The thickness of the light-emitting layer 1113 was set to 40 nm. The components other than the light-emitting layer 1113 were formed in the same way as those of the light-emitting element 4.

Element structures of the light-emitting element 4 and the light-emitting element 5 obtained as described above are shown in Table 5.

TABLE 5

| | First Electrode | Hole-injection Layer | Hole-transport Layer | Light-emitting Layer | First Electron-transport Layer | Second Electron-transport Layer | Electron-injection Layer | Second Electrode |
|---|---|---|---|---|---|---|---|---|
| Light-emitting Element 4 | ITSO 110 nm | BPAFLP: MoO$_x$ (=4:2) 40 nm | BPAFLP 20 nm | 6mDBTPDBq-II: PCBNBB: [Ir(mppr-Me)2(dpm)] (=0.8:0.2:0.05) 40 nm | 6mDBTPDBq-II 10 nm | BPhen 20 nm | LiF 1 nm | Al 200 nm |
| Light-emitting Element 5 | ITSO 110 nm | BPAFLP: MoO$_x$ (=4:2) 40 nm | BPAFLP 20 nm | 6mDBTPDBq-II: [Ir(mppr-Me)$_2$(dpm)] (=1:0.05) 40 nm | 6mDBTPDBq-II 10 nm | BPhen 20 nm | LiF 1 nm | Al 200 nm |

Note that the co-evaporation method refers to an evaporation method in which evaporation is carried out from a plurality of evaporation sources at the same time in one treatment chamber.

Next, over the hole-injection layer 1111, a film of BPAFLP (abbreviation) was formed to a thickness of 20 nm, so that the hole-transport layer 1112 was formed.

Further, 6-[3-(dibenzothiophen-4-yl)phenyl]dibenzo[f,h]quinoxaline (abbreviation: 6mDBTPDBq-II) synthesized in Example 3, 4,4'-di(1-naphthyl)-4"-(9-phenyl-9H-carbazol-3-yl)triphenylamine (abbreviation: PCBNBB), and bis(3,5-dimethyl-2-phenylpyrazinato)(dipivaloylmethanato)iridium (III) (abbreviation: [Ir(mppr-Me)$_2$(dpm)]) were co-evaporated to form the light-emitting layer 1113 over the hole-transport layer 1112. The weight ratio of 6mDBTPDBq-II (abbreviation) to PCBNBB (abbreviation) and [Ir(mppr-Me)$_2$(dpm)] (abbreviation) was adjusted to 0.8:0.2:0.05 (=6mDBTPDBq-II:PCBNBB: [Ir(mppr-Me)$_2$(dpm)]). The thickness of the light-emitting layer 1113 was set to 40 nm.

Further, a film of 6mDBTPDBq-II (abbreviation) was formed to a thickness of 10 nm over the light-emitting layer 1113, so that the first electron-transport layer 1114a was formed.

Then, a film of BPhen (abbreviation) was formed to a thickness of 20 nm over the first electron-transport layer 1114a, so that the second electron-transport layer 1114b was formed.

Further, a film of lithium fluoride (LiF) was formed to a thickness of 1 nm over the second electron-transport layer 1114b using evaporation, so that the electron-injection layer 1115 was formed.

In a glove box containing a nitrogen atmosphere, the light-emitting element 4 and the light-emitting element 5 were each sealed with a glass substrate so as not to be exposed to the air (specifically, a sealant was applied onto an outer edge of the element and heat treatment was performed at 80° C. for 1 hour at the time of sealing). Then, operation characteristics of the light-emitting elements were measured. Note that the measurements were carried out at room temperature (in the atmosphere kept at 25° C.).

Figure 37:
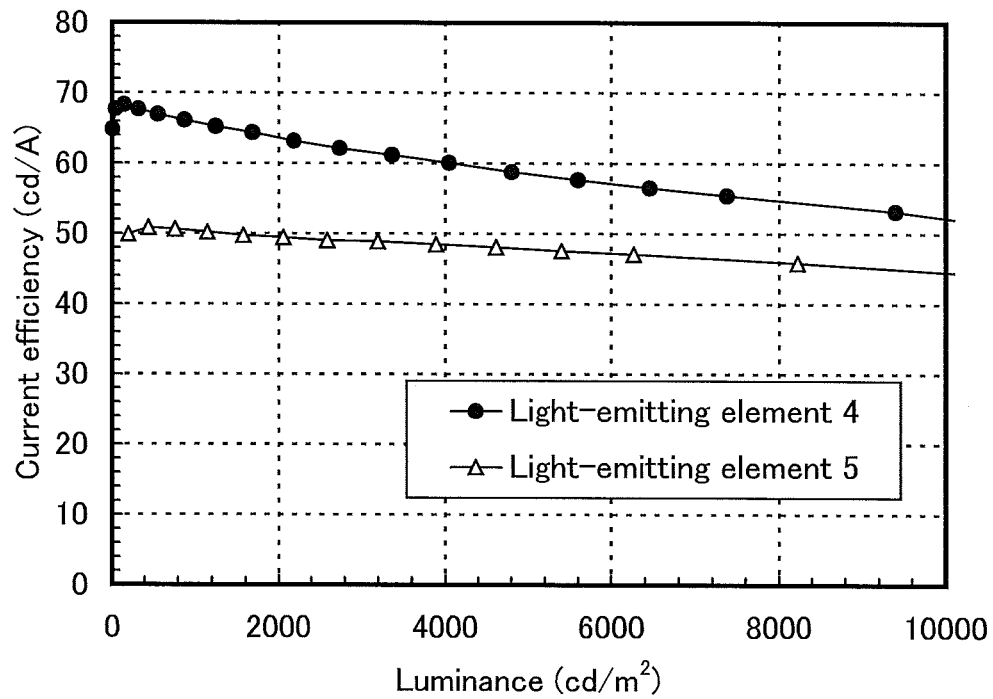
FIG. 37 shows current density-luminance characteristics of light-emitting elements of Example.
Figure 38:
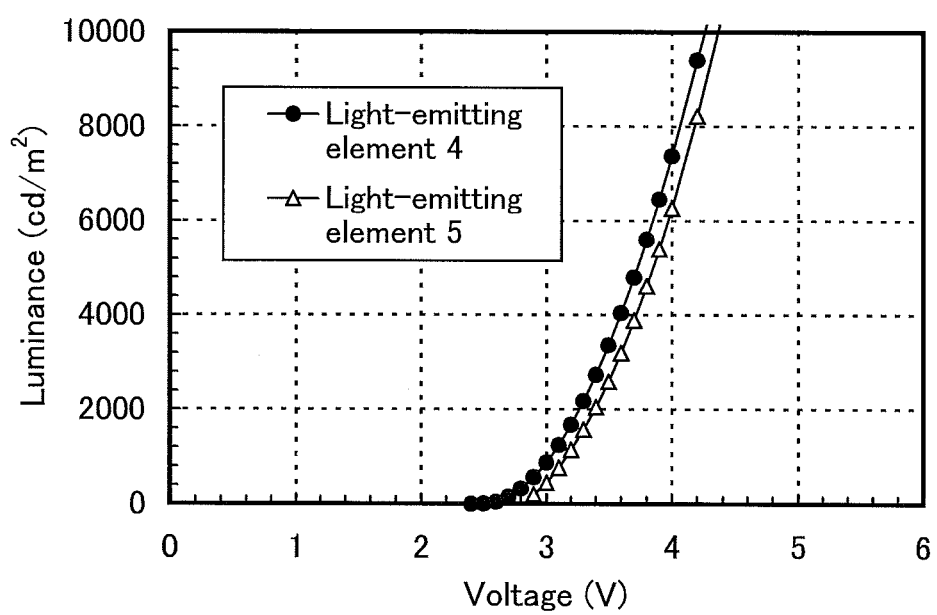
FIG. 38 shows voltage-luminance characteristics of light-emitting elements of Example.
Figure 39:
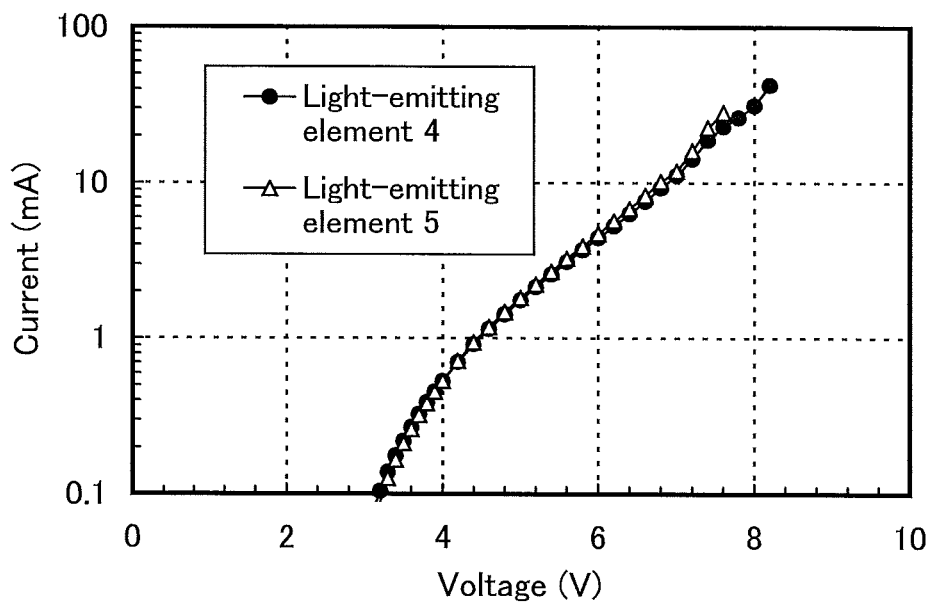
FIG. 39 shows voltage-current characteristics of light-emitting elements of Example.
Figure 40:
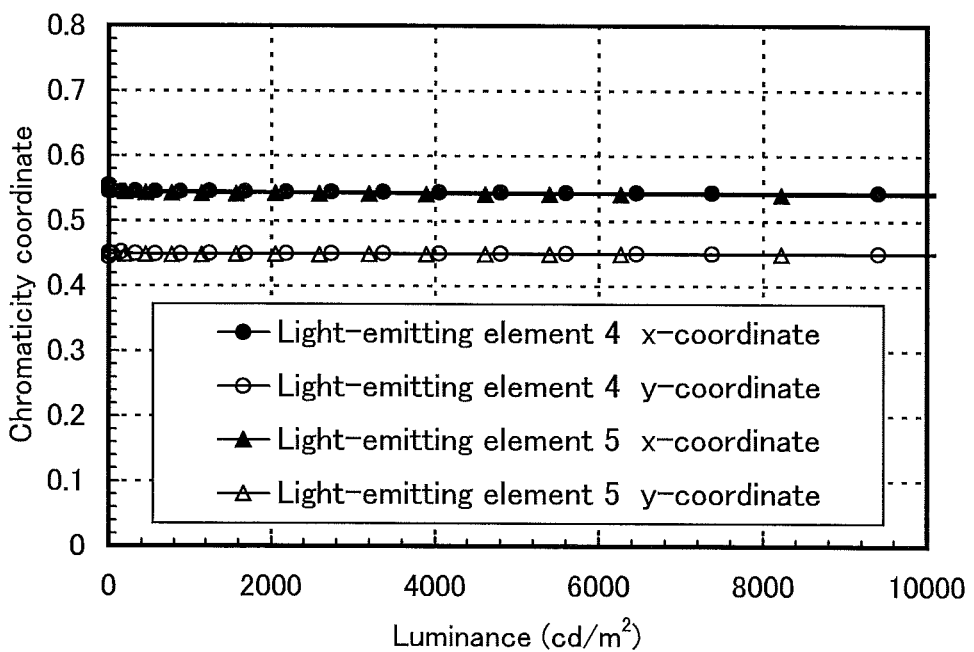
FIG. 40 shows luminance-chromaticity coordinate characteristics of light-emitting elements of Example.
Figure 41:
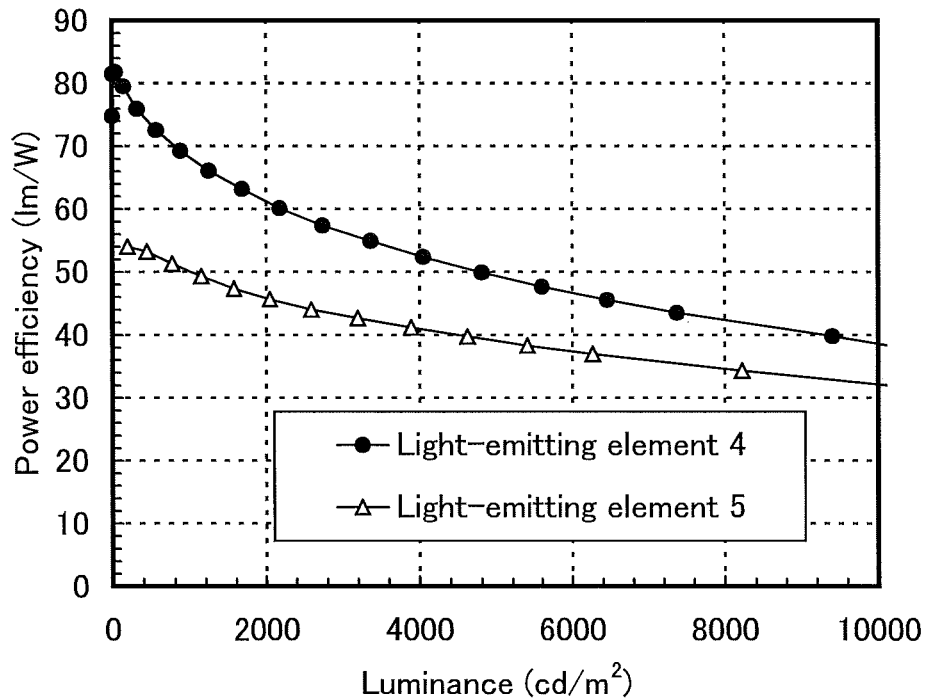
FIG. 41 shows luminance-power efficiency characteristics of light-emitting elements of Example.
Figure 42:
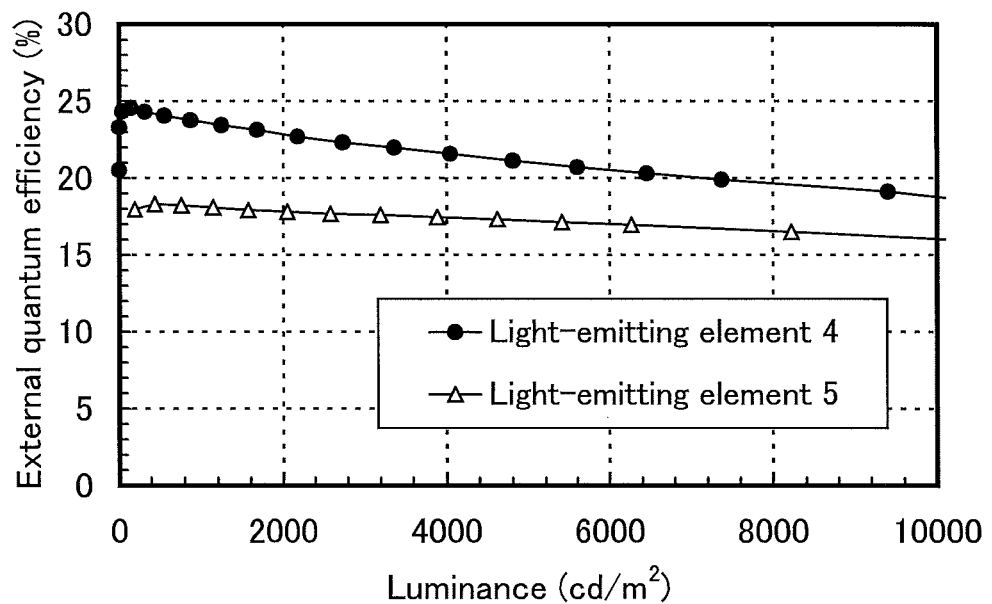
FIG. 42 shows luminance-external quantum efficiency characteristics of light-emitting elements of Example.

Luminance-current efficiency characteristics of the light-emitting elements 4 and 5 are shown in FIG. 37. In FIG. 37, the horizontal axis represents luminance (cd/m$^2$) and the vertical axis represents current efficiency (cd/A). Further, voltage-luminance characteristics of the elements are shown in FIG. 38. In FIG. 38, the horizontal axis represents voltage (V) and the vertical axis represents luminance (cd/m$^2$). Voltage-current characteristics of the elements are shown in FIG. 39. In FIG. 39, the horizontal axis represents voltage (V) and the vertical axis represents current (mA). Further, luminance-chromaticity coordinate characteristics of the elements are shown in FIG. 40. In FIG. 40, the horizontal axis represents luminance (cd/m$^2$) and the vertical axis represents chromaticity coordinate (the x-coordinate or the y-coordinate). Luminance-power efficiency characteristics of the elements are shown in FIG. 41. In FIG. 41, the horizontal axis represents luminance (cd/m$^2$) and the vertical axis represents power efficiency (lm/W). In addition, luminance-external quantum efficiency characteristics of the elements are shown in FIG. 42. In FIG. 42, the horizontal axis represents luminance (cd/m$^2$) and the vertical axis represents external quantum efficiency (%). Further, Table 6 shows the voltage (V), current density (mA/cm$^2$), CIE chromaticity coordinates (x, y), luminance (cd/m$^2$), current efficiency (cd/A), power efficiency (lm/W), and external quantum efficiency (%) of the light-emitting elements at a luminance of around 1000 cd/m$^2$.

can be increased when the host material is doped with a material having a higher hole-transport property.

Next, the light-emitting element 4 was subjected to a reliability test. In the reliability test, the light-emitting element 4 was driven under the conditions where the initial

TABLE 6

| | Voltage (V) | Current Density (mA/cm$^2$) | Chromaticity x | Chromaticity y | Luminance (cd/m$^2$) | Current Efficiency (cd/A) | Power Efficiency (lm/W) | External Quantum Efficiency (%) |
|---|---|---|---|---|---|---|---|---|
| Light-emitting Element 4 | 3.0 | 1.3 | 0.55 | 0.45 | 870 | 66 | 69 | 24 |
| Light-emitting Element 5 | 3.2 | 2.3 | 0.54 | 0.45 | 1100 | 50 | 49 | 18 |

Figure 43:
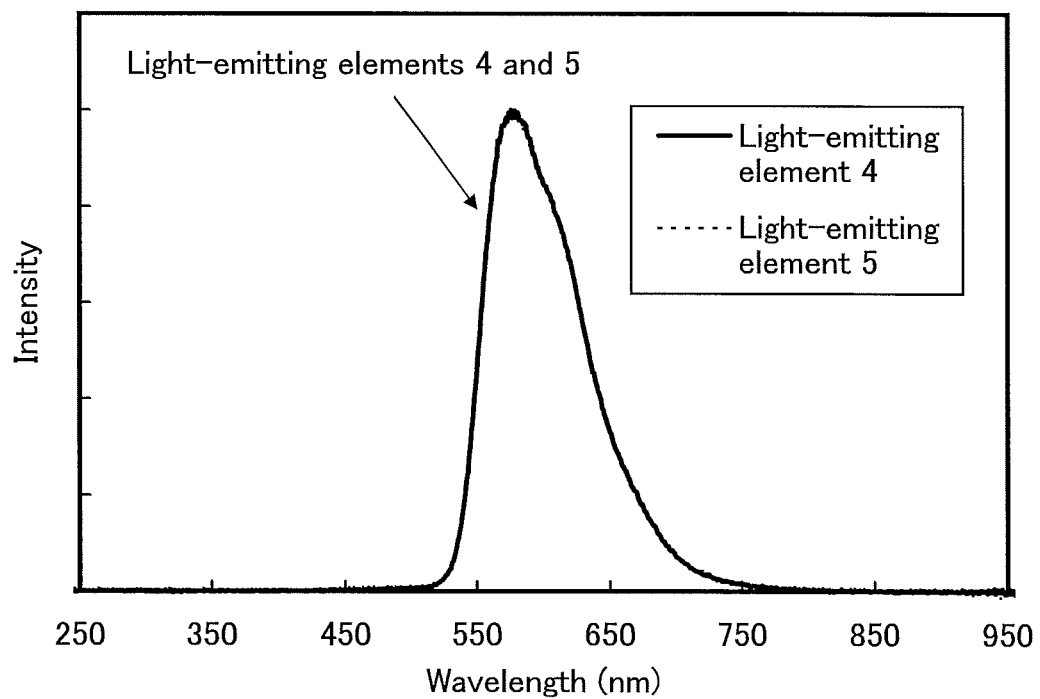
FIG. 43 shows emission spectra of light-emitting elements of Example.

FIG. 43 shows emission spectra of the light-emitting elements 4 and 5 which were obtained when a current of 0.1 mA was made to flow in the light-emitting elements 4 and 5. In FIG. 43, the horizontal axis represents wavelength (nm) and the vertical axis represents emission intensity (arbitrary unit). As shown in FIG. 43, the emission spectrum of the light-emitting element 4 has a peak at 576 nm and the emission spectrum of the light-emitting element 5 has a peak at 578 nm. Note that the emission spectra of the light-emitting elements 4 and 5 shown in FIG. 43 are substantially overlapped with each other. In addition, as shown in Table 6, the CW chromaticity coordinates of the light-emitting element 4 were (x, y)=(0.55, 0.45) at a luminance of 870 cd/m$^2$ and the CIE chromaticity coordinates of the light-emitting element 5 were (x, y)=(0.54, 0.45) at a luminance of 1100 cd/m$^2$. It is found that light emission originating from [Ir(mppr-Me)$_2$(dpm)] was obtained from each of the light-emitting elements 4 and 5.

From the above, it was found that 6mDBTPDBq-II (abbreviation) has a high T$_1$ level and can be favorably used as a host material in the case where a compound emitting phosphorescence with a wavelength longer than or equal to that of at least orange light is used as a light-emitting substance.

As shown in FIG. 40, the light-emitting elements 4 and 5 show substantially no change in color over a range from low luminance to high luminance. It can be said from the results that the light-emitting elements 4 and 5 are elements having excellent carrier balance.

From the results in FIG. 37, FIG. 38, FIG. 39, FIG. 41, and FIG. 42, it was found that the light-emitting element 4 and the light-emitting element 5 each have low drive voltage. Moreover, it was found that the light-emitting element 4 and the light-emitting element 5 each have high current efficiency, high external quantum efficiency, and high power efficiency. In particular, the light-emitting element 4 was shown to have higher current efficiency, higher external quantum efficiency, and higher power efficiency than the light-emitting element 5. A factor in that can be considered as the material with a high hole-transport property such as the amine-based compound, which was contained in the light-emitting layer of the light-emitting element 4.

As described above, by the use of 6mDBTPDBq-II (abbreviation) as a host material in the light-emitting layer, a light-emitting element having low drive voltage and high current efficiency was able to be fabricated. Further, it was found that emission efficiency of the light-emitting element luminance was set to 5000 cd/m$^2$ and the current density was constant.

The light-emitting element 4 kept 80% of the initial luminance after 82 hours elapsed.

The above results suggest that an element having high reliability can be obtained by the use of 6mDBTPDBq-II (abbreviation) for the host material of the light-emitting layer.

Example 10

In this example, a light-emitting element of one embodiment of the present invention will be described with reference to FIG. 27. Chemical formulae of materials used in this example are shown below. Note that the chemical formulae of the materials which are shown above are omitted.

[Chemical formula 75]

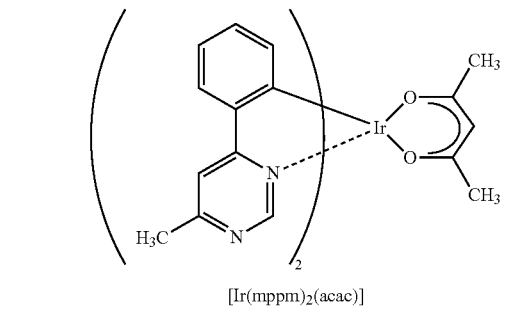

[Ir(mppm)$_2$(acac)]

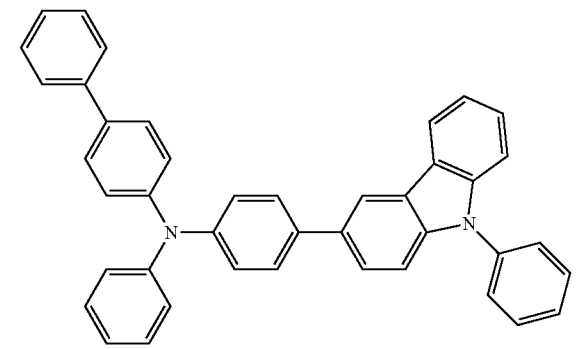

PCBA1BP

A method of fabricating a light-emitting element 6 of this example will be described below.

(Light-Emitting Element 6)

The components other than the light-emitting layer 1113 were formed in the same way as those of the light-emitting element 4. The light-emitting layer 1113 of the light-emitting element 6 is described below.

The light-emitting layer 1113 of the light-emitting element 6 was formed by co-evaporation of 6mDBTPDBq-II which was synthesized in Example 3, 4-phenyl-4'-(9-phenyl-9H-carbazol-3-yl)triphenylamine (abbreviation: PCBA1BP), and (acetylacetonato)bis(6-methyl-4-phenylpyrimidinato)iridium(III) (abbreviation: [Ir(mppm)$_2$(acac)]). The weight ratio of 6mDBTPDBq-II (abbreviation) to PCBA1BP (abbreviation) and [Ir(mppm)$_2$(acac)] (abbreviation) was adjusted to 0.8:0.2:0.05 (=6mDBTPDBq-II: PCBA1BP:[Ir(mppm)$_2$(acac)]). The thickness of the light-emitting layer 1113 was set to 40 nm.

An element structure of the light-emitting element 6 which was obtained is shown in Table 7.

TABLE 7

| | First Electrode | Hole-injection Layer | Hole-transport Layer | Light-emitting Layer | First Electron-transport Layer | Second Electron-transport Layer | Electron-injection Layer | Second Electrode |
|---|---|---|---|---|---|---|---|---|
| Light-emitting Element 6 | ITSO 110 nm | BPAFLP: MoO$_x$ (=4:2) 40 nm | BPAFLP 20 nm | 6mDBTPDBq-II: PCBA1BP: [Ir(mppm)$_2$(acac)] (=0.8:0.2:0.05) 40 nm | 6mDBTPDBq-II 10 nm | BPhen 20 nm | LiF 1 nm | Al 200 nm |

In a glove box containing a nitrogen atmosphere, the light-emitting element 6 was sealed with a glass substrate so as not to be exposed to the air (specifically, a sealant was applied onto an outer edge of the element and heat treatment was performed at 80° C. for 1 hour at the time of sealing). Then, operation characteristics of the light-emitting element were measured. Note that the measurement was carried out at room temperature (in the atmosphere kept at 25° C.).

Figure 44:
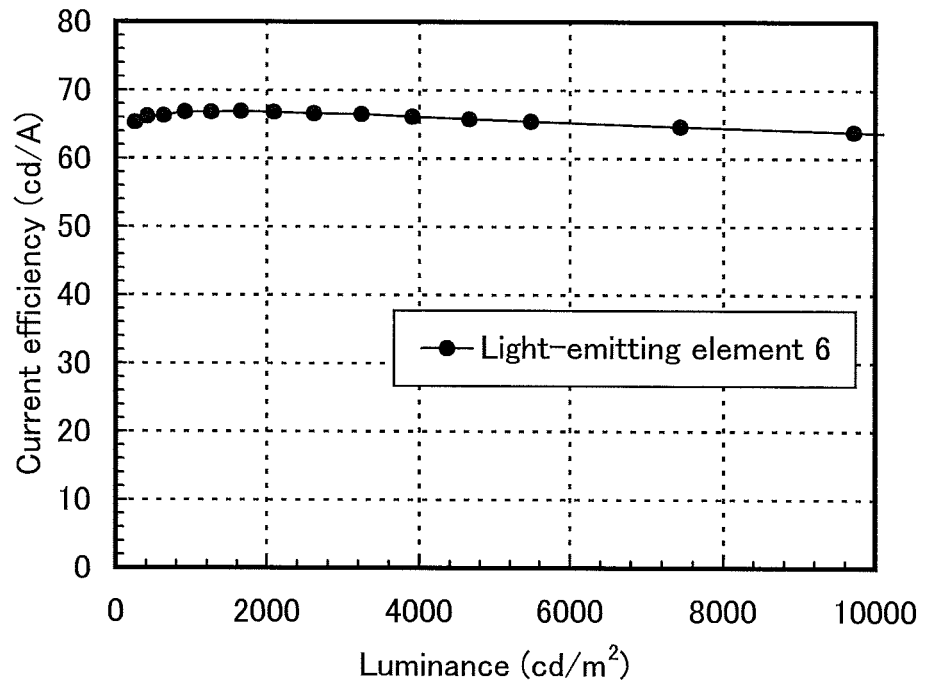
FIG. 44 shows luminance-current efficiency characteristics of a light-emitting element of Example.
Figure 45:
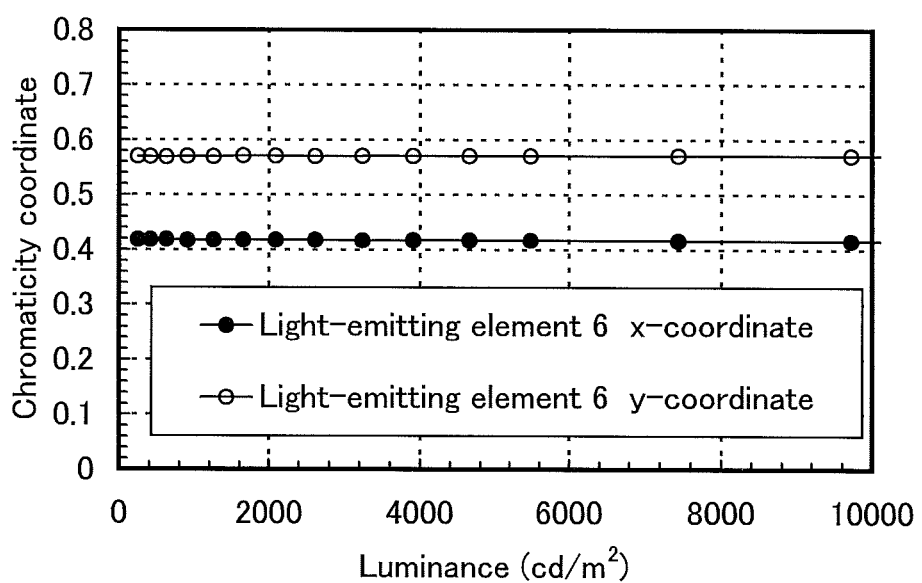
FIG. 45 shows luminance-chromaticity coordinate characteristics of a light-emitting element of Example.
Figure 46:
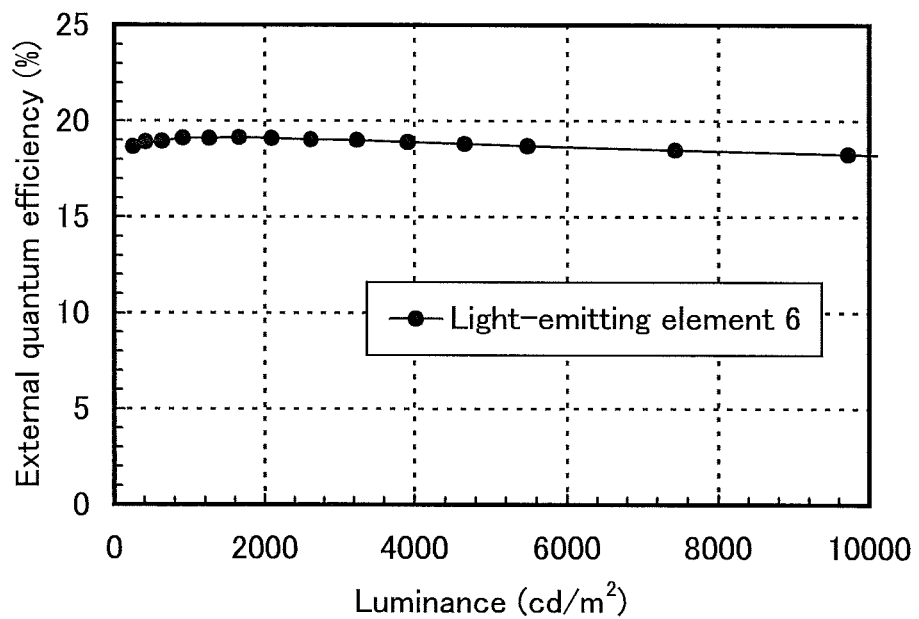
FIG. 46 shows luminance-external quantum efficiency characteristics of a light emitting element of Example.

Luminance-current efficiency characteristics of the light-emitting element 6 are shown in FIG. 44. In FIG. 44, the horizontal axis represents luminance (cd/m$^2$) and the vertical axis represents current efficiency (cd/A). Further, luminance-chromaticity coordinate characteristics of the element are shown in FIG. 45. In FIG. 45, the horizontal axis represents luminance (cd/m$^2$) and the vertical axis represents chromaticity coordinate (the x-coordinate or the y-coordinate). In addition, luminance-external quantum efficiency characteristics of the element are shown in FIG. 46. In FIG. 46, the horizontal axis represents luminance (cd/m$^2$) and the vertical axis represents external quantum efficiency (%). Further, Table 8 shows the voltage (V), current density (mA/cm$^2$), CIE chromaticity coordinates (x, y), and current efficiency (cd/A) of the light-emitting element 6 at a luminance of 910 cd/m$^2$.

Figure 47:
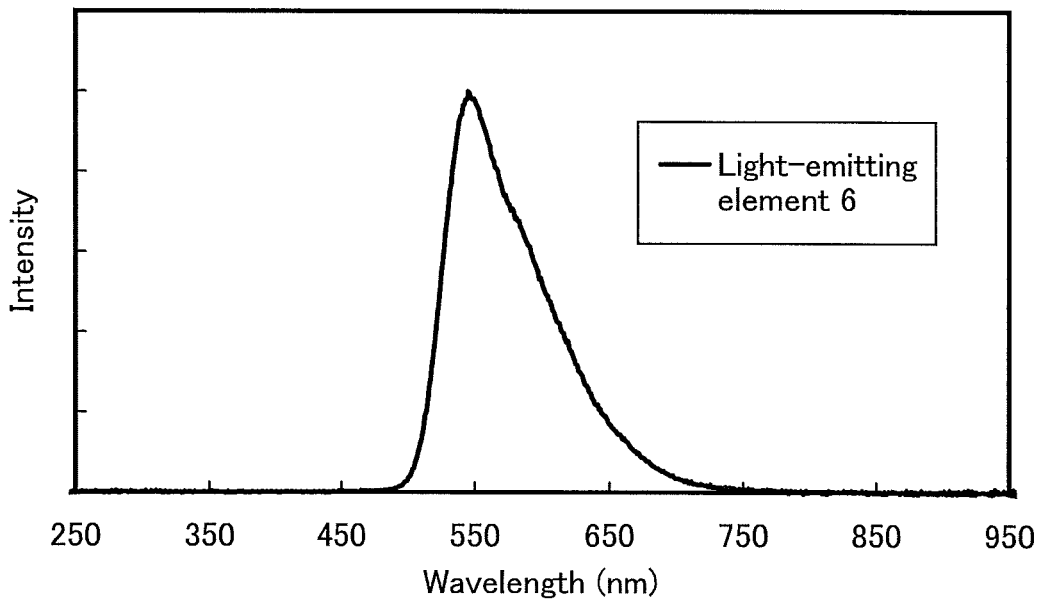
FIG. 47 shows an emission spectrum of a light-emitting element of Example.

FIG. 47 shows an emission spectrum of the light-emitting element 6 which was obtained when a current of 0.1 mA was made to flow in the light-emitting element 6. In FIG. 47, the horizontal axis represents wavelength (nm) and the vertical axis represents emission intensity (arbitrary unit). As shown in FIG. 47, the emission spectrum of the light-emitting element 6 has a peak at 545 nm. In addition, as shown in Table 8, the CIE chromaticity coordinates of the light-emitting element 6 were (x, y)=(0.42, 0.57) at a luminance of 910 cd/m$^2$. It is found that light emission originating from [Ir(mppm)$_2$(acac)] (abbreviation) was obtained from the light-emitting element 6.

From the above, it was found that 6mDBTPDBq-II (abbreviation) has a high T$_1$ level and can be favorably used as a host material in the case where a compound emitting phosphorescence with a wavelength longer than or equal to that of at least yellow light is used as a light-emitting substance.

As shown in FIG. 45, the light-emitting element 6 shows substantially no change in color over a range from low luminance to high luminance. It can be said from the results that the light-emitting element 6 is an element having excellent carrier balance.

From Table 8, FIG. 44, and FIG. 46, it was found that the light-emitting element 6 has high current efficiency and high external quantum efficiency. It was also found that the light-emitting element 6 has low drive voltage.

As described above, by the use of 6mDBTPDBq-II (abbreviation) as a host material in the light-emitting layer, a light-emitting element having low drive voltage and high current efficiency was able to be fabricated.

This application is based on Japanese Patent Application serial no. 2012-169081 filed with Japan Patent Office on Jul. 31, 2012, the entire contents of which are hereby incorporated by reference.

What is claimed is:
1. A light-emitting element comprising:
    a pair of electrodes; and
    a light-emitting layer between the pair of electrodes,
    wherein the light-emitting layer comprises an organic compound, the organic compound comprising:
        a 2,3-unsubstituted dibenzo[f,h]quinoxaline skeleton;
        a first hole-transport skeleton selected from a substituted or unsubstituted dibenzothiophene skeleton, and a substituted or unsubstituted dibenzofuran skeleton;

TABLE 8

| | Voltage (V) | Current Density (mA/cm$^2$) | Chromaticity x | Chromaticity y | Luminance (cd/m$^2$) | Current Efficiency (cd/A) |
|---|---|---|---|---|---|---|
| Light-emitting Element 6 | 3.2 | 1.4 | 0.42 | 0.57 | 910 | 67 | a second hole-transport skeleton selected from a substituted or unsubstituted dibenzothiophene skeleton, and a substituted or unsubstituted dibenzofuran skeleton; and a first arylene skeleton and a second arylene skeleton, wherein the 2,3-unsubstituted dibenzo[f,h]quinoxaline skeleton and the first hole-transport skeleton are bonded through the first arylene skeleton;

wherein the 2,3-unsubstituted dibenzo[f,h]quinoxaline skeleton and the second hole-transport skeleton are bonded through the second arylene skeleton, and wherein the first arylene skeleton is bonded to the 6-position or the 7-position of the 2,3-unsubstituted dibenzo[f,h]quinoxaline skeleton and the second arylene skeleton is bonded to the 10-position or the 11-position of the 2,3-unsubstituted dibenzo[f,h]quinoxaline skeleton.

2. The light-emitting element according to claim 1, wherein the organic compound has a molecular weight of 2000 or less.

3. The light-emitting element according to claim 1, wherein the organic compound has a molecular weight greater than or equal to 500 and less than or equal to 1000.

4. The light-emitting element according to claim 1, wherein at least a precursor ion and a product ion with a value obtained by subtracting m/z=55 from a value of the precursor ion are detected from the organic compound by LC/MS analysis in which an argon gas is collided at an energy higher than or equal to 30 eV and lower than or equal to 100 eV after LC separation.

5. A light-emitting device comprising the light-emitting element according to claim 1.

6. A light-emitting element comprising:
a pair of electrodes; and
a light-emitting layer between the pair of electrodes,
wherein the light-emitting layer comprises an organic compound, the organic compound comprising:
a 2,3-unsubstituted dibenzo[f,h]quinoxaline skeleton;
  a first hole-transport skeleton selected from a substituted or unsubstituted dibenzothiophene skeleton, and a substituted or unsubstituted dibenzofuran skeleton;
  a second hole-transport skeleton selected from a substituted or unsubstituted dibenzothiophene skeleton, and a substituted or unsubstituted dibenzofuran skeleton; and
  a first arylene skeleton and a second arylene skeleton, skeleton,
wherein the 2,3-unsubstituted dibenzo[f,h]quinoxaline skeleton and the first hole-transport skeleton are bonded through the first arylene skeleton,
wherein the 2,3-unsubstituted dibenzo[f,h]quinoxaline skeleton and the second hole-transport skeleton are bonded through the second arylene skeleton, and
wherein at least a precursor ion and a product ion with a value obtained by subtracting m/z=55 from a value of the precursor ion are detected from the organic compound by LC/MS analysis in which an argon gas is collided at an energy higher than or equal to 30 eV and lower than or equal to 100 eV after LC separation.

7. The light-emitting element according to claim 6, wherein the organic compound has a molecular weight of 2000 or less.

8. The light-emitting element according to claim 6, wherein the organic compound has a molecular weight greater than or equal to 500 and less than or equal to 1000.

9. A light-emitting device comprising the light-emitting element according to claim 6.

* * * * *

UNITED STATES PATENT AND TRADEMARK OFFICE
CERTIFICATE OF CORRECTION

PATENT NO. : 9,985,218 B2
APPLICATION NO. : 13/954121
DATED : May 29, 2018
INVENTOR(S) : Harue Osaka et al.

Page 1 of 1

It is certified that error appears in the above-identified patent and that said Letters Patent is hereby corrected as shown below:

In the Claims

-- Claim 6, Column 160, Line 13: delete "skeleton"

Signed and Sealed this
Second Day of October, 2018

Andrei Iancu
*Director of the United States Patent and Trademark Office*